(12) United States Patent
Seibald et al.

(10) Patent No.: US 10,644,206 B2
(45) Date of Patent: May 5, 2020

(54) LIGHTING DEVICE

(71) Applicant: OSRAM OLED GmbH, Regensburg (DE)

(72) Inventors: Markus Seibald, Kaufering (DE); Dominik Baumann, Munich (DE); Stefan Lange, Augsburg (DE); Hubert Huppertz, Innsbruck (AT); Thorsten Schroeder, Munich (DE); Daniel Bichler, Augsburg (DE); Gudrun Plundrich, Biessenhofen (DE); Simon Peschke, Assling (DE); Gregor Hoerder, Innsbruck (AT); Gina Maya Achrainer, Greifenberg (DE); Klaus Wurst, Zirl (AT)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/198,812

(22) Filed: Nov. 22, 2018

(65) Prior Publication Data
US 2019/0157520 A1   May 23, 2019

Related U.S. Application Data

(62) Division of application No. 16/302,724, filed as application No. PCT/EP2017/070343 on Aug. 10, 2017.

(30) Foreign Application Priority Data

Aug. 12, 2016 (DE) .................. 10 2016 114 996
Nov. 11, 2016 (DE) .................. 10 2016 121 694

(51) Int. Cl.
*H01L 33/50* (2010.01)
*C01F 5/00* (2006.01)
(Continued)

(52) U.S. Cl.
CPC ............ *H01L 33/504* (2013.01); *C01B 33/00* (2013.01); *C01F 5/00* (2013.01); *C01G 9/006* (2013.01); *C09K 11/7706* (2013.01)

(58) Field of Classification Search
CPC ........... H01L 33/504; H01L 33/00–648; H01L 27/15–156; H01L 2933/00–0091;
(Continued)

(56) References Cited

U.S. PATENT DOCUMENTS

| 9,028,716 B2 | 5/2015 | Winkler et al. |
| 9,157,025 B2 | 10/2015 | Winkler et al. |

(Continued)

FOREIGN PATENT DOCUMENTS

| DE | 202008018060 U1 | 5/2011 |
| DE | 112011102173 T5 | 3/2013 |

(Continued)

OTHER PUBLICATIONS

Werthmann, R.; Hoppe, R.; Über Oxide des neuen Formeltyps A[T4O4]: Zur Kenntnis von KLi3GeO4, KLi3SiO4 und KLi3TiO4; Z. anorg. allg. Chem, J.A. Barth. Leipzig, dated 1984, p. 7-22.

(Continued)

*Primary Examiner* — Shahed Ahmed
(74) *Attorney, Agent, or Firm* — Viering, Jentschura & Partner MBB

(57) ABSTRACT

A lighting device is specified. The lighting device comprises a phosphor having the general molecular formula $(MA)_a(MB)_b(MC)_c(MD)_d(TA)_e(TB)_f(TC)_g(TD)_h(TE)_i(TF)_j(XA)_k(XB)_l(XC)_m(XD)_n$:E. In this case, MA is selected from a group of monovalent metals, MB is selected from a group of divalent metals, MC is selected from a group of trivalent metals, MD is selected from a group of tetravalent metals, TA is selected from a group of monovalent metals, TB is selected from a group of divalent metals, TC is selected from (Continued)

a group of trivalent metals, TD is selected from a group of tetravalent metals, TE is selected from a group of pentavalent elements, TF is selected from a group of hexavalent elements, XA is selected from a group of elements which comprises halogens, XB is selected from a group of elements which comprises O, S and combinations thereof, XC=N and XD=C and E=Eu, Ce, Yb and/or Mn. The following furthermore hold true: a+b+c+d=t; e+f+g+h+i+j=u; k+l+m+n=v; a+2b+3c+4d+e+2f+3g+4h+5i+6j−k−2l−3m−4n=w; 0.8≤t≤1; −3.5≤u≤4; 3.5≤v≤4; (−0.2)≤w≤0.2 and 0≤m<0.875 v and/or v≥1>0.125 v.

12 Claims, 131 Drawing Sheets

(51) Int. Cl.
  *C01G 9/00* (2006.01)
  *C09K 11/77* (2006.01)
  *C01B 33/00* (2006.01)
(58) Field of Classification Search
  CPC ....... C01F 5/00; C01G 9/006; C09K 11/7706; C09K 11/7734; C09K 11/0883
  See application file for complete search history.

(56) References Cited

U.S. PATENT DOCUMENTS

| | | | |
|---|---|---|---|
| 2002/0190240 A1 | 12/2002 | Feldmann et al. | |
| 2006/0244358 A1 | 11/2006 | Kim et al. | |
| 2007/0166218 A1 | 7/2007 | Hirosaki et al. | |
| 2008/0224596 A1 | 9/2008 | Park et al. | |
| 2012/0019126 A1 | 1/2012 | Porob et al. | |
| 2012/0228719 A1* | 9/2012 | Harada | H01L 27/0629 257/E27.016 |
| 2013/0020533 A1 | 1/2013 | Fujinaga et al. | |
| 2013/0127333 A1 | 5/2013 | Jia et al. | |
| 2013/0140981 A1 | 6/2013 | Huber et al. | |
| 2014/0049155 A1 | 2/2014 | Kurtin | |
| 2014/0140055 A1 | 5/2014 | Chen et al. | |
| 2014/0159584 A1 | 6/2014 | Grajcar | |
| 2015/0109602 A1* | 4/2015 | Martin | F41G 1/345 356/3 |
| 2015/0123155 A1* | 5/2015 | Schmidt | H01L 33/502 257/98 |
| 2016/0312118 A1 | 10/2016 | Fiedler et al. | |
| 2017/0040501 A1* | 2/2017 | Choi | H01L 33/502 |
| 2017/0186911 A1 | 6/2017 | Otto et al. | |
| 2017/0186922 A1 | 6/2017 | Kim et al. | |
| 2017/0294561 A1 | 10/2017 | Ikeda et al. | |
| 2018/0127648 A1* | 5/2018 | Hirosaki | C09K 11/08 |
| 2018/0148644 A1 | 5/2018 | Seibald et al. | |
| 2018/0305613 A1 | 10/2018 | Bichler et al. | |
| 2019/0144744 A1 | 5/2019 | Seibald et al. | |
| 2019/0157520 A1 | 5/2019 | Seibald et al. | |

FOREIGN PATENT DOCUMENTS

| | | |
|---|---|---|
| DE | 10 2015 107 580 A1 | 11/2016 |
| DE | 102017205819 A1 | 10/2017 |
| EP | 2104149 A1 | 9/2009 |
| EP | 2428543 B1 | 3/2012 |
| EP | 2 585 554 B1 | 8/2016 |
| WO | 2012073177 A1 | 6/2012 |
| WO | 2013/175 336 A1 | 11/2013 |
| WO | 2016177890 A1 | 11/2016 |

OTHER PUBLICATIONS

Pejchal Jan et al, "Improvement of the growth of Li4SiO4single crystals for neutron detection and their scintillation and luminescence properties", Journal of Crystal Growth, Elsevier, Feb. 12, 2016, (pp. 143-150), Amsterdam; NL.
German Search Report based on 10 2016 121 694.1 (9 pages) dated Jul. 7, 2017 (for reference purpose only).
International Search Report based on PCT/EP2017/070343 (3 pages) dated Nov. 10, 2017 (for reference purpose only).
Pust et al.,"Narrow-Band Red-Emitting Sr[LiAl3N4]:Eu2+ as a Next-Generation LED-Phosphor Material", Nature materials, 2014, pp. 891-896.
Nowitzki,B; Hoppe R, Neues über Oxide vom Typ A [(TO)n] [1]: NaLi3SiO4, NaLi3GeO4 und Nali3Ti04 [2].Revuede chimie minerale, dated 1986, p. 217-230.
P. Pust, A. S. Wochnik, E. Baumann, P. J. Schmidt, D. Wiechert, C. Scheu, W. Schnick, Ca[LiAl3N4]:Eu2+—A Narrow-Band Red-Emitting Nitridolithoaluminate Chemistry of Materials 2014 26, 3544-3549.
J. Hofmann, R. Brandes, R. Hoppe, Neue Silicate mit Stuffed Pyrgoms: CsKNaLi9{Li[SiO4]}4, CsKNa2Li8{Li[SiO4]}4, RbNa3Li8{Li[SiO4]>4, und RbNaLi4{Li[SiO4]}4, Z. Anorg. Allg. Chem., 1994, 620, 1495-1508.
C. Weiß, R. Hoppe, Das erste Titanat mit Stuffed Pyrgoms: RbNa3Li12[TiO4]4=RbNa3Li8{Li[TiO4]}4, Z. Anorg. Allg. Chem., 1994, 620, 2064-2069.
R. Brandes, R. Hoppe, Das erste Oxogermanat mit Stuffed Pyrgoms: CsNa3Lis8{Li[GeO4]}4, Z Anorg. Allg. Chem., 1995, 621, 713-718.
Lucas et al., Measuring and using light in the melanopsin age; Trends in Neurosciences Jan. 2014 vol. 37 No. 1.
K. Bernet, R. Hoppe, Ein Lithosilicat mit Kolumnareinheiten: RbLi5{Li[SiO4]}2, Z. Anorg. Allg. Chem., 1991, 592, 93-105.
International Search Report issued for international counterpart application PCT/EP2018/080607, dated Feb. 14, 2019 (for reference purpose only).
German Search Report issued for German counterpart application 10 2018 205 464.9, dated Feb. 8, 2019 (for reference purpose only).
U.S. Non-Final Office Action based on U.S. Appl. No. 16/324,924 (22 pages) dated Jul. 31, 2019 (for reference purpose only).
Pust, P. et al., "Group (III) Nitrides M[Mg2Al2N4] (M = Ca,Sr,Ba,Eu) and Ba[Mg2Ga2N4]—Structural Relation and Nontypical Luminescence Properties of Eu2+ Doped Samples", Chem. Mater., 2014, 26, 6113.
Wilhelm D. et al., "Narrow-Band Red Emission in the Nitridolithoaluminate Sr4[LiAl11N14):Eu2+", Chemistry of Materials, 2017, 29, p. 1204.
Wagatha P. et al., "Ca18.75Li10.5[Al39N55]:Eu2+—Supertetrahedron Phosphor for Solid-State Lighting", Chemistry of Materials, 2016, 28, p. 1220.
International Search Report issued for international counterpart application PCT/EP2018/053416, dated May 2, 2018 (for reference purpose only).
Werthmann et al.: "Über Oxide des neuen Formeltyps A[T404]: Zur Kenntnis von KLi3Ge04, KLi3Si04 and KLi3Ti04"; Z. anorg. allg. Chem, J.A. Barth. Leipzig, Jan. 1, 1984 (pp. 7-22).
Pejchal et al.: "Improvement of the growth of Li4SiO4single crystals for neutron detection and their scintillation and luminescence properties", Journal of Crystal Growth, Elsevier, Amsterdam, Feb. 12, 2016 (pp. 143-150).
Written Opinion (7 pages) and International Search Report (based on PCT/EP2017/070343 (4 pages) dated Nov. 10, 2017 and English translation of Written Opinion (8 pages) and ISR (3 pages).
US Office Action based on U.S. Appl. No. 16/198,812, dated Aug. 6, 2019, 35 pages (for reference purpose only).
Notice of Allowance based on U.S. Appl. No. 16/302,724 (9 pages) dated Sep. 30, 2019 (for reference purpose only).
German Search Report based on Application No. 10 2018 108 842.6, dated Dec. 11, 2018, 6 pages (for reference purpose only).
Notice of Allowance issued for corresponding U.S. Appl. No. 16/202,188, dated Mar. 6, 2020, 10 pages (for informational purpose only).

\* cited by examiner

FIG 1A

| NaLi3SiO4 ↔ CaLiAl3N4 | | | LiO2 ↔ AlN2 | |
|---|---|---|---|---|
| Na$_{1-y}$Ca$_y$Li$_{3-2y}$Al$_{3y}$Si$_{1-y}$O$_{4-4y}$N$_{4y}$ : E | | | NaLi$_{3-y'}$Al$_{y'}$SiO$_{4-2y'}$N$_{2y'}$ : E | |
| Na1CaOLi3AlOSiO4N0 | | NaLi3SiO4 | NaLi3AlOSiO4N0 | NaLi3SiO4 |
| Na0,9Ca0,1Li2,8Al0,3Si0,9O3,6N0,4 | | | NaLi2,9Al0,1SiO3,8N0, | |
| Na0,8Ca0,2Li2,6Al0,6Si0,8O3,2N0,8 | | | NaLi2,8Al0,2SiO3,6N0,4 | |
| Na0,7Ca0,3Li2,4Al0,9Si0,7O2,8N1,2 | | | NaLi2,7Al0,3SiO3,4N0,6 | |
| Na0,6Ca0,4Li2,2Al1,2Si0,6O2,4N1,6 | | | NaLi2,6Al0,4SiO3,2N0,8 | |
| Na0,5Ca0,5Li2Al1,5Si0,5O2N2 | NaCaLi4Al3SiO4N4 | | NaLi2,5Al0,5SiO3N1 | Na2Li5AlSi2O3N |
| Na0,4Ca0,6Li1,8Al1,8Si0,4O1,6N2,4 | | | NaLi2,4Al0,6SiO2,8N1,2 | |
| Na0,3Ca0,7Li1,6Al2,1Si0,3O1,2N2,8 | | | NaLi2,3Al0,7SiO2,6N1,4 | |
| Na0,2Ca0,8Li1,4Al2,4Si0,2O0,8N3,2 | | | NaLi2,2Al0,8SiO2,4N1,6 | |
| Na0,1Ca0,9Li1,2Al2,7Si0,1O0,4N3,6 | | | NaLi2,1Al0,9SiO2,2N1,8 | |
| Na0Ca1Li1Al3Si0O0N4 | | CaLiAl3N4 | NaLi2Al1SiO2N2 | NaLi2AlSiO2N2 |
| | | | NaLi1,9Al1,1SiO1,8N2,2 | |
| | | | NaLi1,8Al1,2SiO1,6N2,4 | |
| | | | NaLi1,7Al1,3SiO1,4N2,6 | |
| | | | NaLi1,6Al1,4SiO1,2N2,8 | |
| | | | NaLi1,5Al1,5SiO1N3 | Na2Li2Al3Si2O2N6 |
| | | | NaLi1,4Al1,6SiO0,8N3,2 | |
| | | | NaLi1,3Al1,7SiO0,6N3,4 | |
| | | | NaLi1,2Al1,8SiO0,4N3,6 | |
| | | | NaLi1,1Al1,9SiO0,2N3,8 | |
| | | | NaLi1Al2SiO0N4 | NaLiAl2SiN4 |

FIG 1B

| FIG 1BA |
|---|
| FIG 1BB |

FIG 1BA

| LiO ↔ MgN | | LiSi ↔ ZnAl | |
|---|---|---|---|
| NaLi$_{3-y''}$Mg$_{y''}$SiO$_{4-y''}$N$_{y''}$ : E | NaLi$_3$SiO$_4$ | NaLi$_{3-x}$Si$_{1-x}$Zn$_x$Al$_x$O$_4$ : E | NaLi$_3$SiO$_4$ |
| NaLi3Mg0SiO4N0 | | NaLi3Si1Zn0AlO04 | |
| NaLi2,9Mg0,1SiO3,9N0,1 | | NaLi2,9Si0,9Zn0,1Al0,1O4 | |
| NaLi2,8Mg0,2SiO3,8N0,2 | | NaLi2,8Si0,8Zn0,2Al0,2O4 | |
| NaLi2,7Mg0,3SiO3,7N0,3 | | NaLi2,7Si0,7Zn0,3Al0,3O4 | |
| NaLi2,6Mg0,4SiO3,6N0,4 | | NaLi2,6Si0,6Zn0,4Al0,4O4 | |
| NaLi2,5Mg0,5SiO3,5N0,5 | Na$_2$Li$_5$MgSi$_2$O$_7$N | NaLi2,5Si0,5Zn0,5Al0,5O4 | Na$_2$Li$_5$SiZnAlO$_8$ |
| NaLi2,4Mg0,6SiO3,4N0,6 | | NaLi2,4Si0,4Zn0,6Al0,6O4 | |
| NaLi2,3Mg0,7SiO3,3N0,7 | | NaLi2,3Si0,3Zn0,7Al0,7O4 | |
| NaLi2,2Mg0,8SiO3,2N0,8 | | NaLi2,2Si0,2Zn0,8Al0,8O4 | |
| NaLi2,1Mg0,9SiO3,1N0,9 | | NaLi2,1Si0,1Zn0,9Al0,9O4 | |
| NaLi2Mg1SiO3N1 | NaLi$_2$MgSiO$_3$N | NaLi2SiOZn1AlO4 | NaLi$_2$ZnAlO$_4$ |

FIG 1BB

| | |
|---|---|
| NaLi1,9Mg1,1SiO2,9N1,1 | |
| NaLi1,8Mg1,2SiO2,8N1,2 | |
| NaLi1,7Mg1,3SiO2,7N1,3 | |
| NaLi1,6Mg1,4SiO2,6N1,4 | |
| NaLi1,5Mg1,5SiO2,5N1,5 | Na$_2$Li$_3$Mg$_3$Si$_2$O$_5$N$_3$ |
| NaLi1,4Mg1,6SiO2,4N1,6 | |
| NaLi1,3Mg1,7SiO2,3N1,7 | |
| NaLi1,2Mg1,8SiO2,2N1,8 | |
| NaLi1,1Mg1,9SiO2,1N1,9 | |
| NaLi1Mg2SiO2N2 | NaLiMg$_2$SiO$_2$N$_2$ |
| NaLi0,9Mg2,1SiO1,9N2,1 | |
| NaLi0,8Mg2,2SiO1,8N2,2 | |
| NaLi0,7Mg2,3SiO1,7N2,3 | |
| NaLi0,6Mg2,4SiO1,6N2,4 | |
| NaLi0,5Mg2,5SiO1,5N2,5 | Na$_2$LiMg$_5$Si$_2$O$_3$N$_5$ |
| NaLi0,4Mg2,6SiO1,4N2,6 | |
| NaLi0,3Mg2,7SiO1,3N2,7 | |
| NaLi0,2Mg2,8SiO1,2N2,8 | |
| NaLi0,1Mg2,9SiO1,1N2,9 | |
| NaLi0Mg3SiO1N3 | NaMg$_3$SiON$_3$ |

FIG 1C

| | LiSi ↔ MgAl | | NaO ↔ CaN | |
|---|---|---|---|---|
| | $NaLi_{3-x}Si_{1-x}Mg_xAl_xO_4 : E$ | | $Na_{1-w''''}Ca_{w''''}Li_3SiO_{4-w''''}N_{w''''} : E$ | |
| NaLi3Si1Mg0Al0O4 | | NaLi3SiO4 | Na1Ca0Li3SiO4N0 | NaLi3SiO4 |
| NaLi2,9Si0,9Mg0,1Al0,1O4 | | | Na0,9Ca0,1Li3SiO3,9N0,1 | |
| NaLi2,8Si0,8Mg0,2Al0,2O4 | | | Na0,8Ca0,2Li3SiO3,8N0,2 | |
| NaLi2,7Si0,7Mg0,3Al0,3O4 | | | Na0,7Ca0,3Li3SiO3,7N0,3 | |
| NaLi2,6Si0,6Mg0,4Al0,4O4 | | | Na0,6Ca0,4Li3SiO3,6N0,4 | |
| NaLi2,5Si0,5Mg0,5Al0,5O4 | | Na2Li5SiMgAlO8 | Na0,5Ca0,5Li3SiO3,5N0,5 | NaCaLi6Si2O7N |
| NaLi2,4Si0,4Mg0,6Al0,6O4 | | | Na0,4Ca0,6Li3SiO3,4N0,6 | |
| NaLi2,3Si0,3Mg0,7Al0,7O4 | | | Na0,3Ca0,7Li3SiO3,3N0,7 | |
| NaLi2,2Si0,2Mg0,8Al0,8O4 | | | Na0,2Ca0,8Li3SiO3,2N0,8 | |
| NaLi2,1Si0,1Mg0,9Al0,9O4 | | | Na0,1Ca0,9Li3SiO3,1N0,9 | |
| NaLi2Si0Mg1Al1O4 | | NaLi2MgAlO4 | Na0Ca1Li3SiO3N1 | CaLi3SiO3N |

FIG 1D

| LiSiO ↔ Al2N | | NaLiSiO2 ↔ CaAl2N2 | |
|---|---|---|---|
| NaLi3-w'Al2w'Si1-w'O4-w'Nw' : E | | Na1-w'''Caw'''Li3-w''Si1-w''Al2w''O4-2w'''N2w''' : E | |
| NaLi3AlOSi1O4N0 | NaLi3SiO4 | Na1Ca0Li3Si1AlO04N0 | NaLi3SiO4 |
| NaLi2,9Al0,2Si0,9O3,9N0,1 | | Na0,9Ca0,1Li2,9Si0,9Al0,2O3,8N0,2 | |
| NaLi2,8Al0,4Si0,8O3,8N0,2 | | Na0,8Ca0,2Li2,8Si0,8Al0,4O3,6N0,4 | |
| NaLi2,7Al0,6Si0,7O3,7N0,3 | | Na0,7Ca0,3Li2,7Si0,7Al0,6O3,4N0,6 | |
| NaLi2,6Al0,8Si0,6O3,6N0,4 | | Na0,6Ca0,4Li2,6Si0,6Al0,8O3,2N0,8 | |
| NaLi2,5Al1Si0,5O3,5N0,5 | Na2Li5Al2SiO7N | Na0,5Ca0,5Li2,5Si0,5Al1O3N1 | NaCaLi5SiAl2O6N2 |
| NaLi2,4Al1,2Si0,4O3,4N0,6 | | Na0,4Ca0,6Li2,4Si0,4Al1,2O2,8N1,2 | |
| NaLi2,3Al1,4Si0,3O3,3N0,7 | | Na0,3Ca0,7Li2,3Si0,3Al1,4O2,6N1,4 | |
| NaLi2,2Al1,6Si0,2O3,2N0,8 | | Na0,2Ca0,8Li2,2Si0,2Al1,6O2,4N1,6 | |
| NaLi2,1Al1,8Si0,1O3,1N0,9 | | Na0,1Ca0,9Li2,1Si0,1Al1,8O2,2N1,8 | |
| NaLi2Al2SiO03N1 | NaLi2AlO3N1 | NaOCa1Li2Si0Al2O2N2 | CaLi2AlO2N2 |

FIG 1E

| NASi ↔ CaAl | | NaSiLi ↔ CaMg2 | |
|---|---|---|---|
| Na1-x''Cax'Li3Si1-x'Alx'O4 : E | | Na1-x''Cax''Li3-x'''Si1-x'''Mg2x''O4 : E | |
| Na1Ca0Li3Si1Al0O4 | NaLi3SiO4 | Na1Ca0Li3Si1MgO04 | NaLi3SiO4 |
| Na0,9Ca0,1Li3Si0,9Al0,1O4 | | Na0,9Ca0,1Li2,9Si0,9Mg0,2O4 | |
| Na0,8Ca0,2Li3Si0,8Al0,2O4 | | Na0,8Ca0,2Li2,8Si0,8Mg0,4O4 | |
| Na0,7Ca0,3Li3Si0,7Al0,3O4 | | Na0,7Ca0,3Li2,7Si0,7Mg0,6O4 | |
| Na0,6Ca0,4Li3Si0,6Al0,4O4 | | Na0,6Ca0,4Li2,6Si0,6Mg0,8O4 | |
| Na0,5Ca0,5Li3Si0,5Al0,5O4 | NaCaLi6SiAlO4 | Na0,5Ca0,5Li2,5Si0,5Mg1O4 | NaCaLi5SiMg2O4 |
| Na0,4Ca0,6Li3Si0,4Al0,6O4 | | Na0,4Ca0,6Li2,4Si0,4Mg1,2O4 | |
| Na0,3Ca0,7Li3Si0,3Al0,7O4 | | Na0,3Ca0,7Li2,3Si0,3Mg1,4O4 | |
| Na0,2Ca0,8Li3Si0,2Al0,8O4 | | Na0,2Ca0,8Li2,2Si0,2Mg1,6O4 | |
| Na0,1Ca0,9Li3Si0,1Al0,9O4 | CaLi3AlO4 | Na0,1Ca0,9Li2,1Si0,1Mg1,8O4 | |
| Na0Ca1Li3Si0Al1O4 | | Na0Ca1Li2Si0Mg2O4 | CaLi2Mg2O4 |

FIG 1F

| Li₂Si ↔ Mg₃ | | Si₂ ↔ AlP | |
|---|---|---|---|
| NaLi₃₋₂zMg₃zSi₁₋zO₄ : E | NaLi₃SiO₄ | NaLi₃Si₁₋₂z'Al_z'P_z'O₄ : E | NaLiSiO₄ |
| NaLi3Mg0Si1O4 | | NaLi3SiAl0P0O4 | |
| NaLi2,8Mg0,3Si0,9O4 | | NaLi3Si0,8Al0,1P0,1O4 | |
| NaLi2,6Mg0,6Si0,8O4 | | NaLi3Si0,6Al0,2P0,2O4 | |
| NaLi2,4Mg0,9Si0,7O4 | | NaLi3Si0,4Al0,3P0,3O4 | |
| NaLi2,2Mg1,2Si0,6O4 | | NaLi3Si0,2Al0,4P0,4O4 | |
| NaLi2Mg1,5Si0,5O4 | Na2Li4Mg3SiO8 | NaLi3SiAl0,5P0,5O4 | Na2Li6AlPO8 |
| NaLi1,8Mg1,8Si0,4O4 | | | |
| NaLi1,6Mg2,1Si0,3O4 | | | |
| NaLi1,4Mg2,4Si0,2O4 | | | |
| NaLi1,2Mg2,7Si0,1O4 | NaLiMg3O4 | | |
| NaLi1Mg3SiO4 | | | |

|     |                    | FHWM/ 1/cm | λpeak /nm | λdom /nm | LER/ lm/W |
|-----|--------------------|------------|-----------|----------|-----------|
| VB1 | $BaMgAl_{10}O_{17}$: Eu | 2524 | 452 | 465 | 64 |
| VB2 | $Si_5(PO_4)_3Cl$: Eu | 1516 | 449 | 457 | 45 |
| VB3 | $BaMgAl_{10}O_{17}$: Eu | 2646 | 457 | 471 | 100 |
| AB1 | $NaLi_3SiO_4$: Eu | 1477 | 469 | 473 | 105 |

FIG 11

| molecular formula | NaLi$_3$SiO$_4$ |
|---|---|
| M/g × mol$^{-1}$ | 135.88 |
| crystal system | tetragonal |
| space group | I4$_1$/a (no 88) |
| a/Å | 10.77889(7) |
| c/Å | 12.64137(8) |
| cell volume / Å$^3$ | 1468.73 |
| Z | 16 |
| density / g × cm$^{-3}$ | 2,46 |
| T/K | 293(2) |
| diffractometer | PANalytical Empyrean |
| radiation / Å | Cu-Kα$_1$ (λ=1.540598Å) |
| measurement range | 10° < 2θ < 120° |
|  | 0 ≤ h ≤ 12 |
|  | 0 ≤ k ≤ 12 |
|  | 0 ≤ l ≤ 14 |
| independent reflexes | 546 |
| R$_p$ | 0.1240 |
| R$_{wp}$; R$_{exp}$ | 0.1623; 0.0938 |
| GooF | 1.730 |

FIG 12

| atom | x | y | z | occupation |
|---|---|---|---|---|
| Si1 | 0.0385 | 0.0687 | 0.3054 | 1 |
| Na1 | 0.2642 | 0.0285 | 0.1556 | 1 |
| Li1 | 0.0307 | 0.0920 | 0.0640 | 1 |
| Li2 | 0.0210 | 0.0934 | 0.5557 | 1 |
| Li3 | 0.3661 | 0.2520 | 0.0722 | 1 |
| O1 | 0.1730 | 0.1993 | 0.0476 | 1 |
| O2 | 0.4625 | 0.1023 | 0.0876 | 1 |
| O3 | 0.1620 | 0.1529 | 0.2962 | 1 |
| O4 | 0.1739 | 0.1689 | 0.5668 | 1 |

FIG 17

| LED | λprim/nm | 1. phosphor | 2. phosphor | CIE-x | CIE-y | CCT/K | CRI | R9 | LER/lm/W |
|---|---|---|---|---|---|---|---|---|---|
| VLED1 | 445 | (Lu,Y)$_3$Al$_5$O$_{12}$:Ce | CaAlSiN$_3$:Eu | 0,461 | 0,420 | 2755 | 81 | 36 | 296 |
| VLED2 | 441 | Lu$_3$(Al,Ga)$_5$O$_{12}$:Ce | (Ca,Sr,Ba)$_2$Si$_5$N$_8$:Eu | 0,458 | 0,400 | 2639 | 81 | 14 | 299 |
| LED1 | 410 | KLi$_3$SiO$_4$:Eu | | 0,449 | 0,396 | 2744 | 81 | 21 | 286 |
| LED2 | 390 | KLi$_3$SiO$_4$:Eu | | 0,450 | 0,397 | 2741 | 81 | 21 | 286 |

FIG 21

| molecular formula | KLi$_3$SiO$_4$ |
| --- | --- |
| M/g × mol$^{-1}$ | 151.99 |
| crystal system | triclinic |
| space group | P-1 (no 2) |
| a/Å | 5.7048(2) |
| b/Å | 7.3583(2) |
| c/Å | 9.7299(2) |
| α/° | 83.38572(6) |
| β/° | 76.33540(8) |
| γ/° | 79.95622(8) |
| cell volume / Å$^3$ | 389.626 |
| Z | 4 |
| density / g × cm$^{-3}$ | 2.59 |
| T/K | 293(2) |
| diffractometer | PANalytical Empyrean |
| radiation / Å | Cu-Kα$_1$ (λ=1.540598Å) |
| measurement range | 10° < 2θ < 120° |
|  | −6 ≤ h ≤ 6 |
|  | −8 ≤ k ≤ 8 |
|  | 0 ≤ l ≤ 10 |
| independent reflexes | 1160 |
| R$_p$ | 0.1767 |
| R$_{wp}$; R$_{exp}$ | 0.2356; 0.1147 |
| GooF | 2.054 |

FIG 22

| atom | x | y | z | occupation |
|---|---|---|---|---|
| K1 | 0.0015 | 0.3837 | 0.8853 | 1 |
| K2 | 0.0458 | 0.1423 | 0.6281 | 1 |
| Si1 | 0.4409 | 0.7898 | 0.1347 | 1 |
| Si2 | 0.8351 | 0.2933 | 0.3512 | 1 |
| Li1 | 0.1887 | 0.4454 | 0.3960 | 1 |
| Li2 | 0.1999 | 0.1723 | 0.1452 | 1 |
| Li3 | 0.4368 | 0.0492 | 0.3770 | 1 |
| Li4 | 0.4801 | 0.3258 | 0.6107 | 1 |
| Li5 | 0.5321 | 0.4223 | 0.1295 | 1 |
| Li6 | 0.7997 | 0.0608 | 0.1036 | 1 |
| O1 | 0.1385 | 0.2057 | 0.3474 | 1 |
| O2 | 0.1917 | 0.9327 | 0.0942 | 1 |
| O3 | 0.1970 | 0.4883 | 0.5897 | 1 |
| O4 | 0.3453 | 0.6097 | 0.2560 | 1 |
| O5 | 0.3819 | 0.3241 | 0.0084 | 1 |
| O6 | 0.3974 | 0.1033 | 0.7791 | 1 |
| O7 | 0.6381 | 0.1623 | 0.4637 | 1 |
| O8 | 0.8178 | 0.2891 | 0.1772 | 1 |

FIG 27

| | |
|---|---|
| molecular formula | $NaKLi_6Si_2O_8$ |
| M/g × mol$^{-1}$ | 288.25 |
| crystal system | tetragonal |
| space group | I4/m (no 87) |
| d/Å | 10,9488(1) |
| c/Å | 6,26376(9) |
| cell volume / Å$^3$ | 750,88 |
| Z | 4 |
| density / g × cm$^{-3}$ | 2,55 |
| T/K | 293(2) |
| diffractometer | PANalytical Empyrean |
| radiation / Å | Cu-K$\alpha_1$ ($\lambda$=1.540598Å) |
| measurement range | 10° < 2$\theta$ < 120° |
| | 0 ≤ h ≤ 12 |
| | 0 ≤ k ≤ 12 |
| | 0 ≤ l ≤ 7 |
| independent reflexes | 312 |
| $R_p$ | 0,1299 |
| $R_{wp}$; $R_{exp}$ | 0,1755; 0,1024 |
| GooF | 1,714 |

| atom | x | y | z | occupation |
|---|---|---|---|---|
| O1 | 0.2038(2) | 0.0920(3) | 0.2299(4) | 1 |
| O2 | 0.3927(4) | 0.1728(3) | 0 | 1 |
| O3 | 0.0688(4) | 0.3385(4) | 0 | 1 |
| Li1 | 0.2108 | 0.4263 | 0 | 1 |
| Li2 | 0.1163 | 0.2439 | 0.241800 | 1 |
| Na1 | 0 | 0.5 | 0.25 | 1 |
| K1 | 0 | 0 | 0 | 1 |
| K2 | 0 | 0 | 0.5 | 1 |
| Si1 | 0.2794(2) | 0.0786(2) | 0 | 1 |

FIG 41

| no. | pos. / ° 2θ | rel. Int. / % |
|---|---|---|
| 1 | 16,031 | 14,08 |
| 2 | 17,817 | 16,07 |
| 3 | 19,111 | 42,47 |
| 4 | 22,240 | 17,38 |
| 5 | 22,932 | 3,38 |
| 6 | 25,009 | 27,24 |
| 7 | 25,636 | 48,36 |
| 8 | 25,723 | 41,59 |
| 9 | 28,447 | 23,40 |
| 10 | 30,551 | 43,82 |
| 11 | 31,105 | 37,48 |
| 12 | 36,612 | 100,00 |
| 13 | 38,130 | 14,42 |
| 14 | 38,635 | 75,76 |
| 15 | 38,745 | 54,49 |
| 16 | 44,152 | 13,75 |
| 17 | 48,346 | 11,24 |
| 18 | 52,470 | 7,77 |
| 19 | 52,656 | 6,35 |
| 20 | 52,848 | 5,80 |
| 21 | 53,025 | 2,50 |
| 22 | 54,982 | 7,51 |
| 23 | 58,851 | 13,29 |
| 24 | 67,123 | 10,83 |
| 25 | 67,449 | 9,01 |
| 26 | 71,314 | 6,12 |

|  | AB4 | G2 | OS2 |
|---|---|---|---|
| CIE-x: | 0,255 | 0,287 | 0,263 |
| CIE-y: | 0,680 | 0,536 | 0,645 |
| LER/lm/W$_{opt}$ | 529,0 | 418,6 | 490,8 |
| λpeak/nm | 529 | 523 | 522 |
| λdom/nm | 541,4 | 541,3 | 541,5 |
| FWHM/nm | 45,0 | 102,0 | 65,3 |
| color purity/% | 83,9 | 49,0 | 75,3 |

FIG 45

| λ dom/nm (blue) | 1. phosphor (green) | 2. phosphor (red) | coverage of color space rec 2020 (xy) | coverage of color space rec 2020 (u'v') |
|---|---|---|---|---|
| 448 | AB4 | SrLiAl3N4:Eu | 82,4% | 85,3% |
| 448 | AB5 | SrLiAl3N4:Eu | 83,6% | 85,9% |
| 448 | BS  | SrLiAl3N4:Eu | 72,5% | 80,3% |
| 448 | AB4 | Sr(Sr,Ca)Si2Al2N6:Eu | 78,1% | 78,3% |
| 448 | AB5 | Sr(Sr,Ca)Si2Al2N6:Eu | 79,1% | 78,8% |
| 448 | BS  | Sr(Sr,Ca)Si2Al2N6:Eu | 69,6% | 75,4% |
| 448 | AB4 | K2SiF6:Mn | 80,2% | 80,2% |
| 448 | AB5 | K2SiF6:Mn | 81,3% | 80,6% |
| 448 | BS  | K2SiF6:Mn | 70,9% | 77,0% |
| 448 | AB4 | Mg4GeO5.5F:Mn | 82,8% | 86,0% |
| 448 | AB5 | Mg4GeO5.5F:Mn | 83,9% | 86,4% |
| 448 | BS  | Mg4GeO5.5F:Mn | 72,9% | 80,8% |
| 445 | AB4 | SrLiAl3N4:Eu | 82,1% | 84,8% |
| 445 | AB5 | SrLiAl3N4:Eu | 83,2% | 85,3% |
| 445 | BS  | SrLiAl3N4:Eu | 72,1% | 79,5% |
| 445 | AB4 | Sr(Sr,Ca)Si2Al2N6:Eu | 77,8% | 77,9% |
| 445 | AB5 | Sr(Sr,Ca)Si2Al2N6:Eu | 78,8% | 78,3% |
| 445 | BS  | Sr(Sr,Ca)Si2Al2N6:Eu | 69,3% | 74,8% |
| 445 | AB4 | K2SiF6:Mn | 79,8% | 79,7% |
| 445 | AB5 | K2SiF6:Mn | 81,0% | 80,1% |
| 445 | BS  | K2SiF6:Mn | 70,5% | 76,4% |
| 445 | AB4 | Mg4GeO5.5F:Mn | 82,4% | 85,4% |
| 445 | AB5 | Mg4GeO5.5F:Mn | 83,6% | 85,8% |
| 445 | BS  | Mg4GeO5.5F:Mn | 72,4% | 80,0% |
| 455 | AB4 | SrLiAl3N4:Eu | 82,3% | 84,7% |
| 455 | AB5 | SrLiAl3N4:Eu | 83,4% | 85,2% |
| 455 | BS  | SrLiAl3N4:Eu | 73,2% | 81,8% |
| 455 | AB4 | Sr(Sr,Ca)Si2Al2N6:Eu | 77,8% | 77,6% |
| 455 | AB5 | Sr(Sr,Ca)Si2Al2N6:Eu | 78,8% | 78,0% |
| 455 | BS  | Sr(Sr,Ca)Si2Al2N6:Eu | 69,9% | 76,0% |
| 455 | AB4 | K2SiF6:Mn | 80,0% | 79,5% |
| 455 | AB5 | K2SiF6:Mn | 81,2% | 80,0% |
| 455 | BS  | K2SiF6:Mn | 71,4% | 77,8% |
| 455 | AB4 | Mg4GeO5.5F:Mn | 82,7% | 85,4% |
| 455 | AB5 | Mg4GeO5.5F:Mn | 83,8% | 85,8% |
| 455 | BS  | Mg4GeO5.5F:Mn | 73,6% | 82,4% |

| blue | green | red | | unfiltered | | filtered red | filtered green | filtered blue |
|---|---|---|---|---|---|---|---|---|
| λdom= 445 nm | AB4 | SrLiAl$_3$N$_4$:Eu | CIE x | 0,278 | | 0,703 | 0,216 | 0,155 |
| | | | CIE y | 0,255 | | 0,290 | 0,724 | 0,065 |
| | | | CIE u' | 0,202 | | 0,555 | 0,077 | 0,179 |
| | | | CIE v' | 0,417 | | 0,514 | 0,579 | 0,169 |
| | | | | xy | u'v' | | | |
| | | | coverage (sRGB) | 99,9% | 99,7% | | | |
| | | | coverage (NTSC) | 95,3% | 94,5% | | | |
| | | | coverage (Adobe) | 98,0% | 98,3% | | | |
| | | | coverage (DCI-P3) | 97,3% | 98,3% | | | |
| | | | coverage (rec2020) | 82,1% | 84,8% | | | |
| λdom= 445 nm | AB4 | Sr(Sr,Ca)Si$_2$Al$_2$N$_6$:Eu | CIE x | 0,278 | | 0,685 | 0,224 | 0,155 |
| | | | CIE y | 0,255 | | 0,308 | 0,717 | 0,062 |
| | | | CIE u' | 0,202 | | 0,514 | 0,080 | 0,181 |
| | | | CIE v' | 0,417 | | 0,520 | 0,579 | 0,163 |
| | | | | xy | u'v' | | | |
| | | | coverage (sRGB) | 99,9% | 99,7% | | | |
| | | | coverage (NTSC) | 93,5% | 93,5% | | | |
| | | | coverage (Adobe) | 96,0% | 97,2% | | | |
| | | | coverage (DCI-P3) | 97,6% | 98,5% | | | |
| | | | coverage (rec2020) | 77,8% | 77,9% | | | |

FIG 54AB

| λdom= 445 nm | AB4 | K₂SiF₆:Mn | CIE x | 0,278 | | 0,689 | 0,216 | 0,155 |
|---|---|---|---|---|---|---|---|---|
| | | | CIE y | 0,255 | | 0,304 | 0,724 | 0,064 |
| | | | CIE u' | 0,202 | | 0,524 | 0,077 | 0,180 |
| | | | CIE v' | 0,417 | | 0,519 | 0,579 | 0,167 |
| | | | | xy | u'v' | | | |
| | | | coverage (sRGB) | 99,9% | 99,7% | | | |
| | | | coverage (NTSC) | 95,4% | 94,6% | | | |
| | | | coverage (Adobe) | 98,0% | 98,3% | | | |
| | | | coverage (DCI-P3) | 97,6% | 98,5% | | | |
| | | | coverage (rec2020) | 79,8% | 79,7% | | | |
| λdom= 445 nm | AB4 | Mg₄GeO₅.₅F:Mn | CIE x | 0,278 | | 0,706 | 0,215 | 0,155 |
| | | | CIE y | 0,255 | | 0,288 | 0,725 | 0,065 |
| | | | CIE u' | 0,202 | | 0,560 | 0,076 | 0,179 |
| | | | CIE v' | 0,417 | | 0,514 | 0,579 | 0,169 |
| | | | | xy | u'v' | | | |
| | | | coverage (sRGB) | 99,9% | 99,7% | | | |
| | | | coverage (NTSC) | 95,5% | 94,6% | | | |
| | | | coverage (Adobe) | 98,2% | 98,4% | | | |
| | | | coverage (DCI-P3) | 97,3% | 98,3% | | | |
| | | | coverage (rec2020) | 82,4% | 85,4% | | | |
| λdom= 445 nm | AB5 | SrLiAl₃N₄:Eu | CIE x | 0,278 | | 0,705 | 0,210 | 0,155 |
| | | | CIE y | 0,255 | | 0,288 | 0,731 | 0,066 |
| | | | CIE u' | 0,202 | | 0,558 | 0,074 | 0,179 |
| | | | CIE v' | 0,417 | | 0,514 | 0,579 | 0,171 |
| | | | | xy | u'v' | | | |
| | | | coverage (sRGB) | 99,9% | 99,7% | | | |
| | | | coverage (NTSC) | 96,6% | 95,1% | | | |
| | | | coverage (Adobe) | 99,2% | 98,6% | | | |
| | | | coverage (DCI-P3) | 97,5% | 98,3% | | | |
| | | | coverage (rec2020) | 83,2% | 85,3% | | | |
| λdom= 445 nm | AB5 | Sr(Sr,Ca)Si₂Al₂N₆:Eu | CIE x | 0,278 | | 0,685 | 0,219 | 0,156 |
| | | | CIE y | 0,255 | | 0,307 | 0,723 | 0,063 |
| | | | CIE u' | 0,202 | | 0,516 | 0,078 | 0,181 |
| | | | CIE v' | 0,417 | | 0,520 | 0,579 | 0,165 |
| | | | | xy | u'v' | | | |
| | | | coverage (sRGB) | 99,9% | 99,7% | | | |
| | | | coverage (NTSC) | 94,6% | 94,1% | | | |
| | | | coverage (Adobe) | 97,1% | 97,8% | | | |
| | | | coverage (DCI-P3) | 97,7% | 98,5% | | | |
| | | | coverage (rec2020) | 78,8% | 78,3% | | | |

FIG 54AC

| | | | | | | | |
|---|---|---|---|---|---|---|---|
| λdom=<br>445 nm | AB5 | $K_2SiF_6$:Mn | CIE x<br>CIE y<br>CIE u'<br>CIE v' | 0,278<br>0,255<br>0,202<br>0,417 | | 0,690<br>0,303<br>0,526<br>0,519 | 0,210<br>0,731<br>0,074<br>0,579 | 0,155<br>0,065<br>0,179<br>0,169 |
| | | | | xy | u'v' | | | |
| | | | coverage (sRGB)<br>coverage (NTSC)<br>coverage (Adobe)<br>coverage (DCI-P3)<br>coverage (rec2020) | 99,9%<br>96,7%<br>99,2%<br>97,7%<br>81,0% | 99,7%<br>95,2%<br>98,7%<br>98,5%<br>80,1% | | | |
| λdom=<br>445 nm | AB5 | $Mg_4GeO_{5.5}$F:Mn | CIE x<br>CIE y<br>CIE u'<br>CIE v' | 0,278<br>0,255<br>0,202<br>0,417 | | 0,707<br>0,286<br>0,564<br>0,513 | 0,209<br>0,731<br>0,074<br>0,580 | 0,155<br>0,066<br>0,178<br>0,172 |
| | | | | xy | u'v' | | | |
| | | | coverage (sRGB)<br>coverage (NTSC)<br>coverage (Adobe)<br>coverage (DCI-P3)<br>coverage (rec2020) | 99,9%<br>96,7%<br>99,3%<br>97,4%<br>83,6% | 99,6%<br>95,2%<br>98,7%<br>96,3%<br>85,8% | | | |
| λdom=<br>445 nm | BS | $SrLiAl_3N_4$:Eu | CIE x<br>CIE y<br>CIE u'<br>CIE v' | 0,278<br>0,255<br>0,202<br>0,417 | | 0,688<br>0,301<br>0,526<br>0,518 | 0,283<br>0,687<br>0,106<br>0,579 | 0,159<br>0,042<br>0,200<br>0,119 |
| | | | | xy | u'v' | | | |
| | | | coverage (sRGB)<br>coverage (NTSC)<br>coverage (Adobe)<br>coverage (DCI-P3)<br>coverage (rec2020) | 99,2%<br>80,5%<br>82,2%<br>93,0%<br>72,1% | 97,5%<br>84,6%<br>87,6%<br>93,4%<br>79,5% | | | |

FIG 54AD

| λdom=<br>445 nm | BS | Sr(Sr, Ca)Si$_2$<br>Al$_2$N$_6$:Eu | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>99,1%<br>79,7%<br>81,4%<br>92,2%<br>69,3% | <br><br><br><br>u'v'<br>97,2%<br>84,1%<br>87,1%<br>92,9%<br>74,8% | 0,674<br>0,315<br>0,496<br>0,522 | 0,286<br>0,684<br>0,108<br>0,579 | 0,159<br>0,041<br>0,201<br>0,117 |
|---|---|---|---|---|---|---|---|---|
| λdom=<br>445 nm | BS | K$_2$SiF$_6$:Mn | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>99,2%<br>80,5%<br>82,2%<br>93,1%<br>70,5% | <br><br><br><br>u'v'<br>97,5%<br>84,7%<br>87,6%<br>93,4%<br>76,4% | 0,678<br>0,312<br>0,504<br>0,521 | 0,283<br>0,687<br>0,108<br>0,579 | 0,159<br>0,042<br>0,200<br>0,118 |
| λdom=<br>445 nm | BS | Mg$_4$GeO$_{5.5}$<br>F:Mn | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>99,2%<br>80,6%<br>82,3%<br>93,2%<br>72,4% | <br><br><br><br>u'v'<br>97,5%<br>84,7%<br>87,7%<br>93,5%<br>80,0% | 0,690<br>0,300<br>0,529<br>0,517 | 0,282<br>0,688<br>0,106<br>0,579 | 0,159<br>0,042<br>0,200<br>0,119 |

FIG 54B

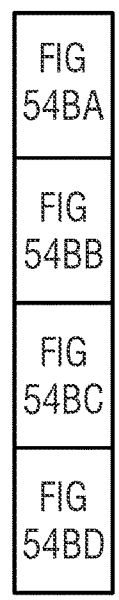

FIG 54BA

| blue | green | red | | unfiltered | filtered red | filtered green | filtered blue |
|---|---|---|---|---|---|---|---|
| $\lambda dom =$ 448 nm | AB4 | $SrLiAl_3N_4:Eu$ | CIE x | 0,278 | 0,704 | 0,215 | 0,153 |
| | | | CIE y | 0,255 | 0,290 | 0,724 | 0,064 |
| | | | CIE u' | 0,202 | 0,556 | 0,077 | 0,177 |
| | | | CIE v' | 0,417 | 0,514 | 0,579 | 0,167 |
| | | | | xy | u'v' | | |
| | | | coverage (sRGB) | 100,0% | 99,8% | | |
| | | | coverage (NTSC) | 95,8% | 95,2% | | |
| | | | coverage (Adobe) | 98,5% | 99,0% | | |
| | | | coverage (DCI-P3) | 97,3% | 99,5% | | |
| | | | coverage (rec2020) | 82,4% | 85,3% | | |
| $\lambda dom =$ 448 nm | AB4 | $Sr(Sr,Ca)Si_2Al_2N_6:Eu$ | CIE x | 0,278 | 0,685 | 0,224 | 0,153 |
| | | | CIE y | 0,255 | 0,308 | 0,717 | 0,062 |
| | | | CIE u' | 0,202 | 0,515 | 0,080 | 0,179 |
| | | | CIE v' | 0,417 | 0,520 | 0,578 | 0,162 |
| | | | | xy | u'v' | | |
| | | | coverage (sRGB) | 100,0% | 99,9% | | |
| | | | coverage (NTSC) | 94,0% | 94,1% | | |
| | | | coverage (Adobe) | 96,5% | 97,9% | | |
| | | | coverage (DCI-P3) | 97,6% | 98,7% | | |
| | | | coverage (rec2020) | 78,1% | 78,3% | | |

FIG 54BB

| λdom = 448 nm | AB4 | K$_2$SiF$_6$:Mn | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>100,0%<br>96,0%<br>98,6%<br>97,5%<br>80,2% | 0,690<br>0,304<br>0,524<br>0,519<br>u'v'<br>99,9%<br>95,3%<br>99,0%<br>98,7%<br>80,2% | 0,215<br>0,724<br>0,076<br>0,579 | 0,153<br>0,063<br>0,177<br>0,165 |
|---|---|---|---|---|---|---|---|
| λdom = 448 nm | AB4 | Mg$_4$GeO$_{5.5}$F:Mn | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>100,0%<br>96,0%<br>98,8%<br>97,3%<br>82,8% | 0,706<br>0,287<br>0,561<br>0,514<br>u'v'<br>99,8%<br>95,3%<br>99,1%<br>98,5%<br>86,0% | 0,214<br>0,725<br>0,076<br>0,579 | 0,153<br>0,065<br>0,176<br>0,168 |
| λdom = 448 nm | AB5 | SrLiAl$_3$N$_4$:Eu | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>99,9%<br>97,0%<br>99,6%<br>97,4%<br>83,6% | 0,705<br>0,288<br>0,559<br>0,514<br>u'v'<br>99,8%<br>95,7%<br>99,3%<br>98,5%<br>85,9% | 0,209<br>0,730<br>0,074<br>0,579 | 0,153<br>0,065<br>0,176<br>0,169 |
| λdom = 448 nm | AB5 | Sr(SrCa)Si$_2$Al$_2$N$_6$:Eu | CIE x<br>CIE y<br>CIE u'<br>CIE v'<br><br>coverage (sRGB)<br>coverage (NTSC)<br>coverage (Adobe)<br>coverage (DCI-P3)<br>coverage (rec2020) | 0,278<br>0,255<br>0,202<br>0,417<br>xy<br>100,0%<br>95,1%<br>97,6%<br>97,8%<br>79,1% | 0,686<br>0,307<br>0,516<br>0,520<br>u'v'<br>99,9%<br>94,8%<br>98,5%<br>98,8%<br>78,8% | 0,219<br>0,722<br>0,078<br>0,579 | 0,154<br>0,063<br>0,178<br>0,164 |

FIG 54BC

| λdom= 448 nm | AB5 | K$_2$SiF$_6$:Mn | CIE x | 0,278 | | 0,691 | 0,209 | 0,153 |
|---|---|---|---|---|---|---|---|---|
| | | | CIE y | 0,255 | | 0,303 | 0,730 | 0,064 |
| | | | CIE u' | 0,202 | | 0,526 | 0,074 | 0,177 |
| | | | CIE v' | 0,417 | | 0,519 | 0,579 | 0,167 |
| | | | | xy | u'v' | | | |
| | | | coverage (sRGB) | 100,0% | 99,8% | | | |
| | | | coverage (NTSC) | 97,2% | 95,8% | | | |
| | | | coverage (Adobe) | 99,6% | 99,3% | | | |
| | | | coverage (DCI-P3) | 97,7% | 98,6% | | | |
| | | | coverage (rec2020) | 81,3% | 80,6% | | | |
| λdom= 448 nm | AB5 | Mg$_4$GeO$_{5.5}$F:Mn | CIE x | 0,278 | | 0,708 | 0,208 | 0,153 |
| | | | CIE y | 0,255 | | 0,286 | 0,731 | 0,066 |
| | | | CIE u' | 0,202 | | 0,564 | 0,073 | 0,176 |
| | | | CIE v' | 0,417 | | 0,513 | 0,579 | 0,170 |
| | | | | xy | u'v' | | | |
| | | | coverage (sRGB) | 99,9% | 99,7% | | | |
| | | | coverage (NTSC) | 97,2% | 95,8% | | | |
| | | | coverage (Adobe) | 99,7% | 99,3% | | | |
| | | | coverage (DCI-P3) | 97,4% | 98,4% | | | |
| | | | coverage (rec2020) | 83,9% | 86,4% | | | |
| λdom= 448 nm | BS | SrLiAl$_3$N$_4$:Eu | CIE x | 0,278 | | 0,690 | 0,283 | 0,157 |
| | | | CIE y | 0,255 | | 0,301 | 0,687 | 0,043 |
| | | | CIE u' | 0,202 | | 0,528 | 0,106 | 0,196 |
| | | | CIE v' | 0,417 | | 0,518 | 0,579 | 0,120 |
| | | | | xy | u'v' | | | |
| | | | coverage (sRGB) | 99,5% | 98,2% | | | |
| | | | coverage (NTSC) | 81,0% | 85,4% | | | |
| | | | coverage (Adobe) | 82,7% | 88,5% | | | |
| | | | coverage (DCI-P3) | 93,6% | 94,2% | | | |
| | | | coverage (rec2020) | 72,5% | 80,3% | | | |

FIG 54BD

| λdom= 448 nm | BS | Sr(Sr,Ca)Si$_2$Al$_2$N$_6$:Eu | CIE x<br>CIE y<br>CIE u'<br>CIE v' | 0,278<br>0,255<br>0,202<br>0,417 | | 0,675<br>0,315<br>0,497<br>0,522 | 0,286<br>0,683<br>0,108<br>0,579 | 0,157<br>0,042<br>0,197<br>0,118 |
| --- | --- | --- | --- | --- | --- | --- | --- | --- |
| | | | | xy | u'v' | | | |
| | | | coverage (sRGB) | 99,4% | 98,0% | | | |
| | | | coverage (NTSC) | 80,2% | 84,8% | | | |
| | | | coverage (Adobe) | 81,9% | 87,9% | | | |
| | | | coverage (DCI-P3) | 92,8% | 93,7% | | | |
| | | | coverage (rec2020) | 69,6% | 75,4% | | | |
| λdom= 448 nm | BS | K$_2$SiF$_6$:Mn | CIE x<br>CIE y<br>CIE u'<br>CIE v' | 0,278<br>0,255<br>0,202<br>0,417 | | 0,679<br>0,311<br>0,505<br>0,521 | 0,282<br>0,687<br>0,106<br>0,579 | 0,157<br>0,042<br>0,196<br>0,119 |
| | | | | xy | u'v' | | | |
| | | | coverage (sRGB) | 99,5% | 98,2% | | | |
| | | | coverage (NTSC) | 81,1% | 85,4% | | | |
| | | | coverage (Adobe) | 82,7% | 88,5% | | | |
| | | | coverage (DCI-P3) | 93,7% | 94,3% | | | |
| | | | coverage (rec2020) | 70,9% | 77,0% | | | |
| λdom= 448 nm | BS | Mg$_4$GeO$_{5.5}$F:Mn | CIE x<br>CIE y<br>CIE u'<br>CIE v' | 0,278<br>0,255<br>0,202<br>0,417 | | 0,692<br>0,299<br>0,532<br>0,517 | 0,282<br>0,687<br>0,106<br>0,579 | 0,157<br>0,043<br>0,196<br>0,120 |
| | | | | xy | u'v' | | | |
| | | | coverage (sRGB) | 99,5% | 98,2% | | | |
| | | | coverage (NTSC) | 81,1% | 85,4% | | | |
| | | | coverage (Adobe) | 82,8% | 88,6% | | | |
| | | | coverage (DCI-P3) | 93,8% | 94,3% | | | |
| | | | coverage (rec2020) | 72,9% | 80,8% | | | |

FIG 54C

| FIG 54CA |
|---|
| FIG 54CB |
| FIG 54CC |
| FIG 54CD |

FIG 54CA

| blue | green | red | | unfiltered | | filtered red | filtered green | filtered blue |
|---|---|---|---|---|---|---|---|---|
| λdom= 455 nm | AB4 | SrLiAl$_3$N$_4$:Eu | CIE x | 0,278 | | 0,705 | 0,214 | 0,147 |
| | | | CIE y | 0,255 | | 0,290 | 0,719 | 0,067 |
| | | | CIE u' | 0,202 | | 0,556 | 0,077 | 0,168 |
| | | | CIE v' | 0,417 | | 0,515 | 0,579 | 0,171 |
| | | | | xy | u'v' | | | |
| | | | coverage (sRGB) | 99,8% | 99,3% | | | |
| | | | coverage (NTSC) | 97,0% | 96,8% | | | |
| | | | coverage (Adobe) | 99,5% | 99,4% | | | |
| | | | coverage (DCI-P3) | 96,5% | 97,7% | | | |
| | | | coverage (rec2020) | 82,3% | 84,7% | | | |
| λdom= 455 nm | AB4 | Sr(Sr, Ca)Si$_2$Al$_2$N$_6$:Eu | CIE x | 0,278 | | 0,686 | 0,224 | 0,148 |
| | | | CIE y | 0,255 | | 0,308 | 0,711 | 0,064 |
| | | | CIE u' | 0,202 | | 0,515 | 0,081 | 0,170 |
| | | | CIE v' | 0,417 | | 0,521 | 0,577 | 0,166 |
| | | | | xy | u'v' | | | |
| | | | coverage (sRGB) | 99,9% | 99,5% | | | |
| | | | coverage (NTSC) | 95,0% | 95,8% | | | |
| | | | coverage (Adobe) | 97,6% | 99,2% | | | |
| | | | coverage (DCI-P3) | 96,8% | 97,7% | | | |
| | | | coverage (rec2020) | 77,8% | 77,6% | | | |

FIG 54CB

| λdom = 455 nm | AB4 | K₂SiF₆:Mn | CIE x | 0,278 | | 0,691 | 0,214 | 0,147 |
|---|---|---|---|---|---|---|---|---|
| | | | CIE y | 0,255 | | 0,304 | 0,719 | 0,066 |
| | | | CIE u' | 0,202 | | 0,525 | 0,076 | 0,169 |
| | | | CIE v' | 0,417 | | 0,519 | 0,578 | 0,169 |
| | | | | xy | u'v' | | | |
| | | | coverage (sRGB) | 99,8% | 99,3% | | | |
| | | | coverage (NTSC) | 97,2% | 97,0% | | | |
| | | | coverage (Adobe) | 99,6% | 99,4% | | | |
| | | | coverage (DCI-P3) | 96,6% | 97,5% | | | |
| | | | coverage (rec2020) | 80,0% | 79,5% | | | |
| λdom = 455 nm | AB4 | Mg₄GeO₅.₅F:Mn | CIE x | 0,278 | | 0,707 | 0,213 | 0,147 |
| | | | CIE y | 0,255 | | 0,288 | 0,720 | 0,067 |
| | | | CIE u' | 0,202 | | 0,562 | 0,076 | 0,168 |
| | | | CIE v' | 0,417 | | 0,514 | 0,578 | 0,172 |
| | | | | xy | u'v' | | | |
| | | | coverage (sRGB) | 99,8% | 99,3% | | | |
| | | | coverage (NTSC) | 97,2% | 96,9% | | | |
| | | | coverage (Adobe) | 99,7% | 99,4% | | | |
| | | | coverage (DCI-P3) | 96,4% | 97,6% | | | |
| | | | coverage (rec2020) | 82,7% | 85,4% | | | |
| λdom = 455 nm | AB5 | SrLiAl₃N₄:Eu | CIE x | 0,278 | | 0,706 | 0,208 | 0,148 |
| | | | CIE y | 0,255 | | 0,289 | 0,725 | 0,067 |
| | | | CIE u' | 0,202 | | 0,559 | 0,074 | 0,168 |
| | | | CIE v' | 0,417 | | 0,514 | 0,578 | 0,173 |
| | | | | xy | u'v' | | | |
| | | | coverage (sRGB) | 99,8% | 99,2% | | | |
| | | | coverage (NTSC) | 98,1% | 97,3% | | | |
| | | | coverage (Adobe) | 99,9% | 99,3% | | | |
| | | | coverage (DCI-P3) | 96,6% | 97,6% | | | |
| | | | coverage (rec2020) | 83,4% | 85,2% | | | |
| λdom = 455 nm | AB5 | Sr(Sr,Ca)Si₂Al₂N₆:Eu | CIE x | 0,278 | | 0,687 | 0,219 | 0,148 |
| | | | CIE y | 0,255 | | 0,308 | 0,716 | 0,065 |
| | | | CIE u' | 0,202 | | 0,517 | 0,078 | 0,170 |
| | | | CIE v' | 0,417 | | 0,521 | 0,578 | 0,168 |
| | | | | xy | u'v' | | | |
| | | | coverage (sRGB) | 99,9% | 99,4% | | | |
| | | | coverage (NTSC) | 96,2% | 96,4% | | | |
| | | | coverage (Adobe) | 98,7% | 99,5% | | | |
| | | | coverage (DCI-P3) | 96,9% | 97,6% | | | |
| | | | coverage (rec2020) | 78,8% | 78,0% | | | |

FIG 54CC

| λdom= 455 nm | AB5 | K₂SiF₆:Mn | CIE x | 0,278 | | 0,692 | 0,208 | 0,148 |
|---|---|---|---|---|---|---|---|---|
| | | | CIE y | 0,255 | | 0,303 | 0,725 | 0,066 |
| | | | CIE u' | 0,202 | | 0,526 | 0,074 | 0,169 |
| | | | CIE v' | 0,417 | | 0,519 | 0,578 | 0,171 |
| | | | | xy | u'v' | | | |
| | | | coverage (sRGB) | 99,8% | 99,2% | | | |
| | | | coverage (NTSC) | 98,3% | 97,4% | | | |
| | | | coverage (Adobe) | 99,8% | 99,3% | | | |
| | | | coverage (DCI-P3) | 96,7% | 97,4% | | | |
| | | | coverage (rec2020) | 81,2% | 80,0% | | | |
| λdom= 455 nm | AB5 | Mg₄GeO₅.₅F:Mn | CIE x | 0,278 | | 0,708 | 0,207 | 0,148 |
| | | | CIE y | 0,255 | | 0,286 | 0,726 | 0,068 |
| | | | CIE u' | 0,202 | | 0,565 | 0,073 | 0,168 |
| | | | CIE v' | 0,417 | | 0,513 | 0,578 | 0,173 |
| | | | | xy | u'v' | | | |
| | | | coverage (sRGB) | 99,8% | 99,2% | | | |
| | | | coverage (NTSC) | 98,3% | 97,4% | | | |
| | | | coverage (Adobe) | 99,8% | 99,3% | | | |
| | | | coverage (DCI-P3) | 96,5% | 96,5% | | | |
| | | | coverage (rec2020) | 83,8% | 85,8% | | | |
| λdom= 455 nm | BS | SrLiAl₃N₄:Eu | CIE x | 0,278 | | 0,693 | 0,280 | 0,151 |
| | | | CIE y | 0,255 | | 0,300 | 0,682 | 0,048 |
| | | | CIE u' | 0,202 | | 0,532 | 0,105 | 0,184 |
| | | | CIE v' | 0,417 | | 0,518 | 0,578 | 0,131 |
| | | | | xy | u'v' | | | |
| | | | coverage (sRGB) | 99,9% | 99,7% | | | |
| | | | coverage (NTSC) | 82,6% | 87,5% | | | |
| | | | coverage (Adobe) | 84,4% | 91,2% | | | |
| | | | coverage (DCI-P3) | 95,3% | 96,7% | | | |
| | | | coverage (rec2020) | 73,2% | 81,8% | | | |

FIG 54CD

| λdom = 445 nm | BS | Sr(Sr,Ca)Si$_2$Al$_2$N$_6$:Eu | CIE x | 0,278 | | 0,677 | 0,284 | 0,151 |
|---|---|---|---|---|---|---|---|---|
| | | | CIE y | 0,255 | | 0,314 | 0,678 | 0,047 |
| | | | CIE u' | 0,202 | | 0,500 | 0,108 | 0,185 |
| | | | CIE v' | 0,417 | | 0,522 | 0,578 | 0,129 |
| | | | | xy | u'v' | | | |
| | | | coverage (sRGB) | 99,9% | 99,7% | | | |
| | | | coverage (NTSC) | 81,6% | 86,9% | | | |
| | | | coverage (Adobe) | 83,5% | 90,5% | | | |
| | | | coverage (DCI-P3) | 94,3% | 96,1% | | | |
| | | | coverage (rec2020) | 69,9% | 76,0% | | | |
| λdom = 455 nm | BS | K$_2$SiF$_6$:Mn | CIE x | 0,278 | | 0,682 | 0,280 | 0,151 |
| | | | CIE y | 0,255 | | 0,311 | 0,682 | 0,047 |
| | | | CIE u' | 0,202 | | 0,508 | 0,105 | 0,184 |
| | | | CIE v' | 0,417 | | 0,521 | 0,578 | 0,130 |
| | | | | xy | u'v' | | | |
| | | | coverage (sRGB) | 99,9% | 99,7% | | | |
| | | | coverage (NTSC) | 82,6% | 87,6% | | | |
| | | | coverage (Adobe) | 84,5% | 91,2% | | | |
| | | | coverage (DCI-P3) | 95,4% | 96,8% | | | |
| | | | coverage (rec2020) | 71,4% | 77,8% | | | |
| λdom = 455 nm | BS | Mg$_4$GeO$_{5.5}$F:Mn | CIE x | 0,278 | | 0,695 | 0,280 | 0,151 |
| | | | CIE y | 0,255 | | 0,298 | 0,683 | 0,048 |
| | | | CIE u' | 0,202 | | 0,536 | 0,105 | 0,184 |
| | | | CIE v' | 0,417 | | 0,517 | 0,578 | 0,131 |
| | | | | xy | u'v' | | | |
| | | | coverage (sRGB) | 99,9% | 99,7% | | | |
| | | | coverage (NTSC) | 82,7% | 87,6% | | | |
| | | | coverage (Adobe) | 84,6% | 91,3% | | | |
| | | | coverage (DCI-P3) | 95,4% | 96,8% | | | |
| | | | coverage (rec2020) | 73,6% | 82,4% | | | |

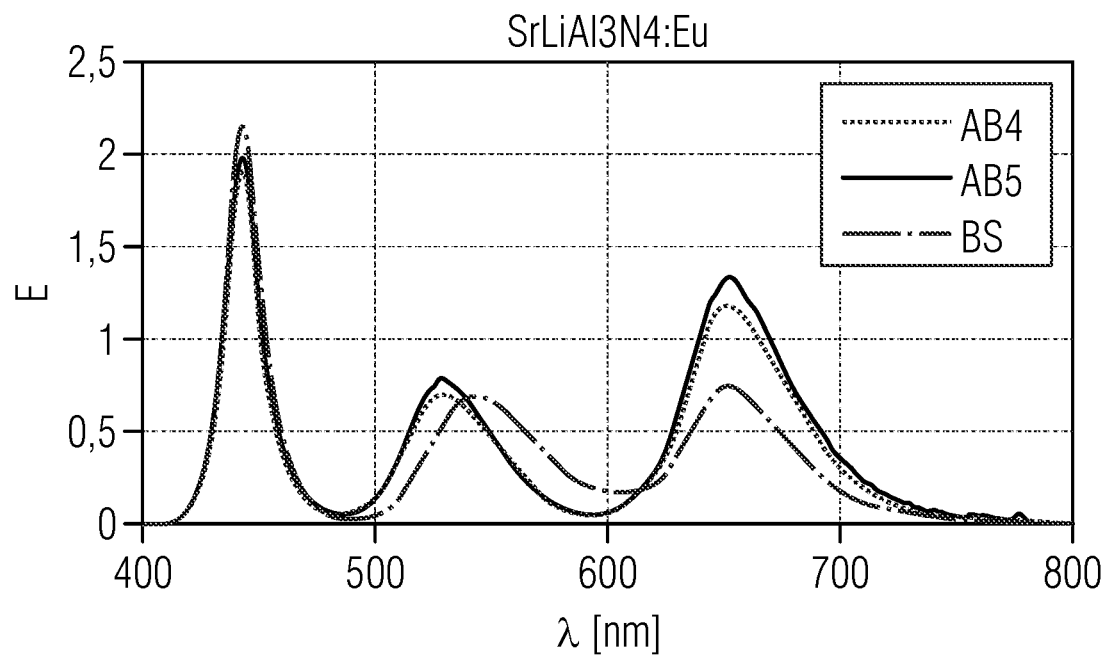
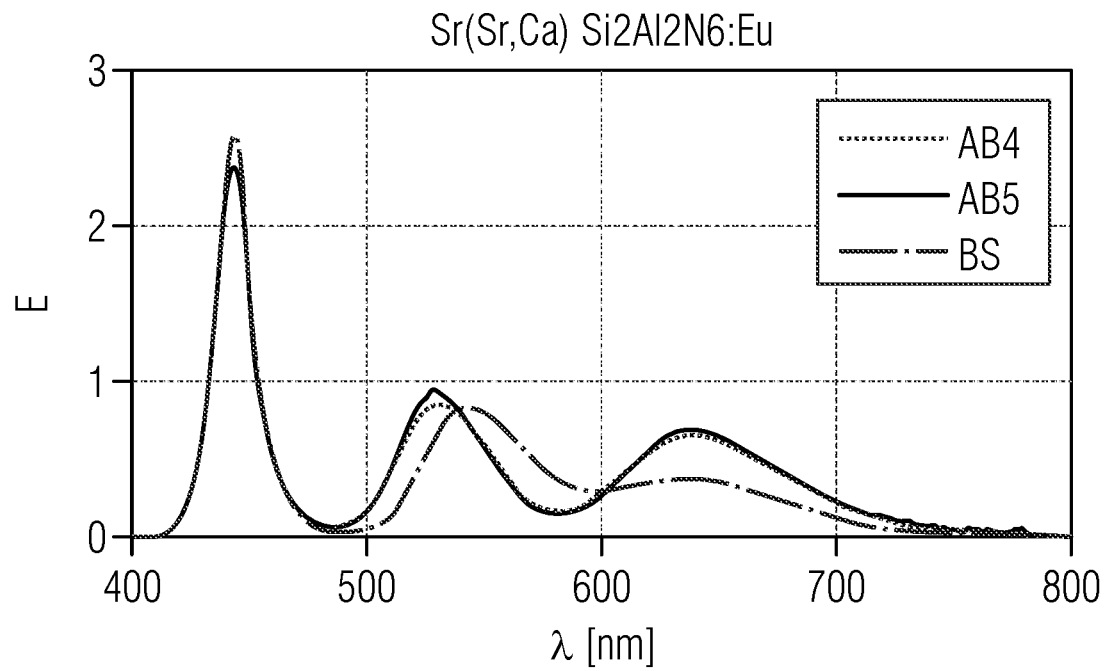

|  | AB5 | G1 | OS1 |
|---|---|---|---|
| CIE-x: | 0,238 | 0,281 | 0,250 |
| CIE-y: | 0,694 | 0,531 | 0,645 |
| LER/lm/W$_{opt}$ | 531,4 | 413,1 | 482,0 |
| λpeak/nm | 528 | 520 | 522 |
| λdom/nm | 538,7 | 538,7 | 538,5 |
| FWHM/nm | 42,8 | 101,9 | 64,6 |
| color purity/% | 84,3 | 46,1 | 72,5 |

|  | AB6 | $Lu_3Al_3Ga_2O_{12}:Ce$ |
|---|---|---|
| CIE-x | 0,301 | 0,282 |
| CIE-y | 0,592 | 0,532 |
| LER / lm/W$_{opt}$ | 432,8 (+5%) | 413,6 |
| $\lambda_{peak}$ / nm | 516,9 | 517,5 |
| FWHM / nm | 72,8 (-28%) | 101,6 |
| purity / % | 69,4 (+49%) | 46,7 |

FIG 72

| molecular formula | $Na_{0.97}Ca_{0.03}Li_{2.94}Al_{0.09}Si_{0.97}O_{3.88}N_{0.12}$ |
|---|---|
| crystal system | tetragonal |
| space group | $I4_1/a$ (no 88) |
| a/Å | 10.7811(3) |
| c/Å | 12.6049(4) |
| cell volume / Å$^3$ | 1465.09(9) |
| density / g × cm$^{-3}$ | 2.491 |
| T / K | 293(2) |
| diffractometer | Bruker D8 Quest Kappa |
| radiation / Å | Mo-K$\alpha$($\lambda$=0.71073Å) |
| measurement range | 4.972° < 2$\theta$ < 75.674° |
|  | −18 ≤ h ≤ 18 |
|  | −18 ≤ k ≤ 18 |
|  | −21 ≤ l ≤ 21 |
| reflexes total | 39083 |
| independent reflexes | 1975 |
| $R_1$, $wR_2$ (I ≥ 2$\sigma$ I) | 0.513, 0.1235 |
| GooF | 1.119 |

FIG 73

| atom | x | y | z | occupation |
|---|---|---|---|---|
| Si1 | 0.32019(4) | 0.78734(4) | 0.44381(4) | 0.97 |
| Li4 | 0.32019(4) | 0.78734(4) | 0.44381(4) | 0.03 |
| Na1 | 0.27416(9) | 0.51280(8) | 0.41062(10) | 0.97 |
| Ca1 | 0.27416(9) | 0.51280(8) | 0.41062(10) | 0.03 |
| O1 | 0.17388(12) | 0.83115(12) | 0.43353(10) | 0.97 |
| O2 | 0.32844(12) | 0.69736(12) | 0.54891(10) | 0.97 |
| O3 | 0.35081(12) | 0.70890(12) | 0.33523(10) | 0.97 |
| O4 | 0.40591(12) | 0.91314(12) | 0.45169(10) | 0.97 |
| N1 | 0.17388(12) | 0.83115(12) | 0.43353(10) | 0.03 |
| N2 | 0.32844(12) | 0.69736(12) | 0.54891(10) | 0.03 |
| N3 | 0.35081(12) | 0.70890(12) | 0.33523(10) | 0.03 |
| N4 | 0.40591(12) | 0.91314(12) | 0.45169(10) | 0.03 |
| Li1 | 0.5289(2) | 0.9113(2) | 0.5632(2) | 0.97 |
| Li2 | 0.0240(3) | 0.9103(3) | 0.4430(2) | 0.97 |
| Li3 | 0.4945(3) | 0.6096(4) | 0.3203(2) | 0.97 |
| Al1 | 0.5289(2) | 0.9113(2) | 0.5632(2) | 0.03 |
| Al2 | 0.0240(3) | 0.9103(3) | 0.4430(2) | 0.03 |
| Al3 | 0.4945(3) | 0.6096(4) | 0.3203(2) | 0.03 |

|  | AB7 | BS |
|---|---|---|
| CIE-x | 0.235 | 0.255 |
| CIE-y | 0.640 | 0.636 |
| $\lambda_{peak}$ / nm | 531.6 | 527.4 |
| $\lambda_{dom}$ / nm | 540.3 | 543.2 |
| FWHM / nm | 45.6 | 49.2 |
| LER / lm/$W_{opt}^{-1}$ | 568.4 | 536.8 |
| color purity / % | 87.9 | 87.2 |

FIG 79

| | |
|---|---|
| molecular formula | $NaK_2Li(Li_3SiO_4)_4$ |
| crystal system | monoclinic |
| space group | C2/m (no 12) |
| a/Å | 15.5011(18) |
| b/Å | 6.2802(7) |
| c/Å | 7.7434(10) |
| β/° | 90.016(7) |
| cell volume / Å$^3$ | 753.82(16) |
| density / g × cm$^{-3}$ | 2.466 |
| T / K | 293(2) |
| radiation / Å | Cu-Kα(λ=1.542Å) |
| measurement range | 5.708° < 2θ < 63.545° |
| | -18 ≤ h ≤ 17 |
| | -7 ≤ k ≤ 7 |
| | -8 ≤ l ≤ 8 |
| reflexes total | 3460 |
| independent reflexes | 688 |
| $R_1$, $wR_2$ (I ≥ 2σ I) | 0.0522, 0.1635 |
| GooF | 1.113 |

FIG 80

| atom | x | y | z | occupation | $U_{iso}$ |
|---|---|---|---|---|---|
| K1 | 0.25317(17) | 1/2 | -0.0212(4) | 1 | --- |
| Na1 | 0 | 0.2507(16) | 1/2 | 0.5 | --- |
| Si1 | 0.35319(18) | 1/2 | 0.3548(4) | 1 | --- |
| Si2 | 0.07284(18) | 1/2 | 0.2070(4) | 1 | --- |
| O1 | 0.4495(5) | 1/2 | 0.2636(10) | 1 | --- |
| O2 | -0.0317(5) | 1/2 | 0.2414(10) | 1 | --- |
| O3 | 0.3044(3) | 0.7191(9) | 0.2900(7) | 1 | --- |
| O4 | 0.1168(5) | 1/2 | 0.4010(10) | 1 | --- |
| O5 | 0.3667(5) | 1/2 | 0.5641(10) | 1 | --- |
| O6 | 0.1044(3) | 0.2800(9) | 0.1106(7) | 1 | --- |
| Li1 | 0.1443(10) | 1/2 | 0.6375(19) | 1 | 0.003(4) |
| Li2 | 0.5680(9) | 1/2 | 0.2086(19) | 1 | 0.002(3) |
| Li3 | 0.0772(9) | 0.255(2) | -0.134(2) | 1 | 0.029(3) |
| Li4 | 0.1874(8) | 0.7447(18) | 0.3590(16) | 1 | 0.015(3) |
| Li5 | 0 | 1/2 | 1/2 | 0.5 | 0.026(10) |
| Li6 | 0 | 0 | 1/2 | 0.5 | 0.025(10) |

| atom | $U_{11}$ | $U_{22}$ | $U_{33}$ | $U_{23}$ | $U_{13}$ | $U_{12}$ |
|---|---|---|---|---|---|---|
| K1 | 0.0298(14) | 0.0205(9) | 0.0169(14) | 0 | 0.0052(11) | 0 |
| Na1 | 0.028(5) | 0.041(4) | 0.032(6) | 0 | 0.003(5) | 0 |
| Si1 | 0.0138(15) | 0.0143(15) | 0.0173(15) | 0 | -0.0016(11) | 0 |
| Si2 | 0.0153(15) | 0.0134(14) | 0.0182(15) | 0 | -0.0017(11) | 0 |
| O1 | 0.015(4) | 0.011(4) | 0.024(4) | 0 | -0.005(3) | 0 |
| O2 | 0.015(4) | 0.012(4) | 0.026(4) | 0 | -0.007(3) | 0 |
| O3 | 0.015(2) | 0.016(3) | 0.022(3) | 0.001(2) | -0.003(2) | -0.0010(19) |
| O4 | 0.025(4) | 0.012(4) | 0.018(4) | 0 | -0.001(3) | 0 |
| O5 | 0.023(4) | 0.015(4) | 0.021(4) | 0 | -0.000(3) | 0 |
| O6 | 0.017(3) | 0.021(3) | 0.019(3) | -0.001(2) | -0.001(2) | 0.003(2) |

|  | AB8 | CIS | OS1 |
|---|---|---|---|
| CIE-x | 0.212 | 0.189 | 0.216 |
| CIE-y | 0.686 | 0.641 | 0.638 |
| $\lambda_{peak}$/nm | 528 | 510 | 517 |
| $\lambda_{dom}$/nm | 533 | 523 | 529 |
| FWHM/nm | 43.3 | 54.6 | 62.4 |
| LER/lm/$W_{opt}$ | 508.8 | 428.9 | 448.7 |

FIG 90

| | |
|---|---|
| molecular formula | $NaRbLi_6Si_2O_8$ |
| $M / g \times mol^{-1}$ | 334.27 |
| crystal system | monoclinic |
| space group | $C2/m$ (no 12) |
| $a/Å$ | 15.7207(1) |
| $b/Å$ | 6.31442(5) |
| $c/Å$ | 7.80780(6) |
| $\beta$ | 90.562(1) |
| cell volume / $Å^3$ | 775.02 |
| $Z$ | 4 |
| density / $g \times cm^{-3}$ | 2.86 |
| $T / K$ | 293(2) |
| diffractometer | PANalytical Empyrean |
| radiation / $Å$ | $Cu\text{-}K\alpha_1 (\lambda = 1.540598 Å)$ |
| | $10° < 2\theta < 120°$ |
| | $-12 \leq h \leq 12$ |
| | $0 \leq k \leq 9$ |
| | $0 \leq l \leq 6$ |
| $R_p$ | 0.1744 |
| $R_{wp}; R_{exp}$ | 0.2084; 0.0998 |
| GooF | 2.089 |

FIG 91

| atom | x | y | z | occupation |
|---|---|---|---|---|
| Rb1 | 0.7557(1) | 0 | 0.5316(1) | 1 |
| Si1 | 0.4293(1) | 0 | 0.7085(1) | 1 |
| Si2 | 0.1461(1) | 0 | 0.8596(1) | 1 |
| Na1 | 0 | 0.2502(2) | 0 | 1 |
| O1 | 0.4013(1) | 0.2170(3) | 0.6094(2) | 1 |
| O2 | 0.4464(2) | 1/2 | 0.2383(3) | 1 |
| O3 | 0.3840(2) | 0 | 0.8959(3) | 1 |
| O4 | 0.0319(2) | 1/2 | 0.7454(3) | 1 |
| O5 | 0.3049(1) | 0.7171(3) | 0.1946(2) | 1 |
| O6 | 0.3701(2) | 1/2 | 0.9336(3) | 1 |
| Li1 | 0.3586(4) | 0 | 0.1347(8) | 1 |
| Li2 | 0.5673(4) | 1/2 | 0.2833(8) | 1 |
| Li3 | 0.1870(3) | 0.2576(7) | 0.1337(7) | 1 |
| Li4 | 0.4308(4) | 0.7532(7) | 0.3732(6) | 1 |

|  | AB9 | VB4 | VB1 |
|---|---|---|---|
| CIE-x | 0,127 | 0,141 | 0,146 |
| CIE-y | 0,120 | 0,162 | 0,134 |
| $\lambda_{peak}$/nm | 473 | 471 | 460 |
| $\lambda_{dom}$/nm | 476 | 479 | 476 |
| FWHM/nm | 22.2 | 36,8 | 57,6 |

FIG 99

| molecular formula | Na$_3$RbLi$_{12}$Si$_4$O$_{16}$ |
|---|---|
| $M$ / g × mol$^{-1}$ | 606.06 |
| crystal system | tetragonal |
| space group | *I4/m (no 87)* |
| $a$/Å | 10.9079(1) |
| $c$/Å | 6.31553(3) |
| cell volume / Å$^3$ | 751.44(1) |
| $Z$ | 2 |
| density / g × cm$^{-3}$ | 2.68 |
| $T$ / K | 293(2) |
| diffractometer | PANalytical Empyrean |
| radiation / Å | Cu-K$\alpha_1$ ($\lambda$=1.540598Å) |
| measurement range | 10° < 2θ < 120° |
|  | 0 ≤ h ≤ 8 |
|  | 0 ≤ k ≤ 9 |
|  | 0 ≤ l ≤ 10 |
| $R_p$ | 0.2188 |
| $R_{wp}$; $R_{exp}$ | 0.2870; 0.1018 |
| GooF | 2.820 |

| atom | x | y | z | occupation |
|---|---|---|---|---|
| O1 | 0.1967(2) | 0.0861(2) | 0.2146(4) | 1 |
| O2 | 0.3935(3) | 0.1755(3) | 0 | 1 |
| O3 | 0.0644(4) | 0.3391(3) | 0 | 1 |
| Li1 | 0.2135(9) | 0.422(1) | 0 | 1 |
| Li2 | 0.1100(7) | 0.2344(6) | 0.259(2) | 1 |
| Na1 | 0 | 1/2 | 1/4 | 1 |
| Rb1 | 0 | 0 | 1/2 | 1 |
| NA2 | 0 | 0 | 0 | 1 |
| Si1 | 0.2791(2) | 0.0742(2) | 0 | 1 |

|  | AB10 | AB-10a | AB-10b |
|---|---|---|---|
| $\lambda_{peak}$/nm | 632 | 627 | 586 |
| $\lambda_{dom}$/nm | 600 | 597 | 580 |
| CIE-x | 0.626 | 0.612 | 0.510 |
| CIE-y | 0.372 | 0.387 | 0.479 |
| FWHM/nm | 97.7 | 96.0 | 92.4 |

FIG 108

| molecular formula | SrSiAl$_{0.84}$Li$_{2.16}$O$_{1.32}$N$_{2.68}$ |
|---|---|
| crystal system | tetragonal |
| space group | *I4/m (no 87)* |
| *a*/Å | 7.820(4) |
| *c*/Å | 3.183(2) |
| cell volume / Å$^3$ | 194.6(2) |
| density / g × cm$^{-3}$ | 3.642 |
| *T* / K | 293(2) |
| radiation / Å | Cu-K$\alpha$($\lambda$=1.542Å) |
| measurement range | 8.014° < 2$\theta$ < 63.312° |
|  | -7 ≤ h ≤ 6 |
|  | -7 ≤ k ≤ 9 |
|  | -3 ≤ l ≤ 3 |
| reflexes total | 306 |
| independent reflexes | 96 |
| $R_1$, $wR_2$(I ≥ 2$\sigma$ I) | 0.0641, 0.1762 |
| GooF | 1.288 |

FIG 109

| atom | x | y | z | occupation |
|---|---|---|---|---|
| Sr01 | 1/2 | 1/2 | 1/2 | 1 |
| Si02 | 0.6426(9) | 0.1865(8) | 0 | 1/4 |
| Al02 | 0.6426(9) | 0.1865(8) | 0 | 0.21(3) |
| Li02 | 0.6426(9) | 0.1865(8) | 0 | 0.54(3) |
| N03 | 0.4045(11) | 0.2430(14) | 0 | 0.67 |
| O03 | 0.4045(11) | 0.2430(14) | 0 | 0.33 |

FIG 110

| atom | $U_{11}$ | $U_{22}$ | $U_{33}$ | $U_{23}$ | $U_{13}$ | $U_{12}$ |
|---|---|---|---|---|---|---|
| Sr01 | 0.0226(15) | 0.0226(15) | 0.082(3) | 0 | 0 | 0 |
| Si02 | 0.017(4) | 0.026(4) | 0.022(4) | 0 | 0 | 0.004(3) |
| Al02 | 0.017(4) | 0.026(4) | 0.022(4) | 0 | 0 | 0.004(3) |
| Li02 | 0.017(4) | 0.026(4) | 0.022(4) | 0 | 0 | 0.004(3) |
| N03 | 0.013(4) | 0.027(6) | 0.017(4) | 0 | 0 | -0.007(4) |
| O03 | 0.013(4) | 0.027(6) | 0.017(4) | 0 | 0 | -0.007(4) |

|  | AB11 |
|---|---|
| CIE-x: | 0.595 |
| CIE-y: | 0.404 |
| LER/lm/W$_{opt}$ | 261.5 |
| lambda_max/nm | 613.4 |
| lambda_dom/nm | 593.6 |
| FWHM/nm | 105 |

FIG 115

| molecular formula | $Na_{1-x}Eu_xLi_{3-2x}Al_{3x}Si_{1-x}O_{4-4x}N_{4x}$ (x=0.2224) |
|---|---|
| crystal system | tetragonal |
| space group | *I4/m (no 87)* |
| *a*/Å | 7.7031(11) |
| *c*/Å | 3.1584(6) |
| cell volume / Å$^3$ | 187.41(6) |
| density / g × cm$^{-3}$ | 3.039 |
| *T / K* | 293(2) |
| diffractometer | Bruker D8 Quest |
| radiation / Å | Mo-Kα(λ=0.71073Å) |
| measurement range | 3.741° ≤ θ ≤ 27.473° |
| | -10 ≤ h ≤ 10 |
| | -10 ≤ k ≤ 10 |
| | -4 ≤ l ≤ 4 |
| reflexes total | 1843 |
| independent reflexes | 127 |
| *R$_1$, wR$_2$* (all data) | 0.0465, 0.1217 |
| GooF | 1.215 |

FIG 116

| atom | x | y | z | occupation |
|---|---|---|---|---|
| Na | 1/2 | 1/2 | 1/2 | 0.7776 |
| Eu | 1/2 | 1/2 | 1/2 | 0.2224 |
| Si | 0.1924(4) | 0.3596(4) | 0 | 0.1944 |
| Al | 0.1924(4) | 0.3596(4) | 0 | 0.1668 |
| Li | 0.1924(4) | 0.3596(4) | 0 | 0.6388 |
| O | 0.4039(5) | 0.2383(7) | 0 | 0.7776 |
| N | 0.4039(5) | 0.2383(7) | 0 | 0.2224 |

FIG 117

| atom | $U_{11}$ | $U_{22}$ | $U_{33}$ | $U_{23}$ | $U_{13}$ | $U_{12}$ |
|---|---|---|---|---|---|---|
| Na | 0.0192(7) | 0.0192(7) | 0.0460(12) | 0 | 0 | 0 |
| Eu | 0.0192(7) | 0.0192(7) | 0.0460(12) | 0 | 0 | 0 |
| Si | 0.0296(16) | 0.0183(14) | 0.0157(15) | 0 | 0 | -0.0017(11) |
| Al | 0.0296(16) | 0.0183(14) | 0.0157(15) | 0 | 0 | -0.0017(11) |
| Li | 0.0296(16) | 0.0183(14) | 0.0157(15) | 0 | 0 | -0.0017(11) |
| O | 0.0164(18) | 0.050(3) | 0.029(2) | 0 | 0 | 0.0020(17) |
| N | 0.0164(18) | 0.050(3) | 0.029(2) | 0 | 0 | 0.0020(17) |

FIG 119

| | | CIE-x | CIE-y | $\lambda_{peak}$ /nm | $\lambda_{dom}$ /nm | FHWM /nm | LER/ lm/W$_{opt}$ |
|---|---|---|---|---|---|---|---|
| AB18 | Na$_{1-x}$Sr$_x$Li$_{3-2x}$Al$_{3x}$Si$_{1-x}$O$_{4-4x}$ (x=0.25): Eu | 0.368 | 0.597 | 543 | 559.8 | 76 | 504 |
| AB6-1 | Na$_{1-x}$Ca$_x$Li$_{3-2x}$Al$_{3x}$Si$_{1-x}$O$_{4-4x}$ (x=0.25): Eu | 0.377 | 0.591 | 544 | 561 | 72 | 491 |
| AB6-2 | Na$_{1-x}$Ca$_x$Li$_{3-2x}$Al$_{3x}$Si$_{1-x}$O$_{4-4x}$ (x=0.25): Eu | 0.399 | 0.579 | 546 | 564 | 72 | 496 |
| AB11-1 | Na$_{1-x}$Eu$_x$Li$_{3-2x}$Al$_{3x}$Si$_{1-x}$O$_{4-4x}$N$_{4x}$(x=0.105): Eu | 0.555 | 0.442 | 593 | 587 | 89 | 344 |

|  | AB11 | Comp258 |
|---|---|---|
|  | $Na_{1-x}Eu_xLi_{3-2x}Al_{3x}Si_{1-x}O_{4-4x}N_{4x}$: Eu (x=0.2224) | $(Sr_{0.495}Ba_{0.495}Eu_{0.01})_2Si_5N_8$: Eu |
| CIE x | 0.595 | 0.597 |
| CIE y | 0.404 | 0.401 |

|  | CIE-x | CIE-y | LER/ lm/W | $\lambda_{peak}$ /nm | $\lambda_{dom}$ /nm | FHWM /nm |
|---|---|---|---|---|---|---|
| AB12 | 0,486 | 0,506 | 488 | 580,3 | 576,5 | 80 |
| $(Ca, Sr, Ba)_2SiO_4: Eu^{2+}$ | 0,494 | 0,498 | 434 | 575,5 | 577,8 | 98 |

| λprim /nm | | CIE-x | CIE-y | CCT/K | LER/ lm/W |
|---|---|---|---|---|---|
| 442 | AB12 | 0,412 | 0,395 | 3394 | 409 |
| 442 | $Gd_3(Al_5Ga)_5O_{12}:Ce^{3+}$ | 0,404 | 0,391 | 3517 | 341 |
| 442 | $Tb_3Al_5O_{12}:Ce^{3+}$ | 0,417 | 0,396 | 3298 | 347 |
| 442 | $(Y, Gd)_3Al_5O_{12}:Ce^{3+}$ | 0,404 | 0,391 | 3516 | 347 |
| 442 | $(Ca, Sr, Ba)_2SiO_4:Eu^{2+}$ | 0,430 | 0,401 | 3094 | 377 |

FIG 126

| molecular formula | SrLi$_{2.5972}$Al$_{1.4028}$O$_{3.1944}$N$_{0.8056}$ |
|---|---|
| crystal system | tetragonal |
| space group | *I4/m (no 87)* |
| *a*/Å | 7.8588(5) |
| *c*/Å | 3.1844(3) |
| cell volume / Å$^3$ | 196.67(3) |
| density / g × cm$^{-3}$ | 3.503 |
| *T / K* | 294(2) |
| diffractometer | Bruker D8 Quest |
| radiation / Å | Mo-K$\alpha$($\lambda$=0.71073Å) |
| measurement range | 3.667° < $\theta$ < 34.933° |
| | -12 ≤ h ≤ 11 |
| | -12 ≤ k ≤ 12 |
| | -5 ≤ l ≤ 5 |
| reflexes total | 3084 |
| independent reflexes | 2489 |
| $R_1$, $wR_2$ (I ≥ 2$\sigma$ I) | 0.0438, 0.12 |
| GooF | 1.196 |

FIG 127

| atom | x | y | z | occupation |
|---|---|---|---|---|
| Sr1 | 1/2 | 1/2 | 1/2 | 1 |
| Al1 | 0.1875(3) | 0.6453(3) | 0 | 0.3507 |
| Li1 | 0.1875(3) | 0.6453(3) | 0 | 0.6493 |
| N1 | 0.2427(5) | 0.4078(34) | 0 | 0.2014 |
| O1 | 0.2427(5) | 0.4078(34) | 0 | 0.7986 |

FIG 128

| atom | $U_{11}$ | $U_{22}$ | $U_{33}$ | $U_{23}$ | $U_{13}$ | $U_{12}$ |
|---|---|---|---|---|---|---|
| Sr1 | 0.0186(3) | 0.0186(3) | 0.0345(6) | 0 | 0 | 0 |
| Al1 | 0.0111(10) | 0.0079(10) | 0.0036(9) | 0 | 0 | 0.0033(7) |
| Li1 | 0.0111(10) | 0.0079(10) | 0.0036(9) | 0 | 0 | 0.0033(7) |
| N1 | 0.0233(15) | 0.0090(12) | 0.0115(13) | 0 | 0 | -0.0045(10) |
| O1 | 0.0233(15) | 0.0090(12) | 0.0115(13) | 0 | 0 | -0.0045(10) |

FIG 145

| molecular formula | CsNaKLi(Li$_3$SiO$_4$)$_4$ |
|---|---|
| molecular weight / g × mol$^{-1}$ | 653.56 |
| crystal system | tetragonal |
| space group | *I4/m (no 87)* |
| *a*/Å | 11.0175 |
| *c*/Å | 6.36928 |
| cell volume / Å$^3$ | 773.143 |
| Z | 2 |
| density / g × cm$^{-3}$ | 2.80 |
| *T / K* | 293(2) |
| diffractometer | PANalytical Empyrean |
| radiation / Å | Mo-K$\alpha_1$ ($\lambda$=1.540598Å) |
| measurement range | 10° < 2θ < 80° |
| $R_p$ | 0.1829 |
| $R_{wp}$; $R_{exp}$ | 0.2270; 0.1193 |
| GooF | 1.903 |

FIG 146

| atom | x | y | z | occupation |
|---|---|---|---|---|
| Si1 | 0.2846 | 0.0787 | 0 | 1 |
| Cs1 | 0 | 0 | 1/2 | 1 |
| K1 | 0 | 0 | 0 | 1 |
| Na1 | 0 | 1/2 | 1/4 | 1/2 |
| Li1 | 0.1144 | 0.2447 | 0.2425 | 1 |
| Li2 | 0.2121 | 0.4247 | 0 | 1 |
| Li3 | 0 | 1/2 | 0 | 1/2 |
| O1 | 0.0614 | 0.3362 | 0 | 1 |
| O2 | 0.4027 | 0.1688 | 0 | 1 |
| O3 | 0.2051 | 0.0971 | 0.215 | 1 |

FIG 147

| molecular formula | $CsNa_2K(Li_3SiO_4)_4$ |
|---|---|
| molecular weight / g × mol$^{-1}$ | 669.61 |
| crystal system | tetragonal |
| space group | *I4/m (no 87)* |
| *a*/Å | 10.9825 |
| *c*/Å | 6.32814 |
| cell volume / Å$^3$ | 763.269 |
| Z | 2 |
| density / g × cm$^{-3}$ | 2.91 |
| *T / K* | 293(2) |
| diffractometer | PANalytical Empyrean |
| radiation / Å | Cu-K$\alpha_1$ ($\lambda$=1.540598Å) |
| measurement range | 10° < 2θ < 80° |
| $R_p$ | 0.2077 |
| $R_{wp}$; $R_{exp}$ | 0.2582; 0.1188 |
| GooF | 2.174 |

FIG 148

| atom | x | y | z | occupation |
|---|---|---|---|---|
| Si1 | 0.2853 | 0.0785 | 0 | 1 |
| Cs1 | 0 | 0 | 1/2 | 1 |
| K1 | 0 | 0 | 0 | 1 |
| Na1 | 0 | 1/2 | 1/4 | 1 |
| Li1 | 0.1163 | 0.2439 | 0.2418 | 1 |
| Li2 | 0.2108 | 0.4263 | 0 | 1 |
| O1 | 0.0612 | 0.3372 | 0 | 1 |
| O2 | 0.4012 | 0.1712 | 0 | 1 |
| O3 | 0.2061 | 0.0961 | 0.2146 | 1 |

FIG 149

| molecular formula | RbNa$_2$K(Li$_3$SiO$_4$)$_4$ |
|---|---|
| molecular weight / g × mol$^{-1}$ | 622.17 |
| crystal system | tetragonal |
| space group | *I4/m (no 87)* |
| *a*/Å | 10.9704 |
| *c*/Å | 6.29927 |
| cell volume / Å$^3$ | 758.115 |
| Z | 2 |
| density / g × cm$^{-3}$ | 2.73 |
| *T / K* | 293(2) |
| diffractometer | PANalytical Empyrean |
| radiation / Å | Cu-K$\alpha_1$ ($\lambda$=1.540598Å) |
| measurement range | 10° < 2θ < 80° |
| $R_p$ | 0.1813 |
| $R_{wp}$; $R_{exp}$ | 0.2355; 0.1073 |
| GooF | 2.194 |

FIG 150

| atom | x | y | z | occupation |
|---|---|---|---|---|
| Si1 | 0.2853 | 0.0785 | 0 | 1 |
| Rb1 | 0 | 0 | 1/2 | 1 |
| K1 | 0 | 0 | 0 | 1 |
| Na1 | 0 | 1/2 | 1/4 | 1 |
| Li1 | 0.1163 | 0.2439 | 0.2418 | 1 |
| Li2 | 0.2108 | 0.4263 | 0 | 1 |
| O1 | 0.0612 | 0.3372 | 0 | 1 |
| O2 | 0.4012 | 0.1712 | 0 | 1 |
| O3 | 0.2061 | 0.0961 | 0.2146 | 1 |

FIG 151

| molecular formula | $CsNaRbLi(Li_3SiO_4)_4$ |
|---|---|
| molecular weight / g × mol$^{-1}$ | 699.94 |
| crystal system | tetragonal |
| space group | *I4/m (no 87)* |
| a/Å | 10.9729 |
| c/Å | 6.34058 |
| cell volume / Å$^3$ | 763.433 |
| Z | 2 |
| density / g × cm$^{-3}$ | 2.96 |
| T / K | 293(2) |
| diffractometer | PANalytical Empyrean |
| radiation / Å | Cu-K$\alpha_1$ ($\lambda$=1.540598Å) |
| measurement range | 10° < 2θ < 80° |
| $R_p$ | 0.2103 |
| $R_{wp}$; $R_{exp}$ | 0.2631; 0.1245 |
| GooF | 2.113 |

| atom | x | y | z | occupation |
|---|---|---|---|---|
| Si1 | 0.2846 | 0.0787 | 0 | 1 |
| Cs1 | 0 | 0 | 1/2 | 1 |
| Rb1 | 0 | 0 | 0 | 0.6102 |
| Na1 | 0 | 1/2 | 1/4 | 1/2 |
| Li1 | 0.1144 | 0.2447 | 0.2425 | 1 |
| Li2 | 0.2121 | 0.4247 | 0 | 1 |
| Li3 | 0 | 1/2 | 0 | 1/2 |
| O1 | 0.0614 | 0.3362 | 0 | 1 |
| O2 | 0.4027 | 0.1688 | 0 | 1 |
| O3 | 0.2051 | 0.0971 | 0.215 | 1 |

| embodiment | λpeak /nm | λdom /nm | CIE-x | CIE-y | FHWM /nm |
|---|---|---|---|---|---|
| AB12-1 | 575 | 575 | 0.475 | 0.516 | 79.2 |
| AB12-2 | 596 | 587 | 0.555 | 0.443 | 76.9 |

| λpeak /nm | 547 |
|---|---|
| λdom /nm | 561 |
| CIE-x | 0.380 |
| CIE-y | 0.593 |
| FHWM/nm | 73.6 |

| x** | λ_peak /nm | V / Å³ |
|---|---|---|
| 0.17 | 580 | 196.37 |
| 0.20 | 592 | 196.65 |
| 0.24 | 617 | 197.44 |
| 0.24 | 620 | 197.32 |
| 0.28 | 628 | 198.01 |
| 0.28 | 635 | 198.26 |
| 0.34 | 644 | 198.98 |
| 0.34 | 654 | 198.89 |
| 0.44 | 678 | 201.42 |

FIG 158

| structure type | UCr$_4$C$_4$ | |
|---|---|---|
| crystal system | tetragonal | |
| space group | I4/m (no 87) | |
| embodiment | AB12-1 | AB12-2 |
| x** | 0.1250(2) | 0.1375(2) |
| a/Å | 7.8575(2) Å | 7.8645(3) Å |
| c/Å | 3.18730(10) Å | 3.1949(2) Å |
| V/Å$^3$ | 196.785(12) Å$^3$ | 197.61(2) Å$^3$ |
| density / g × cm$^{-3}$ | 3.433 | 3.426 |
| T / K | 293(2) | |
| radiation / Å | Cu-Kα(λ=1.542Å) | |
| measurement range /° | 7.975°<2θ<66.278° | 7.968°<2θ<66.148° |
| reflexes total | 626 | 512 |
| independent reflexes | 102 | 103 |
| measured reciprocal space | -8 ≤ h ≤ 9 | -8 ≤ h ≤ 8 |
| | -9 ≤ k ≤ 9 | -9 ≤ k ≤ 7 |
| | -3 ≤ l ≤ 3 | -3 ≤ l ≤ 3 |
| $R_1$; $wR_2$(I ≥ 2σ I) | 0.0265; 0.0707 | 0.0284, 0.0705 |
| GooF | 1.172 | 1.263 |

| atom | x | y | z | occupation |
|---|---|---|---|---|
| Sir01 | 1/2 | 1/2 | 1/2 | 1 |
| Al02 | 0.1856(4) | 0.6447(4) | 0 | 0.319(13) |
| Li02 | 0.1856(4) | 0.6447(4) | 0 | 0.681(13) |
| O03 | 0.2445(6) | 0.4073(5) | 0 | 0.1375 |
| N03 | 0.2445(6) | 0.4073(5) | 0 | 0.8625 |

FIG 161
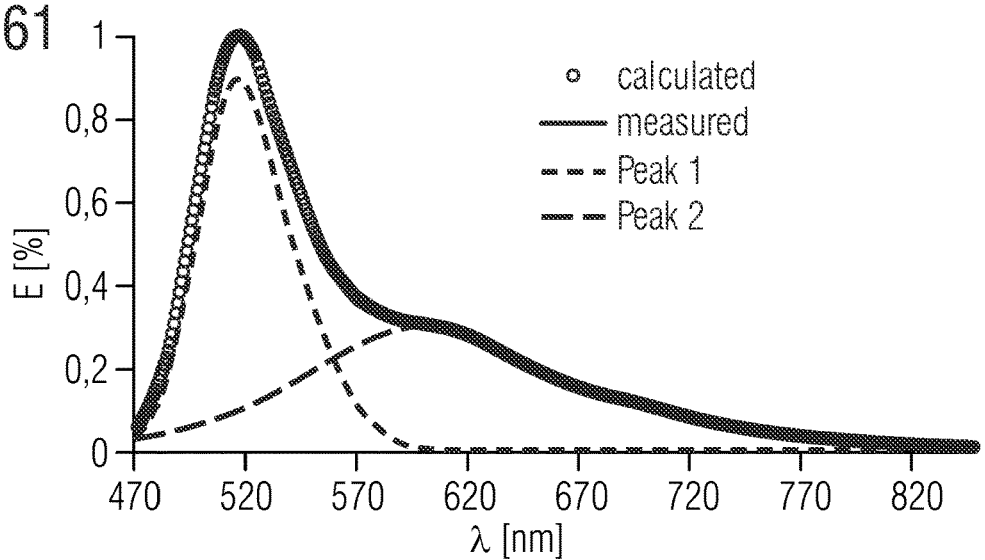
FIG 162
|  | AB17 | Peak 1 | Peak 2 |
|---|---|---|---|
| relative intensity | 100% | 48% | 51% |
| CIE-x: | 0.333 | 0.171 | 0.499 |
| CIE-y: | 0.577 | 0.681 | 0.471 |
| LER/lm/W$_{opt}$ | 381 | 451 | 310 |
| λpeak/nm | 516 | 515 | 598 |
| λdom/nm | 554 | 523 | 580 |
| FWHM/nm | 60 | 49 | 138 |
FIG 163
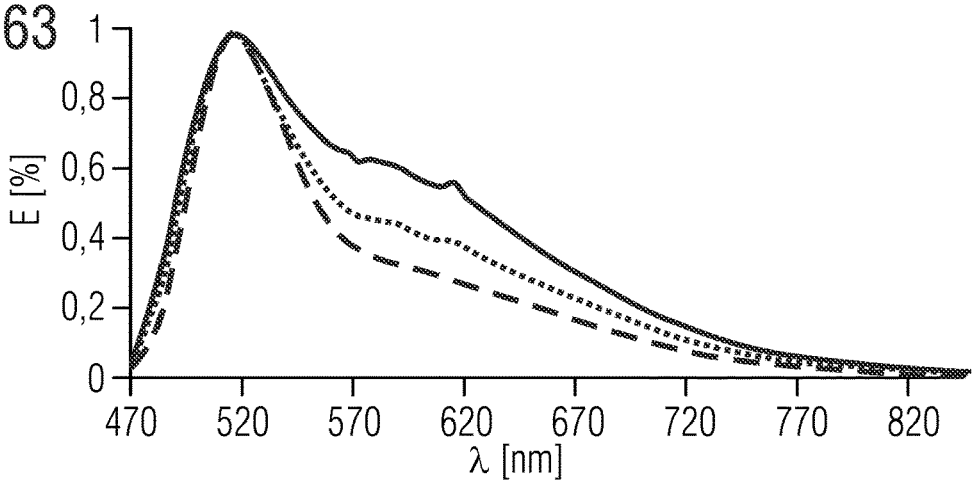

FIG 164

| | AB17-LED1 | AB17-LED2 | Comp1 | Comp2 | Comp3 |
|---|---|---|---|---|---|
| $\lambda_{Prim}$/nm | 438 | 443 | 438 | 443 | 443 |
| phosphor | NaK7[Li3SiO4]8:Eu | NaK7[Li3SiO4]8:Eu | (Lu0,82Y0,15Ce0,03)3Al5O12 | (Lu0,82Y0,15Ce0,03)3Al5O12 | (Lu0,755Y0,2Ce0,045)3Al5O12 |
| CIE-x | 0,289 | 0,281 | 0,278 | 0,276 | 0,294 |
| CIE-y | 0,308 | 0,294 | 0,300 | 0,304 | 0,302 |
| CCT / K | 8374 | 9607 | 9713 | 9654 | 8171 |
| CRI | 80 | 84 | 63 | 67 | 66 |
| R9 | 53 | 64 | -55 | -55 | -30 |

FIG 167

| | AB17-LED3 | Comp4 | AB17-LED4 | AB17-LED5 | Comp5 |
|---|---|---|---|---|---|
| $\lambda_{prim}$/nm | 443 | 446 | 433 | 443 | 446 |
| phosphor | NaK$_7$[Li$_3$SiO$_4$]$_8$:Eu | Lu$_3$Al$_5$O$_{12}$:Ce | NaK$_7$[Li$_3$SiO$_4$]$_8$:Eu | NaK$_7$[Li$_3$SiO$_4$]$_8$:Eu | Lu$_3$Al$_5$O$_{12}$:Ce |
| second phosphor | - | CaAlSiN$_3$:Eu | - | - | CaAlSiN$_3$:Eu |
| CIE-x before filter | 0,262 | 0,273 | 0,250 | 0,251 | 0,273 |
| CIE-y before filter | 0,251 | 0,249 | 0,213 | 0,225 | 0,249 |
| filter curve | standard | standard | HCG | HCG | HCG |
| red: CIE-x after filter | 0,646 | 0,653 | 0,663 | 0,665 | 0,670 |
| red: CIE-y after filter | 0,327 | 0,325 | 0,320 | 0,322 | 0,320 |
| green: CIE-x after filter | 0,267 | 0,283 | 0,237 | 0,237 | 0,256 |
| green: CIE-y after filter | 0,603 | 0,582 | 0,670 | 0,668 | 0,654 |
| blue: CIE-x after filter | 0,151 | 0,150 | 0,154 | 0,150 | 0,146 |
| blue: CIE-y after filter | 0,062 | 0,058 | 0,060 | 0,062 | 0,065 |
| coverage sRGB (x, y, color space) | 97% | 96% | 100% | 100% | 100% |
| coverage sRGB (u', v', color space) | 99% | 98% | 100% | 100% | 99% |

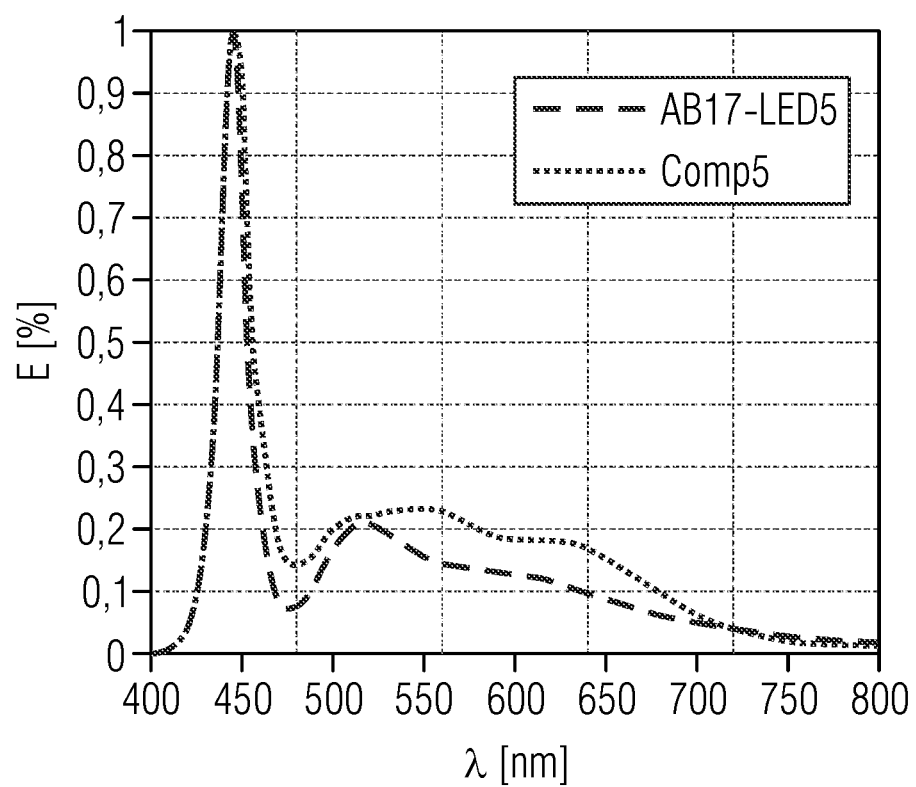

FIG 174

| | |
|---|---|
| molecular formula | $NaK_7[Li_3SiO_4]_8$ |
| crystal system | tetragonal |
| space group | $I4_1/a$ |
| $a$/Å | 15.5557(8) |
| $c$/Å | 12.7471(7) |
| cell volume / Å$^3$ | 3084.5(4) |
| density / g × cm$^{-3}$ | 2.584 |
| $T$ / K | 193(2) |
| diffractometer | Bruker D8 Quest |
| radiation / Å | Mo-K$\alpha$($\lambda$=0.71073Å) |
| measurement range | 3.336° < $\theta$ < 29.981° |
| | -21 ≤ h ≤ 21 |
| | -21 ≤ k ≤ 21 |
| | -17 ≤ l ≤ 17 |
| reflexes total | 49450 |
| independent reflexes | 2232 |
| $R_1$, $wR_2$ (I ≥ 2σ I) | 0.0328, 0.0992 |
| GooF | 1.228 |

FIG 175

| atom | x | y | z | occupation |
|---|---|---|---|---|
| K1 | 0.23954(4) | -0.01300(4) | 0.26443(5) | 0.01266(14) |
| K2 | 1/2 | 1/4 | 0.60364(6) | 0.01179(17) |
| K3 | 1/2 | 1/4 | 3/8 | 0.0164(2) |
| Na1 | 1/2 | 1/4 | 7/8 | 0.0149(4) |
| Li1 | 0.3354(3) | 0.3190(3) | 0.5003(3) | 0.0102(8) |
| Li2 | 0.5645(3) | 0.3990(3) | 0.7506(3) | 0.0076(8) |
| Li3 | 0.1681(3) | 0.1824(3) | 0.2523(3) | 0.0092(8) |
| Li4 | 0.4288(3) | 0.4331(3) | 0.8779(3) | 0.0128(9) |
| Li5 | 0.4101(3) | -0.0611(3) | 0.3839(4) | 0.0121(9) |
| Li6 | 0.3128(3) | 0.1787(4) | 0.6232(4) | 0.0229(12) |
| Si1 | 0.35449(4) | 0.32082(4) | 0.74881(5) | 0.00251(14) |
| Si2 | 0.32029(4) | 0.15078(4) | 0.37805(5) | 0.00384(14) |
| O1 | 0.44452(11) | 0.37548(11) | 0.74456(13) | 0.0049(3) |
| O2 | 0.35286(12) | 0.19687(11) | 0.26977(13) | 0.0076(3) |
| O3 | 0.37621(11) | 0.21765(11) | 0.74897(13) | 0.0053(3) |
| O4 | 0.30545(11) | 0.34889(11) | 0.85697(13) | 0.0067(3) |
| O5 | 0.30158(11) | 0.34529(12) | 0.64204(13) | 0.0070(3) |
| O6 | 0.36470(11) | 0.05410(11) | 0.37575(13) | 0.0053(3) |
| O7 | 0.35859(12) | 0.19726(11) | 0.48353(13) | 0.0068(3) |
| O8 | 0.21605(11) | 0.14282(13) | 0.38244(14) | 0.0097(3) |

FIG 176

| atom | $U_{11}$ | $U_{22}$ | $U_{33}$ | $U_{23}$ | $U_{13}$ | $U_{12}$ |
|---|---|---|---|---|---|---|
| K1 | 0.0137(3) | 0.0107(2) | 0.0136(3) | -0.00054(19) | -0.00477(19) | 0.00171(18) |
| K2 | 0.0103(3) | 0.0138(3) | 0.0113(3) | 0 | 0 | 0.0008(3) |
| K3 | 0.0116(3) | 0.0116(3) | 0.0260(6) | 0 | 0 | 0 |
| Na1 | 0.0137(6) | 0.0137(6) | 0.0174(11) | 0 | 0 | 0 |
| Li1 | 0.018(2) | 0.0073(18) | 0.0050(18) | 0.0011(15) | 0.0006(16) | 0.0016(16) |
| Li2 | 0.0069(18) | 0.0106(19) | 0.0053(18) | 0.0002(14) | 0.0002(14) | -0.0012(14) |
| Li3 | 0.014(2) | 0.0061(18) | 0.0070(18) | -0.0011(14) | -0.0016(15) | -0.0002(15) |
| Li4 | 0.022(2) | 0.0093(19) | 0.0065(19) | -0.0004(15) | -0.0035(16) | 0.0063(17) |
| Li5 | 0.019(2) | 0.010(2) | 0.0072(19) | -0.0004(15) | -0.0011(16) | 0.0059(17) |
| Li6 | 0.012(2) | 0.051(4) | 0.006(2) | -0.002(2) | 0.0016(17) | -0.017(2) |
| Si1 | 0.0030(3) | 0.0035(3) | 0.0010(3) | -0.00000(19) | 0.00011(19) | -0.00033(19) |
| Si2 | 0.0060(3) | 0.0040(3) | 0.0015(3) | -0.0004(2) | -0.0003(2) | 0.0026(2) |
| O1 | 0.0040(7) | 0.0070(7) | 0.0035(7) | -0.0002(6) | 0.0002(5) | -0.0031(6) |
| O2 | 0.0150(8) | 0.0052(7) | 0.0025(7) | 0.0009(6) | -0.0006(6) | 0.0030(6) |
| O3 | 0.0067(7) | 0.0048(7) | 0.0045(7) | 0.0004(6) | 0.0009(6) | 0.0002(6) |
| O4 | 0.0059(7) | 0.0118(8) | 0.0024(7) | -0.0012(6) | -0.0004(6) | 0.0015(6) |
| O5 | 0.0055(7) | 0.0134(8) | 0.0021(7) | 0.0011(6) | -0.0002(6) | 0.0006(6) |
| O6 | 0.0072(7) | 0.0048(7) | 0.0040(7) | 0.0000(5) | 0.0005(6) | 0.0018(6) |
| O7 | 0.0121(8) | 0.0060(7) | 0.0025(7) | -0.0007(6) | -0.0006(6) | 0.0028(6) |
| O8 | 0.0063(8) | 0.0181(9) | 0.0046(7) | -0.0009(6) | 0.0001(6) | 0.0055(7) |

LIGHTING DEVICE

RELATED APPLICATIONS

The present application is a divisional of U.S. patent application Ser. No. 16/302,724, filed on Nov. 19, 2018 which is a National Stage Application of PCT application No. PCT/EP2017/070343 filed on Aug. 10, 2017, which claims priority from German application No. 10 2016 114 996.9 filed on Aug. 12, 2016 and from German application No. 10 2016 121 694.1 filed on Nov. 11, 2016, all of which are incorporated herein by reference in their entirety.

TECHNICAL FIELD

Various embodiments relate to a lighting device, in particular a conversion light-emitting diode (conversion LED).

BACKGROUND

Phosphors which can be efficiently excited by ultraviolet, blue or green primary radiation and have an efficient emission in the blue, green, yellow, red or deep-red spectral range are of very great interest for the production of white and colored conversion LEDs. Conversion LEDs are used for many applications, for example for general lighting, display backlighting, signage, display panels, in automobiles and in numerous further consumer products. Conversion LEDs for the backlighting of display elements, such as displays, for example, differ greatly from conversion LEDs for general lighting. The requirements made of conversion LEDs for general lighting consist, in particular, in a high luminous efficiency combined with a high efficiency, a high color rendering index and a color temperature of less than 3500 K. Conversion LEDs for the backlighting of display elements require, in particular, phosphors having narrowband emission in the blue, green and red spectral range in order to cover the widest possible color space. Moreover, there is great demand for colored conversion LEDs which render colors adapted to consumer desires (so-called "color on demand" applications).

Previous white-emitting conversion LEDs for general lighting and backlighting use a semiconductor chip which emits a blue primary radiation, and a red and green phosphor. What is disadvantageous about this solution is that the epitaxially grown semiconductor chips, based for example on GaN or InGaN, can have fluctuations in the peak wavelength of the emitted primary radiation. This leads to fluctuations in the white overall radiation, such as a change in the color locus and the color rendering, since the primary radiation contributes the blue portion to the overall radiation. This is problematic particularly when a plurality of semiconductor chips are used in a device.

In order to avoid fluctuations, the semiconductor chips are sorted in accordance with their color loci ("binning"). The narrower the tolerances set with regard to the wavelength of the emitted primary radiation, the higher the quality of conversion LEDs which consist of more than one semiconductor chip. However, even after sorting with narrow tolerances, the peak wavelength of the semiconductor chips can change significantly in the case of variable operating temperatures and forward currents. In general lighting and other applications, this can lead to a change in the optical properties, such as the color locus and the color temperature.

In the backlighting of display elements, such as displays in televisions, computer monitors, tablets and smartphones, manufacturers endeavor to render the colors in a vivid and lifelike way, since this is very attractive to consumers. The backlighting of display elements therefore requires light sources having very narrowband emissions, that is to say a small full width at half maximum, in the green, blue and red spectral range in order to cover the widest possible color space. As light sources for backlighting applications, predominantly a blue-emitting semiconductor chip is combined with a phosphor having a peak wavelength in the green spectral range and a phosphor having a peak wavelength in the red spectral range.

Conversion LEDs for backlighting applications conventionally use as green phosphor, for example, an yttrium aluminum garnet, a lutetium aluminum garnet or a β-SiAlON ($Si_{6-z}Al_zO_zN_{8-z}$:RE or $Si_{6-x}Al_zO_yN_{8-y}$:$RE_z$ where RE=rare earth metal). However, yttrium aluminum garnet has an emission peak having a large full width at half maximum, such that, as a result of considerable filter losses, the achievable color space is restricted and the efficiency is also reduced. β-SiAlON with a full width at half maximum of less than 60 nm has a narrowband emission in the green spectral range which leads to a more saturated green rendering than with a garnet phosphor. However, β-SiAlONs lack a good internal and external quantum efficiency, which makes the entire backlighting not very efficient. Furthermore, the production of these phosphors requires very high temperatures and expensive equipment. The production of the phosphor is thus very expensive and thus so is the production of conversion LEDs comprising said phosphor.

Quantum dots, on account of their very narrowband emission, are also used for converting primary radiation for backlighting applications. However, quantum dots are very unstable. Moreover, most commercially available quantum dots comprise harmful elements such as Hg or Cd, the concentration of which is limited in commercial electrical and electronic devices under the RoHS regulations ("reduction of hazardous substances", EU Directive 2011/65/EU).

Known blue-green to green phosphors for conversion LEDs are for example the phosphors $Ca_8Mg(SiO_4)_4Cl_2$:Eu, $(Sr,Ba)_2SiO_4$:Eu and $Lu_3(Al,Ga)_5O_{12}$:Ce. However, conversion LEDs comprising these phosphors have inadequate color purity and cannot achieve specific color loci, for which reason they are not appropriate for many "color on demand" applications.

SUMMARY

The object of the present disclosure is to specify a lighting device, in particular a conversion LED, which is improved by comparison with the prior art and which can be used in particular for general lighting, backlighting and "color on demand" applications.

The object is achieved by means of a lighting device as claimed in independent claim 1. Advantageous embodiments and developments of the present disclosure are respectively specified in the dependent claims.

A phosphor is specified. The phosphor has the general molecular formula:

$(TF)_j(XA)_k(XB)_l(XC)_m(XD)_n$.

In this case, MA is selected from a group of monovalent metals, MB is selected from a group of divalent metals, MC is selected from a group of trivalent metals, MD is selected from a group of tetravalent metals, TA is selected from a group of monovalent metals, TB is selected from a group of divalent metals, TC is selected from a group of trivalent metals, TD is selected from a group of tetravalent metals, TE is selected from a group of pentavalent elements, TF is selected from a group of hexavalent elements, XA is selected from a group of elements which comprises halogens, XB is selected from a group of elements which comprises O, S and combinations thereof, XC=N and XD=C. The following furthermore hold true:

a+b+c+d=t;
e+f+g+h+i+j=u
k+l+m+n=v
a+2b+3c+4d+e+2f+3g+4h+5i+6j−k−2l−3m−4n=w
0.8≤t≤1
3.5≤u≤4
3.5≤v≤4
(−0.2)≤w≤0.2.

In accordance with at least one embodiment, the phosphor comprises within its molecular formula at least Eu, Ce, Yb and/or Mn. Eu, Ce, Yb and/or Mn serve as activators of the phosphor which is responsible for the emission of radiation. The phosphor can thus have in particular the following formula:

$(MA)_a(MB)_b(MC)_c(MD)_d(TA)_e(TB)_f(TC)_g(TD)_h(TE)_i(TF)_j(XA)_k(XB)_l(XC)_m(XD)_n$:E, wherein E=Eu, Ce,Yb and/or Mn.

Here and hereinafter phosphors are described on the basis of molecular formulae. In the case of the specified molecular formulae it is possible for the phosphor to comprise further elements for instance in the form of impurities, wherein these impurities taken together should advantageously have at most a proportion by weight in the phosphor of at most 1 per mille or 100 ppm (parts per million) or 10 ppm.

In accordance with at least one embodiment, the following holds true for the phosphor having the general molecular formula $(MA)_a(MB)_b(MC)_c(MD)_d(TA)_e(TB)_f(TC)_g(TD)_h(TE)_i(TF)_j(A)_k(XB)_l(C)_m(XD)_n$ or $(MA)_a(MB)_b(MC)_c(MD)_d(TA)_e(TB)_f(TC)_g(TD)_h(TE)_i(TF)_j(XA)_k(XB)_l(XC)_m(XD)_n$:E:0≤m<0.875v and/or v≥1>0.125v.

A lighting device comprising a phosphor is specified. The phosphor has the following general molecular formula:

$(MA)_a(MB)_b(MC)_c(MD)_d(TA)_e(TB)_f(TC)_g(TD)_h(TE)_i(TF)_j(XA)_k(XB)_l(XC)_m(XD)_n$, wherein
MA is selected from a group of monovalent metals which comprises Li, Na, K, Rb, Cs, Cu, Ag and combinations thereof,
MB is selected from a group of divalent metals which comprises Mg, Ca, Sr, Ba, Zn, Mn, Eu, Yb, Ni, Fe, Co and combinations thereof,
MC is selected from a group of trivalent metals which comprises Y, Fe, Cr, Sc, In, rare earth metals and combinations thereof,
MD is selected from a group of tetravalent metals which comprises Zr, Hf, Mn, Ce and combinations thereof,
TA is selected from the group of monovalent metals which comprises Li, Na, Cu, Ag and combinations thereof,
TB is selected from a group of divalent metals which comprises Mg, Zn, Mn, Eu, Yb, Ni and combinations thereof,
TC is selected from a group of trivalent metals which comprises B, Al, Ga, In, Y, Fe, Cr, Sc, rare earth metals and combinations thereof,
TD is selected from a group of tetravalent metals which comprises Si, Ge, Sn, Mn, Ti, Zr, Hf, Ce and combinations thereof,
TE is selected from a group of pentavalent elements which comprises P, Ta, Nb, V and combinations thereof,
TF is selected from a group of hexavalent elements which comprises W, Mo and combinations thereof,
XA is selected from a group of elements which comprises F, Cl, Br and combinations thereof,
XB is selected from a group of elements which comprises O, S and combinations thereof,
XC=N
XD=C
a+b+c+d=t
e+f+g+h+i+j=u
k+l+m+n=v
a+2b+3c+4d+e+2f+3g+4h+5i+6j−k−2l−3m−4n=w
0.8≤t≤1
3.5≤u≤4
3.5≤v≤4
(−0.2)≤w≤0.2 and
0≤m<0.875 v and/or v≥1>0.125 v. The phosphor contains in particular within its molecular formula at least Eu, Ce, Yb and/or Mn and has in particular the molecular formula $(MA)_a(MB)_b(MC)_c(MD)_d(TA)_e(TB)_f(TC)_g(TD)_h(TE)_i(TF)_j(XA)_k(XB)_l(XC)_m(XD)_n$:E where E=Eu,Ce,Yb and/or Mn.

The assignment of the elements to MA, MB, MC, MD, TA, TB, TC, TD, TE, TF is based in particular on the arrangement thereof within the crystal structures of the phosphors. In particular, in this case, within the crystal structures TA, TB, TC, TD, TE and/or TF are surrounded by XA, XB, XC and/or XD and the resultant structural units are linked via common corners and edges. The corner and edge linkage of the structural units results in particular in the formation of cavities or channels in which MA, MB, MC and/or MD are arranged. On account of this assignment, it is possible for the possible elements in MA, MB, MC, MD, TA, TB, TC, TD, TE and TF to overlap.

In accordance with at least one embodiment, the phosphor has the following general molecular formula:

$(MA)_a(MB)_b(TA)_e(TB)_f(TC)_g(TD)_h(XC)_m(XB)_l$, wherein
MA is selected from a group of monovalent metals which comprises Li, Na, K, Rb, Cs, Cu, Ag and combinations thereof,
MB is selected from a group of divalent metals which comprises Mg, Ca, Sr, Ba, Zn, Mn, Eu, Yb, Ni, Fe, Co and combinations thereof,
TA is selected from a group of monovalent metals which comprises Li, Na, Cu, Ag and combinations thereof,
TB is selected from a group of divalent metals which comprises Mg, Zn, Mn, Eu, Yb, Ni and combinations thereof,
TC is selected from a group of trivalent metals which comprises B, Al, Ga, In, Y, Fe, Cr, Sc, rare earths and combinations thereof,
TD is selected from a group of tetravalent metals which comprises Si, Ge, Sn, Mn, Ti, Zr, Hf, Ce and combinations thereof,
XB is selected from a group of elements which comprises O, S and combinations thereof,
XC=N
a+b=t
e+f+g+h=u
l+m=v
a+2b+e+2f+3g+4h−2l−3m=w
0.8≤t≤1
3.5≤u≤4

3.5≤v≤4
(−0.2)≤w≤0.2 and
0≤m<0.875 v and/or v≥l>0.125 v. The phosphor contains in particular within its molecular formula at least Eu, Ce, Yb and/or Mn and has in particular the molecular formula $(MA)_a(MB)_b(TA)_e(TB)_f(TC)_g(TD)_h(XC)_m(XB)_i$:E where E=Eu, Ce, Yb and/or Mn. The following advantageously hold true:

MA is selected from a group of monovalent metals which comprises Li, Na, K, Rb, Cs and combinations thereof, MB is selected from a group of divalent metals which comprises Mg, Ca, Sr, Ba, Eu and combinations thereof, TA is selected from a group of monovalent metals which comprises Li, Na, Cu, Ag and combinations thereof, TB is selected from a group of divalent metals which comprises Eu, TC is selected from a group of trivalent metals which comprises B, Al, Ga, In and combinations thereof, TD is selected from a group of tetravalent metals which comprises Si, Ge, Sn, Mn, Ti and combinations thereof,

XB=O.

In one embodiment, the lighting device is a conversion light-emitting diode.

A conversion light-emitting diode (conversion LED) is specified. The conversion light-emitting diode (conversion LED) comprises a phosphor of the molecular formula $(MA)_a$ $(MB)_b (MC)_c(MD)_d(TA)_e (TB)_f(TC)_g(TD)_h(TE)_i(TF)_j(XA)_k$ $(XB)_l(XC)_m(XD)_n$.

In this case, MA is selected from a group of monovalent metals, MB is selected from a group of divalent metals, MC is selected from a group of trivalent metals, MD is selected from a group of tetravalent metals, TA is selected from a group of monovalent metals, TB is selected from a group of divalent metals, TC is selected from a group of trivalent metals, TD is selected from a group of tetravalent metals, TE is selected from a group of pentavalent elements, TF is selected from a group of hexavalent elements, XA is selected from a group of elements which comprises halogens, XB is selected from a group of elements which comprises O, S and combinations thereof, XC=N and XD=C. The following furthermore hold true:

a+b+c+d=t;
e+f+g+h+i+j=u
k+l+m+n=v
a+2b+3c+4d+e+2f+3g+4h+5i+6j−k−2l−3m−4n=w
0.8≤t≤1
3.5≤u≤4
3.5≤v≤4
(−0.2)≤w≤0.2. The phosphor contains in particular within its molecular formula at least Eu, Ce, Yb and/or Mn and has in particular the molecular formula $(MA)_a(MB)_b$ $(MC)_c(MD)_d(TA)_e$ $(TB)_f(TC)_g(TD)_h(TE)_i(TF)_j(XA)_k$ $(XB)_l(XC)_m(XD)_n$:E where E=Eu, Ce, Yb and/or Mn. In particular, the phosphor is arranged in a conversion element.

In accordance with one embodiment, the lighting device, in particular the conversion LED, comprises a primary radiation source configured to emit an electromagnetic primary radiation during operation of the lighting device, in particular of the conversion LED. Furthermore, the lighting device, in particular the conversion LED, comprises a conversion element arranged in the beam path of the electromagnetic primary radiation. The conversion element comprises a phosphor configured at least partly to convert the electromagnetic primary radiation into an electromagnetic secondary radiation during operation of the lighting device, in particular of the conversion LED. The phosphor has in particular the following molecular formula:

wherein

MA is selected from a group of monovalent metals which comprises Li, Na, K, Rb, Cs, Cu, Ag and combinations thereof, MB is selected from a group of divalent metals which comprises Mg, Ca, Sr, Ba, Zn, Mn, Eu, Yb, Ni, Fe, Co and combinations thereof, MC is selected from a group of trivalent metals which comprises Y, Fe, Cr, Sc, In, rare earth metals and combinations thereof, MD is selected from a group of tetravalent metals which comprises Zr, Hf, Mn, Ce and combinations thereof, TA is selected from a group of monovalent metals which comprises Li, Na, Cu, Ag and combinations thereof, TB is selected from a group of divalent metals which comprises Mg, Zn, Mn, Eu, Yb, Ni and combinations thereof, TC is selected from a group of trivalent metals which comprises B, Al, Ga, In, Y, Fe, Cr, Sc, rare earth metals and combinations thereof, TD is selected from a group of tetravalent metals which comprises Si, Ge, Sn, Mn, Ti, Zr, Hf, Ce and combinations thereof, TE is selected from a group of pentavalent elements which comprises P, Ta, Nb, V and combinations thereof, TF is selected from a group of hexavalent elements which comprises W, Mo and combinations thereof, XA is selected from a group of elements which comprises F, Cl, Br and combinations thereof, XB is selected from a group of elements which comprises O, S and combinations thereof, XC=N,
XD=C,
a+b+c+d=t
e+f+g+h+i+j=u
k+l+m+n=v
a+2b+3c+4d+e+2f+3g+4h+5i+6j−k−2l−3m−4n=w
0.8≤t≤1
3.5≤u≤4
3.5≤v≤4
(−0.2)≤w≤0.2 and
0≤m<0.875 v and/or v≥l>0.125 v. The phosphor contains in particular within its molecular formula at least Eu, Ce, Yb and/or Mn and has in particular the molecular formula $(MA)_a(MB)_b(MC)_c(MD)_d(TA)_e(TB)_f(TC)_g(TD)_h(TE)_i(TF)_j$ $(XA)_k(XB)_l(XC)_m(XD)_n$:E where E=Eu, Ce, Yb and/or Mn. 0≤m<0.875 v and/or v≥l>0.125 v means that the mol proportion of XC, that is to say nitrogen, in the phosphor is below 87.5 mol % relative to the total substance amount v of XA, XB, XC and XD and/or the molar proportion of XB, that is to say oxygen and/or sulphur, in the phosphor is above 12.5 mol % relative to the total substance amount v of XA, XB, XC and XD.

The fact that the phosphor at least partly converts the electromagnetic primary radiation into an electromagnetic secondary radiation can mean, firstly, that the electromagnetic primary radiation is partly absorbed by the phosphor and emitted as secondary radiation having a wavelength range that is at least partly different, in particular longer, than the primary radiation. In the case of this so-called partial conversion, the lighting device, in particular the conversion LED, emits in particular an overall radiation composed of the primary radiation and the secondary radiation. It is thus possible for the lighting device, in particular the conversion LED, to emit a mixed radiation composed of primary radiation and secondary radiation.

The fact that the phosphor at least partly converts the electromagnetic primary radiation into an electromagnetic secondary radiation can also mean that the electromagnetic primary radiation is almost completely absorbed by the phosphor and is emitted in the form of an electromagnetic secondary radiation. This can also be referred to as full conversion. The emitted radiation or overall radiation of the lighting device, in particular of the conversion LED, in accordance with this embodiment thus almost completely corresponds to the electromagnetic secondary radiation. Almost complete conversion should be understood to mean a conversion of more than 90%, in particular more than 95%. It is thus possible for the lighting device, in particular the conversion LED, to emit predominantly secondary radiation.

In accordance with at least one embodiment, the primary radiation source is a layer sequence comprising an active layer configured to emit an electromagnetic primary radiation during operation of the lighting device.

In this context, "layer sequence" should be understood to mean a layer sequence comprising more than one layer, for example a sequence of a p-doped and an n-doped semiconductor layer, wherein the layers are arranged one above another and wherein at least one active layer which emits electromagnetic primary radiation is contained.

The layer sequence can be embodied as an epitaxial layer sequence or as a radiation-emitting semiconductor chip having an epitaxial layer sequence, that is to say as an epitaxially grown semiconductor layer sequence. In this case, the layer sequence can be embodied for example on the basis of InGaAlN. InGaAlN-based semiconductor chips and semiconductor layer sequences are, in particular, those in which the epitaxially produced semiconductor layer sequence comprises a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$. Semiconductor layer sequences comprising at least one active layer on the basis of InGaAlN can emit for example electromagnetic radiation in an ultraviolet to blue wavelength range.

Besides the active layer, the active semiconductor layer sequence can comprise further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and combinations thereof. Furthermore, one or more mirror layers can be applied for example on a side of the semiconductor layer sequence facing away from the growth substrate. The structures described here, concerning the active layer or the further functional layers and regions, are known to the person skilled in the art in particular with regard to construction, function and structure and are therefore not explained in greater detail at this juncture.

In one embodiment, the emitted primary radiation of the primary radiation source or of the active layer of the layer sequence is in the near UV range to blue range of the electromagnetic spectrum. In this case, in the near UV range can mean that the emitted primary radiation has a wavelength of between 300 nm and 420 nm inclusive. In this case, in the blue range of the electromagnetic spectrum can mean that the emitted primary radiation has a wavelength of between 420 nm and 500 nm inclusive, advantageously up to and including 460 nm.

In one embodiment, during operation of the lighting device the active layer of the layer sequence emits an electromagnetic primary radiation having a wavelength of between 300 nm and 500 nm inclusive or between 300 nm and 460 nm inclusive, advantageously between 300 nm or 330 nm and 450 nm or 440 nm or 430 nm inclusive.

In accordance with at least one embodiment, the primary radiation source or the layer sequence has a radiation exit surface, above which the conversion element is arranged.

Here and hereinafter the fact that one layer or one element is arranged or applied "on" or "above" another layer or another element can mean in this case that said one layer or said one element is arranged directly in direct mechanical and/or electrical contact on the other layer or the other element. Furthermore, it can also mean that said one layer or said one element is arranged indirectly on or above the other layer or the other element. In this case, further layers and/or elements can then be arranged between said one or the other layer or between said one or the other element.

In this case, the radiation exit surface is a main surface of the primary radiation source or of the layer sequence. The radiation exit surface extends in particular parallel to a main extension plane of the semiconductor layers of the layer sequence. By way of example, at least 75% or 90% of the primary radiation leaving the layer sequence emerges from the layer sequence via the radiation exit surface.

In one embodiment, the conversion element has direct mechanical contact with the primary radiation source or the layer sequence, in particular with the radiation exit surface of the primary radiation source or of the layer sequence.

In one embodiment, the conversion element is arranged over the whole area above the primary radiation source or the layer sequence, in particular the radiation exit surface of the primary radiation source or of the layer sequence.

In one embodiment, the conversion element comprises a matrix material. The phosphor can be distributed in the matrix material; by way of example, the phosphor is distributed homogeneously in the matrix material.

The matrix material is transparent both to the primary radiation and to the secondary radiation and is selected for example from a group of materials consisting of: glasses, silicones, epoxy resins, polysilazanes, polymethacrylates and polycarbonates and combinations thereof. Transparent is understood to mean that the matrix material is at least partly transmissive to the primary radiation and also to the secondary radiation.

In accordance with at least one embodiment, MA, MB, MC, MD, TA, TB, TC, TD, TE and TF are the corresponding monovalent, divalent, trivalent, tetravalent, pentavalent or hexavalent cations. In other words, MA and TA have the oxidation number +1, MB and TB have the oxidation number +2, MC and TC have the oxidation number +3, MD and TD have the oxidation number +4, TE has the oxidation number +5 and TF has the oxidation number +6. XA, XB, XC and XD are, in particular, the anions of the corresponding elements. In this case, XA advantageously has the oxidation number −1, XB the oxidation number −2, XC, that is to say N, the oxidation number −3 and XD, that is to say C, the oxidation number −4.

WO 2013/175336 A1 describes a new family of red-emitting phosphors which have an emission having small values of the full width at half maximum. The phosphors disclosed therein have a proportion of at least 87.5% nitrogen and at most 12.5% oxygen relative to the total amount of anionic elements of the phosphor. In accordance with WO 2013/175336 A1, a higher oxygen content in the phosphors leads to unstable compounds. Consequently, phosphors having an oxygen content of more than 12.5% could not be isolated.

Here and hereinafter the full width at half maximum is understood to mean the spectral width at the level of half the maximum of the emission peak, FWHM for short. The emission peak is understood to mean the peak having the maximum intensity.

The inventors of the present disclosure have surprisingly established that a higher oxygen and/or sulfur proportion, that is to say an oxygen and/or sulfur proportion in the phosphor of more than 12.5 mol % relative to the total substance amount of anionic elements, or a lower nitrogen proportion, that is to say a nitrogen proportion in the phosphor of less than 87.5 mol % relative to the total substance amount of anionic elements, leads to very stable and efficient phosphors having a high quantum efficiency. The phosphors have a high absorptivity in the UV range to green range, in particular between 300 nm and 500 nm or between 300 nm and 460 nm, advantageously between 300 nm and 430 nm or 300 nm and 450 nm, and can thus be efficiently excited by a primary radiation in this wavelength range. The primary radiation can be converted completely (full conversion) or partly (partial conversion) into a radiation of longer wavelength, also called secondary radiation, by the phosphors.

In accordance with at least one embodiment, it advantageously holds true that: $0 \leq m < 0.75$ v or $v \geq l > 0.25$ v, $0 \leq m < 0.625$ v or $v \geq l > 0.375$ v. Particularly advantageously: $0 \leq m < 0.5$ v or $v \geq l > 0.5$ v, $0 \leq m < 0.375$ v or $v \geq l > 0.625$ v, $0 \leq m < 0.25$ v or $v \geq l > 0.7$ v, $0 \leq m < 0.125$ v or $v \geq l > 0.875$ v or $m=0$ or $l=v$.

The inventors have discovered that, surprisingly, with increasing oxygen and/or sulfur content or with decreasing nitrogen content, the peak wavelength of the phosphors shifts toward shorter wavelengths and moreover very stable phosphors result. As a result it is advantageously possible to correspondingly set the desired peak wavelength of the phosphor by varying the oxygen or nitrogen content. Moreover, the peak wavelength and/or the full width at half maximum of the phosphor can be varied by combinations or substitutions of the metals or elements MA, MB, MC, MD, TA, TB, TC, TD, TE, TF, XA, XC, XD and/or XB. A possibility has thus been found of providing phosphors which, in terms of their properties, in particular the peak wavelength and the full width at half maximum, can be adapted in a targeted manner for a corresponding application and in this case are surprisingly also still very stable. In particular, the phosphors can have very narrow values of the full width at half maximum, for example below 50 nm, below 30 nm or below 20 nm, which makes the phosphors interesting for many applications, for example for backlighting applications.

In the present case, "peak wavelength" denotes the wavelength in the emission spectrum at which the maximum intensity is present in the emission spectrum.

In accordance with at least one embodiment, the following hold true for the phosphor having the molecular formula $(MA)_a(MB)_b(MC)_c(MD)_d(TA)_e(TB)_f(TC)_g(TD)_h(TE)_i(TF)_j(XA)_k(XB)_l(XC)_m(XD)_n$:E:
a+b+c+d=1;
e+f+g+h+i+j=4;
k+l+m+n=4;
a+2b+3c+4d+e+2f+3g+4h+5i+6j−k−2l−3m−4n=0    and
m<3.5 or l>0.5. This is therefore an electroneutral phosphor.

In accordance with at least one embodiment, it holds true that n=0, k=0, v=4 and m<3.5 and l>0.5. Then the phosphor thus has the following molecular formula:

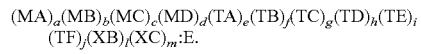

In this case, MA, MB, MC, MD, TA, TB, TC, TD, TE, TF, XC and XB are defined as above. In accordance with this embodiment, the phosphor comprises only nitrogen and oxygen, nitrogen and sulfur or nitrogen, sulfur and oxygen, advantageously only nitrogen and oxygen, as anions. However, this does not exclude the presence of further, including anionic, elements in the form of impurities. It advantageously holds true that m<3.0 and l>1.0; m<2.5 and l>1.5; m<2.0 and l<2.0; m<1.5 and l>2.5; m<1.5 and l>2.5; m<1.0 and l>3.0; m<0.5 and l>3.5 or m=0 and l=4.

In accordance with at least one embodiment, the phosphor has the general molecular formula $(MA)_a(MB)_b(TA)_e(TD)_h(XB)_l(XC)_m$:E.

In this case, the following advantageously hold true:
MA is selected from a group of monovalent metals which comprises Li, Na, K, Rb, Cs, Cu, Ag and combinations thereof. Particularly advantageously, MA is selected from a group of monovalent metals which comprises Li, Na, K, Rb, Cs and combinations thereof, MB is selected from a group of divalent metals which comprises Mg, Ca, Sr, Ba, Zn, Mn, Eu, Yb, Ni, Fe, Co and combinations thereof. Particularly advantageously, MB is selected from a group of divalent metals which comprises Mn, Eu, Yb and combinations thereof. Very particularly advantageously, MB=Eu or a combination of Eu and Mn and/or Yb, TA is selected from a group of monovalent metals which comprises Li, Na, Cu, Ag and combinations thereof. Particularly advantageously, TA is selected from a group of monovalent metals which comprises Li, Na and combinations thereof. Very particularly advantageously, TA=Li, TD is selected from a group of tetravalent metals which comprises Si, Ge, Sn, Mn, Ti, Zr, Hf, Ce and combinations thereof. Particularly advantageously, TD is selected from a group of tetravalent metals which comprises Si, Ge, Sn, Mn, Ti, and combinations thereof. Very particularly advantageously, TD=Si, XB is selected from a group of elements which comprises O, S and combinations thereof. Particularly advantageously, XB=O, XC=N. The following furthermore hold true:
a+b=t,
e+h=u,
l+m=v,
a+2b+e+4h−2l−3m=w
$0.8 \leq t \leq 1$
$3.5 \leq u \leq 4$
$3.5 \leq v \leq 4$
$(-0.2) \leq w \leq 0.2$
$0 \leq m < 0.875$ v and/or $v \geq l > 0.125$ v and
E=Eu, Ce, Yb and/or Mn, advantageously E=Eu.

In accordance with at least one embodiment, the phosphor has the general molecular formula

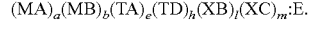

In this case, the following hold true:
MA is selected from a group of monovalent metals which comprises Li, Na, K, Rb, Cs, Cu, Ag and combinations thereof. Advantageously, MA is selected from a group of monovalent metals which comprises Li, Na, K, Rb and combinations thereof, MB is selected from a group of divalent metals which comprises Mg, Ca, Sr, Ba, Zn, Mn, Eu, Yb, Ni, Fe, Co and combinations thereof. It is advantageously selected from a group of divalent metals which comprises Mn, Eu, Yb and combinations thereof. Particularly advantageously, MB=Eu or a combination of Eu with Mn and/or Yb, TA is selected from a group of monovalent metals which comprises Li, Na, Cu, Ag and combinations thereof. Advantageously, TA is selected from a group of monovalent metals which comprises Li, Na and combinations thereof. Particularly advantageously, TA=Li, TD is selected from a group of tetravalent metals which comprises Si, Ge, Sn, Mn, Ti, Zr, Hf, Ce and combinations thereof. Advantageously, TD is selected from a group of tetravalent metals which comprises Si, Ge, Sn, Mn, Ti, and combinations thereof. Particularly advantageously, TD=Si, XB is selected from a group of elements which comprises O, S and combinations thereof. Advantageously, XB=O.

XC=N. The following furthermore hold true:
$a+b=1$;
$e+h=4$;
$l+m=4$;
$a+2b+e+4h-2l-3m=0$ and $m<3.5$ or $l>0.5$ and E=Eu, Ce, Yb and/or Mn, advantageously E=Eu.

In accordance with at least one embodiment, the phosphor has the general molecular formula $(MA)_a(MB)_b(TA)_e(TC)_g(TD)_h(XB)_l(XC)_m$:E auf, wherein MA is selected from a group of monovalent metals which comprises Li, Na, K, Rb, Cs, Cu, Ag and combinations thereof, MB is selected from a group of divalent metals which comprises Mg, Ca, Sr, Ba, Zn, Mn, Eu, Yb, Ni, Fe, Co and combinations thereof, TA is selected from a group of monovalent metals which comprises Li, Na, Cu, Ag and combinations thereof, TC is selected from a group of trivalent metals which comprises B, Al, Ga, In, Y, Fe, Cr, Sc, rare earths and combinations thereof, TD is selected from a group of tetravalent metals which comprises Si, Ge, Sn, Mn, Ti, Zr, Hf, Ce and combinations thereof, XB is selected from a group of elements which comprises O, S and combinations thereof, XC=N
$a+b=t$
$e+g+h=u$
$l+m=v$
$a+2b+e+3g+4h-2l-3m=w$
$0.8 \leq t \leq 1$
$3.5 \leq u \leq 4$
$3.5 \leq v \leq 4$
$(-0.2) \leq w \leq 0.2$ and E=Eu, Ce, Yb and/or Mn. It advantageously holds true that: $0 \leq m < 0.875$ v and/or $v \geq l > 0.125$ v. In accordance with this embodiment, the phosphor comprises only nitrogen and oxygen, nitrogen and sulfur or nitrogen, sulfur and oxygen, advantageously only nitrogen and oxygen, as anions.

In accordance with at least one embodiment, the phosphor has the general molecular formula $(MA)_a(MB)_b(TA)_e(TC)_g(TD)_h(XB)_l(XC)_m$:E auf, wherein MA is selected from a group of monovalent metals which comprises Li, Na, K, Rb, Cs, Cu, Ag and combinations thereof, MB is selected from a group of divalent metals which comprises Mg, Ca, Sr, Ba, Eu and combinations thereof, TA is selected from a group of monovalent metals which comprises Li, Na, Cu, Ag and combinations thereof, TC is selected from a group of trivalent metals which comprises B, Al, Ga and combinations thereof, TD is selected from a group of tetravalent metals which comprises Si, Ge and combinations thereof, XB=O,
XC=N
$a+b=1$
$e+g+h=4$
$l+m=4$
$a+2b+e+3g+4h-2l-3m=0$ and E=Eu, Ce, Yb and/or Mn. Advantageously, $m<3.5$ or $l>0.5$. This is therefore an electroneutral phosphor comprising only nitrogen and oxygen as anions.

In accordance with at least one embodiment, the phosphor has the general molecular formula $(MA)_a(MB)$ b $(TA)$ e $(TC)_g$ (TD) h $(XB)_l(XC)_m$:E, wherein MA is selected from a group of monovalent metals which comprises Li, Na, K and combinations thereof, MB is selected from a group of divalent metals which comprises Mg, Ca, Sr, Ba, Eu and combinations thereof, TA=Li,
TC=Al,
TD=Si,
XB=O,
XC=N
$a+b=1$
$e+g+h=4$
$l+m=4$
$a+2b+e+3g+4h-2l-3m=0$ and E=Eu, Ce, Yb and/or Mn, advantageously E=Eu. Advantageously, $m<3.5$ or $l>0.5$. This is therefore an electroneutral phosphor comprising only nitrogen and oxygen as anions. The phosphor contains within its molecular formula at least Eu, Ce, Yb and/or Mn.

In accordance with at least one embodiment, the phosphor is an oxide, that is to say that only oxygen is present as anionic element in the phosphor. The phosphor then has one of the following general molecular formulae:

$(MA)_1(TA)_3(TD)_1(XB)_4$:E, $(MA)_1(TA)_{3-x}(TD)_{1-x}(TB)_x(TC)_x(XB)_4$:E, $(MA)_{1-x}(MB)_x(TA)_3(TD)_{1-x}(TC)_x(XB)_4$:E, $(MA)_{1-x''}(MB)_x(TA)_{3-x''}(TD)_{1-x''}(TB)_{2x''}(XB)_4$:E, $(MA)_1(TA)_{3-2z}(TB)_{3z}(TD)_{1-z}(XB)_4$:E or $(MA)_1(TA)_3(TD)_{1-2z}(TC)_z(TE)_z(XB)_4$:E, wherein XB=O,
$0 \leq x \leq 1$, for example x=0, 0.1; 0.2; 0.3; 0.4; 0.5; 0.6; 0.7; 0.8; 0.9 or 1, advantageously $0<x<1$, for example x=0.1; 0.2; 0.3; 0.4; 0.5; 0.6; 0.7; 0.8 or 0.9,
$0 \leq x' \leq 1$, for example x'=0, 0.1; 0.2; 0.3; 0.4; 0.5; 0.6; 0.7; 0.8; 0.9 or 1, advantageously $0<x'<1$, for example x'=0.1; 0.2; 0.3; 0.4; 0.5; 0.6; 0.7; 0.8 or 0.9, $0 \leq x'' \leq 1$, for example x''=0, 0.1; 0.2; 0.3; 0.4; 0.5; 0.6; 0.7; 0.8; 0.9 or 1, advantageously 0<x<1, for example x''=0.1; 0.2; 0.3; 0.4; 0.5; 0.6; 0.7; 0.8 or 0.9, $0 \leq z \leq 1$, advantageously z=0, 0.1; 0.2; 0.3; 0.4; 0.5; 0.6; 0.7; 0.8; 0.9 or 1, advantageously 0<z<1, for example z=0.1; 0.2; 0.3; 0.4; 0.5; 0.6; 0.7; 0.8 or 0.9, $0 \leq z' \leq 0.5$, advantageously 0<z'<0.5, for example z'=0, 0.1; 0.2; 0.3 or 0.4, and E is selected from a group comprising Eu, Ce, Yb, Mn and combinations thereof.

Here and hereinafter E can also be referred to as activator. The activator and in particular its surroundings in the host lattice are responsible for the luminescence, in particular the peak wavelength of the emission of the phosphor.

The metals or elements MA, MB, TA, TB, TC, TD, TE and/or XB form in the phosphors in particular the host lattice; in this case, E can partly replace lattice sites of the cationic elements MA, MB, TA, TB, TC, TD and/or TE, or occupy interstitial sites. In particular, in this case E occupies the lattice sites of MA. For charge balancing, the proportion of the further elements, for example that of TA and/or TD, may change.

In accordance with at least one embodiment, the phosphor is an oxide or oxonitride, advantageously an oxonitride, and therefore has in its molecular formula only oxygen or oxygen and nitrogen as anionic elements. In this case, the phosphor can have one of the following general molecular formulae:

$$(MA)_{1-y}(TB)_y(TA)_{3-2y}(TC)_{3y}(TD)_{1-y}(XB)_{4-4y}(XC)_{4y}:E,$$

$$(MA)_{1-y*}(MB)_{y*}(TA)_{3-2y*}(TC)_{3y*}(TD)_{1-y*}(XB)_{4-4y*}(XC)_{4y*}:E,$$

$$(MA)_1(TA)_{3-y}(TC)_y(TD)_1(XB)_{4-2y}(XC)_{2y}:E,$$

$$(MA)_1(TA)_{3-y''}(TB)_{y''}(TD)_1(XB)_{4-y''}(XC)_{y''}:E,$$

$$(MA)_{1-w'''}(MB)_{w'''}(TA)_3(TD)_1(XB)_{4-w'''}(XC)_{w'''}:E,$$

$$(MA)_1(TA)_{3-w'}(TC)_{2w'}(TD)_{1-w'}(XB)_{4-w'}(XC)_{w'}:E \text{ or}$$

$$(MA)_{1-w''}(MB)_{w''}(TA)_{3-w''}(TD)_{1-w''}(TC)_{2w''}(XB)_{4-2w''}(XC)_{2w''}:E,$$

wherein
XB=O,
$0 \leq y \leq 1$, for example y=0; 0.1; 0.2; 0.3; 0.4; 0.5; 0.6; 0.7; 0.8; 0.9 or 1, advantageously 0<y<0.875, for example y=0.1; 0.2; 0.3; 0.4; 0.5; 0.6; 0.7 or 0.8, very particularly advantageously $0 \leq y \leq 0.4$, $0<y*<0.875$ or advantageously $0<y* \leq 0.5$, particularly advantageously $0<y* \leq 0.3$, very particularly advantageously $0<y* \leq 0.1$, $0 \leq y' \leq 2$, for example y'=0, 0.1; 0.2; 0.3; 0.4; 0.5; 0.6; 0.7; 0.8; 0.9; 1.0; 1.1; 1.2; 1.3; 1.4; 1.5; 1.6; 1.7; 1.8; 1.9 or 2.0, advantageously $0<y' \leq 1.75$, particularly advantageously $0 \leq y' \leq 0.9$, $0 \leq y'' \leq 3$, for example y''=0, 0.1; 0.2; 0.3; 0.4; 0.5; 0.6; 0.7; 0.8; 0.9; 1.0; 1.1; 1.2; 1.3; 1.4; 1.5; 1.6; 1.7; 1.8; 1.9; 2.0; 2.1; 2.2; 2.3; 2.4; 2.5; 2.6; 2.7; 2.8; 2.9 or 3.0, advantageously 0<y''<3, particularly advantageously $0<y'' \leq 1.9$, $0 \leq w''' \leq 1$, for example w'''=0, 0.1; 0.2; 0.3; 0.4; 0.5; 0.6; 0.7; 0.8; 0.9 or 1, advantageously 0<w'''<1, $0 \leq w' \leq 1$, for example w'=0, 0.1; 0.2; 0.3; 0.4; 0.5; 0.6; 0.7; 0.8; 0.9 or 1, advantageously 0<w'<1, $0 \leq w'' \leq 1$, for example w''=0, 0.1; 0.2; 0.3; 0.4; 0.5; 0.6; 0.7; 0.8; 0.9 or 1, advantageously 0<w''<1, and E is selected from a group which comprises Eu, Ce, Yb, Mn and combinations thereof.

In accordance with at least one embodiment, E is selected from a group which comprises Eu, Ce, Yb, Mn and combinations thereof. In particular, E is $Eu^{3+}$, $Eu^{2+}$, $Ce^{3+}$, $Yb^{3+}$, $Yb^{2+}$ and/or $Mn^{4+}$.

The metals or elements MA, MB, TA, TB, TC, TD, XC and/or XB form the host lattice in the phosphors; in this case, E can partly replace lattice sites of MA, MB, TA, TB, TC and/or TD, advantageously of MA, or occupy interstitial sites.

By using the activators Eu, Ce, Yb and/or Mn, in particular Eu or Eu in combination with Ce, Yb and/or Mn, it is possible for the color locus of the phosphor in the CIE color space, the peak wavelength λpeak thereof or the dominant wavelength λdom thereof, and the full width at half maximum to be set particularly well.

The dominant wavelength is a possibility for describing non-spectral (polychromatic) light mixtures by spectral (monochromatic) light that produces a similar hue perception. In the CIE color space, the line connecting a point for a specific color and the point CIE-x=0.333, CIE-y=0.333 can be extrapolated such that it meets the contour of the space at two points. The intersection point that is nearer to said color represents the dominant wavelength of the color as wavelength of the pure spectral color at this intersection point. The dominant wavelength is thus the wavelength that is perceived by the human eye.

In accordance with a further embodiment, the activator E can be present in mol % amounts of between 0.1 mol % and 20 mol %, 1 mol % and 10 mol %, 0.5 mol % and 5 mol %, 2 mol % and 5 mol %. Excessively high concentrations of E may lead to a loss of efficiency as a result of concentration quenching. Here and hereinafter, mol % indications for the activator E, in particular Eu, are understood in particular as mol % indications relative to the molar proportions of MA, MB, MC and MD in the respective phosphor.

In accordance with at least one embodiment, the phosphor has one of the following general molecular formulae:

$$(MA)Li_{3-x}Si_{1-x}Zn_xAl_xO_4:E;$$

$$(MA)Li_{3-x}Si_{1-x}Mg_xAl_xO_4:E;$$

$$(MA)_{1-x}Ca_xLi_3Si_{1-x}Al_xO_4:E;$$

$$(MA)_{1-x'}Ca_{x'}Li_{3-x''}Si_{1-x''}Mg_{2x''}O_4:E;$$

$$(MA)Li_{3-2z}Mg_{3z}Si_{1-z}O_4:E;$$

$$(MA)Li_3Si_{1-2z'}Al_{z'}P_{z'}O_4:E.$$

In particular, MA, E, x, x', x'', z and z' are accorded the definitions disclosed above.

Proceeding from the phosphor of the molecular formula $(MA)Li_3SiO_4$:E, in accordance with at least one embodiment, LiSi can be at least partly replaced by ZnAl or MgAl and a phosphor of the formula $(MA)Li_{3-x}Si_{1-x}Zn_xAl_xO_4$:E or $(MA)Li_{3-x}Si_{1-x}Mg_xAl_xO_4$:E is obtained.

Proceeding from the phosphor of the molecular formula $(MA)Li_3SiO_4$:E in accordance with at least one embodiment, (MA)Si can be at least partly replaced by CaAl and a phosphor of the formula $(MA)_{1-x}Ca_xLi_3Si_{1-x}Al_xO_4$:E is obtained.

Proceeding from the phosphor of the molecular formula $(MA)Li_3SiO_4$:E in accordance with at least one embodiment, (MA)LiSi can be at least partly replaced by $CaMg_2$ and a phosphor of the formula $(MA)_{1-x''}Ca_{x''}Li_{3-x''}Si_{1-x''}Mg_{2x''}O_4:E$ is obtained.

Proceeding from the phosphor of the molecular formula $(MA)Li_3SiO_4:E$ in accordance with at least one embodiment, $Li_2Si$ can be at least partly replaced by $Mg_3$ and a phosphor of the formula $(MA)Li_{3-2z}Mg_{3z}Si_{1-z}O_4:E$ is obtained.

Proceeding from the phosphor of the molecular formula $(MA)Li_3SiO_4:E$ in accordance with at least one embodiment, $Si_2$ can be at least partly replaced by AlP and a phosphor of the formula $(MA)Li_3Si_{1-2z}Al_zP_zO_4:E$ is obtained.

In accordance with at least one embodiment, the phosphor has one of the following general molecular formulae:

$(MA)_{1-y}Zn_yLi_{3-2y}Al_{3y}Si_{1-y}O_{4-4y}N_{4y}:E$ $(MA)_{1-y*}Ca_{y*}Li_{3-2y*}Al_{3y*}Si_{1-y*}O_{4-4y*}N_{4y*}:E,$ $(MA)_{1-y*}Sr_{y*}Li_{3-2y*}Al_{3y*}Si_{1-y*}O_{4-4y*}N_{4y*}:E$ $(MA)_{1-y}Eu_{y}Li_{3-2y}Al_{3y}Si_{1-y}O_{4-4y}N_{4y}:E$ $(MA)Li_{3-y}Al_ySiO_{4-2y}N_{2y}:E,$ $(MA)Li_{3-y''}Mg_{y''}SiO_{4-y''}N_{y''}:E,$ $(MA)_{1-w'''}Ca_{w'''}Li_3SiO_{4-w'''}N_{w'''}:E,$ $(MA)Li_{3-w}Al_{2w}Si_{1-w}O_{4-w}N_w:E,$ $(MA)_{1-w''}Ca_{w''}Li_{3-w''}Si_{1-w''}Al_{2w''}O_{4-2w''}N_{2w''}:E.$

In particular, MA, E, y, y*, y', y'', w''', w' and w'' are accorded the definitions disclosed above. It furthermore holds true that $0<y\leq1$, advantageously $0<y<0.875$ or $0<y<0.5$, particularly advantageously $0.05\leq y\leq0.45$, very particularly advantageously $0.1\leq y\leq0.4$, $0.15\leq y\leq0.35$ or $0.2\leq y\leq0.3$ and $0\leq y*\leq1$, advantageously $0<y*<0.875$ or $0<y*\leq0.5$, particularly advantageously $0<y***\leq0.3$.

Proceeding from the phosphor of the molecular formula $(MA)Li_3SiO_4:E$ in accordance with at least one embodiment, $(MA)Li_3SiO_4$ can be at least partly replaced by $CaLiAl_3N_4$ and a phosphor of the formula $(MA)_{1-y*}Ca_{y*}Li_{3-2y*}Al_{3y*}Si_{1-y*}O_{4-4y*}N_{4y*}:E$ is obtained. In this case, MA is selected from a group of monovalent metals which comprises Li, Na, K, Rb, Cs, Cu, Ag and combinations thereof, and E is selected from a group which comprises Eu, Ce, Yb, Mn and combinations thereof. Advantageously, MA is selected from a group of monovalent metals which comprises Li, Na, K, Rb and combinations thereof and E=Eu. Very advantageously, MA=Na. The phosphor is an oxonitridolithoalumosilicate phosphor. It holds true that $0<y*<0.875$, advantageously $0<y*\leq0.5$, particularly advantageously $0<y*\leq0.3$, very particularly advantageously $0<y*\leq0.1$. By way of example, it holds true that $y*=0.01$; 0.02; 0.03; 0.04 or 0.05.

Proceeding from the phosphor of the molecular formula $(MA)Li_3SiO_4:E$ in accordance with at least one embodiment, $(MA)Li_3SiO_4$ can be at least partly replaced by $SrLiAl_3N_4$ and a phosphor of the formula $(MA)_{1-y*}Sr_{y*}Li_{3-2y*}Al_{3y*}Si_{1-y*}O_{4-4y*}N_{4y*}:E$ is obtained. In this case, MA is selected from a group of monovalent metals which comprises Li, Na, K, Rb, Cs, Cu, Ag and combinations thereof and E is selected from a group which comprises Eu, Ce, Yb, Mn and combinations thereof, advantageously, E=Eu. Advantageously, MA is selected from a group of monovalent metals which comprises Li, Na, K, Rb and combinations thereof. Very advantageously, MA=Na. The phosphor is an oxonitridolithoalumosilicate phosphor. It holds true that $0<y*<0.875$, advantageously $0<y*\leq0.5$, particularly advantageously $0<y*\leq0.3$. For example $y***=0.25$.

Proceeding from the phosphor of the molecular formula $(MA)Li_3SiO_4:E$ in accordance with at least one embodiment, $(MA)Li_3SiO_4$ can be at least partly replaced by $EuLiAl_3N_4$ and a phosphor of the formula $(MA)_{1-y}Eu_{y}Li_{3-2y}Al_{3y}Si_{1-y}O_{4-4y}N_{4y}:E$ is obtained. In this case, MA is selected from a group of monovalent metals which comprises Li, Na, K, Rb, Cs, Cu, Ag and combinations thereof, and E is selected from a group which comprises Eu, Ce, Yb, Mn and combinations thereof; advantageously, E=Eu. Advantageously, MA is selected from a group of monovalent metals which comprises Li, Na, K, Rb and combinations thereof. Very advantageously, MA=Na. The phosphor is an oxonitridolithoalumosilicate phosphor. It advantageously holds true that $0<y<0.875$ or $0<y<0.5$, particularly advantageously $0.05\leq y\leq0.45$, very particularly advantageously $0.1\leq y\leq0.4$, $0.15\leq y\leq0.35$ or $0.2\leq y**\leq0.3$. Surprisingly, despite the in some instances very high proportions of Eu, the phosphor does not exhibit any concentration-governed quenching behavior and the associated loss of efficiency. Despite the high proportion of Eu, the phosphor is thus surprisingly very efficient.

Proceeding from the phosphor of the molecular formula $(MA)Li_3SiO_4:E$ in accordance with at least one embodiment, $LiO_2$ can be at least partly replaced by $AlN_2$ and a phosphor of the formula $(MA)Li_{3-y}Al_ySiO_{4-2y}N_{2y}:E$ is obtained.

Proceeding from the phosphor of the molecular formula $(MA)Li_3SiO_4:E$ in accordance with at least one embodiment, LiO can be at least partly replaced by MgN and a phosphor of the formula $(MA)Li_{3-y''}Mg_{y''}SiO_{4-y''}N_{y''}:E$ is obtained.

Proceeding from the phosphor of the molecular formula $(MA)Li_3SiO_4:E$ in accordance with at least one embodiment, (MA)O can be at least partly replaced by CaN and a phosphor of the formula $(MA)_{1-w'''}Ca_{w'''}Li_3SiO_{4-w'''}N_{w'''}:E$ is obtained.

Proceeding from the phosphor of the molecular formula $(MA)Li_3SiO_4:E$ in accordance with at least one embodiment, LiSiO can be at least partly replaced by $Al_2N$ and a phosphor of the formula $(MA)Li_{3w}Al_{2w}Si_{1-w}O_{4-w}N_w:E$ is obtained.

Proceeding from the phosphor of the molecular formula $(MA)Li_3SiO_4:E$ in accordance with at least one embodiment, $(MA)Li_3SiO_2$ can be at least partly replaced by $CaAl_2N_2$ and a phosphor of the formula $(MA)_{1-w''}Ca_{w''}Li_{3-w''}Si_{1-w''}Al_{2w''}O_{4-2w''}N_{2w''}:E$ is obtained.

In accordance with at least one embodiment, MA is selected from a group of monovalent metals which comprises Li, Na, K, Rb, Cs and combinations thereof. By way of example, MA can be chosen as follows: MA=Na, K, (Na,K), (Rb,Li). (Na,K), (Rb,Li) in this case means that a combination of Na and K or a combination of Rb and Li is present. This choice of MA yields particularly efficient phosphors that are applicable in diverse ways.

In accordance with at least one embodiment, the phosphor has one of the following general molecular formulae:

$NaLi_{3-x}Si_{1-x}Zn_xAl_xO_4:E,$ $NaLi_{3-x}Si_{1-x}Mg_xAl_xO_4:E,$ $Na_{1-x}Ca_xLi_3Si_{1-x}Al_xO_4:E,$ $Na_{1-x''}Ca_{x''}Li_{3-x''}Si_{1-x''}Mg_{2x''}O_4$:E, $NaLi_{3-2z}Mg_{3z}Si_{1-z}O_4$:E, $NaLi_3Si_{1-2z'}Al_{z'}P_{z'}O_4$:E.

In particular, x, x', x", z and z' are accorded the meanings mentioned above.

In accordance with at least one embodiment, the phosphor has one of the following general molecular formulae:

$(Na_rK_{1-r})_1Li_{3-x}Si_{1-x}Zn_xAl_xO_4$:E, $(Na_rK_{1-r})_1Li_{3-x}Si_{1-x}Mg_xAl_xO_4$:E, $(Na_rK_{1-r})_{1-x}Ca_xLi_3Si_{1-x}Al_xO_4$:E, $(Na_rK_{1-r})_{1-x''}Ca_{x''}Li_{3-x''}Si_{1-x''}Mg_{2x''}O_4$:E, $(Na_rK_{1-r})_1Li_{3-2z}Mg_{3z}Si_{1-z}O_4$:E, $(Na_rK_{1-r})_1Li_3Si_{1-2z'}Al_{z'}P_{z'}O_4$:E, wherein 0≤r≤1, for example r=0; 0.05; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0. Advantageously, 0≤r≤0.1 or 0.1<r≤0.4 or 0.4<r≤1.0; particularly advantageously r=0, 0.125, 0.25, 0.5 or 1.0. In particular, x, x', x", z and z' are accorded the meanings mentioned above.

In accordance with at least one embodiment, the phosphor has one of the following general molecular formulae:

$(Rb_rLi_{1-r})_1Li_{3-x}Si_{1-x}Zn_xAl_xO_4$:E, $(Rb_rLi_{1-r})_1Li_{3-x}Si_{1-x}Mg_xAl_xO_4$:E, $(Rb_rLi_{1-r})_{1-x}Ca_xLi_3Si_{1-x}Al_xO_4$:E, $(Rb_rLi_{1-r})_{1-x''}Ca_{x''}Li_{3-x''}Si_{1-x''}Mg_{2x''}O_4$:E, $(Rb_rLi_{1-r})_1Li_{3-2z}Mg_{3z}Si_{1-z}O_4$:E, $(Rb_rLi_{1-r})_1Li_3Si_{1-2z'}Al_{z'}P_{z'}O_4$:E, wherein 0≤r'≤1, for example r'=0; 0.05; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0, advantageously 0.25≤r'≤0.75, particularly advantageously 0.4≤r'≤0.6, very particularly advantageously r'=0.5. In particular, x, x', x", z and z' are accorded the meanings mentioned above.

In accordance with at least one embodiment, the phosphor has one of the following general molecular formulae:

$(Na_rK_{1-r})_{1-y*}Ca_{y*}Li_{3-2y*}Al_{3y*}Si_{1-y*}O_{4-4y*}N_{4y*}$:E, $(Na_rK_{1-r})Li_{3-y'}Al_{y'}SiO_{4-2y'}N_{2y'}$:E, $(Na_rK_{1-r})Li_{3-y''}Mg_{y''}SiO_{4-y''}N_{y''}$:E, $(Na_rK_{1-r})_{1-w'''}Ca_{w'''}Li_3SiO_{4-w'''}N_{w'''}$:E, $(Na_rK_{1-r})Li_{3-w'}Al_{2w'}Si_{1-w'}O_{4-w'}N_{w'}$:E, $(Na_rK_{1-r})_{1-w''}Ca_{w''}Li_{3-w''}Si_{1-w''}Al_{2w''}O_{4-2w''}N_{2w''}$:E, wherein 0≤r≤1, for example r=0; 0.05; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0. Advantageously, 0≤r≤0.1 or 0.1<r≤0.4 or 0.4<r≤1.0; particularly advantageously r=0, 0.25, 0.5 or 1.0. In particular, y*, y', y", w''', w' and w" are accorded the meanings mentioned above.

In accordance with at least one embodiment, the phosphor has one of the following general molecular formulae:

$(Rb_rLi_{1-r})_{1-y*}Ca_{y*}Li_{3-2y*}Al_{3y*}Si_{1-y*}N_{4y*}$:E, $(Rb_rLi_{1-r})Li_{3-y'}Al_{y'}SiO_{4-2y'}N_{2y'}$:E, $(Rb_rLi_{1-r})Li_{3-y''}Mg_{y''}SiO_{4-y''}N_{y''}$:E, $(Rb_rLi_{1-r})_{1-w'''}Ca_{w'''}Li_3SiO_{4-w'''}N_{w'''}$:E, $(Rb_rLi_{1-r})Li_{3-w'}Al_{2w'}Si_{1-w'}O_{4-w'}N_{w'}$:E, $(Rb_rLi_{1-r})_{1-w''}Ca_{w''}Li_{3-w''}Si_{1-w''}Al_{2w''}O_{4-2w''}N_{2w''}$:E, wherein 0≤r'≤1, for example r'=0; 0.05; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0, advantageously 0.25≤r'≤0.75, particularly advantageously 0.4≤r'≤0.6, very particularly advantageously r'=0.5. In particular, y*, y', y", w''', w' and w" are accorded the meanings mentioned above.

In accordance with at least one embodiment, the phosphor has one of the following general molecular formulae:

$Na_{1-y*}Ca_{y*}Li_{3-2y*}Al_{3y*}Si_{1-y*}O_{4-4y*}N_{4y*}$:E, $NaLi_{3-y'}Al_{y'}SiO_{4-2y'}N_{2y'}$:E, $NaLi_{3-y''}Mg_{y''}SiO_{4-y''}N_{y''}$:E, $Na_{1-w'''}Ca_{w'''}Li_3SiO_{4-w'''}N_{w'''}$:E, $NaLi_{3-w'}Al_{2w'}Si_{1-w'}O_{4-w'}N_{w'}$:E, $Na_{1-w''}Ca_{w''}Li_{3-w''}Si_{1-w''}Al_{2w''}O_{4-2w''}N_{2w''}$:E.

In particular, y*, y', y", w''', w' and w" are accorded the meanings mentioned above.

In accordance with at least one embodiment, the phosphor has the general molecular formula $(MA)_1(TA)_3(TD)_1(XB)_4$:E. In this case, MA is selected from a group of monovalent metals which comprises Li, Na, K, Rb, Cs, Cu, Ag and combinations thereof. Advantageously, MA is selected from a group of monovalent metals which comprises Li, Na, K, Rb, Cs and combinations thereof. TA is selected from a group of monovalent metals which comprises Li, Na, Cu, Ag and combinations thereof. TD is selected from a group of tetravalent metals which comprises Si, Ge, Sm, Mn, Ti, Zr, Hf, Ce and combinations thereof. XB is selected from a group of elements which comprises O, S and combinations thereof. E is selected from a group which comprises Eu, Ce, Yb, Mn and combinations thereof; advantageously, E=Eu. In particular, E occupies the lattice sites of MA or interstitial sites. For charge balancing, in this case the proportion of the further elements, for example that of TA and/or TD, may change. By way of example, E=$Eu^{2+}$ and replaces $MA^+$ in the molecular formula; the charge balancing is effected by changing the proportion of TA and/or TD.

In accordance with at least one embodiment, the phosphor has the general molecular formula $(MA)_1(TA)_3(TD)_1(XB)_4$:E. In this case, MA is selected from a group of monovalent metals which comprises Li, Na, K, Rb, Cs and combinations thereof. TA=Li, TD=Si, XB=O and E is selected from a group which comprises Eu, Ce, Yb, Mn and combinations thereof. It advantageously holds true that: E=Eu or a combination of Eu with Ce, Yb and/or Mn.

Surprisingly, it has been found that the properties of the phosphor, in particular with regard to the peak wavelength and the full width at half maximum, can be changed considerably by varying the composition of MA. Moreover, the phosphors have a high absorptivity of primary radiation in the range of 300 nm to 460 nm or 300 nm to 500 nm, in particular between 300 nm and 450 nm or 300 nm and 430 nm.

By way of example, the phosphor of the formula NaLi$_3$SiO$_4$:Eu, upon excitation with a primary radiation having a wavelength of 400 nm, emits in the blue spectral range of the electromagnetic spectrum and exhibits a narrowband emission, that is to say an emission having a small full width at half maximum. By contrast, upon excitation with a primary radiation having a wavelength of 400 nm, the phosphor of the formula KLi$_3$SiO$_4$:Eu exhibits very broadband emission from the blue to red spectral range, thus giving rise to a white-colored luminous impression. The phosphors of the formula (Na$_{0.5}$K$_{0.5}$)Li$_3$SiO$_4$:Eu, (Rb$_{0.25}$Na$_{0.75}$)Li$_3$SiO$_4$:Eu, (Cs$_{0.25}$Na$_{0.5}$K$_{0.25}$)Li$_3$SiO$_4$:Eu, (Rb$_{0.25}$Na$_{0.5}$K$_{0.25}$)Li$_3$SiO$_4$:Eu and (Cs$_{0.25}$Na$_{0.25}$Rb$_{0.25}$Li$_{0.25}$)Li$_3$SiO$_4$:Eu exhibit narrowband emission in the blue-green spectral range of the electromagnetic spectrum and the phosphors of the formula (Rb$_{0.5}$Li$_{0.5}$)Li$_3$SiO$_4$:Eu, (Rb$_{0.5}$Na$_{0.5}$)Li$_3$SiO$_4$:Eu, (Na$_{0.25}$K$_{0.75}$)Li$_3$SiO$_4$:Eu, (Na$_{0.25}$K$_{0.50}$Li$_{0.25}$)Li$_3$SiO$_4$:Eu and (Cs$_{0.25}$Na$_{0.25}$K$_{0.25}$Li$_{0.25}$)Li$_3$SiO$_4$:Eu exhibit narrowband emission in the green spectral range of the electromagnetic spectrum. Upon excitation with a primary radiation having a wavelength of 460 nm, the phosphor of the formula Na$_{0.125}$K$_{0.875}$Li$_3$SiO$_4$:Eu has a band in the yellow-orange range. Besides the latter, Na$_{0.125}$K$_{0.875}$Li$_3$SiO$_4$:Eu exhibits a further emission peak having high intensity in the blue-green range.

The properties of the phosphors are presented in the table below:

|  | $\lambda_{prim}$ | $\lambda_{peak}$ | $\lambda_{dom}$ | FWHM |
| --- | --- | --- | --- | --- |
| NaLi$_3$SiO$_4$:Eu | 400 nm | 469 nm | 473 nm | 32 nm |
| KLi$_3$SiO$_4$:Eu | 400 nm | 616 nm | 585 nm | 143 nm |
| (Na$_{0.5}$K$_{0.5}$)Li$_3$SiO$_4$:Eu | 400 nm | 486 nm | 493 nm | 19.2 nm |
| (Rb$_{0.5}$Li$_{0.5}$)Li$_3$SiO$_4$:Eu | 400 nm | 528 nm | 538.7 nm | 42.8 nm |
| (Na$_{0.25}$K$_{0.75}$)Li$_3$SiO$_4$:Eu | 400 nm | 529 nm | 541.4 nm | 45 nm |
| (Na$_{0.25}$K$_{0.5}$Li$_{0.25}$)Li$_3$SiO$_4$:Eu | 460 nm | 532 nm | 540.3 nm | 45.6 nm |
| (Rb$_{0.5}$Na$_{0.5}$)Li$_3$SiO$_4$:Eu | 460 nm | 528 nm | 533 nm | 43.3 nm |
| (Rb$_{0.25}$Na$_{0.75}$)Li$_3$SiO$_4$:Eu | 400 nm | 473 nm | 476 nm | 22.2 nm |
| (Cs$_{0.25}$Na$_{0.25}$K$_{0.25}$Li$_{0.25}$)Li$_3$SiO$_4$:Eu | 400 nm | 530 nm | 532 nm | 46 nm |
| (Cs$_{0.25}$Na$_{0.5}$K$_{0.25}$)Li$_3$SiO$_4$:Eu | 400 nm | 486 nm | 497 nm | 26 nm |
| (Rb$_{0.25}$Na$_{0.5}$K$_{0.25}$)Li$_3$SiO$_4$:Eu | 400 nm | 480 nm | 490 nm | 27 nm |
| (Cs$_{0.25}$Na$_{0.25}$Rb$_{0.25}$Li$_{0.25}$)Li$_3$SiO$_4$:Eu | 400 nm | 473 nm | 489 nm | 24 nm |
| Na$_{0.125}$K$_{0.875}$Li$_3$SiO$_4$:Eu | 460 nm | 516 nm | 554 nm | 60 nm |

By virtue of the different emission properties, the phosphors are suitable for a wide variety of applications.

The blue or blue-green spectral range is understood to mean the range of the electromagnetic spectrum between 420 nm and 520 nm.

The green spectral range is understood to mean the range of the electromagnetic spectrum between 520 nm and 580 nm inclusive.

The red spectral range is understood to mean the range of the electromagnetic spectrum between 630 nm and 780 nm.

The yellow or yellow-orange spectral range is understood to mean the range of the electromagnetic spectrum between 580 nm and 630 nm.

In accordance with at least one embodiment, the phosphor has the general molecular formula (Na$_r$K$_{1-r}$)$_1$(TA)$_3$(TD)$_1$(XB)$_4$:E, where 0≤r≤1, for example r=0; 0.05; 0.1; 0.125; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0. Advantageously, 0≤r≤0.1 or 0.1<r≤0.4 or 0.4<r≤1.0; particularly advantageously r=0, 0.125, 0.25, 0.5 or 1.0. Advantageously, TA=Li, TD=Si, XB=O and E=Eu, Ce, Yb and/or Mn, advantageously E=Eu. Surprisingly, the properties of the phosphor, in particular the peak wavelength and the full width at half maximum, change upon variation of the proportions of Na and K in the phosphor. As a result, a wide variety of applications are usable by virtue of these phosphors.

In accordance with at least one embodiment, the phosphor (Na$_r$K$_{1-r}$)$_1$(TA)$_3$(TD)$_1$(XB)$_4$:E or (Na$_r$K$_{1-r}$)Li$_3$SiO$_4$:E crystallizes in a tetragonal, monoclinic or triclinic crystal system, in particular in a tetragonal or triclinic crystal system. Advantageously, the phosphor in accordance with this embodiment crystallizes in the space group I4$_1$/a, I4/m or P-1. Particularly advantageously, the phosphor in accordance with this embodiment crystallizes in a tetragonal crystal system with the space group I4$_1$/a or I4/m or in a triclinic crystal system with the space group P-1.

In accordance with at least one embodiment, the phosphor has the formula (Na$_r$K$_{1-r}$)$_1$(TA)$_3$(TD)$_1$(XB)$_4$:E where 0.4<r≤1, advantageously 0.45<r≤1, very particularly advantageously r=0.5 or 1. Advantageously, TA=Li, TD=Si, XB=O and E=Eu, Ce, Yb and/or Mn, and the phosphor has the formula (Na$_r$K$_{1-r}$)Li$_3$SiO$_4$:E. Advantageously, it holds true that E=Eu. By way of example, the phosphor has the formula NaLi$_3$SiO$_4$:Eu or (Na$_{0.5}$K$_{0.5}$)Li$_3$SiO$_4$:Eu. The peak wavelength of the phosphor is in the blue spectral range, in particular in the range between 450 nm and 500 nm.

The phosphor (Na$_r$K$_{1-r}$)$_1$(TA)$_3$(TD)$_1$(XB)$_4$:E or (Na$_r$K$_{1-r}$)Li$_3$SiO$_4$:E where 0.4<r≤1, for example NaLi$_3$SiO$_4$:Eu or (Na$_{0.5}$K$_{0.5}$)Li$_3$SiO$_4$:Eu, is suitable in particular for use in conversion LEDs which emit white radiation. To that end, the phosphor can be combined with a red and green phosphor.

Moreover, the phosphor (Na$_r$K$_{1-r}$)$_1$(TA)$_3$(TD)$_1$(XB)$_4$:E or (Na$_r$K$_{1-r}$)Li$_3$SiO$_4$:E where 0.4<r≤1, in particular (Na$_{0.5}$K$_{0.5}$)Li$_3$SiO$_4$:Eu, is suitable for use in lighting devices such as conversion LEDs which emit a blue radiation.

In accordance with at least one embodiment, the phosphor has the formula (Na$_r$K$_{1-r}$)$_1$(TA)$_3$(TD)$_1$(XB)$_4$:E where 0.2<r≤0.4, advantageously 0.2<r≤0.3, very particularly advantageously r=0.25. Advantageously, TA=Li, TD=Si and XB=O and the phosphor has the formula (Na$_r$K$_{1-r}$)Li$_3$SiO$_4$:E. E is selected from a group which comprises Eu, Mn, Ce, Yb and combinations thereof; advantageously, E=Eu. By way of example, the phosphor has the formula (Na$_{0.25}$K$_{0.75}$)Li$_3$SiO$_4$:Eu. The peak wavelength of the phosphor is in the green spectral range, in particular.

The phosphor (Na$_r$K$_{1-r}$)$_1$(TA)$_3$(TD)$_1$(XB)$_4$:E or (Na$_r$K$_{1-r}$)Li$_3$SiO$_4$:E where 0.2<r≤0.4, advantageously 0.2<r≤0.4, particularly advantageously 0.2<r≤0.3, very particularly advantageously r=0.25, is suitable in particular for use in conversion LEDs for the backlighting of displays.

Moreover, the phosphor (Na$_r$K$_{1-r}$)$_1$(TA)$_3$(TD)$_1$(XB)$_4$:E or (Na$_r$K$_{1-r}$)Li$_3$SiO$_4$:E where 0.2<r≤0.4, advantageously 0.2<r≤0.4, in particular $(Na_{0.25}K_{0.75})Li_3SiO_4$:Eu, is suitable for use in lighting devices such as conversion LEDs which emit a green radiation.

In accordance with at least one embodiment, the phosphor has the formula $(Na_rK_{1-r})_1(TA)_3(TD)_1(XB)_4$:E where 0.05<r≤0.2, advantageously 0.1<r≤0.2. Advantageously, TA=Li, TD=Si and XB=O and the phosphor has the formula $(Na_rK_{1-r})Li_3SiO_4$:E. E is selected from a group which comprises Eu, Mn, Ce, Yb and combinations thereof; advantageously, E=Eu. By way of example, the phosphor is $Na_{0.125}K_{0.875}Li_3SiO_4$:Eu.

Surprisingly, the phosphor of the formula $(Na_rK_{1-r})_1(TA)_3(TD)_1(XB)_4$:E or $(Na_rK_{1-r})Li_3SiO_4$:E where 0.05<r≤0.2 has a wide emission band. In particular, besides the band having the highest intensity (=peak wavelength), the phosphor has a further emission peak, which has an intensity of similar magnitude to that of the emission peak at the peak wavelength.

The phosphor $(Na_rK_{1-r})_1(TA)_3(TD)_1(XB)_4$:E or $(Na_rK_{1-r})Li_3SiO_4$:E where 0.05<r≤0.2, advantageously 0.1<r≤0.2, in particular $Na_{0.125}K_{0.875}Li_3SiO_4$:Eu, is suitable for example for use in lighting devices such as conversion LEDs which emit white radiation. By virtue of the wide emission, in particular the two emission peaks in the blue or blue-green range and in the yellow-orange range, the phosphor can advantageously be used as sole phosphor in a lighting device such as a conversion LED. In particular, with such a conversion LED it is possible to generate a white overall radiation having color temperatures above 8000 K and a high color rendering index and great color space coverage, which can be used in particular for general lighting and backlighting of displays.

In accordance with at least one embodiment, the phosphor has the formula $(Na_rK_{1-r})_1(TA)_3(TD)_1(XB)_4$:E where 0≤r≤0.05, advantageously r=0. Advantageously, TA=Li, TD=Si and XB=O and the phosphor has the formula $(Na_rK_{1-r})Li_3SiO_4$:E. E is selected from a group which comprises Eu, Mn, Ce, Yb and combinations thereof, advantageously, E=Eu. By way of example, the phosphor is $KLi_3SiO_4$:Eu. The phosphor exhibits very broadband emission from the blue to red spectral range, thus giving rise to a white luminous impression.

The phosphor $(Na_rK_{1-r})_1(TA)_3(TD)_1(XB)_4$:E or $(Na_rK_{1-r})Li_3SiO_4$:E where 0≤r≤0.05, in particular $KLi_3SiO_4$:Eu, is suitable for example for use in lighting devices such as conversion LEDs which emit white radiation. As a result of the wide emission of the phosphor, the latter can advantageously be used as sole phosphor in a lighting device such as a conversion LED.

In accordance with at least one embodiment, the phosphor has the general molecular formula $(Rb_{r'}Li_{1-r'})_1(TA)_3(TD)_1(XB)_4$:E, wherein 0≤r'≤1, for example r'=0; 0.05; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95; 1.0, advantageously 0.25≤r'≤0.75, particularly advantageously 0.4≤r'≤0.6, very particularly advantageously r'=0.5. Advantageously, TA=Li, TD=Si and XB=O and the phosphor has the formula $(Rb_{r'}Li_{1-r'})Li_3SiO_4$:E. E is selected from a group which comprises Eu, Mn, Ce, Yb and combinations thereof; advantageously, E=Eu. It has been found that these phosphors have a small full width at half maximum and are applicable in diverse ways.

In accordance with at least one embodiment, the phosphor has the general molecular formula $(K,Na,Li,Cs)_1(TA)_3(TD)_1(XB)_4$:E, wherein K, Na, Li and Cs are contained in the phosphor. Advantageously, TA=Li, TD=Si and XB=O and the phosphor has the formula $(K,Na,Li,Cs)Li_3SiO_4$:E. E is selected from a group which comprises Eu, Mn, Ce, Yb and combinations thereof; advantageously, E=Eu. Particularly advantageously, the phosphor has the formula $(Cs_{0.25}Na_{0.25}K_{0.25}Li_{0.25})(TA)_3(TD)_1(XB)_4$:E or $(Cs_{0.25}Na_{0.25}K_{0.25}Li_{0.25})Li_3SiO_4$:E. The peak wavelength of the phosphor is in the green spectral range, in particular, and has a full width at half maximum of less than 50 nm.

In accordance with at least one embodiment, the phosphor has the general molecular formula $(Rb,Na,Li,Cs)_1(TA)_3(TD)_1(XB)_4$:E, wherein Rb, Na, Li and Cs are contained in the phosphor.

Advantageously, TA=Li, TD=Si and XB=O and the phosphor has the formula $(Rb,Na,Li,Cs) Li_3SiO_4$:E. E is selected from a group which comprises Eu, Mn, Ce, Yb and combinations thereof; advantageously, E=Eu. Particularly advantageously, the phosphor has the formula $(Cs_{0.25}Na_{0.25}Rb_{0.25}Li_{0.25})(TA)_3(TD)_1(XB)_4$:E or $(Cs_{0.25}Na_{0.25}Rb_{0.25}Li_{0.25})Li_3SiO_4$:E. The peak wavelength of the phosphor is in the blue spectral range, in particular, and has a full width at half maximum of less than 30 nm.

In accordance with at least one embodiment, the phosphor has the general molecular formula $(Cs,Na,K)_1(TA)_3(TD)_1(XB)_4$:E, wherein Na, K and Cs are contained in the phosphor. Advantageously, TA=Li, TD=Si and XB=O and the phosphor has the formula $(Cs,Na,K)Li_3SiO_4$:E. E is selected from a group which comprises Eu, Mn, Ce, Yb and combinations thereof; advantageously, E=Eu. Particularly advantageously, the phosphor has the formula $(Cs_{0.25}Na_{0.50}K_{0.25})(TA)_3(TD)_1(XB)_4$:E or $(Cs_{0.25}Na_{0.50}K_{0.25})Li_3SiO_4$:E. The peak wavelength of the phosphor is in the blue spectral range, in particular, and has a full width at half maximum of less than 30 nm.

In accordance with at least one embodiment, the phosphor has the general molecular formula $(Rb,Na,K)_1(TA)_3(TD)_1(XB)_4$:E, wherein Na, K and Rb are contained in the phosphor. Advantageously, TA=Li, TD=Si and XB=O and the phosphor has the formula $(Rb,Na,K) Li_3SiO_4$:E. E is selected from a group which comprises Eu, Mn, Ce, Yb and combinations thereof; advantageously, E=Eu. Particularly advantageously, the phosphor has the formula $(Rb_{0.25}Na_{0.50}K_{0.25})(TA)_3(TD)_1(XB)_4$:E or $(Rb_{0.25}Na_{0.50}K_{0.25}) Li_3SiO_4$:E. The peak wavelength of the phosphor is in the blue spectral range, in particular, and has a full width at half maximum of less than 30 nm.

The phosphors $(Rb,Na,Li,Cs)_1(TA)_3(TD)_1(XB)_4$:E, $(Cs,Na,K)_1(TA)_3(TD)_1(XB)_4$:E and $(Rb,Na,K)_1(TA)_3(TD)_1(XB)_4$:E are suitable in particular for use in conversion LEDs which emit white radiation. To that end, the phosphor can be combined in each case with a red and green phosphor. Moreover, these phosphors are suitable for use in lighting devices such as conversion LEDs which emit a blue radiation.

In accordance with at least one embodiment, the phosphor $(Rb,Na,Li,Cs)_1(TA)_3(TD)_1(XB)_4$:E, $(K,Na,Li,Cs)_1(TA)_3(TD)_1(XB)_4$:E, $(Rb,Na,K)_1(TA)_3(TD)_1(XB)_4$:E, $(Cs,Na,K)(TA)_3(TD)_1(XB)_4$:E, $(K,Na,Li,Cs) Li_3SiO_4$:E, $(Rb,Na,Li,Cs) Li_3SiO_4$:E, $(Rb,Na,K) Li_3SiO_4$:E or $(Cs,Na,K) Li_3SiO_4$:E crystallizes in a tetragonal crystal system. Advantageously, the phosphor in accordance with this embodiment crystallizes in the space group I4/m. Particularly advantageously, the phosphor in accordance with this embodiment crystallizes in a tetragonal crystal system with I4/m.

In accordance with at least one embodiment, the phosphor has the general molecular formula

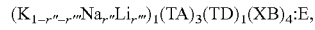

wherein $0<r''<0.5$ and $0<r'''<0.5$, for example $r''=0.05$; 0.1; 0.15; 0.2; 0.25; 0.3; 0.35, 0.4; 0.45 and $r'''=0.05$; 0.1; 0.15; 0.2; 0.25; 0.3; 0.35, 0.4; 0.45. Advantageously, $0.1<r'<0.4$ and $0.1<r'''<0.4$, particularly advantageously $0.2<r''<0.3$ and $0.2<r'''<0.3$. Advantageously, TA=Li, TD=Si and XB=O and the phosphor has the formula $(K_{1-r''-r'''}Na_{r''}Li_{r'''})_1Li_3SiO_4$:E. E is selected from a group which comprises Eu, Mn, Ce, Yb and combinations thereof; advantageously, E=Eu. Surprisingly, the properties of the phosphor, in particular the peak wavelength and the full width at half maximum, change upon variation of the proportions of Na, Li and K in the phosphor.

As a result, these phosphors can be used in a wide variety of applications. By way of example, the phosphor has the formula $(K_{0.5}Na_{0.25}Li_{0.25})Li_3SiO_4$:Eu. The peak wavelength of the phosphor is in the green spectral range, in particular, and has a full width at half maximum of less than 50 nm.

In accordance with at least one embodiment, the phosphor $(K_{1-r''-r'''}Na_{r''}Li_{r'''})_1(TA)_3(TD)_1(XB)_4$:E or $(K_{1-r''-r'''}Na_{r''}Li_{r'''})_1Li_3SiO_4$:E crystallizes in a tetragonal or monoclinic crystal system. Advantageously, the phosphor in accordance with this embodiment crystallizes in the space group I4/m or C2/m. Particularly advantageously, the phosphor in accordance with this embodiment crystallizes in a tetragonal crystal system with the space group I4/m or in a monoclinic crystal system with the space group C2/m, particularly advantageously in a monoclinic crystal system with the space group C2/m.

In accordance with at least one embodiment, the phosphor has the general molecular formula $(Rb_{r*}Na_{1-r*})_1(TA)_3(TD)_1(XB)_4$:E, wherein $0<r*<1$, for example $r*=0.05$; 0.1; 0.15; 0.2; 0.25; 0.3; 0.35, 0.4; 0.45; 0.5; 0.55; 0.6; 0.65; 0.7; 0.75; 0.8; 0.85; 0.9; 0.95. Advantageously, TA=Li, TD=Si and XB=O and the phosphor has the formula $(Rb_{r*}Na_{1-r*})Li_3SiO_4$:E. E is selected from a group which comprises Eu, Mn, Ce, Yb and combinations thereof; advantageously E=Eu.

In accordance with at least one embodiment, the phosphor $(Rb_{r*}Na_{1-r*})_1(TA)_3(TD)_1(XB)_4$:E or $(Rb_{r*}Na_{1-r*})Li_3SiO_4$:E crystallizes in a tetragonal or monoclinic crystal system. Advantageously, the phosphor in accordance with this embodiment crystallizes in the space group I4/m or C2/m. Particularly advantageously, the phosphor in accordance with this embodiment crystallizes in a tetragonal crystal system with the space group I4/m or in a monoclinic crystal system with the space group C2/m.

In accordance with at least one embodiment, the phosphor has the general molecular formula $(Rb_{r*}Na_{1-r*})_1(TA)_3(TD)_1(XB)_4$:E, wherein $0.4 \leq r* <1.0$, advantageously $0.4 \leq r* <0.875$ or $0.4 \leq r* \leq 0.75$, particularly advantageously $0.4 \leq r* \leq 0.6$ very particularly advantageously $r*=0.5$. Advantageously, TA=Li, TD=Si and XB=O and the phosphor has the formula $(Rb_{r*}Na_{1-r*})Li_3SiO_4$:E. E is selected from a group which comprises Eu, Mn, Ce, Yb and combinations thereof; advantageously E=Eu. By way of example, the phosphor has the formula $(Rb_{0.5}Na_{0.5})Li_3SiO_4$:Eu. The peak wavelength of the phosphor is in the green spectral range, in particular, and has a full width at half maximum of between 42 and 44 nm.

In accordance with at least one embodiment, the phosphor has the general molecular formula $(Rb_{r*}Na_{1-r*})_1(TA)_3(TD)_1(XB)_4$:E, wherein $0<r*<0.4$, for example $r*=0.05$; 0.1; 0.15; 0.2; 0.25; 0.3; 0.35, advantageously $0.1 \leq r* \leq 0.35$, particularly advantageously $0.2 \leq r* \leq 0.3$, very particularly advantageously $r*=0.25$. Advantageously, TA=Li, TD=Si and XB=O and the phosphor has the formula $(Rb_{r*}Na_{1-r*})Li_3SiO_4$:E. E is selected from a group which comprises Eu, Mn, Ce, Yb and combinations thereof; advantageously E=Eu. The peak wavelength of the phosphor is advantageously in the blue spectral range and has a full width at half maximum of between 20 and 24 nm.

The phosphor $(Rb_{r*}Na_{1-r*})_1(TA)_3(TD)_1(XB)_4$:E or $(Rb_{r*}Na_{1-r*})Li_3SiO_4$:E where $0<r*<0.4$, advantageously $0.1 \leq r* \leq 0.35$, particularly advantageously $0.2 \leq r* \leq 0.3$, very particularly advantageously $r*=0.25$, is suitable in particular for use in conversion LEDs which emit white radiation. To that end, the phosphor can be combined with a red and green phosphor.

Moreover, the phosphor $(Rb_{r*}Na_{1-r*})_1(TA)_3(TD)_1(XB)_4$:E or $(Rb_{r*}Na_{1-r*})Li_3SiO_4$:E where $0<r*<0.4$, advantageously $0.1 \leq r* \leq 0.35$, particularly advantageously $0.2 \leq r* \leq 0.3$, very particularly advantageously $r*=0.25$, is suitable for use in lighting devices such as conversion LEDs which emit a blue radiation.

In accordance with at least one embodiment, the phosphor has the formula $(Na_rK_{1-r})_1(TA)_3(TD)_1(XB)_4$:E or $(Na_rK_{1-r})Li_3SiO_4$:E where $0.2<r \leq 0.4$, advantageously $0.2<r \leq 0.3$, particularly advantageously $r=0.25$ or $(Rb_{r'}Li_{1-r'})_1(TA)_3(TD)_1(XB)_4$:E or $(Rb_{r'}Li_{1-r'})Li_3SiO_4$:E where $0 \leq r' \leq 1$, advantageously $0.25 \leq r' \leq 0.75$, particularly advantageously $0.4 \leq r' \leq 0.6$. Advantageously, TA=Li, TD=Si and XB=O. The peak wavelength of the phosphor is in the green spectral range, in particular, and has a full width at half maximum of less than 50 nm.

Surprisingly, the phosphors according to the present disclosure $(Na_rK_{1-r})_1(TA)_3(TD)_1(XB)_4$:E where $0.2<r \leq 0.4$, $(Rb_{r'}Li_{1-r'})_1(TA)_3(TD)_1(XB)_4$:E where $0 \leq r' \leq 1$, $(K_{1-r''-r'''}Na_{r''}Li_{r'''})_1(TA)_3(TD)_1(XB)_4$:E where $0<r''<0.5$ and $0<r'''<0.5$, (K,Na,Li,Cs) $(TA)_3(TD)_1(XB)_4$:E, and $(Rb_{r*}Na_{1-r*})_1(TA)_3(TD)_1(XB)_4$:E where $0.4 \leq r*<1.0$, for example $(Rb_{0.5}Li_{0.5})$ $Li_3SiO_4$:Eu, $(Na_{0.25}K_{0.75})$ $Li_3SiO_4$:Eu, $(Na_{0.25}K_{0.50}Li_{0.25})$ $Li_3SiO_4$:Eu, $(Cs_{0.25}Na_{0.25}K_{0.25}Li_{0.25})$ $Li_3SiO_4$:Eu and $(Rb_{0.5}Na_{0.5})$ $Li_3SiO_4$:Eu, have a peak wavelength in the green spectral range and a very small full width at half maximum and are therefore suitable in particular for white-emitting lighting devices such as, for example, white-emitting conversion LEDs in conjunction with a semiconductor chip that emits a blue primary radiation and with a red phosphor for backlighting applications in particular for display elements such as displays. Advantageously, a particularly large bandwidth of colors can be achieved with such a white-emitting conversion LED. As a result of the small full width at half maximum of the phosphors according to the present disclosure $(Na_rK_{1-r})_1(TA)_3(TD)_1(XB)_4$:E where $0.2<r \leq 0.4$, $(Rb_{r'}Li_{1-r'})_1(TA)_3(TD)_1(XB)_4$:E where $0 \leq r' \leq 1$, $(K_{1-r''-r'''}Na_{r''}Li_{r'''})_1(TA)_3(TD)_1(XB)_4$:E where $0<r''<0.5$ where $0<r'''<0.5$, (K,Na,Li,Cs) $(TA)_3(TD)_1(XB)_4$:E and $(Rb_{r*}Na_{1-r*})_1(TA)_3(TD)_1(XB)_4$:E where $0.4 \leq r*<1.0$ for example $(Rb_{0.5}Li_{0.5})$ $Li_3SiO_4$:Eu, $(Na_{0.25}K_{0.75})$ $Li_3SiO_4$:Eu, $(Na_{0.25}K_{0.50}Li_{0.25})$ $Li_3SiO_4$:Eu, $(Cs_{0.25}Na_{0.25}K_{0.25}Li_{0.25})$ $Li_3SiO_4$:Eu and $(Rb_{0.5}Na_{0.5})$ $Li_3SiO_4$:Eu, the emission peaks exhibit a very large overlap with the transmission range of a standard green filter, such that only little light is lost and the achievable color space is large.

In accordance with at least one embodiment, the phosphor has the following general molecular formula:

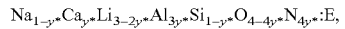

$$Na_{1-y*}Ca_{y*}Li_{3-2y*}Al_{3y*}Si_{1-y*}O_{4-4y*}N_{4y*}:E,$$

wherein $0<y*<0.875$; advantageously $0<y* \leq 0.5$, particularly advantageously $0<y* \leq 0.3$, very particularly advantageously $0<y* \leq 0.1$. By way of example, $y*=0.01$; 0.02; 0.03, 0.04 or 0.05. E is selected from a group which comprises Eu, Mn, Ce, Yb and combinations thereof. Advantageously, E=Eu or $Eu^{2+}$.

Surprisingly, it has been found that the phosphor of the formula $NaLi_3SiO_4$:Eu has an isotypic crystal structure with respect to the known phosphor $CaLiAl_3N_4$:Eu. The fact that two compounds crystallize in an isotypic crystal structure means, in particular, that the atoms of one compound occupy the same place within the crystal structure as the corresponding atoms of the other compound. As a result, the linkages of structural units within the structures are maintained unchanged. An isotypic crystal structure in the case of oxides and nitrides is atypical since nitrides, in comparison with oxides, usually have a higher degree of condensation of the polyhedra, in particular the tetrahedra, within the crystal structure. This is surprising particularly in the present case since the degree of condensation of the phosphor according to the present disclosure of the formula $NaLi_3SiO_4$:Eu is one, whereas typical oxosilicates have a degree of condensation of less than or equal to 0.5. Surprisingly, the inventors have discovered that, proceeding from the phosphor of the molecular formula $NaLi_3SiO_4$:Eu, the elements Na, Li, Si, O can be partly replaced by the elements Ca, Li, Al and N, thus resulting in a phosphor of the formula $Na_{1-y*}Ca_{y*}Li_{3-2y*}Al_{3y*}Si_{1-y}O_{4-4y*}N_{4y*}$:Eu. This phosphor is present in a mixed phase, in particular, such that within the crystal structure of $NaLi_3SiO_4$:Eu, the lattice sites are partly occupied by the elements Ca, Li, Al and N.

The known phosphor $CaLiAl_3N_4$:Eu is a phosphor which emits in the red range of the electromagnetic spectrum, has a peak wavelength at approximately 670 nm, has a full width at half maximum of approximately 60 nm and crystallizes in an isotypic crystal structure with respect to $NaLi_3SiO_4$. In comparison therewith, $NaLi_3SiO_4$:Eu emits in the blue spectral range of the electromagnetic spectrum with a peak wavelength of approximately 470 nm and exhibits a more narrowband emission, that is to say an emission having a smaller full width at half maximum than 60 nm. The mixed phase according to the present disclosure of these phosphors advantageously makes it possible to provide a phosphor of the formula $Na_{1-y*}Ca_{y*}Li_{3-2y*}Al_{3y*}Si_{1-y}O_{4-4y*}N_{4y*}$:Eu in which the proportion of $CaLiAl_3N_4$ can be varied, which is expressed by the index y* in the formula. As a result of this variation, it is possible to provide a phosphor which, as a result of the variable composition, allows the peak wavelength to be set in a range of between 470 nm and 670 nm. The phosphor can thus be set in a targeted manner with regard to the desired color locus, depending on requirements or application. Consequently, with just one phosphor it is possible, surprisingly, to generate almost all colors of the visible range, from blue to red.

The peak wavelength of the phosphor $Na_{1-y*}Ca_{y*}Li_{3-2y*}Al_{3y*}Si_{1-y*}O_{4-4y*}N_{4y*}$:E where 0<y*<0.875, advantageously 0<y*≤0.5, particularly advantageously 0<y*≤0.3, very particularly advantageously 0<y*≤0.1, is advantageously in the blue or green spectral range. The phosphor is suitable in particular in combination with a green and red phosphor for white conversion LEDs, in particular for general lighting. Moreover, the phosphor is suitable for colored conversion LEDs.

In accordance with at least one embodiment, the phosphor $Na_{1-y*}Ca_{y*}Li_{3-2y*}Al_{3y*}Si_{1-y*}O_{4-4y*}N_{4y*}$:E crystallizes in a tetragonal crystal system. Advantageously, the phosphor in accordance with this embodiment crystallizes in the space group $I4_1/a$. Particularly advantageously, the phosphor in accordance with this embodiment crystallizes in a tetragonal crystal system with the space group $I4_1/a$.

In accordance with at least one embodiment, the phosphor has the following general molecular formula:

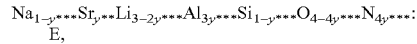

wherein 0<y*<0.875; advantageously 0<y*≤0.5, particularly advantageously 0<y*≤0.3. By way of example, it holds true that y*=0.01; 0.02; 0.03, 0.04 or 0.05. E is selected from a group which comprises Eu, Mn, Ce, Yb and combinations thereof. Advantageously, E=Eu or $Eu^{2+}$.

In accordance with at least one embodiment, the phosphor has the formula $(MB)_b(TA)_e(TC)_g(TD)_h(XB)_l(XC)_m$:E, wherein
  MB is selected from a group of divalent metals which comprises Mg, Ca, Sr, Ba, Zn, Mn, Eu, Yb, Ni, Fe, Co and combinations thereof,
  TA is selected from a group of monovalent metals which comprises Li, Na, Cu, Ag and combinations thereof,
  TC is selected from a group of trivalent metals which comprises B, Al, Ga, In, Y, Fe, Cr, Sc, rare earths and combinations thereof,
  TD is selected from a group of tetravalent metals which comprises Si, Ge, Sn, Mn, Ti, Zr, Hf, Ce and combinations thereof,
  XB=O and/or S
  XC=N
  b=1;
  e+g+h=4;
  l+m=4;
  2b+e+3g+4h−2l−3m=0 and m<3.5 or l>0.5.
  E=Eu, Ce, Yb and/or Mn, advantageously E=Eu.

In accordance with at least one embodiment, the phosphor has the formula $(MB)_b(TA)_e(TC)_g(TD)_h(XB)_l(XC)_m$:E, wherein
  MB is selected from a group of divalent metals which comprises Mg, Ca, Sr, Ba and combinations thereof,
  TA is selected from a group of monovalent metals which comprises Li, Na and combinations thereof,
  TC is selected from a group of trivalent metals which comprises B, Al, Ga and combinations thereof,
  TD is selected from a group of tetravalent metals which comprises Si, Ge and combinations thereof,
  XC=N
  XB=O
  b=1;
  e+g+h=4;
  l+m=4;
  2b+e+3g+4h−2l−3m=0 and m<3.5 or l>0.5.
  E=Eu, Ce, Yb and/or Mn, advantageously E=Eu.

In accordance with at least one embodiment, the phosphor has the following general molecular formula:

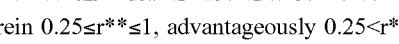

wherein 0.25≤r≤1, advantageously 0.25<r<0.875, particularly advantageously 0.4≤r**≤0.8. MB is selected from a group of divalent metals which comprises Mg, Ca, Sr, Ba and combinations thereof, and E=Eu, Ce, Yb and/or Mn, advantageously E=Eu.

In accordance with at least one embodiment, the phosphor has the following general molecular formula:

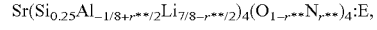

wherein 0.25≤r≤1, advantageously 0.25<r<0.875, particularly advantageously 0.4≤r≤0.8 and E=Eu, Ce, Yb and/or Mn. The phosphor is, in particular, a mixed phase of the compounds $SrSiLi_3O_3N$:Eu (r=0.25) and $Sr_2Si_2Al_3Li_3N_8$:Eu (r**=1).

The mixed phase according to the present disclosure advantageously makes it possible to provide a phosphor in which the proportion of nitrogen can be varied, which is expressed in the formula by the index $r^{**}$. As a result of this variation, it is possible to provide a phosphor which, as a result of the variable composition, allows the peak wavelength to be set from the yellow to red spectral range. Consequently, the phosphor can be set in a targeted manner with regard to the desired color locus and/or color rendering index, depending on requirements or application. With just one phosphor, surprisingly, it is thus possible to generate many colors of the visible range, in particular from yellow to red.

In accordance with at least one embodiment, the phosphor $(MB)(Si_{0.25}Al_{-1/8+r^{}/2}Li_{7/8-r^{}/2})_4(O_{1-r^{}}N_{r^{}})_4$:E or $Sr(Si_{0.25}Al_{-1/8+r^{}/2}Li_{7/8-r^{}/2})_4(O_{1-r^{}}N_{r^{}})_4$:E crystallizes in a tetragonal crystal system. Advantageously, the phosphor in accordance with this embodiment crystallizes in the space group I4/m. Particularly advantageously, the phosphor in accordance with this embodiment crystallizes in a tetragonal crystal system with the space group I4/m.

In accordance with at least one embodiment, the phosphor has the following general molecular formula:

$$Na_{1-y^{}}Eu_{y^{}}Li_{3-2y^{}}Al_{3y^{}}Si_{1-y^{}}O_{4-4y^{}}N_{4y^{**}}:E,$$

wherein $0<y^{}\leq 1.0$, advantageously $0<y^{}<0.875$ or $0<y^{}<0.5$, particularly advantageously $0.05\leq y^{}\leq 0.45$, very particularly advantageously $0.1\leq y^{}\leq 0.4$, $0.15\leq y^{}\leq 0.35$ or $0.2\leq y^{**}\leq 0.3$. E=Eu, Ce, Yb and/or Mn, advantageously E=Eu.

Surprisingly, it has been found that the phosphor of the formula $Na_{1-y^*}$-$Eu_{y^{}}Li_{3-2y^{}}Al_{3y^{}}Si_{1-y^{}}O_{4-4y^{}}N_{4y^{}}$:E, advantageously $Na_{1-y^{}}Eu_{y^{}}Li_{3-2y^{}}Al_{3y^{}}Si_{1-y^{}}O_{4-4y^{}}N_{4y^{}}$:Eu, can be produced as a mixed phase between $NaLi_3SiO_4$:E or $NaLi_3SiO_4$:Eu ($y^{}=0$) and the compound $EuLiAl_3N_4$ ($y^{**}=1$) and moreover constitutes an efficient phosphor having unique properties. This phosphor is present in particular in a mixed phase, such that within the crystal structure of $NaLi_3SiO_4$:Eu the lattice sites are partly occupied by the elements Eu, Li, Al and N.

$NaLi_3SiO_4$:Eu emits in the blue spectral range. The mixed phase according to the present disclosure of $NaLi_3SiO_4$:Eu and the compound $EuLiAl_3N_4$ advantageously makes it possible to provide a phosphor of the formula $Na_{1-y^*}Eu_{y^{}}Li_{3-2y^{}}Al_{3y^{}}Si_{1-y^{}}O_{4-4y^{}}N_{4y^{}}$:Eu in which the proportion of $EuLiAl_3N_4$ can be varied, which is expressed in the formula by the index $y^{**}$. As a result of this variation, it is possible to provide a phosphor which, as a result of the variable composition, allows the peak wavelength to be set in a range from the yellow to red range. Consequently, the phosphor can be set in a targeted manner with regard to the desired color locus, depending on requirements or application. With just one phosphor, surprisingly, it is thus possible to generate almost all colors of the visible range, from yellow to red.

In accordance with at least one embodiment, the phosphor $Na_{1-y^{}}Eu_{y^{}}Li_{3-2y^{}}Al_{3y^{}}Si_{1-y^{}}O_{4-4y^{}}N_{4y^{**}}$:Eu crystallizes in a tetragonal crystal system. Advantageously, the phosphor in accordance with this embodiment crystallizes in the space group I4/m.

Particularly advantageously, the phosphor in accordance with this embodiment crystallizes in a tetragonal crystal system with the space group I4/m.

In accordance with at least one embodiment, the phosphor has the formula $(MB)_b(TA)_e(TC)_g(XB)_l(XC)_m$:E, wherein
MB is selected from a group of divalent metals which comprises Mg, Ca, Sr, Ba, Zn, Mn, Eu, Yb, Ni, Fe, Co and combinations thereof,
TA is selected from a group of monovalent metals which comprises Li, Na, Cu, Ag and combinations thereof,
TC is selected from a group of trivalent metals which comprises B, Al, Ga, In, Y, Fe, Cr, Sc, rare earth metals and combinations thereof,
XB=O,
XC=N,
b=1;
e+g=4;
l+m=4;
2b+e+3g−2l−3m=0 and m<3.5 or l>0.5.
E=Eu, Ce, Yb and/or Mn, advantageously E=Eu.

In accordance with at least one embodiment, the phosphor has the formula $(MB)_b(TA)_e(TC)_g(XB)_l(XC)_m$:E, wherein
MB is selected from a group of divalent metals which comprises Mg, Ca, Sr, Ba, Zn and combinations thereof,
TA is selected from a group of monovalent metals which comprises Li, Na, Cu, Ag and combinations thereof,
TC is selected from a group of trivalent metals which comprises B, Al, Ga and combinations thereof,
XB=O,
XC=N,
b=1;
e+g=4;
l+m=4;
2b+e+3g−2l−3m=0 and m<3.5 or l>0.5.
E=Eu, Ce, Yb and/or Mn, advantageously E=Eu.

In accordance with at least one embodiment, the phosphor has the following general molecular formula:

$$(MB)Li_{3-2x^{}}Al_{1+2x^{}}O_{4-4x^{}}N_{4x^{}}:Eu$$

where $0<x^{}\leq 1.0$, advantageously $0<x^{}<0.875$, particularly advantageously $0.125\leq x^{}<0.875$ or $0.125\leq x^{}\leq 0.5$, very particularly advantageously $0.125\leq x^{**}\leq 0.45$. MB is selected from a group of divalent metals which comprises Mg, Ca, Sr, Ba, Zn and combinations thereof.

In accordance with at least one embodiment, the phosphor has the following general molecular formula:

$$SrLi_{3-2x^{}}Al_{1+2x^{}}O_{4-4x^{}}N_{4x^{}}:Eu$$

where $0<x^{}\leq 1.0$, advantageously $0<x^{}<0.875$, particularly advantageously $0.125\leq x^{}<0.875$ or $0.125\leq x^{}\leq 0.5$, very particularly advantageously $0.125\leq x^{**}\leq 0.45$.

Surprisingly, it has been found that the phosphor of the formula $SrLi_{3-2x^{}}Al_{1+2x^{}}O_{4-4x^{}}N_{4x^{}}$:Eu can be produced as a mixed phase between $SrLi_3AlO_4$:Eu ($x^{}=0$) and the compound $SrLiAl_3N_4$ ($x^{}=1$) and moreover constitutes an efficient phosphor having unique properties. In particular, the phosphors have a small full width at half maximum.

$SrLiAl_3N_4$:Eu is a known phosphor exhibiting narrow-band emission in the red spectral range. The mixed phase according to the present disclosure of $SrLi_3AlO_4$:Eu and the compound $SrLiAl_3N_4$ advantageously makes it possible to provide a phosphor of the formula $SrLi_{3-2x^{}}Al_{1+2x^{}}O_{4-4x^{}}N_{4x^{}}$:Eu in which the proportion of $SrLiAl_3N_4$ can be varied, which is expressed in the formula by the index $x^{**}$. As a result of this variation, it is possible to provide a phosphor which, as a result of the variable composition, allows the peak wavelength to be set in a range from the green to yellow or yellow-orange range. As a result, it is possible to achieve color loci which cannot be achieved with known phosphors. Consequently, the phosphor can be set in a targeted manner with regard to the desired color locus in the green to yellow range, depending on requirements or application.

Surprisingly, it has been found that the phosphor of the formula $SrLi_{3-2x^{}}Al_{1+2x^{}}O_{4-4x^{}}N_{4x^{}}$:Eu, as $x^{}$ increases, starting from $x^{} \geq 0.1250$, crystallizes in the same crystal structure but in the process the cell volume of the unit cell increases and at the same time, as $x^{}$ increases, the peak wavelength is shifted into the longer-wavelength range, in particular from the green right into the red spectral range. Thus, the phosphor $SrLi_{3-2x^{}}Al_{1+2x^{}}O_{4-4x^{}}N_{4x^{}}$:Eu where $0.125 \leq x^{} \leq 1$, advantageously $0.125 \leq x^{} < 0.875$, particularly advantageously $0.125 \leq x^{} \leq 0.5$, very particularly advantageously $0.125 \leq x^{} \leq 0.45$, is usable in diverse ways and is suitable in particular for colored conversion LEDs comprising $SrLi_{3-2x^{}}Al_{1+2x^{}}O_{4-4x^{}}N_{4x^{**}}$:Eu as sole phosphor. In addition, the phosphors advantageously have small values of full width at half maximum of less than 80 nm.

The phosphor $SrLi_{3-2x^{}}Al_{1+2x^{}}O_{4-4x^{}}N_{4x^{}}$:Eu, in particular where $x^{**} \geq 0.1250$, is suitable for example for use in lighting devices such as conversion LEDs which emit white radiation, wherein a superimposition of the blue primary radiation and the secondary radiation yields a white overall radiation. The phosphor is very robust and efficient and it is advantageously possible to provide a conversion LED which emits an overall radiation having a color temperature of less than 3600 K, in particular 3400 K±100 K, and a color locus near the Planckian locus.

In accordance with at least one embodiment, the phosphor has the following general molecular formula:

$$SrLi_{3-2x^{}}Al_{1+2x^{}}O_{4-4x^{}}N_{4x^{}}:Eu$$

where $0 < x^{} < 0.125$, advantageously $0 < x^{} < 0.120$.

The phosphor $SrLi_{3-2x^{}}Al_{1+2x^{}}O_{4-4x^{}}N_{4x^{}}$:Eu where $0 < x^{} < 0.125$ surprisingly does not crystallize in an isotypic crystal structure with respect to the crystal structure of $SrLi_{3-2x^{}}Al_{1+2x^{}}O_{4-4x^{}}N_{4x^{}}$:Eu where $x^{} \geq 0.125$. In particular, the phosphor where $0 < x^{} < 0.125$ can form a crystal structure which can be described as a crystallographic superstructure of the crystal structure of variants of the phosphor where $x^{} \geq 0.125$.

Advantageously, the peak wavelength of this phosphor is in the green range of the electromagnetic spectrum. The full width at half maximum is advantageously smaller in comparison with $SrLi_{3-2x^{}}Al_{1+2x^{}}O_{4-4x^{}}N_{4x^{}}$:Eu where $x^{**} \geq 0.125$.

In accordance with at least one embodiment, the phosphor (MB) $Li_{3-2x^{}}Al_{1+2x^{}}O_{4-4x^{}}N_{4x^{}}$:Eu or $SrLi_{3-2x^{}}Al_{1+2x^{}}O_{4-4x^{}}N_{4x^{}}$:Eu crystallizes in a tetragonal crystal system. Advantageously, the phosphor in accordance with this embodiment crystallizes in the space group I4/m. Particularly advantageously, the phosphor in accordance with this embodiment crystallizes in a tetragonal crystal system in the space group I4/m.

In accordance with at least one embodiment, the phosphor crystallizes in a crystal structure having the same atomic sequence as in $UCr_4C_4$, $CsKNa_2Li_{12}Si_4O_{16}$ or $RbLi_5\{Li[SiO_4]\}_2$. The fact that the phosphor crystallizes in a crystal structure having the same atomic sequence as in $UCr_4C_4$, $CsKNa_2Li_{12}Si_4O_{16}$ or $RbLi_5\{Li[SiO_4]\}_2$ means, here and hereinafter, that the succession of the atoms of the phosphor follows the same pattern as the succession of the atoms in $UCr_4C_4$, $CsKNa_2Li_{12}Si_4O_{16}$ or $RbLi_5\{Li[SiO_4]\}_2$. In other words, the crystal structure exhibits the same structural motifs as $UCr_4C_4$, $CsKNa_2Li_{12}Si_4O_{16}$ or $RbLi_5\{Li[SiO_4]\}_2$. By way of example, the phosphor of the formula $(Na_{0.5}K_{0.5})$ $Li_3SiO_3$:Eu crystallizes in a crystal structure having the same atomic sequence as in $CsKNa_2Li_{12}Si_4O_{16}$; in this case, K occupies the sites of Cs and of K, Na occupies the sites of Na, Li occupies the sites of Li, Si occupies the sites of Si, and O occupies the sites of O. As a result of the variation of the ionic radii in the course of substitution with other atomic species, the absolute position (atomic coordinates) of the atoms may change.

The phosphor can also crystallize in a crystal structure having the same atomic sequence as in the structures $NaLi_3SiO_4$ or $KLi_3GeO_4$ derived from $UCr_4C_4$.

In accordance with at least one embodiment, the phosphor crystallizes in the same structure type as $NaLi_3SiO_4$
$KLi_3SiO_4$
$RbLi_5\{Li[SiO_4]\}2$
$UCr_4C_4$
$CsKNa_2Li_{12}Si_4O_{16}$ or
$CsKNaLi_9\{Li[SiO_4]\}_4$.

The crystal structures of the embodiments are distinguished in particular by a three-dimensionally linked spatial network. In this case, TA, TB, TC, TD, TE and/or TF are surrounded by XA, XB, XC and/or XD and the resultant structural units, advantageously tetrahedra, are linked via common corners and edges. This arrangement results in a three-dimensionally extending anionic structural unit. MA, MB, MC and/or MD are arranged in the resultant cavities and/or channels.

In accordance with at least one embodiment, the phosphor has a crystal structure in which TA, TB, TC, TD, TE and/or TF are surrounded by XA, XB, XC and/or XD and the resultant structural units are linked via common corners and edges to form a three-dimensional spatial network having cavities and/or channels and MA, MB, MC and/or MD are arranged in the cavities and/or channels. In particular, the structural units are tetrahedra, wherein advantageously XA, XB, XC and/or XD occupy the corners of the tetrahedra and TA, TB, TC, TD, TE and/or TF are arranged in the center of the tetrahedra.

By way of example, in the crystal structure of the embodiment $KLi_3SiO_4$:E, which is isotypic with respect to $KLi_3GeO_4$, Li and Si are surrounded by O and form the anionic structural unit in the form of a spatial network of distorted $(Li/Si)O_4$ tetrahedra. In the resultant cavities, the K atoms are surrounded by 8 O atoms in a distorted cubic fashion.

In the crystal structure of the exemplary embodiment $RbLi_5\{Li[SiO_4]\}_2$:E, one portion of the Li atoms and Si are surrounded by O and form the anionic structural unit in the form of a spatial network. In this case, the Si atoms are surrounded by 4 O atoms in a distorted tetrahedral fashion. The Li atoms which participate in the structural unit are surrounded by 3 O atoms in a distorted trigonal planar fashion in their first coordination sphere. With addition of further O atoms in the vicinity, the coordination can also be described as distorted tetrahedral or distorted trigonal bipyramidal. In the resultant cavities, the Rb atoms are surrounded by 8 O atoms in a distorted cubic fashion, while the other portion of the Li atoms is surrounded by 4 O atoms in a distorted square planar fashion.

Depending on the chemical composition of the phosphors disclosed here, a severe distortion of the coordination sphere around MA, MB, MC and/or MD may occur. In the case of the exemplary embodiment $NaLi_3SiO_4$:E, for example, that has the effect that the vicinity of the Na atoms is present as a distorted trigonal prism or, with addition of a further O atom, as a distorted capped cube.

The specified embodiments of the phosphor can be produced in accordance with methods specified below. All features described for the phosphor thus also apply to the method for producing said phosphor, and vice-versa.

A method for producing a phosphor is specified.

In accordance with at least one embodiment, the phosphor has the general molecular formula:

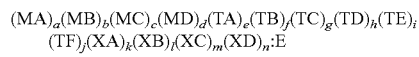
$(MA)_a(MB)_b(MC)_c(MD)_d(TA)_e(TB)_f(TC)_g(TD)_h(TE)_i(TF)_j(XA)_k(XB)_l(XC)_m(XD)_n$:E In this case, MA is selected from a group of monovalent metals, MB is selected from a group of divalent metals, MC is selected from a group of trivalent metals, MD is selected from a group of tetravalent metals, TA is selected from a group of monovalent metals, TB is selected from a group of divalent metals, TC is selected from a group of trivalent metals, TD is selected from a group of tetravalent metals, TE is selected from a group of pentavalent elements, TF is selected from a group of hexavalent elements, XA is selected from a group of elements which comprises halogens, XB is selected from a group of elements which comprises O, S and combinations thereof, XC=N and XD=C. The following furthermore hold true:

$a+b+c+d=t$;
$e+f+g+h+i+j=u$
$k+l+m+n=v$
$a+2b+3c+4d+e+2f+3g+4h+5i+6j-k-2l-3m-4n=w$
$0.8 \leq t \leq 1$
$3.5 \leq u \leq 4$
$3.5 \leq v \leq 4$
$(-0.2) \leq w \leq 0.2$ and E=Eu, Ce, Yb and/or Mn. It advantageously holds true that: $0 \leq m < 0.875$ v and/or $v \geq l > 0.125$ v.

The method comprises the following method steps:
A) mixing starting materials with the phosphor,
B) heating the mixture obtained under A) to a temperature T1 of between 500 and 1400° C., advantageously between 700 and 1400° C.,
C) annealing the mixture at a temperature T1 of 500 to 1400° C., advantageously between 700 and 1400° C., for 0.5 minute to 10 hours.

In one embodiment, the starting materials are present as powder.

In one embodiment, method step C) is followed by a further method step:
D) cooling the mixture to room temperature. Room temperature is understood to mean 20° C., in particular.

In one embodiment, method step D) is followed by method steps B) and C) again, wherein the phosphor obtained in method step D) is then heated and annealed, respectively. The optical properties of the phosphor can be improved by this further annealing process.

In accordance with at least one embodiment, the starting materials melt during the process of heating the mixture obtained under A) in method step B).

The heating and cooling rates can be for example 250° C. per hour.

In one embodiment, method steps B), C) and/or D) take place under forming gas atmosphere. Advantageously, in the forming gas the ratio of nitrogen:hydrogen is 92.5:7.5.

In one embodiment, method steps B), C) and/or D) take place in a tube furnace.

In accordance with at least one embodiment, the method comprises the following method step A):
A) mixing the starting materials comprising $K_2CO_3$, $Cs_2CO_3$, $Na_2CO_3$ and/or $Rb_2CO_3$.

In accordance with at least one embodiment, the method comprises the following method step A):
A) mixing the starting materials comprising or consisting of $SiO_2$, $Eu_2O_3$, $Li_2CO_3$ and at least one carbonate from $K_2CO_3$, $Cs_2CO_3$, $Na_2CO_3$ and $Rb_2CO_3$. In particular, with the use of these starting materials it is possible to produce the phosphors $(Na_rK_{1-r})Li_3SiO_4$:Eu, $(Rb_rLi_{1-r})Li_3SiO_4$:Eu and $(K_{1-r''-r'''}Na_{r''}Li_{r'''})Li_3SiO_4$:Eu, advantageously $NaLi_3SiO_4$:Eu, $KLi_3SiO_4$:Eu, $(Na_{0.5}K_{0.5})Li_3SiO_4$:Eu, $(Rb_{0.5}Li_{0.5})Li_3SiO_4$:Eu, $(Na_{0.25}K_{0.75})Li_3SiO_4$:Eu and $(Na_{0.25}K_{0.5}Li_{0.25})Li_3SiO_4$:Eu.

In accordance with at least one embodiment, the method comprises the following method step A):
A) mixing the starting materials comprising or consisting of CaO, NaF, $LiN_3$, $Li_2O$, $LiAlH_4$, $AlF_3$, $SiO_2$ and $EuF_3$. In particular, with the use of these starting materials it is possible to produce a phosphor of the formula $Na_{1-y*}Ca_{y*}Li_{3-2y*}Al_{3y*}Si_{1-y}O_{4-4y*}N_{4y*}$:Eu, for example $Na_{0.97}Ca_{0.03}Li_{2.94}Al_{0.09}Si_{0.97}O_{3.88}N_{0.12}$:Eu.

The production method can be carried out very simply in comparison with many other methods for producing phosphors. In particular, no protective gas atmosphere is required since the products are insensitive to moisture or oxygen. Moreover, the synthesis is carried out at moderate temperatures and is therefore very energy-efficient. The requirements made, for example, of the furnace used are thus low. The starting materials are commercially available in a cost-effective manner and are non-toxic.

In accordance with at least one embodiment, the lighting device, in particular the conversion LED, emits a white radiation during operation. The radiation can be composed of a superimposition of the primary radiation and the secondary radiation or only of the secondary radiation.

In accordance with at least one embodiment, the phosphor emits a secondary radiation having a peak wavelength in the blue or blue-green spectral range of the electromagnetic spectrum. In order to generate a white overall radiation, the conversion element can comprise a second and a third phosphor. In particular, the second phosphor can be configured partly to convert the electromagnetic primary radiation into an electromagnetic secondary radiation that is in the red spectral range of the electromagnetic spectrum during operation of the lighting device. The third phosphor can be configured in particular partly to convert the electromagnetic primary radiation into an electromagnetic secondary radiation that is in the green spectral range of the electromagnetic spectrum during operation of the lighting device. A superimposition of the blue, green and red secondary radiation produces a white luminous impression. The lighting device, in particular the conversion LED, in accordance with this embodiment is suitable in particular for general lighting.

The conversion of the UV or blue primary radiation into a secondary radiation having a somewhat longer wavelength in the blue or blue-green range of the electromagnetic spectrum increases the efficiency of the lighting device, in particular of the conversion LED. In comparison with the primary radiation, the peak wavelength of the secondary radiation is closer to the maximum of eye sensitivity at 555 nm, as a result of which the emitted radiation has a higher overlap with the eye sensitivity curve and is thus perceived as brighter.

In accordance with at least one embodiment, the phosphor emits a secondary radiation having a peak wavelength in the green spectral range of the electromagnetic spectrum. In order to generate a white overall radiation, the conversion element can comprise a second phosphor, which can be configured partly to convert the electromagnetic primary radiation into an electromagnetic secondary radiation in the red spectral range of the electromagnetic spectrum during operation of the lighting device. A superimposition of the blue primary radiation and the green and red secondary radiation produces a white luminous impression. The lighting device, in particular the conversion LED, in accordance with this embodiment is suitable in particular for backlighting applications.

The third phosphor having a peak wavelength in the green spectral range can be selected from a group comprising β-SiAlONs, α-SiAlONs, chlorosilicates, orthosilicates, siliconoxynitrides (SiONs), garnets and combinations thereof.

In accordance with one embodiment, the garnet phosphor can be selected from the material system $(Y, Lu, Gd)_3(Al, Ga)_5O_{12}$:Ce or $(Y,Lu,Gd)_3(Al)_5O_{12}$:Ce. Advantageously, the garnet phosphor is selected from the material system $(Y,Lu)_3Al_5O_{12}$:Ce and $(Y,Lu)_3(Al,Ga)_5O_{12}$:Ce. By way of example, the phosphor is $Y_3Al_5O_{12}$:Ce.

The α-SiAlONs can have for example the following molecular formula: $M_tSi_{12-(t'+t'')}Al_{(t'+t'')}O_nN_{16-n}$:Eu where M=Ca, Mg, Y, advantageously Ca.

The chlorosilicates can have for example the following molecular formula: $(Ca,Sr,Ba,Eu)_8Mg(SiO_4)_4Cl_2$.

The siliconoxynitrides can have for example the following molecular formula:

$$(EA*_{1-t'''}Eu_{t'''})Si_2O_2N_2$$

where $0<t'''\leq 0.2$, advantageously $0<t'''\leq 0.15$, particularly advantageously $0.02\leq t'''\leq 0.15$ and EA*=Sr, Ca, Ba and/or Mg. Preference is given to $(Sr_{1-t'''-o}EA*_oEu_{t'''})Si_2O_2N_2$ where EA*=Ba, Ca and/or Mg and $0\leq o<0.5$.

The second phosphor having a peak wavelength in the red spectral range can be for example a nitridosilicate or a nitridoaluminate. In particular, the nitridosilicate can be selected from the material systems $(Ca,Sr,Ba,Eu)_2(Si,Al)_5(N,O)_8$, $(Ca,Sr,Ba,Eu)AlSi(N,O)_3$, $(Ca,Sr,Ba,Eu)AlSi(N,O)_3\cdot Si_2N_2O$, $(Ca,Sr,Ba,Eu)_2Si_5N_8$, $(Ca,Sr,Ba,Eu)AlSiN_3$ and combinations thereof. The nitridoaluminate can have the formula $MLiAl_3N_4$:Eu (M=Ca,Sr).

Furthermore, the second phosphor can be selected from a material system having a peak wavelength in the red spectral range, which is described in the patent application WO2015/052238A1, the disclosure content of which in this regard is hereby incorporated by reference in its entirety. By way of example, the second phosphor has the formula $Sr(Sr,Ca)Si_2Al_2N_6$:Eu.

The second phosphor having a peak wavelength in the red spectral range can also be a phosphor having the molecular formula $A_2[SiF_6]$:Mn$^{4+}$ where A=Li, Na, K, Rb, Cs, for example $K_2SiF_6$:Mn$^{4+}$.

The second phosphor having a peak wavelength in the red spectral range can also be $Mg_4GeO_{5.5}F$:Mn.

In accordance with at least one embodiment, the lighting device, in particular the conversion LED, is configured to emit a white radiation. In this case, the phosphor has the formula $(Na_rK_{1-r})_1(TA)_3(TD)_1(XB)_4$:E where $0\leq r\leq 0.05$, advantageously r=0. Advantageously, TA=Li, TD=Si, XB=O and E=Eu, Ce, Yb and/or Mn, advantageously E=Eu. By way of example, the phosphor is $KLi_3SiO_4$:Eu. The phosphor exhibits very broadband emission from the blue to red spectral range, thus giving rise to a white-colored luminous impression. In this case, it is advantageously possible for the conversion element to consist of this phosphor or this phosphor and the matrix material. In particular, the conversion element or the lighting device, in particular the conversion LED, in accordance with this embodiment comprises no further phosphor. The phosphor can thus be present, therefore, as sole phosphor in the conversion element or the lighting device, in particular the conversion LED. The lighting device, in particular the conversion LED, has a high efficiency and a high color rendering index. In particular the lighting device, in particular the conversion LED, in accordance with this embodiment emits warm-white radiation having a color temperature of less than 3500 K, in particular less than 3000 K. Thus, this lighting device, in particular this conversion LED, is suitable in particular for general lighting.

In comparison with known white-emitting conversion LEDs which use a blue-emitting semiconductor chip and a red and green phosphor for generating white light, here the complicated binning of the semiconductor chips can be dispensed with or can be carried out at least with a greater tolerance. It is possible to use semiconductor chips which have a primary radiation that is not perceived or is only scarcely perceived by the human eye (300 nm to 430 nm or 440 nm). Production-, temperature- or forward-current-dictated fluctuations of the primary radiations do not adversely affect the overall radiation properties. In comparison with the use of two or more phosphors, color adaptation by varying the concentrations of the phosphors is not necessary since the emission spectrum is generated by only one phosphor and is thus constant. The conversion LEDs can thus be produced with a high throughput since color adaptation or complicated chip binning is not necessary. No color shifts or other adverse effects on the emission spectrum as a result of selective degradation of only one phosphor occur. A partial conversion of the primary radiation can also be carried out depending on the application. Since it is possible to excite the phosphor with a primary radiation in the range of 300 nm to 430 nm or 440 nm, a contribution of the primary radiation, advantageously in the short-wave blue range of the electromagnetic spectrum, to the overall radiation has the effect that objects illuminated thereby appear whiter, more radiant and therefore more attractive. By way of example, optical brightening agents in textiles can thereby be excited.

In accordance with at least one embodiment, the lighting device, in particular the conversion LED, is configured to emit a white radiation. In this case, the phosphor has the formula $(Na_rK_{1-r})_1(TA)_3(TD)_1(XB)_4$:E or $(Na_rK_{1-r})Li_3SiO_4$:E where $0.05<r\leq 0.2$, advantageously $0.1<r\leq 0.2$ where E=Eu, Ce, Yb and/or Mn, advantageously E=Eu. By way of example, the phosphor is $Na_{0.125}K_{0.875}Li_3SiO_4$:Eu. The phosphor exhibits broadband emission from the green to red spectral range, thus resulting in a white overall radiation through the superimposition of a blue primary radiation and the secondary radiation. In this case, it is advantageously possible for the conversion element to consist of this phosphor or this phosphor and the matrix material. In particular, the conversion element or the lighting device, in particular the conversion LED, in accordance with this embodiment comprises no further phosphor. The phosphor can thus be present, therefore, as sole phosphor in the conversion element or the lighting device, in particular the conversion LED. In contrast to conversion LEDs comprising a plurality of phosphors, therefore, no color shifts or other adverse effects on the emission spectrum as a result of selective degradation of only one phosphor occur.

The lighting device, in particular the conversion LED, has in particular a high color rendering index, even though no further red phosphor is present. In particular, the lighting device, in particular the conversion LED, in accordance with this embodiment emits cold-white radiation having a color temperature of more than 6500 K, advantageously more than 8000 K. The maximum value of the color temperature can be 10 000 K. Therefore, this lighting device, in particular this conversion LED, is suitable in particular for general lighting, for example for office spaces. Studies prove that cold-white overall radiation in the case of general lighting can increase the ability to concentrate, since the production of melatonin can be reduced by the high proportion of blue in the overall radiation.

In accordance with at least one embodiment, the lighting device, in particular the conversion light-emitting diode, is configured to emit a white radiation, wherein the phosphor has the formula $(Na_rK_{1-r})_1(TA)_3(TD)_1(XB)_4$:E where $0.2<r\leq 0.4$, advantageously $0.2<r\leq 0.3$, $(Rb_rLi_{1-r})_1(TA)_3(TD)_1(XB)_4$:E where $0\leq r'\leq 1$, advantageously $0.25\leq r'\leq 0.75$, particularly advantageously $0.4\leq r'\leq 0.6$, $(K_{1-r''-r'''}Na_{r''}Li_{r'''})_1(TA)_3(TD)_1(XB)_4$:E where $0<r''<0.5$ and $0<r'''<0.5$, advantageously $0.1<r'<0.4$ and $0.1<r'''<0.4$, particularly advantageously $0.2<r''<0.3$ and $0.2<r'''<0.3$, $(Cs,Na,K,Li)_1(TA)_3(TD)_1(XB)_4$:E, advantageously $(Cs_{0.25}Na_{0.25}K_{0.25}Li_{0.25})(TA)_3(TD)_1(XB)_4$:E or $(Rb_{r*}Na_{1-r*})_1(TA)_3(TD)_1(XB)_4$:E where $0.4\leq r*<0.875$, advantageously $0.4\leq r*\leq 0.75$, particularly advantageously $0.4\leq r*\leq 0.6$, very particularly advantageously $r*=0.5$. Advantageously, TA=Li, TD=Si and XB=O. Particularly advantageously, TA=Li, TD=Si, E=Eu and XB=O. The conversion element comprises at least one second phosphor configured partly to convert the electromagnetic primary radiation into an electromagnetic secondary radiation that is in the red spectral range of the electromagnetic spectrum during operation of the lighting device, in particular the conversion LED.

In accordance with at least one embodiment, the phosphor has the formula $(Na_rK_{1-r})_1(TA)_3(TD)_1(XB)_4$:E where $0.2<r\leq 0.4$, advantageously $0.2<r\leq 0.3$, particularly advantageously $r=0.25$, $(Rb_rLi_{1-r})_1(TA)_3(TD)_1(XB)_4$:E where $0\leq r'\leq 1$, advantageously $0.25\leq r'\leq 0.75$, particularly advantageously $0.4\leq r'\leq 0.6$, $(K_{1-r''-r'''}Na_{r''}Li_{r'''})_1(TA)_3(TD)_1(XB)_4$:E where $0<r''<0.5$ and $0<r'''<0.5$, advantageously $0.1<r''<0.4$ and $0.1<r'''<0.4$, particularly advantageously $0.2<r''<0.3$ and $0.2<r'''<0.3$, $(Cs,Na,K,Li)_1(TA)_3(TD)_1(XB)_4$:E, advantageously $(Cs_{0.25}Na_{0.25}K_{0.25}Li_{0.25})(TA)_3(TD)_1(XB)_4$:E or $(Rb_{r*}Na_{1-r*})_1(TA)_3(TD)_1(XB)_4$:E where $0.4\leq r*<0.875$, advantageously $0.4\leq r*\leq 0.75$, particularly advantageously $0.4\leq r*\leq 0.6$, very particularly advantageously $r*=0.5$. Advantageously, TA=Li, TD=Si and XB=O. Particularly advantageously, TA=Li, TD=Si, E=Eu and XB=O. The peak wavelength of the phosphor is advantageously in the green spectral range and has a full width at half maximum of less than 50 nm. The conversion element comprises a second phosphor configured partly to convert the electromagnetic primary radiation into an electromagnetic secondary radiation that is in the red spectral range of the electromagnetic spectrum during operation of the lighting device. It is possible for the conversion element to consist of the phosphor and the second phosphor or of the phosphor, the second phosphor and the matrix material. In particular, the conversion element or the conversion LED in accordance with this embodiment does not comprise a further phosphor. The phosphor and the second phosphor can thus be present, therefore, as sole phosphors in the conversion element or the lighting device, in particular the conversion LED. A superimposition of the primary radiation and the secondary radiation in the red and green spectral range gives a white-colored luminous impression.

A particularly large bandwidth of colors can advantageously be rendered with a lighting device, in particular with a conversion LED, in accordance with this embodiment. Therefore, the lighting device, in particular the conversion LED, in accordance with this embodiment is suitable in particular for backlighting applications for display elements such as displays.

In the case of LCD displays ("liquid crystal displays") and other displays, the colors are rendered by the primary colors red, green and blue. The bandwidth of colors which can be rendered on a display is therefore limited by the spanned color triangle of the colors red, green and blue. These colors are correspondingly filtered out from the spectrum for backlighting by red, green and blue color filters. However, the wavelength range of the transmitted radiation of the color filters is still very wide. Therefore, light sources having very narrowband emissions, that is to say a small full width at half maximum, in the green, blue and red spectral range are required in order to cover the widest possible color space. As light sources for backlighting applications, predominantly a blue-emitting semiconductor chip with a phosphor having a peak wavelength in the green and a phosphor having a peak wavelength in the red spectral range are combined, wherein the phosphors have the smallest possible full width at half maximum for the emission. Ideally the emission peaks are in this case congruent with the transmission range of the respective color filter in order to lose as little light as possible, to achieve the maximum efficiency and to reduce crosstalk or an overlap of the different color channels, which limits the achievable color space.

As a result of the small full width at half maximum of the phosphors according to the present disclosure $(Na_rK_{1-r})_1(TA)_3(TD)_1(XB)_4$:E where $0.2<r\leq 0.4$, $(Rb_rLi_{1-r})_1(TA)_3(TD)_1(XB)_4$:E where $0\leq r'\leq 1$, $(K_{1-r''-r'''}Na_{r''}Li_{r'''})(TA)_3(TD)_1(XB)_4$:E where $0<r''<0.5$ and $0<r'''<0.5$, $(Cs,Na,K,Li)_1(TA)_3(TD)_1(XB)_4$:E or $(Rb_{r*}Na_{1-r*})_1(TA)_3(TD)_1(XB)_4$:E where $0.4\leq r*<0.875$, for example $(Rb_{0.5}Li_{0.5})Li_3SiO_4$:Eu, $(Na_{0.25}K_{0.75})Li_3SiO_4$:Eu, $(Na_{0.25}K_{0.50}Li_{0.25})Li_3SiO_4$:Eu, $(Cs_{0.25}Na_{0.25}K_{0.25}Li_{0.25})Li_3SiO_4$:Eu or $(Rb_{0.5}Na_{0.5})Li_3SiO_4$:Eu, the emission peaks exhibit a very large overlap with the transmission range of a standard green filter (having a full width at half maximum in the range of typically 70 to 120 nm), such that only little light is lost and the achievable color space is large. In particular, a phosphor having a small full width at half maximum, such as $K_2SiF_6$:Mn, $Mg_4GeO_{5.5}F$:Mn, $SrLiAl_3N_4$:Eu or $Sr(Sr, Ca)Si_2Al_2N_6$:Eu, is used as second phosphor. In particular, the combination of a green and a red phosphor having a small full width at half maximum results in a large color space being covered.

In accordance with at least one embodiment, the lighting device, in particular the conversion LED, is configured to emit a white radiation. In this case, the phosphor has the formula $(Na_rK_{1-r})_1(TA)_3(TD)_1(XB)_4$:E or $(Na_rK_{1-r})Li_3SiO_4$:E where $0.05<r\leq 0.2$, advantageously $0.1<r\leq 0.2$ where E=Eu, Ce, Yb and/or Mn, advantageously E=Eu. By way of example, the phosphor is $Na_{0.125}K_{0.87}Li_3SiO_4$:Eu. The phosphor advantageously exhibits broadband emission from the green to red spectral range. In conjunction with a blue primary radiation, the overall radiation exhibits a very large overlap with the transmission range of a standard green, red and blue filter, such that only little light is lost and the achievable color space is large. It is thus advantageously possible for the conversion element to consist of this phosphor or this phosphor and the matrix material. In particular, the conversion element or the lighting device, in particular the conversion LED, in accordance with this embodiment does not have a further phosphor. The phosphor can thus be present, therefore, as sole phosphor in the conversion element or the lighting device, in particular the conversion LED. Therefore, this lighting device, in particular this conversion LED, is suitable in particular for backlighting applications.

In accordance with at least one embodiment, the lighting device, in particular the conversion light-emitting diode, is configured to emit a green radiation; the phosphor has the formula $(Na_rK_{1-r})_1(TA)_3(TD)_1(XB)_4:E$ where $0.2<r\leq0.4$, advantageously $0.2<r\leq0.3$, particularly advantageously $r=0.25$, $(Rb_{r'}Li_{1-r'})_1(TA)_3(TD)_1(XB)_4:E$ where $0\leq r'\leq1$, advantageously $0.25\leq r'\leq0.75$, particularly advantageously $0.4\leq r'\leq0.6$, $(K_{1-r''-r'''}Na_{r''}Li_{r'''})_1(TA)_3(TD)_1(XB)_4:E$ where $0<r''<0.5$ and $0<r'''<0.5$, advantageously $0.1<r''<0.4$ and $0.1<r'''<0.4$, particularly advantageously $0.2<r''<0.3$ and $0.2<r'''<0.3$, $(Cs,Na,K,Li)_1(TA)_3(TD)_1(XB)_4:E$, advantageously $(Cs_{0.25}Na_{0.25}K_{0.25}Li_{0.25})(TA)_3(TD)_1(XB)_4:E$ or $(Rb_{r*}Na_{1-r*})_1(TA)_3(TD)_1(XB)_4:E$ $0.4\leq r*<0.875$, advantageously $0.4\leq r*\leq0.75$, particularly advantageously $0.4\leq r*\leq0.6$, very particularly advantageously $r*=0.5$. Advantageously, TA=Li, TD=Si and XB=O. Particularly advantageously, TA=Li, TD=Si, E=Eu and XB=O. The peak wavelength of the phosphor is in the green spectral range, in particular, and has a full width at half maximum of less than 50 nm. It is possible for the conversion element to consist of this phosphor or this phosphor and the matrix material. In particular, the conversion element or the lighting device, in particular the conversion LED, in accordance with this embodiment does not have a further phosphor. The phosphor can thus be present, therefore, as sole phosphor in the conversion element or the lighting device, in particular the conversion LED.

Green light-emitting diodes, which emit a radiation in the green wavelength range, can be obtained firstly by means of semiconductor chips which emit green directly or conversion LEDs having a semiconductor chip and a green phosphor. Semiconductor chips which emit green directly exhibit a very low quantum efficiency. In the case of the conversion LEDs, the primary radiation can on the one hand be converted completely into green secondary radiation (full conversion) or on the other hand be converted only partly into green secondary radiation (partial conversion), and the remaining proportion of primary radiation is filtered out by means of a filter, such that the lighting device emits exclusively or almost exclusively secondary radiation, in particular green secondary radiation.

$(Y,Lu)_3(Al,Ga)_5O_{12}:Ce$, orthosilicates or oxonitridoorthosilicates are conventionally used as green phosphors. The conventional conversion LEDs often have a low efficiency and color purity. In order to avoid these disadvantages, filters are used to adapt the emission. However, this adversely affects the total power of the conversion LED.

Lighting devices, in particular conversion LEDs, comprising the green phosphor according to the present disclosure of the formula $(Na_rK_{1-r})_1(TA)_3(TD)_1(XB)_4:E$ where $0.2<r\leq0.4$, $(Rb_{r'}Li_{1-r'})_1(TA)_3(TD)_1(XB)_4:E$ where $0\leq r'\leq1$, $(K_{1-r''-r'''}Na_{r''}Li_{r'''})_1(TA)_3(TD)_1(XB)_4:E$ where $0<r''<0.5$ and $0<r'''<0.5$, $(Cs,Na,K,Li)_1(TA)_3(TD)_1(XB)_4:E$, advantageously $(Cs_{0.25}Na_{0.25}K_{0.25}Li_{0.25})(TA)_3(TD)_1(XB)_4:E$ or $(Rb_{r*}Na_{1-r*})_1(TA)_3(TD)_1(XB)_4:E$ where $0.4\leq r*<0.875$, for example $(Rb_{0.5}Li_{0.5})Li_3SiO_4:Eu$, $(Na_{0.25}K_{0.75})Li_3SiO_4:Eu$, $(Na_{0.25}K_{0.50}Li_{0.25})Li_3SiO_4:Eu$, $(Cs_{0.25}Na_{0.25}K_{0.25}Li_{0.25})Li_3SiO_4:Eu$ or $(Rb_{0.5}Na_{0.5})Li_3SiO_4:Eu$, are by contrast very efficient and exhibit a high color purity and a high power even without the use of a color filter.

In accordance with at least one embodiment, the lighting device, in particular the conversion light-emitting diode, is configured to emit a white radiation. The phosphor has the formula $(Na_rK_{1-r})_1(TA)_3(TD)_1(XB)_4:E$ where $0.4<r\leq1$, advantageously $0.45<r\leq1$, very particularly advantageously $r=0.5$ or 1.

Advantageously, TA=Li, TD=Si and XB=O. Alternatively, the phosphor has the formula $(Rb_{r*}Na_{1-r*})_1(TA)_3(TD)_1(XB)_4:E$, wherein $0<r*<0.4$, for example $r*=0.05$; 0.1; 0.15; 0.2; 0.25; 0.3; 0.35, advantageously $0.1\leq r*\leq0.35$, particularly advantageously $0.2\leq r*\leq K$ 0.3, very particularly advantageously $r*=0.25$ or $(Cs,Na,Rb,Li)_1(TA)_3(TD)_1(XB)_4:E$, $(Cs,Na,K)_1(TA)_3(TD)_1(XB)_4:E$ and $(Rb,Na,K)_1(TA)_3(TD)_1(XB)_4:E$. Advantageously, TA=Li, TD=Si and XB=O. By way of example, the phosphor has the formula $NaLi_3SiO_4:Eu$, $(Na_{0.5}K_{0.5})Li_3SiO_4:Eu$, $(Rb_{0.25}Na_{0.75})Li_3SiO_4:Eu$, $(Cs_{0.25}Na_{0.25}Rb_{0.25}Li_{0.25})Li_3SiO_4:Eu$, $(Cs_{0.25}Na_{0.5}K_{0.25})Li_3SiO_4:Eu$ or $(Rb_{0.25}Na_{0.5}K_{0.25})Li_3SiO_4:Eu$. The peak wavelength of these phosphors is advantageously in the blue spectral range, in particular in the range of between 450 nm and 500 nm. The conversion element comprises a second and a third phosphor, wherein the second phosphor is configured partly to convert the electromagnetic primary radiation into an electromagnetic secondary radiation that is in the red spectral range of the electromagnetic spectrum, and the third phosphor is configured to convert the electromagnetic primary radiation into an electromagnetic secondary radiation that is in the green spectral range of the electromagnetic spectrum during operation of the lighting device. It is possible for the conversion element to consist of the phosphor, the second and third phosphors or of the phosphor, the second and third phosphors and the matrix material. In particular, the conversion element or the lighting device, in particular the conversion LED, in accordance with this embodiment does not have a further phosphor. The phosphor and the second and third phosphors can thus be present, therefore, as sole phosphors in the conversion element or the lighting device, in particular the conversion LED. A superimposition of the secondary radiations in the blue, red and green spectral range gives a white-colored luminous impression. The lighting device, in particular conversion LED in accordance with this embodiment is suitable in particular for general lighting.

Known white-emitting conversion LEDs use a semiconductor chip which emits a blue primary radiation, and at least one red and green phosphor. A superimposition of the blue primary radiation and the red and green secondary radiation gives rise to white light. What is disadvantageous about this solution is that the epitaxially grown semiconductor chips, based for example on GaN or InGaN, may have fluctuations in the peak wavelength of the emitted primary radiation. This leads to fluctuations in the white overall radiation, such as a change in the color locus and the color rendering, since the primary radiation contributes the blue portion to the overall radiation. This is problematic particularly when a plurality of semiconductor chips are used in a device. In order to prevent fluctuations, the semiconductor chips have to be sorted in accordance with their color loci ("binning"). The narrower the tolerances set with regard to the wavelength of the emitted primary radiation, the higher the quality of devices which consist of more than one semiconductor chip. However, even after sorting with narrow tolerances, the peak wavelength of the semiconductor chips can change significantly in the case of variable operating temperatures and forward currents. In general lighting and other applications, this may lead to a change in the optical properties, such as the color locus and the color temperature. An additional factor is that for conventional solutions in the range of 450 nm to 500 nm of the electromagnetic spectrum there is a spectral gap in the emission spectrum in which no or only very little light is emitted. This results in a reduction of the color rendering index in comparison with the reference light source.

The phosphor $(Na_rK_{1-r})_1(TA)_3(TD)_1(XB)_4$:E where $0.4<r\leq 1$, for example $NaLi_3SiO_4$:Eu, $(Rb_{r*}Na_{1-r*})_1(TA)_3(TD)_1(XB)_4$:E, where $0<r*<0.4$, $(Cs,Na,Rb,Li)_1(TA)_3(TD)_1(XB)_4$:E, $(Cs,Na,K)_1(TA)_3(TD)_1(XB)_4$:E or $(Rb,Na,K)_1(TA)_3(TD)_1(XB)_4$:E or $(Na_{0.5}K_{0.5})Li_3SiO_4$:Eu, can be excited efficiently with a primary radiation of 300 nm to 440 nm. The combination of a semiconductor chip with a primary radiation of 300 nm to 440 nm, for example based on GaInN, leads to the emission of a secondary radiation in the blue spectral range which is stable over a significantly wider temperature range and larger ranges for the forward currents. Since the primary radiation of 300 nm to 440 nm is not visible or is scarcely visible, a wide variety of semiconductor chips can be used as primary radiation source and a constant and stable emission spectrum of the conversion LED can nevertheless be obtained. In this regard complex "binning" of the semiconductor chips can be avoided or simplified and the efficiency can be increased. As a result of a peak wavelength of the phosphor in the range of 450 nm and 500 nm, the emission is increased in this range. The color rendering index can thus advantageously be increased.

In accordance with at least one embodiment, the lighting device, in particular the conversion light-emitting diode, is configured to emit a white radiation. The phosphor has the formula $Na_{1-y*}Ca_{y*}Li_{3-2y*}Al_{3y*}Si_{1-y*}O_{4-4y*}N_{4y*}$:E where $0<y*<0.875$, advantageously $0<y*\leq 0.5$, particularly advantageously $0<y*\leq 0.3$, very particularly advantageously $0<y*\leq 0.1$, for example $Na_{0.97}Ca_{0.03}Li_{2.94}Al_{0.09}Si_{0.97}O_{3.88}N_{0.12}$:Eu. The peak wavelength of the phosphor is advantageously in the blue or green spectral range, in particular in the range of between 470 nm and 560 nm, advantageously between 470 nm and 520 nm. The conversion element comprises in particular a second and a third phosphor, wherein the second phosphor is configured partly to convert the electromagnetic primary radiation into an electromagnetic secondary radiation that is in the red spectral range of the electromagnetic spectrum, and the third phosphor is configured to convert the electromagnetic primary radiation into an electromagnetic secondary radiation that is in the green spectral range of the electromagnetic spectrum during operation of the lighting device. In this case, the third phosphor has in particular an electromagnetic secondary radiation having a peak wavelength of more than 520 nm. It is possible for the conversion element to consist of the phosphor, the second and third phosphors or of the phosphor, the second and third phosphors and the matrix material. In particular, the conversion element or the lighting device, in particular the conversion LED, in accordance with this embodiment does not have a further phosphor. The phosphor and the second and third phosphors can thus be present, therefore, as sole phosphors in the conversion element or the lighting device, in particular the conversion LED. A superimposition of the secondary radiations gives a white-colored luminous impression. Radiation in the range of 450 nm to 500 nm of the electromagnetic spectrum is also emitted as a result of the use of the phosphor $Na_{1-y*}Ca_{y*}Li_{3-2y*}Al_{3y*}Si_{1-y*}O_{4-4y*}N_{4y*}$:E. With the use of standard phosphors, a spectral gap in the overall emission spectrum often prevails here, in which therefore no or only very little light is emitted. As a result, the overall radiation almost continuously covers in particular the visible range of the electromagnetic spectrum, whereby the overall radiation has a high color rendering index. The lighting device, in particular conversion LED, in accordance with this embodiment is suitable in particular for general lighting.

In accordance with at least one embodiment, the lighting device, in particular the conversion light-emitting diode, is configured to emit a white radiation. The phosphor has the formula $Sr(Si_{0.25}Al_{-1/8+r/2}Li_{7/8-r/2})_4(O_{1-r}N_{r})_4$:E, wherein $0.25\leq r\leq 1$, advantageously $0.25<r<0.875$, particularly advantageously $0.4\leq r\leq 0.8$. Advantageously, E=Eu. The peak wavelength of the phosphor is advantageously in the yellow to red spectral range. The conversion element can comprise a further phosphor, wherein a white-colored luminous impression is produced by a superimposition of the secondary radiations and/or the primary radiation and the secondary radiations. Since the peak wavelength of the phosphor $Sr(Si_{0.25}Al_{-1/8+r/2}Li_{7/8-r/2})_4(O_{1-r}N_{r})_4$:E can be in the yellow to red spectral range depending on the proportion of $r$, the choice of the further phosphor within the conversion LED for generating white light depends on the peak wavelength of the phosphor $Sr(Si_{0.25}Al_{-1/8+r/2}Li_{7/8-r/2})_4(O_{1-r}N_{r})_4$:E.

In accordance with at least one embodiment, the lighting device, in particular the conversion light-emitting diode, is configured to emit a radiation that is in the yellow to red spectral range. The phosphor has the formula $Na_{1-y}Eu_{y}Li_{3-2y}Al_{3y}Si_{1-y}O_{4-4y}N_{4y}$:Eu, wherein $0<y\leq 1.0$, advantageously $0<y<0.875$ or $0<y<0.5$, particularly advantageously $0.05\leq y\leq 0.45$, very particularly advantageously $0.1\leq y\leq 0.4$, $0.15\leq y\leq 0.35$ or $0.2\leq y\leq 0.3$. It is possible for the conversion element to consist of this phosphor or this phosphor and the matrix material. In particular, the conversion element or the lighting device, in particular the conversion LED, in accordance with this embodiment does not have a further phosphor. The phosphor can thus be present, therefore, as sole phosphor in the conversion element or the lighting device, in particular the conversion LED.

In accordance with at least one embodiment, the lighting device, in particular the conversion light-emitting diode, is configured to emit a radiation that is in the yellow or yellow-orange spectral range. The phosphor has the formula $Na_{1-y}Eu_{y}Li_{3-2y}Al_{3y}Si_{1-y}O_{4-4y}N_{4y}$:Eu, wherein $0.1\leq y\leq 0.4$, $0.15\leq y\leq 0.35$ or $0.2\leq y\leq 0.3$. Conversion light-emitting diodes of this embodiment are suitable in particular for the use thereof in warning lights and flashing lights in motor vehicles. The inventors have been able to show that the color loci of the overall radiation of the conversion light-emitting diode of this embodiment lie in the color space defined by the ECE/UNECE for flashing lights in motor vehicles in Europe and in the color space defined by the SAE for flashing lights in motor vehicles in North America.

In particular, the electromagnetic primary radiation is almost completely absorbed by the phosphor $Na_{1-y}Eu_{y}Li_{3-2y}Al_{3y}Si_{1-y}O_{4-4y}N_{4y**}$:Eu and emitted in the form of an electromagnetic secondary radiation. The emitted radiation or overall radiation of the lighting device, in particular of the conversion LED, in accordance with this embodiment thus almost completely corresponds to the electromagnetic secondary radiation.

Yellow or orange-yellow light-emitting diodes, which emit a radiation in the yellow or yellow-orange wavelength range, can firstly be obtained by means of semiconductor chips on the basis of InGaAlP which emit directly in this spectral range or conversion LEDs having a semiconductor chip and a yellow phosphor. However, semiconductor chips which emit yellow directly exhibit a very low quantum efficiency in comparison with conversion LEDs.

In accordance with at least one embodiment, the lighting device, in particular the conversion light-emitting diode, is configured to emit a blue radiation. The phosphor has the formula $(Na_rK_{1-r})_1(TA)_3(TD)_1(XB)_4$:E where $0.4<r\leq1$, advantageously $0.45<r\leq1$, very particularly advantageously $r=0.5$. Advantageously, TA=Li, TD=Si and XB=O. Alternatively, the phosphor has the formula $(Rb_{r*}Na_{1-r*})_1(TA)_3(TD)_1(XB)_4$:E, wherein $0<r*<0.4$, advantageously $0.1\leq r*\leq0.35$, particularly advantageously $0.2\leq r*\leq0.3$, very particularly advantageously $r*=0.25$ or $(Cs,Na,Rb,Li)_1(TA)_3(TD)_1(XB)_4$:E, $(Cs,Na,K)_1(TA)_3(TD)_1(XB)_4$:E and $(Rb,Na,K)_1(TA)_3(TD)_1(XB)_4$:E. By way of example, the phosphor has the formula $NaLi_3SiO_4$:Eu or $(Na_{0.5}K_{0.5})Li_3SiO_4$:Eu, $(Rb_{0.25}Na_{0.75})Li_3SiO_4$:Eu or $(Cs_{0.25}Na_{0.25}Rb_{0.25}Li_{0.25})Li_3SiO_4$:Eu, $(Cs_{0.25}Na_{0.5}K_{0.25})Li_3SiO_4$:Eu or $(Rb_{0.25}Na_{0.5}K_{0.25})Li_3SiO_4$:Eu. The peak wavelength of these phosphors is in the blue spectral range. It is possible for the conversion element to consist of this phosphor or this phosphor and the matrix material. In particular, the conversion element or the lighting device, in particular the conversion LED, in accordance with this embodiment does not have a further phosphor; the phosphor can thus be present, therefore, as sole phosphor in the conversion element or the lighting device, in particular the conversion LED. With the lighting device, in particular the conversion LED, in accordance with this embodiment it is advantageously possible to obtain many color loci in the blue range of the electromagnetic spectrum which have not been able to be achieved heretofore.

The lighting devices, in particular the conversion LEDs, of this embodiment are suitable for example for signal lights, such as blue lights of, for example, police vehicles, ambulances, emergency doctor vehicles or fire department vehicles. Since said signal lights must firstly be very bright and secondly be in a specific color locus range (the dominant wavelength is usually between 465 nm and 480 nm), not all blue light sources are suitable for this use. On the other hand, lighting devices, in particular conversion LEDs, comprising the phosphor $(Na_rK_{1-r})_1(TA)_3(TD)_1(XB)_4$:E where $0.4<r\leq1$, in particular comprising $(Na_{0.5}K_{0.5})Li_3SiO_4$:Eu or $(Rb_{r*}Na_{1-r*})_1(TA)_3(TD)_1(XB)_4$:E where $0<r*<0.4$ in particular comprising $(Rb_{0.25}Na_{0.75})Li_3SiO_4$:Eu, are suitable for suppressing melatonin production for human beings. $(Cs,Na,Rb,Li)_1(TA)_3(TD)_1(XB)_4$:E, $(Cs,Na,K)_1(TA)_3(TD)_1(XB)_4$:E and $(Rb,Na,K)_1(TA)_3(TD)_1(XB)_4$:E such as for example $(Cs_{0.25}Na_{0.25}Rb_{0.25}Li_{0.25})Li_3SiO_4$:Eu, $(Cs_{0.25}Na_{0.5}K_{0.25})Li_3SiO_4$:Eu or $(Rb_{0.25}Na_{0.5}K_{0.25})Li_3SiO_4$:Eu are likewise suitable for this. TA=Li, TD=Si and XB=O advantageously hold true for the phosphors. The lighting device, in particular conversion LED, in accordance with this embodiment can thus be used in a targeted manner to increase the vigilance and/or ability to concentrate. By way of example, they can contribute to overcoming jetlag more rapidly. Moreover, the phosphor or a lighting device, in particular a conversion LED, comprising the phosphor is suitable for "color on demand" applications, that is to say for lighting devices, in particular conversion LEDs, having blue color loci adapted to consumer desires, for example for realizing certain brand-specific or product-specific colors, for example in advertising or in the design of the interior fittings for automobiles.

In accordance with at least one embodiment, the lighting device, in particular the conversion light-emitting diode, is configured to emit a blue or green radiation. The phosphor has the formula $Na_{1-y*}Ca_{y*}Li_{3-2y*}Al_{3y*}Si_{1-y*}O_{4-4y*}N_{4y*}$:E where $0<y*<0.875$, advantageously $0<y*\leq0.5$, particularly advantageously $0<y*\leq0.3$, very particularly advantageously $0<y*\leq0.1$. By way of example, the phosphor has the formula $Na_{0.97}Ca_{0.03}Li_{2.94}Al_{0.09}Si_{0.97}O_{3.88}N_{0.12}$:Eu. The peak wavelength of the phosphor is in the blue or green spectral range. It is possible for the conversion element to consist of this phosphor or this phosphor and the matrix material. In particular, the conversion element or the lighting device, in particular the conversion LED, in accordance with this embodiment does not have a further phosphor; the phosphor can thus be present, therefore, as sole phosphor in the conversion element or the lighting device, in particular the conversion LED. With the lighting device, in particular the conversion LED, in accordance with this embodiment it is advantageously possible to obtain many color loci in the green range of the electromagnetic spectrum. The conversion light-emitting diode or lighting device of this embodiment is suitable in particular for applications in which a saturated green emission is required, such as for video projection, for example in the cinema, office or at home, head-up displays, for light sources having an adjustable color rendering index or color temperature, light sources having a spectrum adapted to the application, such as store lighting or FCI lamps ("feeling of contrast index"). FCI lamps are lighting devices which are geared to generating a white light having a particularly high color contrast index. Conversion light-emitting diodes or lighting devices of this embodiment are also suitable for colored spotlights, wall lighting systems or moving spotlights, in particular in stage lighting.

In accordance with at least one embodiment, the lighting device, in particular the conversion light-emitting diode, is configured to emit a yellow to red radiation. The phosphor has the formula $Sr(Si_{0.25}Al_{-1/+r/2}Li_{7/8-r/2})_4(O_{1-r}N_{r})_4$:E, wherein $0.25\leq r\leq1$, advantageously $0.25<r\leq0.875$, particularly advantageously $0.4\leq r**\leq0.8$. Advantageously, E=Eu. By way of example, the phosphor has the formula $SrSiAl_{0.84}Li_{2.16}O_{1.32}N_{2.68}$:Eu$^{2+}$. In particular, the primary radiation is completely or almost completely converted into the secondary radiation by the phosphor, such that the overall radiation completely or almost completely corresponds to the secondary radiation. The peak wavelength of the phosphor is in the yellow to red spectral range. It is possible for the conversion element to consist of this phosphor or this phosphor and the matrix material. In particular, the conversion element or the lighting device, in particular the conversion LED, in accordance with this embodiment does not have a further phosphor; the phosphor can thus be present, therefore, as sole phosphor in the conversion element or the lighting device, in particular the conversion LED. With the lighting device, in particular the conversion LED, in accordance with this embodiment it is advantageously possible to obtain many color loci in the yellow to red range of the electromagnetic spectrum.

In accordance with at least one embodiment, the lighting device, in particular the conversion light-emitting diode, is configured to emit a white radiation. The phosphor has the following general molecular formula:

$$SrLi_{3-2x}Al_{1+2x}O_{4-4x}N_{4x}:Eu$$

where $0<x\leq1.0$, advantageously $0<x<0.875$, particularly advantageously $0.125\leq x<0.875$ or $0.125\leq x\leq0.5$, very particularly advantageously $0.125\leq x**\leq0.45$. Advantageously, E=Eu. In this case, it is advantageously possible for the conversion element to consist of this phosphor or this phosphor and the matrix material. In particular, the conversion element or the lighting device, in particular the conversion LED, in accordance with this embodiment does not have a further phosphor. The phosphor can thus be present, therefore, as sole phosphor in the conversion element or the lighting device, in particular the conversion LED. The overall radiation is composed of the primary radiation and the secondary radiation. In particular, the lighting device, in particular the conversion LED, in accordance with this embodiment emits warm-white radiation having a color temperature of less than 3600 K, in particular 3400 K±100 K. Advantageously, the color locus of the overall radiation can be near the Planckian locus. Therefore, this lighting device, in particular this conversion LED, is suitable in particular for general lighting for example for living spaces.

In accordance with at least one embodiment, the lighting device, in particular the conversion light-emitting diode, is configured to emit a green to red radiation. The phosphor has the formula $SrLi_{3-2x^{}}Al_{1+2x^{}}O_{4-4x^{}}N_{4x^{}}$:Eu where $0<x^{}\leq1.0$, advantageously $0<x^{}<0.875$, particularly advantageously $0.125\leq x^{}<0.875$ or $0.125\leq x^{}\leq 0.5$, very particularly advantageously $0.125\leq x^{}\leq 0.45$. The peak wavelength of the phosphor is in the green to red spectral range depending on the proportion of $x^{}$. It is possible for the conversion element to consist of this phosphor or this phosphor and the matrix material. In particular, the conversion element or the lighting device, in particular the conversion LED, in accordance with this embodiment does not have a further phosphor; the phosphor can thus be present, therefore, as sole phosphor in the conversion element or the lighting device, in particular the conversion LED. With the lighting device, in particular the conversion LED, in accordance with this embodiment it is advantageously possible to obtain many color loci in the green to red range of the electromagnetic spectrum.

In accordance with at least one embodiment, the lighting device, in particular the conversion light-emitting diode, is configured to emit a white radiation. The phosphor has the following general molecular formula:

$$(Na_rK_{1-r})_1(TA)_3(TD)_1(XB)_4{:}E$$

where $0.05<r\leq0.2$, advantageously $0.1<r\leq0.2$, in particular $Na_{0.125}K_{0.875}Li_3SiO_4$:Eu. In this case, it is advantageously possible for the conversion element to consist of this phosphor or this phosphor and the matrix material. In particular, the conversion element or the lighting device, in particular the conversion LED, in accordance with this embodiment does not have a further phosphor. The phosphor can thus be present, therefore, as sole phosphor in the conversion element or the lighting device, in particular the conversion LED. The overall radiation is composed of the primary radiation and the secondary radiation. In particular, the lighting device, in particular the conversion LED, in accordance with this embodiment emits cold-white radiation having a color temperature of more than 8000 K. Moreover, it is possible to obtain a high color rendering index without a further phosphor being necessary. Therefore, this lighting device, in particular this conversion LED, is suitable in particular for general lighting, for example for office spaces.

In accordance with at least one embodiment, the lighting device, in particular the conversion LED, comprises a filter or filter particles absorbing the primary radiation and/or partly the secondary radiation. In particular, the lighting device, in particular conversion LED, comprises a filter or filter particles absorbing the primary radiation and/or partly the secondary radiation if the lighting device, in particular the conversion LED, is used for the backlighting of display elements.

In one embodiment, the filters are color filter systems of the colors red, green and blue.

In one embodiment, the color filter system has a respective full width at half maximum in the range of 70 to 120 nm for the colors red, green, blue.

The color filter system advantageously comprises a blue filter, a green filter and a red filter, which filter the overall radiation to form light of a first, second and third transmission spectrum.

In one embodiment, the emission of the lighting device, in particular of the conversion LED, and the transmission of the color filter system are chosen such that the maxima are at similar wavelengths. As a result, there is only little reabsorption at the color filter system.

In one embodiment, the phosphor(s) is (are) distributed homogeneously in the conversion element.

In one embodiment, the phosphor(s) are distributed with a concentration gradient in the conversion element.

In one embodiment, the phosphor having a shorter peak wavelength is disposed downstream of the phosphor(s) having a longer peak wavelength in order to reduce absorption losses.

In one embodiment, the phosphor or the phosphors is or are particles of the corresponding phosphor.

The particles of the phosphors can have, independently of one another, an average grain size of between 1 µm and 50 µm, advantageously between 5 µm and 40 µm, particularly advantageously between 8 µm and 35 µm, very particularly advantageously between 8 µm and 30 µm. With these grain sizes, the primary radiation or the secondary radiation is advantageously scattered little and/or principally in the forward direction at these particles, which reduces efficiency losses.

In one embodiment, the conversion element consists of the phosphor and the matrix material or the phosphors and the matrix material.

In one embodiment, the conversion element is configured as a lamina.

In one embodiment, the lamina has a thickness of 1 µm to 1 mm, advantageously 10 µm to 150 µm, particularly advantageously 25 µm to 100 µm.

The layer thickness of the entire lamina can be uniform. In this regard, a constant color locus can be obtained over the entire area of the lamina.

In one embodiment, the conversion element can be a ceramic lamina. This should be understood to mean that the lamina consists of sintered-together particles of the phosphor or of the phosphors.

In one embodiment, the lamina comprises a matrix material, for example glass, in which the phosphor(s) is or are embedded. The lamina can also consist of the matrix material, for example of glass, and the phosphor(s). Silicones, epoxy resins, polysilazanes, polymethacrylates and polycarbonates and combinations thereof are also possible as matrix materials for the lamina.

In accordance with one embodiment, the conversion element is configured as a lamina arranged above the primary radiation source or the layer sequence.

The conversion element shaped as a lamina can be fitted directly on the primary radiation source or the layer sequence. It is possible for the lamina to completely cover the entire surface, in particular the radiation exit surface, of the primary radiation source or of the layer sequence.

The lighting device, in particular the conversion LED, can comprise a housing. In the housing, a cutout can be present in the center. The primary radiation source or the layer sequence can be fitted in the cutout. It is also possible for one or more further primary radiation sources or layer sequences to be fitted in the cutout.

It is possible for the cutout to be filled with a potting that covers the primary radiation source or the layer sequence. However, the cutout can also consist of an air space.

In one embodiment, the conversion element is arranged above the cutout of the housing. In this embodiment, there is in particular no direct and/or positively locking contact between the conversion element and the primary radiation source or the layer sequence. That is to say that there may be a distance between the conversion element and the primary radiation source or layer sequence. In other words, the conversion element is disposed downstream of the primary radiation source or the layer sequence and is irradiated by the primary radiation. A potting or an air gap may then be formed between the conversion element and the primary radiation source or the layer sequence. This arrangement may be referred to as "remote phosphor conversion".

In one embodiment, the conversion element is part of a potting of the primary radiation source or of the layer sequence or the conversion element forms the potting.

In one embodiment, the conversion element is configured as a layer. The layer can be arranged above the radiation exit surface of the primary radiation source or of the layer stack or above the radiation exit surface and the side surfaces of the primary radiation source or of the layer stack.

The use of a lighting device, in particular of a conversion LED, is specified. All features of the lighting device and of the conversion LED are also disclosed for the use thereof, and vice-versa.

The use of a lighting device, in particular of a conversion LED, for the backlighting of display devices, in particular displays, is specified. By way of example, displays of televisions, such as liquid crystal displays, computer monitors, tablets or smartphones are involved.

For the backlighting of display elements, the lighting devices, in particular conversion LEDs, used must firstly have a high brightness and secondly cover a large color space. Known filter systems used in conversion LEDs for backlighting consist of three or four color filters (blue, green and red or blue, green, yellow and red). The filters usually have a full width at half maximum in the range of typically 70 to 120 nm. The transmission results from the superposition of the three color filters; this results in regions of the visible spectrum in which complete transmission is not achieved. That has the effect that, in the case of a broadband spectrum of the conversion LED that backlights the color filters, a proportion of the emitted light is absorbed by the filter. In order to obtain the maximum quantity of light from the conversion LED at the display level, therefore, narrow-band phosphors are required. In order moreover to obtain a high color saturation, it is important for the individual emissions of the conversion LEDs to address spectrally in each case as far as possible only one color of the color filter system.

Surprisingly, the lighting devices, in particular conversion LEDs, according to the present disclosure are very well suited to the backlighting of displays. In particular a lighting device, in particular a conversion LED, having a conversion element comprising the phosphor of the formula $(Na_rK_{1-r})_1(TA)_3(TD)_1(XB)_4:E$ where $0.2<r\leq0.4$, advantageously $0.2<r\leq0.3$, very particularly advantageously $r=0.25$, $(Rb_{r'}Li_{1-r'})_1(TA)_3(TD)_1(XB)_4:E$ where $0\leq r'\leq 1$, advantageously $0.25\leq r'\leq0.75$, particularly advantageously $0.4\leq r'\leq0.6$, $(K_{1-r''-r'''}Na_{r''}Li_{r'''})_1(TA)_3(TD)_1(XB)_4:E$ where $0<r''<0.5$ and $0<r'''<0.5$, advantageously $0.1<r''<0.4$ and $0.1<r'''<0.4$, particularly advantageously $0.2<r''<0.3$ and $0.2<r'''<0.3$, $(Cs,Na,K,Li)_1(TA)_3(TD)_1(XB)_4:E$, advantageously $(Cs_{0.25}Na_{0.25}K_{0.25}Li_{0.25})(TA)_3(TD)_1(XB)_4:E$, or $(Rb_{r*}Na_{1-r*})_1(TA)_3(TD)_1(XB)_4:E$ where $0.4\leq r*<1.0$, advantageously $0.4\leq r*\leq0.75$, particularly advantageously $0.4\leq r*\leq0.6$, very particularly advantageously $r*=0.5$, has proved to be particularly suitable for the backlighting of display elements since the peak wavelength of the phosphor is in the green spectral range of the electromagnetic spectrum and has a full width at half maximum of less than 50 nm. As a result of the small full width at half maximum of the phosphors according to the present disclosure, the emission peaks exhibit a very large overlap with the transmission range of a standard green filter, such that only little light is lost and the achievable color space is large.

Lighting devices, in particular conversion LEDs, having a conversion element comprising the phosphor $(Na_rK_{1-r})_1(TA)_3(TD)_1(XB)_4:E$ where $0.05<r\leq0.2$, advantageously $0.1<r\leq0.2$, are also suitable for the backlighting of displays.

The use of a lighting device, in particular a conversion LED, in warning lights and flashing lights in motor vehicles is specified. The lighting device, in particular the conversion light-emitting diode, is configured to emit an orange or yellow-orange radiation. Advantageously, the phosphor has the formula $Na_{1-y}Eu_{y}Li_{3-2y}Al_{3y}Si_{1-y}O_{4-4y}N_{4y}:Eu$, wherein $0.1\leq y\leq0.4$, $0.15\leq y\leq0.35$ or $0.2\leq y\leq0.3$.

The use of a lighting device, in particular a conversion LED, in blue light sources for reducing melatonin production or for color-on-demand applications is specified. The lighting device, in particular the conversion light-emitting diode, is configured to emit a blue radiation. Advantageously, the phosphor has the formula $(Na_rK_{1-r})_1(TA)_3(TD)_1(XB)_4:E$ where $0.4<r\leq1$, advantageously $0.45<r\leq1$, very particularly advantageously $r=0.5$. Advantageously, TA=Li, TD=Si and XB=O. By way of example, the phosphor has the formula $(Na_{0.5}K_{0.5})Li_3SiO_4:Eu$. Alternatively, the phosphor has the formula $(Rb_{r*}Na_{1-r*})_1(TA)_3(TD)_1(XB)_4:E$, wherein $0<r*<0.4$, advantageously $0.1\leq r*\leq0.35$, particularly advantageously $0.2\leq r*\leq0.3$, very particularly advantageously $r*=0.25$. By way of example, the phosphor has the formula $(Rb_{0.25}Na_{0.75})Li_3SiO_4:Eu$. Alternatively, the phosphor has the formula $(Cs,Na,Rb,Li)_1(TA)_3(TD)_1(XB)_4:E$, $(Cs,Na,K)_1(TA)_3(TD)_1(XB)_4:E$ or $(Rb,Na,K)_1(TA)_3(TD)_1(XB)_4:E$, for example $(Cs_{0.25}Na_{0.25}Rb_{0.25}Li_{0.25})Li_3SiO_4:Eu$, $(Cs_{0.25}Na_{0.5}K_{0.25})Li_3SiO_4:Eu$ or $(Rb_{0.25}Na_{0.5}K_{0.25})Li_3SiO_4:Eu$. The peak wavelength of the phosphor is in the blue spectral range.

Vigilance and/or the ability to concentrate can be increased by reducing melatonin production.

The use of a lighting device, in particular a conversion LED, for general lighting is specified. The lighting device, in particular the conversion light-emitting diode, is configured to emit a white radiation. In particular, warm-white radiation having a color temperature of less than 3500 K, advantageously less than 3000 K, is involved.

For general lighting, the phosphor in this case has for example the formula $(Na_rK_{1-r})_1(TA)_3(TD)_1(XB)_4:E$ where $0\leq r\leq0.05$, advantageously $r=0$. Advantageously, TA=Li, TD=Si and XB=O. By way of example, the phosphor is $KLi_3SiO_4:Eu$. The phosphor exhibits very broadband emission from the blue to red spectral range, thus giving rise to a white-colored luminous impression. The lighting device, in particular the conversion LED, in accordance with this embodiment emits a warm-white radiation having a color temperature of less than 3500 K, in particular less than 3000 K.

For general lighting, the phosphor can also have the following formula $$(Na_rK_{1-r})_1(TA)_3(TD)_1(XB)_4:E$$

where $0.4<r\leq1$, advantageously $0.45<r\leq1$, very particularly advantageously $r=0.5$ or $1$. Advantageously, TA=Li, TD=Si and XB=O. By way of example, the phosphor has the formula NaLi$_3$SiO$_4$:Eu or (Na$_{0.5}$K$_{0.5}$)Li$_3$SiO$_4$:Eu. Alternatively, the phosphor can have the formula (Rb$_{r*}$Na$_{1-r*}$)$_1$(TA)$_3$(TD)$_1$(XB)$_4$:E, wherein $0<r*<0.4$, advantageously $0.1\leq r*\leq0.35$, particularly advantageously $0.2\leq r*\leq0.3$, very particularly advantageously $r*=0.25$. By way of example, the phosphor has the formula (Rb$_{0.25}$Na$_{0.75}$) Li$_3$SiO$_4$:Eu. Alternatively, the phosphor has the formula (Cs,Na,Rb,Li)$_1$(TA)$_3$(TD)$_1$(XB)$_4$:E, (Cs,Na,K)$_1$(TA)$_3$(TD)$_1$(XB)$_4$:E or (Rb,Na,K)$_1$(TA)$_3$(TD)$_1$(XB)$_4$:E, for example (Cs$_{0.25}$Na$_{0.25}$Rb$_{0.25}$Li$_{0.25}$) Li$_3$SiO$_4$:Eu, (Cs$_{0.25}$Na$_{0.5}$K$_{0.25}$) Li$_3$SiO$_4$:Eu or (Rb$_{0.25}$Na$_{0.5}$K$_{0.25}$) Li$_3$SiO$_4$:Eu. The peak wavelengths of these phosphors are advantageously in the blue spectral range, in particular in the range of between 450 nm and 500 nm. The conversion element comprises a second and a third phosphor, wherein the second phosphor is configured partly to convert the electromagnetic primary radiation into an electromagnetic secondary radiation in the red spectral range and the third phosphor is configured to convert the electromagnetic primary radiation into an electromagnetic secondary radiation in the green spectral range during operation of the lighting device.

For general lighting, the phosphor can also have the following formula

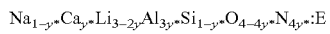

$0<y*\leq0.875$, advantageously $0<y*\leq0.5$, particularly advantageously $0<y*\leq0.3$, very particularly advantageously $0<y*\leq0.1$. The peak wavelength of the phosphor is advantageously in the blue or green spectral range. The conversion element comprises a second and a third phosphor, wherein the second phosphor is configured partly to convert the electromagnetic primary radiation into an electromagnetic secondary radiation in the red spectral range and the third phosphor is configured to convert the electromagnetic primary radiation into an electromagnetic secondary radiation in the green spectral range during operation of the lighting device.

In accordance with at least one embodiment, the display device is a display, for example of a television, of a smartphone, or a computer monitor or of a tablet.

In accordance with at least one embodiment, the lighting device, in particular the conversion LED, has a conversion element comprising the phosphor of the formula (Na$_r$K$_{1-r}$)$_1$(TA)$_3$(TD)$_1$(XB)$_4$:E where $0.2<r\leq0.4$, advantageously $0.2<r\leq0.3$, particularly advantageously $r=0.25$ or (Rb$_{r'}$Li$_{1-r'}$)$_1$(TA)$_3$(TD)$_1$(XB)$_4$:E where $0\leq r'\leq 1$, advantageously $0.25\leq r'\leq 0.75$, particularly advantageously $0.4\leq r'\leq 0.6$, very particularly advantageously $r'=0.5$, (K$_{1-r''-r'''}$Na$_{r''}$Li$_{r'''}$)$_1$(TA)$_3$(TD)$_1$(XB)$_4$:E where $0<r''<0.5$ and $0<r'''<0.5$, advantageously $0.1<r''<0.4$ and $0.1<r'''<0.4$, particularly advantageously $0.2<r''<0.3$ and $0.2<r'''<0.3$, (Cs,Na,K,Li)$_1$(TA)$_3$(TD)$_1$(XB)$_4$:E, advantageously (Cs$_{0.25}$Na$_{0.25}$K$_{0.25}$Li$_{0.25}$)(TA)$_3$(TD)$_1$(XB)$_4$:E or (Rb$_{r*}$Na$_{1-r*}$)$_1$(TA)$_3$(TD)$_1$(XB)$_4$:E where $0.4\leq r*<1.0$, advantageously $0.4\leq r*\leq 0.75$, particularly advantageously $0.4\leq r*\leq 0.6$, very particularly advantageously $r*=0.5$. The conversion element comprises a second phosphor configured partly to convert the electromagnetic primary radiation into an electromagnetic secondary radiation that is in the red spectral range of the electromagnetic spectrum during operation of the lighting device.

EXEMPLARY EMBODIMENTS

The first exemplary embodiment (A1) of the phosphor according to the present disclosure has the molecular formula NaLi$_3$SiO$_4$:Eu$^{2+}$ (2 mol % Eu$^{2+}$ relative to the substance amount of Na) and is produced as follows: Na$_2$CO$_3$, Li$_2$CO$_3$, SiO$_2$ and Eu$_2$O$_3$ are melted in a stoichiometric ratio corresponding to the molecular formula in an open nickel crucible. The weighed-in quantities of the starting materials are found in table 1 below. The nickel crucible with the mixed starting materials is heated for one hour to approximately 1000° C. under a forming gas atmosphere (N$_2$:H$_2$=92.5:7.5) and then cooled. Further heating under the same forming gas atmosphere and to temperatures below the melting point of the phosphor can be carried out in order to further improve the optical properties of the phosphor.

TABLE 1

| Starting material | Substance amount/ mmol | Mass/g |
|---|---|---|
| Na$_2$CO$_3$ | 21.82 | 2.313 |
| Li$_2$CO$_3$ | 66.21 | 4.892 |
| SiO$_2$ | 43.94 | 2.640 |
| Eu$_2$O$_3$ | 0.44 | 0.155 |

The starting materials of the phosphor are commercially available, stable and moreover very inexpensive. The synthesis at comparatively low temperatures makes the phosphor very inexpensive to produce and, as a result, also economically attractive.

The phosphor of the first exemplary embodiment (AB1) exhibits an emission in the blue spectral range of the electromagnetic spectrum.

The second exemplary embodiment (AB2) of the phosphor according to the present disclosure has the molecular formula KLi$_3$SiO$_4$:Eu$^{2+}$ (2 mol % Eu$^{2+}$ relative to the substance amount of K) and is produced as follows: K$_2$CO$_3$, Li$_2$CO$_3$, SiO$_2$ and Eu$_2$O$_3$ are melted in a stoichiometric ratio corresponding to the molecular formula in an open nickel crucible. The weighed-in quantities of the starting materials are found in table 2 below. The nickel crucible with the mixed starting materials is heated for one hour to approximately 1000° C. under a forming gas atmosphere (N$_2$:H$_2$=92.5:7.5) and then cooled. Further heating under the same forming gas atmosphere and to temperatures below the melting point of the phosphor can be carried out in order to further improve the optical properties of the phosphor.

TABLE 2

| Starting material | Substance amount/ mmol | Mass/g |
|---|---|---|
| K$_2$CO$_3$ | 40.78 | 5.636 |
| Li$_2$CO$_3$ | 123.71 | 9.141 |
| SiO$_2$ | 82.10 | 4.933 |
| Eu$_2$O$_3$ | 0.82 | 0.290 |

The phosphor of the second exemplary embodiment (AB2) exhibits a wide emission from the blue to red spectral range of the electromagnetic spectrum and thus emits white, in particular warm-white, radiation having a color temperature of less than 3500 K.

The third exemplary embodiment (AB3) of the phosphor according to the present disclosure has the molecular formula (Na$_{0.5}$K$_{0.5}$)Li$_3$SiO$_4$:Eu$^{2+}$ (2 mol % Eu$^{2+}$ relative to the substance amount of Na and K) or NaKLi$_6$Si$_2$O$_8$:Eu$^{2+}$ and is produced as follows: K$_2$CO$_3$, Na$_2$CO$_3$, Li$_2$CO$_3$, SiO$_2$ and Eu$_2$O$_3$ are melted in a stoichiometric ratio corresponding to the molecular formula in an open nickel crucible. The weighed-in quantities of the starting materials are found in table 3 below. The nickel crucible with the mixed starting materials is heated for one hour to eight hours to 800° C. to 1100° C. under a forming gas atmosphere ($N_2:H_2=92.5:7.5$) and then cooled. Further heating under the same forming gas atmosphere and to temperatures below the melting point of the phosphor can be carried out in order to further improve the optical properties of the phosphor.

TABLE 3

| Starting material | Substance amount/ mmol | Mass/g |
|---|---|---|
| $Na_2CO_3$ | 10.65 | 1.129 |
| $K_2CO_3$ | 10.44 | 1.443 |
| $Li_2CO_3$ | 63.97 | 4.727 |
| $SiO_2$ | 42.46 | 2.551 |
| $Eu_2O_3$ | 0.43 | 0.150 |

The phosphor of the third exemplary embodiment (AB3) exhibits an emission in the blue spectral range of the electromagnetic spectrum.

The fourth exemplary embodiment (AB4) of the phosphor according to the present disclosure has the molecular formula ($Na_{0.25}K_{0.75}$)$Li_3SiO_4$:$Eu^{2+}$ (2 mol % $Eu^{2+}$ relative to the substance amount of Na and K) or $NaK_3Li_{12}Si_4O_{16}$:$Eu^{2+}$ and is produced as follows: $K_2CO_3$, $Na_2CO_3$, $Li_2CO_3$, $SiO_2$ and $Eu_2O_3$ are melted in a stoichiometric ratio corresponding to the molecular formula in an open nickel crucible. The weighed-in quantities of the starting materials are found in table 4 below. The nickel crucible with the mixed starting materials is heated for four hours to 900° C. to 1100° C. under a forming gas atmosphere ($N_2:H_2=92.5:7.5$) and then cooled. Further heating under the same forming gas atmosphere and to temperatures below the melting point of the phosphor can be carried out in order to further improve the optical properties of the phosphor.

TABLE 4

| Starting material | Substance amount/ mmol | Mass/g |
|---|---|---|
| $Na_2CO_3$ | 5.24 | 0.555 |
| $K_2CO_3$ | 15.50 | 2.142 |
| $Li_2CO_3$ | 62.90 | 4.648 |
| $SiO_2$ | 41.75 | 2.508 |
| $Eu_2O_3$ | 0.42 | 0.147 |

The phosphor of the fourth exemplary embodiment (AB4) exhibits an emission in the green spectral range of the electromagnetic spectrum.

The fifth exemplary embodiment (AB5) of the phosphor according to the present disclosure has the molecular formula ($Rb_{0.5}Li_{0.5}$) $Li_3SiO_4$:$Eu^{2+}$ (2 mol % $Eu^{2+}$ relative to the substance amount of ($Rb_{0.5}Li_{0.5}$)) or $RbLiLi_6Si_2O_8$:$Eu^{2+}$ and is produced as follows: $Rb_2CO_3$, $Li_2CO_3$, $SiO_2$ and $Eu_2O_3$ are melted in a stoichiometric ratio corresponding to the molecular formula in an open nickel crucible. The weighed-in quantities of the starting materials are found in table 5 below. The nickel crucible with the mixed starting materials is heated for four hours to approximately 1000° C. under a forming gas atmosphere ($N_2:H_2=92.5:7.5$) and then cooled. Afterward, the product obtained is ground and a green powder is obtained.

Further heating under the same forming gas atmosphere and to temperatures below the melting point of the phosphor can be carried out in order to further improve the optical properties of the phosphor.

TABLE 5

| Starting material | Substance amount/ mmol | Mass/g |
|---|---|---|
| $Rb_2CO_3$ | 17.05 | 3.937 |
| $Li_2CO_3$ | 52.30 | 3.864 |
| $SiO_2$ | 34.56 | 2.076 |
| $Eu_2O_3$ | 0.35 | 0.122 |

The phosphor of the fifth exemplary embodiment (AB5) exhibits an emission in the green spectral range of the electromagnetic spectrum.

The sixth exemplary embodiment (AB6) of the phosphor according to the present disclosure has the molecular formula $Na_{1-y*}Ca_{y*}Li_{3-2y*}Al_{3y*}Si_{1-y*}O_{4-4y*}N_{4y*}$:Eu (where y*=0.03; $Eu^{2+}$ approximately 2 mol % relative to the substance amount of Na and Ca) and is produced as follows: CaO, NaF, $NiN_3$, $Li_2O$, $LiAlH_4$, $AlF_3$, $SiO_2$ and $EuF_3$ are heated in a stoichiometric ratio corresponding to the molecular formula to a maximum of 950° C. in a welded shut tantalum ampoule. During the heating or firing process, the ampoule is situated in an evacuated glass tube in order to avoid oxidation of the ampoule (reduced stability) and hence bursting, which results from the vapor pressure of evaporated starting materials during heating. After cooling to room temperature, individual crystals of the phosphor can be isolated from byproducts and be structurally and optically examined. The weighed-in quantities of the starting materials are found in table 6 below.

TABLE 6

| Starting material | Mass/mg |
|---|---|
| CaO | 7.01 |
| NaF | 15.75 |
| $LiN_3$ | 8.15 |
| $Li_2O$ | 21.51 |
| $LiAlH_4$ | 9.49 |
| $AlF_3$ | 10.50 |
| $SiO_2$ | 22.53 |
| $EuF_3$ | 2.09 |

The synthesis at comparatively low temperatures makes the phosphor very inexpensive to produce and, as a result, also economically attractive. By means of energy dispersive X-ray spectroscopy on single crystals of the phosphor, an average Ca proportion of 3 mol % based on the total substance amount of Na and Ca and a nitrogen proportion of 3 mol % relative to the total substance amount of nitrogen and oxygen were determined, which accords with the formula $Na_{0.97}Ca_{0.03}Li_{2.94}Al_{0.09}Si_{0.97}O_{3.88}N_{0.12}$:Eu.

The phosphor of the sixth exemplary embodiment (AB6) exhibits an emission in the blue-green spectral range of the electromagnetic spectrum.

The seventh exemplary embodiment (AB7) of the phosphor according to the present disclosure has the molecular formula ($Na_{0.25}K_{0.50}Li_{0.25}$) $Li_3SiO_4$:$Eu^{2+}$ or $NaK_2Li$ ($Li_3SiO_4$)$_4$:$Eu^{2+}$ and is produced as follows: $K_2CO_3$, $Na_2CO_3$, $Li_2CO_3$, $SiO_2$ and $Eu_2O_3$ are mixed in a stoichiometric ratio corresponding to the molecular formula in an open nickel crucible. The weighed-in quantities of the starting materials are found in table 7 below. The nickel crucible with the mixed starting materials is heated for four hours to approximately 750° C. under a forming gas atmosphere ($N_2:H_2=92.5:7.5$) and then cooled. Further heating under the same forming gas atmosphere and to temperatures below the melting point of the phosphor can be carried out in order to further improve the optical properties of the phosphor. After cooling, an agglomerate of light green crystals is obtained, which are separated into individual crystals by grinding for example in an agate mortar.

TABLE 7

| Starting material | Substance amount/ mmol | Mass/g |
| --- | --- | --- |
| $Na_2CO_3$ | 1.377 | 0.146 |
| $K_2CO_3$ | 9.420 | 1.302 |
| $Li_2CO_3$ | 77.192 | 5.704 |
| $SiO_2$ | 46.117 | 2.771 |
| $Eu_2O_3$ | 0.220 | 0.078 |

The phosphor of the seventh exemplary embodiment (AB7) exhibits an emission in the green spectral range of the electromagnetic spectrum. By means of single crystal diffractometry, the molecular formula $(Na_{0.25}K_{0.50}Li_{0.25})Li_3SiO_4:Eu^{2+}$ can be allocated to the phosphor.

The eighth exemplary embodiment (AB8) of the phosphor according to the present disclosure has the molecular formula $(Rb_{0.5}Na_{0.5})$ $Li_3SiO_4:Eu^{2+}$ or $RbNaLi_6Si_2O_8:Eu^{2+}$ and is produced as follows: $Rb_2CO_3$, $Na_2CO_3$, $Li_2CO_3$, $SiO_2$ and $Eu_2O_3$ are mixed in a stoichiometric ratio corresponding to the molecular formula in an open nickel crucible. The weighed-in quantities of the starting materials are found in table 8 below. The nickel crucible with the mixed starting materials is heated for one to eight hours to between 700° C. and 1000° C. under a forming gas atmosphere ($N_2:H_2=92.5:7.5$) and then cooled. The product obtained is then ground and a green powder is obtained.

Further heating under the same forming gas atmosphere and to temperatures below the melting point of the phosphor can be carried out in order to further improve the optical properties of the phosphor.

TABLE 8

| Starting material | Substance amount/ mmol | Mass/g |
| --- | --- | --- |
| $Rb_2CO_3$ | 9.64 | 2.226 |
| $Na_2CO_3$ | 8.77 | 0.929 |
| $Li_2CO_3$ | 59.2 | 4.371 |
| $SiO_2$ | 39.1 | 2.348 |
| $Eu_2O_3$ | 0.358 | 0.126 |

The phosphor of the eighth exemplary embodiment (AB8) exhibits an emission in the green spectral range of the electromagnetic spectrum.

The ninth exemplary embodiment (AB9) of the phosphor according to the present disclosure has the molecular formula $(Rb_{0.25}Na_{0.75})$ $Li_3SiO_4:Eu^{2+}$ or $RbNa_3Li_{12}Si_4O_{16}:Eu^{2+}$ and is produced as follows: $Rb_2CO_3$, $Na_2CO_3$, $Li_2CO_3$, $SiO_2$ and $Eu_2O_3$ are mixed in a stoichiometric ratio corresponding to the molecular formula in an open nickel crucible. The weighed-in quantities of the starting materials are found in table 9 below. The nickel crucible with the mixed starting materials is heated for one to eight hours to between 700° C. and 1000° C. under a forming gas atmosphere ($N_2:H_2=92.5:7.5$) and then cooled. The product obtained is then ground and a green powder is obtained.

Further heating under the same forming gas atmosphere and to temperatures below the melting point of the phosphor can be carried out in order to further improve the optical properties of the phosphor.

TABLE 9

| Starting material | Substance amount/ mmol | Mass/g |
| --- | --- | --- |
| $Rb_2CO_3$ | 5.521 | 1.275 |
| $Na_2CO_3$ | 14.96 | 1.586 |
| $Li_2CO_3$ | 60.28 | 4.454 |
| $SiO_2$ | 44.10 | 2.650 |
| $Eu_2O_3$ | 0.1 | 0.035 |

The phosphor of the ninth exemplary embodiment (AB9) exhibits an emission in the blue spectral range of the electromagnetic spectrum.

The tenth exemplary embodiment (AB10) of the phosphor according to the present disclosure has the molecular formula $Sr(Si_{0.25}Al_{-1/8+r^{}/2}Li_{7/8-r^{}/2})_4(O_{1-r^{}}N_{r^{}})_4$ where $r^{**}=0.67$ and thus $SrSiAl_{0.84}Li_{2.16}O_{1.32}N_{2.68}:Eu^{2+}$ and is produced as follows: $NaLi_3SiO_4$, $SrO$, $LiAlH_4$ and $Eu_2O_3$ are mixed in an open nickel crucible. The weighed-in quantities of the starting materials are found in table 10 below. The nickel crucible with the mixed starting materials is heated for one to eight hours, advantageously 2 to six hours, very particularly advantageously for four hours, to a temperature between 800° C. and 1000° C., advantageously 900° C., under a forming gas atmosphere ($N_2:H_2=92.5:7.5$) in a tube furnace and then cooled.

Further heating under the same forming gas atmosphere and to temperatures below the melting point of the phosphor can be carried out in order to further improve the optical properties of the phosphor.

TABLE 10

| Starting material | Substance amount/ mmol | Mass/g |
| --- | --- | --- |
| $NaLi_3SiO_4$ | 31.42 | 4.270 |
| SrO | 23.70 | 2.456 |
| $LiAlH_4$ | 77.12 | 2.922 |
| $Eu_2O_3$ | 1.00 | 0.352 |

The phosphor of the tenth exemplary embodiment (AB10) exhibits an emission in the yellow or yellow-orange spectral range of the electromagnetic spectrum. The composition of the tenth exemplary embodiment was determined by means of energy dispersive X-ray spectroscopy on single crystals and single crystal diffractometry.

The eleventh exemplary embodiment (AB11) of the phosphor according to the present disclosure has the molecular formula $Na_{1-y^{}}Eu_{y^{}}Li_{3-2y^{}}Al_{3y^{}}Si_{1-y^{}}O_{4-4y^{}}N_{4y^{}}:Eu$ where $y^{}=0.2224$ and is produced as follows: CaO, LiF, $LiN_3$, $Li_2O$, $LiAlH_4$, $SiO_2$ and $EuF_3$ are heated to a maximum of 900° C. in a welded shut tantalum ampoule. During the heating or firing process, the ampoule is situated in an evacuated glass tube in order to avoid oxidation of the ampoule (reduced stability) and hence bursting, which results from the vapor pressure of evaporated starting materials during heating. After cooling to room temperature, individual orange crystals of the phosphor can be isolated from byproducts and be structurally and optically examined. The weighed-in quantities of the starting materials are found in table 11 below.

TABLE 11

| Starting material | Mass/mg |
| --- | --- |
| Na$_2$O | 11.02 |
| LiF (Flux) | 10 |
| LiN$_3$ | 11.61 |
| Li$_2$O | 17.72 |
| LiAlH$_4$ | 13.50 |
| SiO$_2$ | 21.37 |
| EuF$_3$ | 24.78 |

The phosphor of the eleventh exemplary embodiment (AB11) exhibits an emission in the yellow-orange spectral range of the electromagnetic spectrum.

The twelfth exemplary embodiment (AB12) of the phosphor according to the present disclosure has the molecular formula SrLi$_{3-2x}$Al$_{1+2x}$O$_{4-4x}$N$_{4x}$:Eu where x**=0.2014 and is produced as follows: SrAl$_2$O$_4$:Eu and LiN$_3$ are heated to a maximum of 900° C. in a welded shut tantalum ampoule. During the heating or firing process, the ampoule is situated in an evacuated glass tube in order to avoid oxidation of the ampoule (reduced stability) and hence bursting, which results from the vapor pressure of evaporated starting materials during heating. After cooling to room temperature, individual yellow/green crystals of the phosphor can be isolated from byproducts and be structurally and optically examined. The weighed-in quantities of the starting materials are found in table 12 below.

TABLE 12

| Starting material | Mass/mg |
| --- | --- |
| SrAl$_2$O$_4$:Eu | 30.64 |
| LiN$_3$ | 22.06 |

The phosphor can be produced at comparatively low temperatures, below 1000° C., which makes possible a cost-saving synthesis.

The phosphor of the twelfth exemplary embodiment (AB12) exhibits an emission in the green to yellow spectral range of the electromagnetic spectrum.

Further exemplary embodiments of the phosphor having the molecular formula SrLi$_{3-2x}$Al$_{1+2x}$O$_{4-4x}$N$_{4x}$:Eu are produced by mixing the starting materials in accordance with table 13 below in an open nickel crucible. The nickel crucible with the mixed starting materials is heated for one to 12 hours, advantageously 4 to 8 hours, to a temperature of between 800° C. and 1200° C., advantageously 900° C., under a forming gas atmosphere (N$_2$:H$_2$=92.5:7.5) under atmospheric pressure or slightly reduced pressure in a tube furnace and is then cooled. After cooling to room temperature, individual yellow/green crystals can be isolated.

TABLE 13

| Exemplary embodiment | x** | Starting material | Substance amount/mmol | Mass/g |
| --- | --- | --- | --- | --- |
| AB12-1 | 0.125 | SrO | 70.00 | 7.253 |
| | | Al$_2$O$_3$ | 17.67 | 1.802 |
| | | Li$_3$N | 23.57 | 0.821 |
| | | Eu$_2$O$_3$ | 0.3524 | 0.124 |
| AB12-2 | 0.1375 | SrO | 75.17 | 7.789 |
| | | Al$_2$O$_3$ | 15.18 | 1.548 |
| | | Li$_3$N | 15.19 | 0.529 |
| | | Eu$_2$O$_3$ | 0.3808 | 0.134 |
| AB12-3 | 0.17 | SrO | 63.22 | 6.551 |
| | | Al$_2$O$_3$ | 43.00 | 4.385 |
| | | Li$_2$CO$_3$ | 21.50 | 1.589 |
| | | Li$_3$N | 64.51 | 2.247 |
| | | Eu$_2$O$_3$ | 0.6450 | 0.227 |
| AB12-4 | 0.20 | SrO | 69.44 | 7.195 |
| | | Al$_2$O$_3$ | 49.60 | 5.057 |
| | | Li$_2$CO$_3$ | 7.092 | 0.524 |
| | | Li$_3$N | 56.68 | 1.974 |
| | | Eu$_2$O$_3$ | 0.7075 | 0.249 |
| AB12-5 | 0.24 | SrO | 70.48 | 7.303 |
| | | Al$_2$O$_3$ | 48.90 | 4.986 |
| | | AlN | 8.636 | 0.354 |
| | | Li$_3$N | 60.40 | 2.104 |
| | | Eu$_2$O$_3$ | 0.7189 | 0.253 |
| AB12-6 | 0.28 | SrO | 70.04 | 7.258 |
| | | Al$_2$O$_3$ | 44.79 | 4.567 |
| | | AlN | 21.91 | 0.898 |
| | | Li$_3$N | 58.14 | 2.025 |
| | | Eu$_2$O$_3$ | 0.7161 | 0.252 |
| AB12-7 | 0.34 | SrO | 69.41 | 7.192 |
| | | Al$_2$O$_3$ | 38.72 | 3.948 |
| | | AlN | 41.55 | 1.703 |
| | | Li$_3$N | 54.78 | 1.908 |
| | | Eu$_2$O$_3$ | 0.7075 | 0.249 |
| AB12-8 | 0.44 | SrO | 68.37 | 7.085 |
| | | Al$_2$O$_3$ | 28.83 | 2.940 |
| | | AlN | 73.48 | 3.012 |
| | | Li$_3$N | 49.30 | 1.717 |
| | | Eu$_2$O$_3$ | 0.6990 | 0.246 |

The thirteenth exemplary embodiment (AB13) of the phosphor according to the present disclosure has the molecular formula (Cs$_{0.25}$Na$_{0.25}$K$_{0.25}$Li$_{0.25}$) Li$_3$SiO$_4$:Eu$^{2+}$ and is produced analogously to the eighth exemplary embodiment. The starting materials are indicated in table 14 below.

TABLE 14

| Starting material | Substance amount/mmol | Mass/g |
| --- | --- | --- |
| Cs$_2$CO$_3$ | 4.75 | 1.547 |
| Na$_2$CO$_3$ | 5.16 | 0.547 |
| Li$_2$CO$_3$ | 62.1 | 4.585 |
| K$_2$CO$_3$ | 5.16 | 0.713 |
| SiO$_2$ | 41.0 | 2.463 |
| Eu$_2$O$_3$ | 0.412 | 0.145 |

The phosphor of the thirteenth exemplary embodiment (AB13) exhibits an emission in the green spectral range of the electromagnetic spectrum.

The fourteenth exemplary embodiment (AB14) of the phosphor according to the present disclosure has the molecular formula (Cs$_{0.25}$Na$_{0.50}$K$_{0.25}$)Li$_3$SiO$_4$:Eu$^{2+}$ and is produced analogously to the eighth exemplary embodiment. The starting materials are indicated in table 15 below.

TABLE 15

| Starting material | Substance amount/mmol | Mass/g |
| --- | --- | --- |
| Cs$_2$CO$_3$ | 4.50 | 1.466 |
| Na$_2$CO$_3$ | 9.78 | 1.037 |
| Li$_2$CO$_3$ | 58.8 | 4.347 |
| K$_2$CO$_3$ | 4.89 | 0.676 |
| SiO$_2$ | 38.9 | 2.336 |
| Eu$_2$O$_3$ | 0.392 | 0.138 |

The phosphor of the fourteenth exemplary embodiment (AB14) exhibits an emission in the blue spectral range of the electromagnetic spectrum.

The fifteenth exemplary embodiment (AB15) of the phosphor according to the present disclosure has the molecular formula $(Rb_{0.25}Na_{0.50}K_{0.25})Li_3SiO_4$:$Eu^{2+}$ and is produced analogously to the eighth exemplary embodiment. The starting materials are indicated in table 16 below.

TABLE 16

| Starting material | Substance amount/mmol | Mass/g |
|---|---|---|
| $Rb_2CO_3$ | 4.70 | 1.086 |
| $Na_2CO_3$ | 10.2 | 1.083 |
| $Li_2CO_3$ | 61.5 | 4.541 |
| $K_2CO_3$ | 5.11 | 0.706 |
| $SiO_2$ | 40.6 | 2.440 |
| $Eu_2O_3$ | 0.409 | 0.144 |

The phosphor of the fifteenth exemplary embodiment (AB15) exhibits an emission in the blue spectral range of the electromagnetic spectrum.

The sixteenth exemplary embodiment (AB16) of the phosphor according to the present disclosure has the molecular formula $(Rb_{0.25}Na_{0.25}Cs_{0.25}Li_{0.25})Li_3SiO_4$:$Eu^{2+}$ and is produced analogously to the eighth exemplary embodiment. The starting materials are indicated in table 17 below.

TABLE 17

| Starting material | Substance amount/mmol | Mass/g |
|---|---|---|
| $Rb_2CO_3$ | 4.49 | 1.036 |
| $Cs_2CO_3$ | 4.48 | 1.461 |
| $Na_2CO_3$ | 9.34 | 0.990 |
| $Li_2CO_3$ | 56.2 | 4.151 |
| $SiO_2$ | 37.1 | 2.230 |
| $Eu_2O_3$ | 0.375 | 0.132 |

The phosphor of the sixteenth exemplary embodiment (AB16) exhibits an emission in the blue spectral range of the electromagnetic spectrum.

The seventeenth exemplary embodiment (AB17) of the phosphor according to the present disclosure has the molecular formula $(Na_{0.125}K_{0.875})Li_3SiO_4$:$Eu^{2+}$ or $NaK_7(Li_3SiO_4)$:$Eu^{2+}$ and is produced as follows: $K_2CO_3$, $Na_2CO_3$, $Li_2CO_3$, $SiO_2$ and $Eu_2O_3$ are mixed in a stoichiometric ratio corresponding to the molecular formula in an open nickel crucible. The weighed-in quantities of the starting materials are found in table 18 below. The nickel crucible with the mixed starting materials is heated for four hours to 1000° C. under a forming gas atmosphere ($N_2$:$H_2$=92.5:7.5) and is then cooled at a constant cooling rate to 300° C. The furnace is switched off and, after cooling to room temperature, yellow-green single crystals are isolated.

TABLE 18

| Starting material | Mass/mg |
|---|---|
| $Na_2CO_3$ | 25.97 |
| $K_2CO_3$ | 101.58 |
| $Li_2CO_3$ | 221.67 |
| $SiO_2$ | 120.17 |
| $Eu_2O_3$ | 7.04 |

The phosphor of the seventeenth exemplary embodiment (AB17) exhibits an emission in the blue-green and in the yellow-orange spectral range of the electromagnetic spectrum.

Further advantageous embodiments and developments of the present disclosure are evident from the exemplary embodiments described below in association with the figures.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1A, 1B, 1BA, 1BB, 1C, 1D, 1E, 1F show a selection of possible electroneutral molecular formulae of substitution experiments.

FIGS. 2, 13, 23, 38, 63, 68, 74, 82, 83, 92, 93, 102, 103, 105, 112, 118b, 129, 131, 133, 135, 152b, 154, 161, 163 show emission spectra of exemplary embodiments of the phosphor according to the present disclosure.

FIGS. 4, 43, 66, 70, 76, 86, 96, 121, 123 show a comparison of optical properties of an exemplary embodiment of the phosphor according to the present disclosure with comparative examples.

FIGS. 5, 6, 44, 67, 69, 75, 85, 95, 122 show a comparison of emission spectra of an exemplary embodiment with comparative examples.

FIGS. 8, 18, 25, 71, 77, 78, 88, 97, 107, 114, 137, 138, 139, 140, 160, 171, 172, 173 show excerpts from the crystal structure for exemplary embodiments of the phosphor according to the present disclosure.

FIGS. 9, 19, 40, 65, 111, 118a, 177 show X-ray diffraction powder diffractograms using copper $K_{\alpha 1}$ radiation or molybdenum $K_{\alpha 1}$ radiation.

FIGS. 11, 12, 21, 22, 27, 28, 72, 73, 79, 80, 81, 90, 91, 99, 100, 108, 109, 110, 115, 116, 117, 126, 127, 128, 145-151, 152a, 158, 159, 174, 175, 176 show characteristic properties of exemplary embodiments of the phosphor according to the present disclosure.

FIGS. 15, 16, 124 show comparisons of emission spectra of a conversion LED with an exemplary embodiment of the phosphor according to the present disclosure with comparative examples.

FIGS. 17, 125, 164, 167 show a comparison of optical properties of a conversion LED with an exemplary embodiment of the phosphor according to the present disclosure with comparative examples.

FIG. 29 shows a comparison of emission spectra of an exemplary embodiment with comparative examples and the sensitivity curve for melatonin production.

FIGS. 31, 120, 165 show color loci of various phosphors in the CIE standard diagram (1931).

FIGS. 35, 36, 37, 166, 168 show simulated LED spectra at various excitation wavelengths.

FIG. 41 shows the reflection positions and the relative intensity of the reflections of the X-ray diffraction powder diffractogram of an exemplary embodiment of the phosphor according to the present disclosure.

FIGS. 42, 87, 101 show the thermal quenching behavior of an exemplary embodiment of the phosphor according to the present disclosure in comparison with the conventional phosphor.

FIG. 45 shows the coverage of the color space rec2020 by different combinations of green and red phosphor.

FIGS. 59 to 62 show the simulated emission spectra of conversion LEDs with different combinations of green and red phosphor.

FIGS. 106, 113, 119, 153, 155, 162 show optical properties of exemplary embodiments.

DETAILED DESCRIPTION

In the following description, numerous specific details are given to provide a thorough understanding of embodiments. The embodiments may be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIGS. 1A, 1B, 1C, 1D, 1E and 1F show tables with possible electroneutral phosphors which are achievable by substitution experiments, analogously to the general molecular formula $(MA)_a(MB)_b(MC)_c(MD)_d(TA)_e(TB)_f$ $(TC)_g(TD)_h(TE)_i(TF)_j(XA)_k(XB)_l(XC)_m(XD)_n$. The substitutions shown are merely by way of example, other substitutions are likewise possible. The activator E is illustrated in each case only in the general formula and not in the concrete embodiments, but is nevertheless also present in the concrete embodiments.

Figure 2:
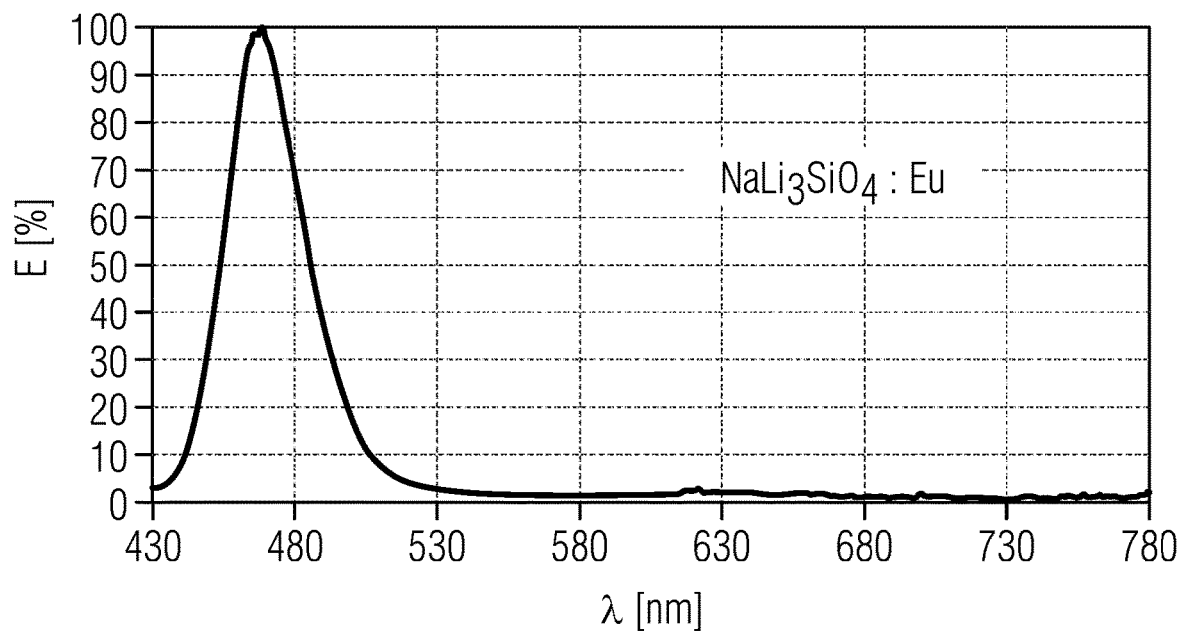

FIG. 2 illustrates the emission spectrum of the first exemplary embodiment AB1 of the phosphor according to the present disclosure having the molecular formula $NaLi_3SiO_4$. The wavelength in nanometers is plotted on the x-axis and the emission intensity in percent is plotted on the y-axis. For measuring the emission spectrum, the phosphor according to the present disclosure was excited with primary radiation having a wavelength of 400 nm. The phosphor has a full width at half maximum of 32 nm or 1477 cm$^{-1}$ and a dominant wavelength of 473 nm; the peak wavelength is approximately 469 nm.

Figure 3:
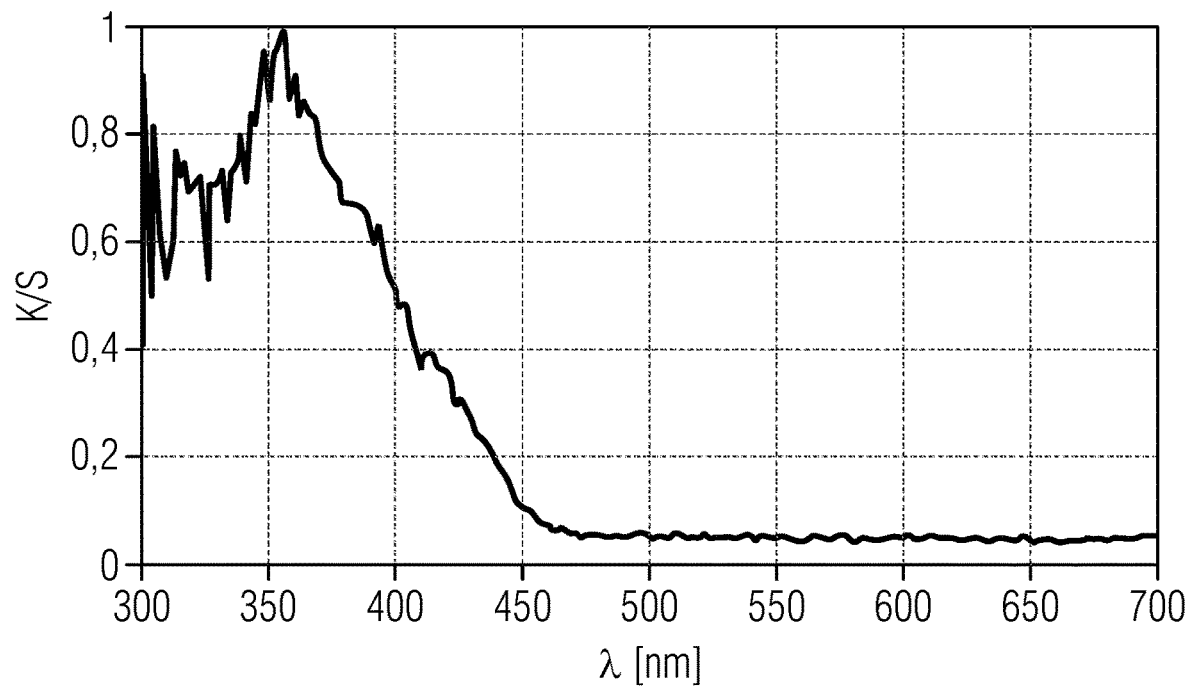
FIGS. 3, 14, 24, 39, 64, 84, 94, 104, 130, 132, 134, 136 show the Kubelka-Munk functions for exemplary embodiments of the phosphor according to the present disclosure.

FIG. 3 shows a normalized Kubelka-Munk function (K/S), plotted against the wavelength λ in nm, for the first exemplary embodiment (AB1) of the phosphor according to the present disclosure. In this case, K/S was calculated as follows:

$$K/S=(1-R_{inf})^2/2R_{inf}$$

wherein $R_{inf}$ corresponds to the diffuse reflection of the phosphor.

It is evident from FIG. 3 that the maximum of K/S for the first exemplary embodiment (AB1) of the phosphor according to the present disclosure is approximately 360 nm. High K/S values mean a high absorption in this range. The phosphor can be efficiently excited with a primary radiation starting from approximately 300 nm to 430 nm or 440 nm.

Figures 4, 5:
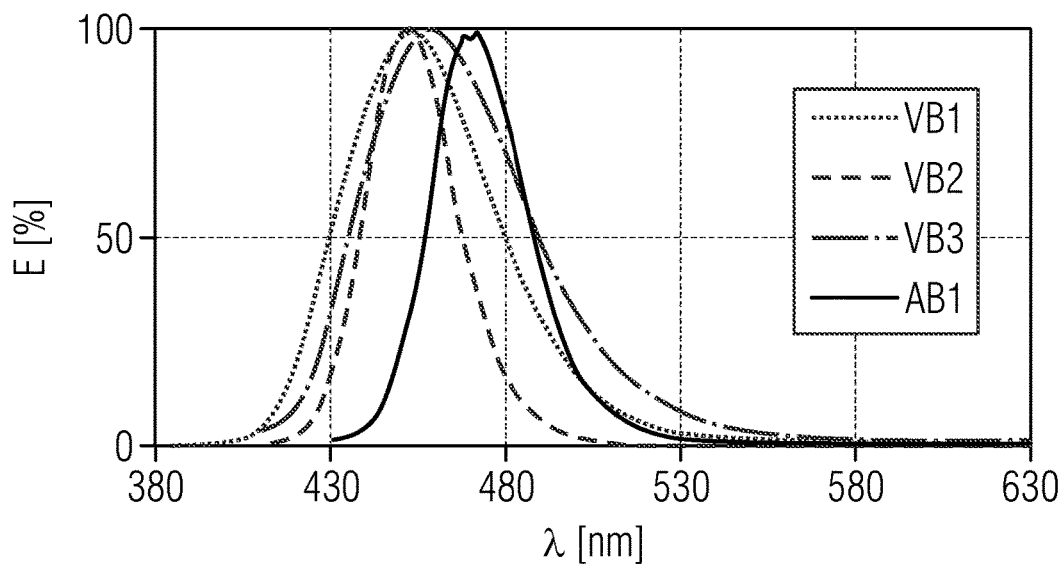

FIG. 4 shows a comparison of the full width at half maximum (FWHM), the peak wavelength ($\lambda_{peak}$), the dominant wavelength ($\lambda_{dom}$) and the luminous efficiency (LER) between a first comparative example (VB1: $BaMgAl_{10}O_{17}$:Eu), a second comparative example (VB2: $Sr_5(PO_4)_3Cl$:Eu), a third comparative example (VB3: $BaMgAl_{10}O_{17}$:Eu) and the first exemplary embodiment of the phosphor according to the present disclosure $NaLi_3SiO_4$:Eu (AB1). VB1 and VB3 differ in the concentration of Eu. All phosphors emit radiation in the blue range of the electromagnetic spectrum. The peak wavelength of the phosphor according to the present disclosure $NaLi_3SiO_4$:Eu is of somewhat longer wavelength in comparison with the comparative examples. As evident, the phosphor according to the present disclosure $NaLi_3SiO_4$:Eu has a significantly smaller full width at half maximum and/or a higher luminous efficiency (LER) than the comparison examples. The shift in the peak wavelength to a longer wavelength and the smaller full width at half maximum result in an increase in the overlap with the eye sensitivity curve. Consequently, the phosphor according to the present disclosure has a very high luminous efficiency that is higher in comparison with the comparative examples.

Figure 6:
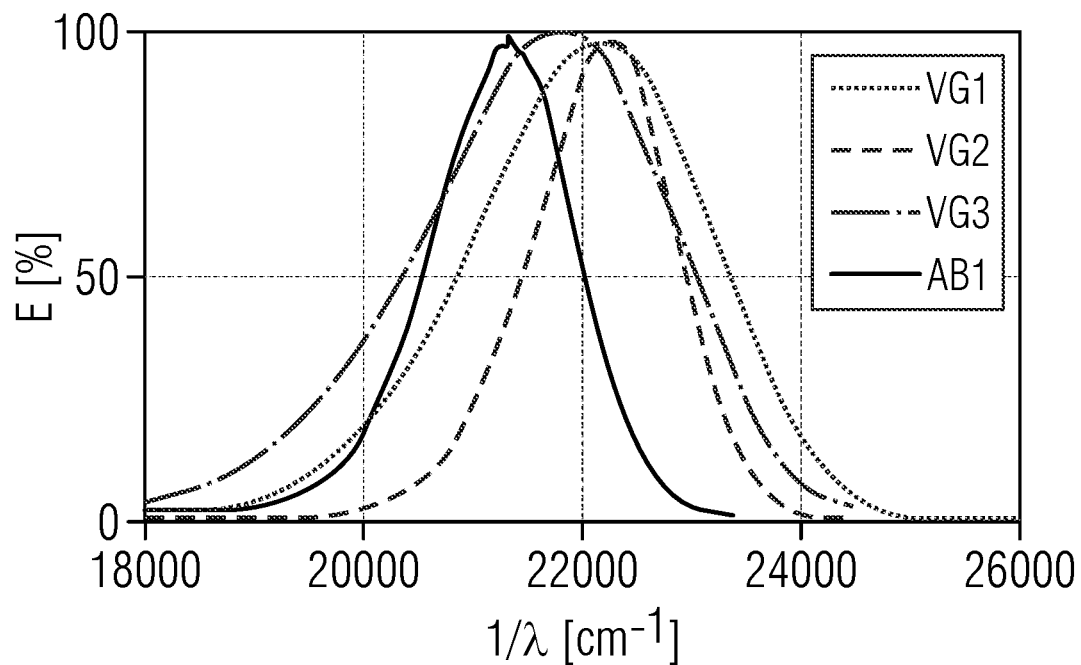

FIGS. 5 and 6 show the emission spectra of VB1, VB2, VB3 and AB1, as described in FIG. 4. In FIG. 5, the wavelength in nanometers is plotted on the x-axis and the emission intensity in percent is plotted on the y-axis. In FIG. 6, the wave number in cm$^{-1}$ is plotted on the x-axis and the emission intensity in percent is plotted on the y-axis. The significantly smaller full width at half maximum of the phosphor according to the present disclosure $NaLi_3SiO_4$:Eu in comparison with VB1 and VB3 ($BaMgAl_{10}O_{17}$:Eu) becomes evident here. In contrast to AB1, moreover, $BaMgAl_{10}O_{17}$:Eu phosphors exhibit a low absorption starting from a wavelength of 350 nm (cf. FIG. 7). Together with the relatively large full width at half maximum, that results in a relatively poor color purity of the phosphors VB1 and VB3. Although the known phosphor VB2 exhibits a small full width at half maximum, it has the disadvantage that it contains chlorine. Many applications are subject to strict conditions as far as the chlorine content is concerned, and so the application of this phosphor is limited if only for this reason. The risk of the release of corrosive HCl during its production is also disadvantageous, which increases the costs for the synthesis equipment and the maintenance measures thereof.

Figure 7:
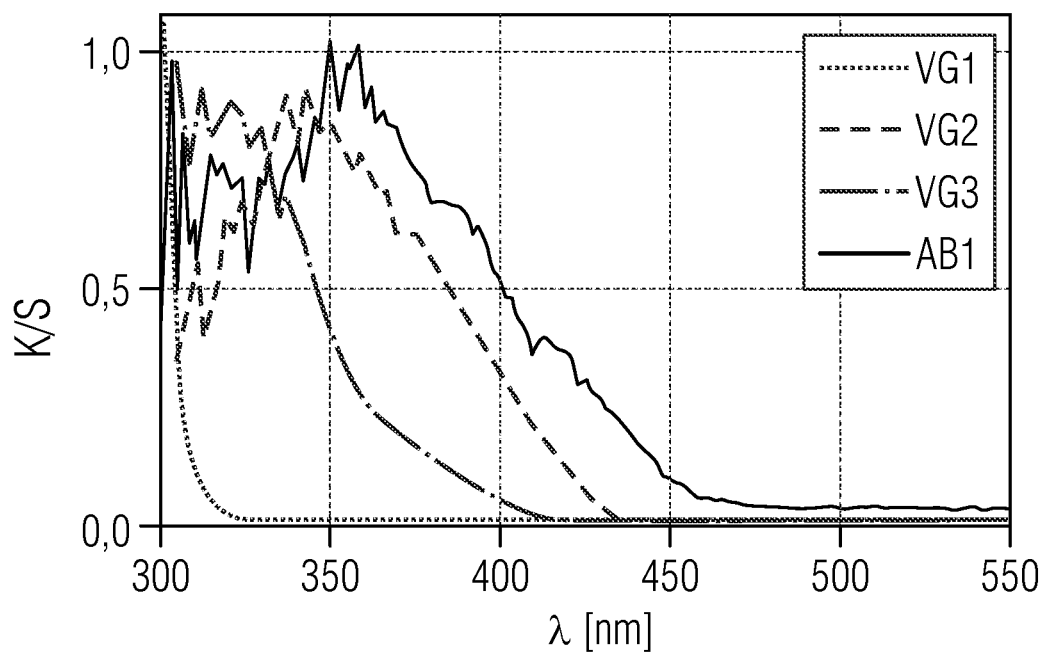
FIG. 7 shows a comparison of the Kubelka-Munk function of an exemplary embodiment with comparative examples.

FIG. 7 shows a normalized Kubelka-Munk function (K/S), plotted against the wavelength λ in nm, for various phosphors VB1, VB2, VB3 and AB1, as defined in FIG. 4. The curve with the reference signs VB1, VB2 and VB3 represents K/S for known phosphors; the curve with the reference sign AB1 represents K/S for the first exemplary embodiment of the phosphor according to the present disclosure. It is evident that the phosphor according to the present disclosure AB1 has a higher absorption at longer wavelengths, in particular in the range starting from 360 nm, in comparison with the comparative examples VB1, VB2 and VB3. This is particularly advantageous since an efficient excitation of the phosphor according to the present disclosure with a primary radiation having a peak wavelength in the UV range to blue range of the electromagnetic spectrum, in particular in the range of between 300 nm and 460 nm, advantageously between 300 nm and 430 nm or 440 nm, is possible. Therefore, the phosphor according to the present disclosure is able to be employed particularly well in combination with semiconductor chips which have a primary radiation in the range of between 300 nm and 430 nm or 440 nm.

Figure 8:
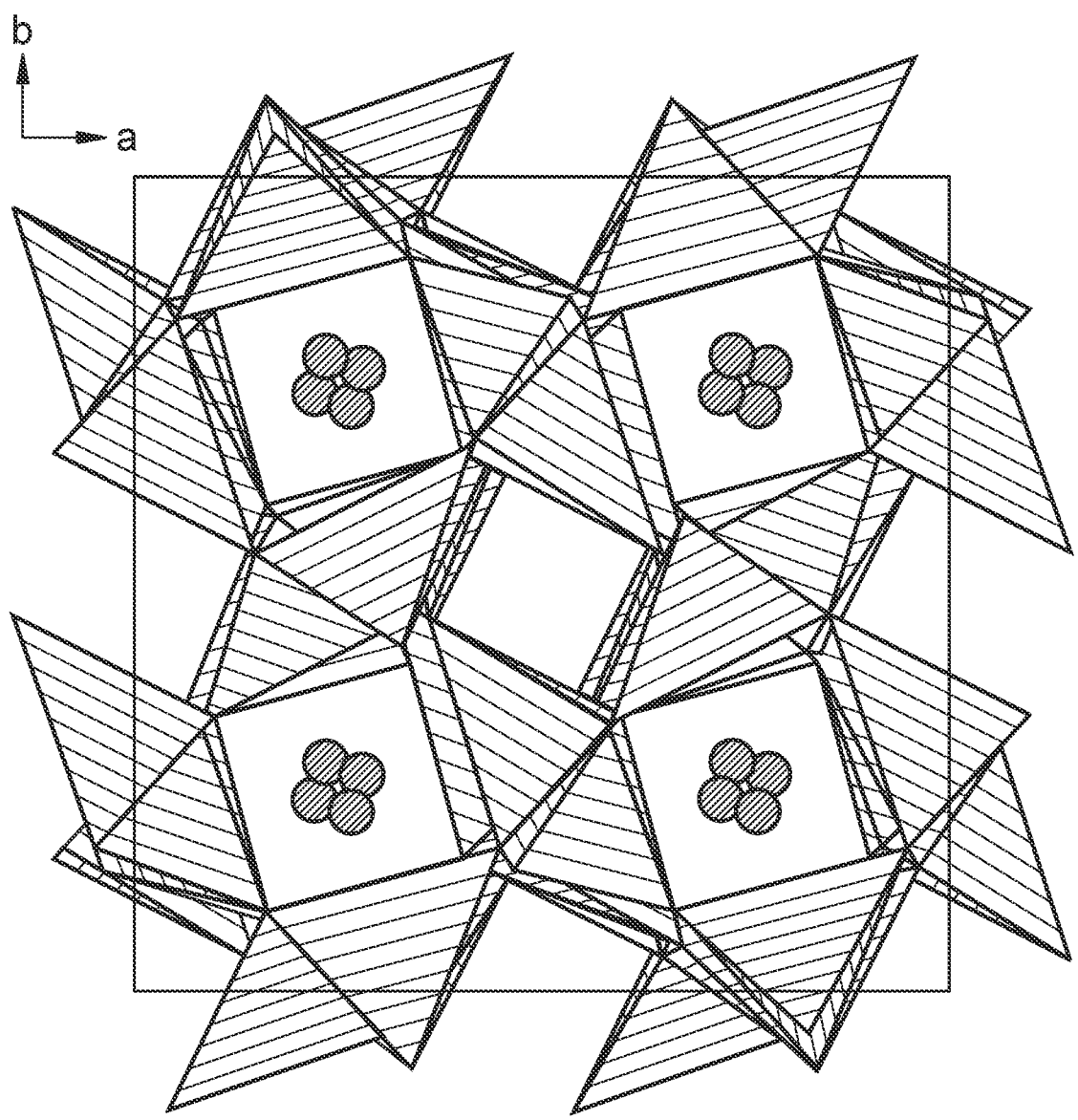

FIG. 8 shows the tetragonal crystal structure of the phosphor $NaLi_3SiO_4$:Eu in a schematic illustration. The hatched circles represent the Na atoms. The crystal structure corresponds to the crystal structure of $NaLi_3SiO_4$, as described in B. Nowitzki, R. Hoppe, Neues über Oxide vom Typ $A[(TO)_n]$: $NaLi_3SiO_4$, $NaLi_3GeO_4$, $NaLi_3TiO_4$, [New findings concerning oxides of the type $A[(TO)_n]$: $NaLi_3SiO_4$, $NaLi_3GeO_4$, $NaLi_3TiO_4$] Revue de Chimie minérale, 1986, 23, 217-230. The crystal structure is isotypic with respect to that of $CaLiAl_3N_4$:Eu, described in P. Pust, A. S. Wochnik, E. Baumann, P. J. Schmidt, D. Wiechert, C. Scheu, W. Schnick, $Ca[LiAl_3N_4]$:$Eu^{2+}$—A Narrow-Band Red-Emitting Nitridolithoaluminate, Chemistry of Materials 2014 26, 3544-3549.

Figure 9:
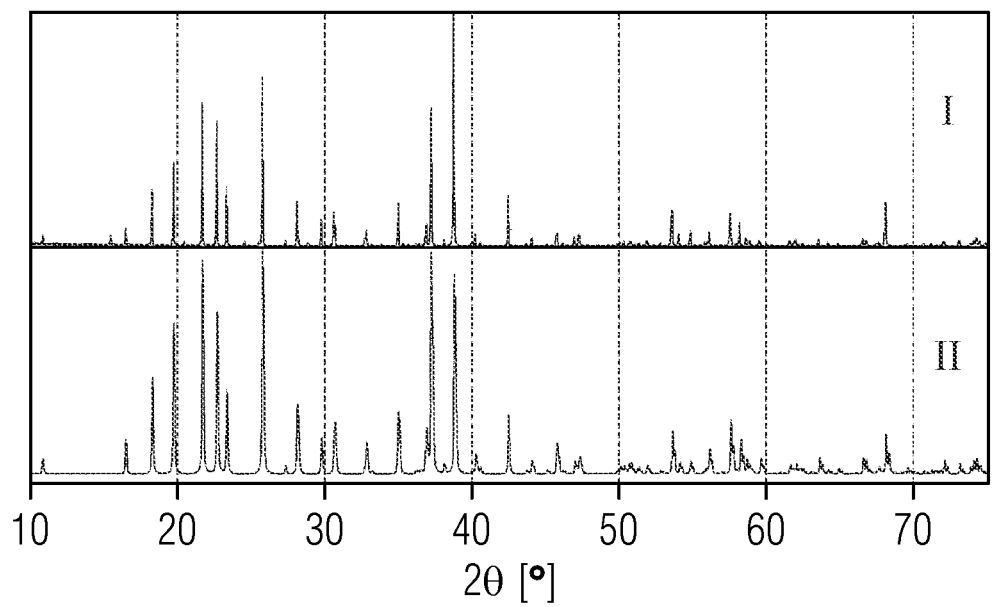

Two X-ray diffraction powder diffractograms using copper $K_{\alpha 1}$ radiation are indicated in FIG. 9. The diffraction angles in ° θ2 values are indicated on the x-axis, and the intensity is indicated on the y-axis. The X-ray diffraction powder diffractogram provided with the reference sign I shows that of the first exemplary embodiment AB1 of the phosphor according to the present disclosure $NaLi_3SiO_4$:Eu. The X-ray diffraction powder diffractogram provided with the reference sign II shows the X-ray diffraction powder diffractogram for $NaLi_3SiO_4$ simulated from the crystal structure of $NaLi_3SiO_4$ (B. Nowitzki, R. Hoppe, Neues über Oxide vom Typ $A[(TO)_n]$: $NaLi_3SiO_4$, $NaLi_3GeO_4$, $NaLi_3TiO_4$, Revue de Chimie minérale, 1986, 23, 217-230). From the correspondence of the reflections it is evident that the phosphor according to the present disclosure $NaLi_3SiO_4$:Eu crystallizes in the same crystal structure as $NaLi_3SiO_4$.

Figure 10:
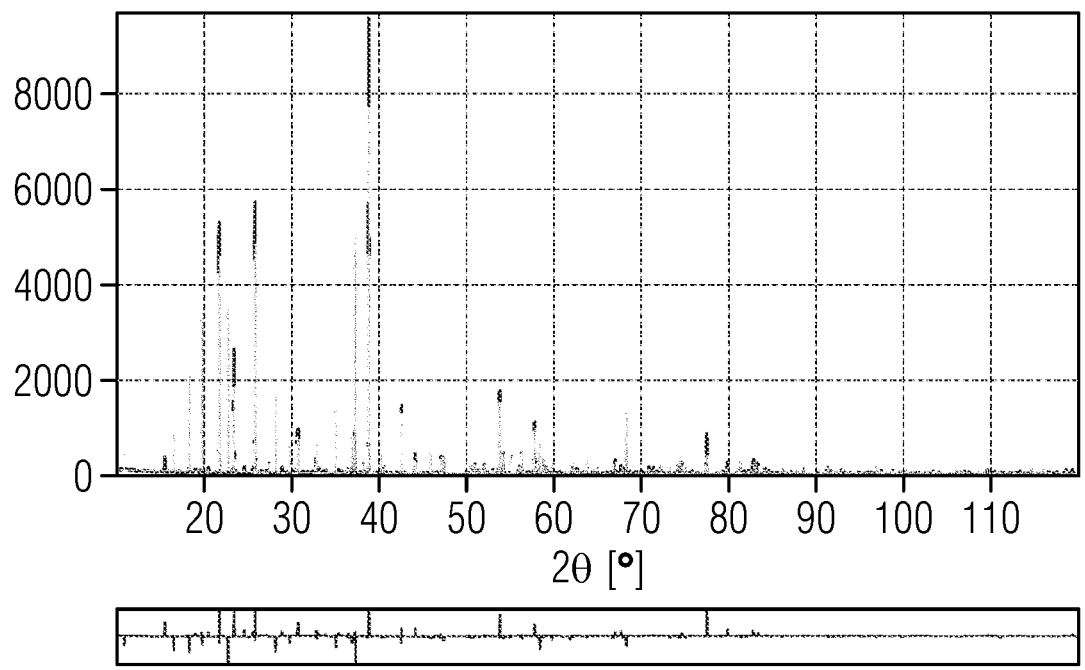
FIGS. 10, 20, 26, 89, 98, 141, 142, 143, 144 show Rietveld refinements of X-ray powder diffractograms of exemplary embodiments of the phosphor according to the present disclosure.

A crystallographic evaluation is found in FIG. 10. FIG. 10 shows a Rietveld refinement of the X-ray powder diffractogram of the first exemplary embodiment AB1, that is to say for $NaLi_3SiO_4$:Eu. For the Rietveld refinement, the atomic parameters for $NaLi_3SiO_4$ (table 7 in B. Nowitzki, R. Hoppe, Revue de Chimie minérale, 1986, 23, 217-230) were used to show that the crystal structure of $NaLi_3SiO_4$:Eu corresponds to that of $NaLi_3SiO_4$. The upper diagram here illustrates the superimposition of the measured reflections with the calculated reflections for $NaLi_3SiO_4$. The lower diagram illustrates the differences between the measured and calculated reflections.

FIG. 11 shows crystallographic data of $NaLi_3SiO_4$.

FIG. 12 shows atomic positions in the structure of $NaLi_3SiO_4$.

Figure 13:
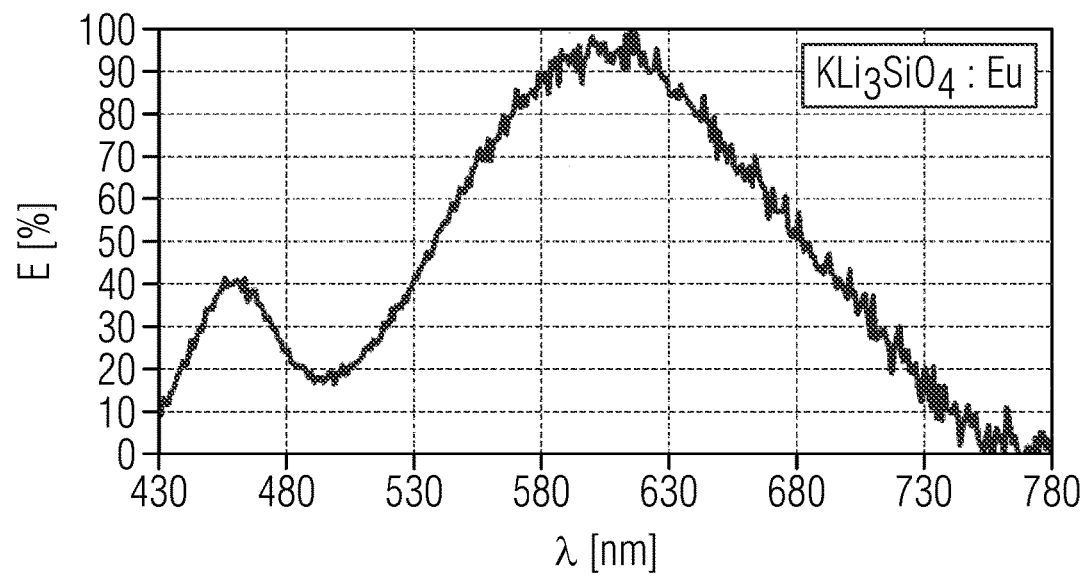

FIG. 13 illustrates the emission spectrum of the second exemplary embodiment AB2 of the phosphor according to the present disclosure having the molecular formula $KLi_3SiO_4$:$Eu^{2+}$. The wavelength in nanometers is plotted on the x-axis and the emission intensity in percent is plotted on the y-axis. For measuring the emission spectrum, the phosphor according to the present disclosure was excited with primary radiation having a wavelength of 400 nm. The phosphor exhibits a broadband emission from approximately 430 nm to approximately 780 nm and thus emits white radiation or the emitted radiation produces a white luminous impression. The color locus of the phosphor is advantageously near that of the Planckian radiator at 2700 K. The color locus is at the following coordinates CIE-x=0.449 and CIE-y=0.397 in the CIE standard chromaticity diagram from 1931. The color temperature (CCT) is 2742 K, the luminous efficiency is 290 lm/W, the CRI (color rendering index) is 81, and the color rendering index R9 is 21. A conversion LED comprising the phosphor according to the present disclosure $KLi_3SiO_4$:$Eu^{2+}$ is thus suitable in particular for general lighting.

Figure 14:
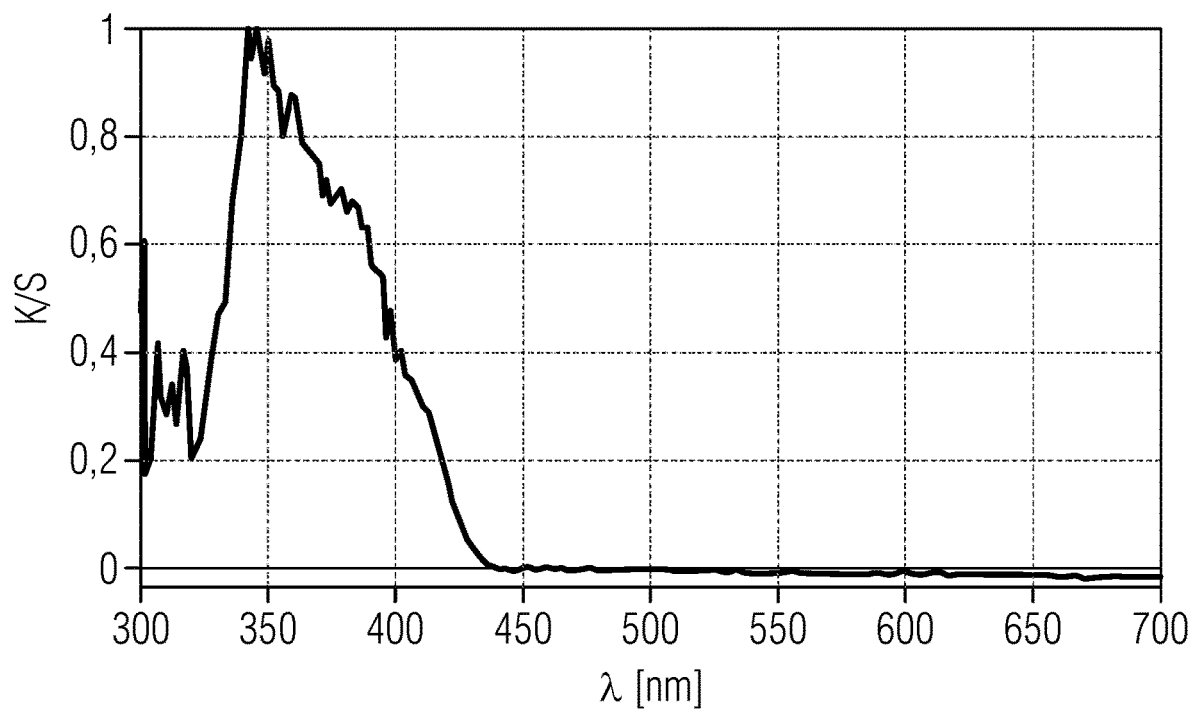

FIG. 14 shows a normalized Kubelka-Munk function (K/S), plotted against the wavelength λ in nm, for the second exemplary embodiment (AB2) of the phosphor according to the present disclosure.

It is evident from FIG. 14 that the maximum of K/S for the second exemplary embodiment (AB2) of the phosphor according to the present disclosure invention is approximately 340 nm. The phosphor can be efficiently excited with a primary radiation starting from approximately 300 nm to 430 nm or 440 nm.

Figure 15:
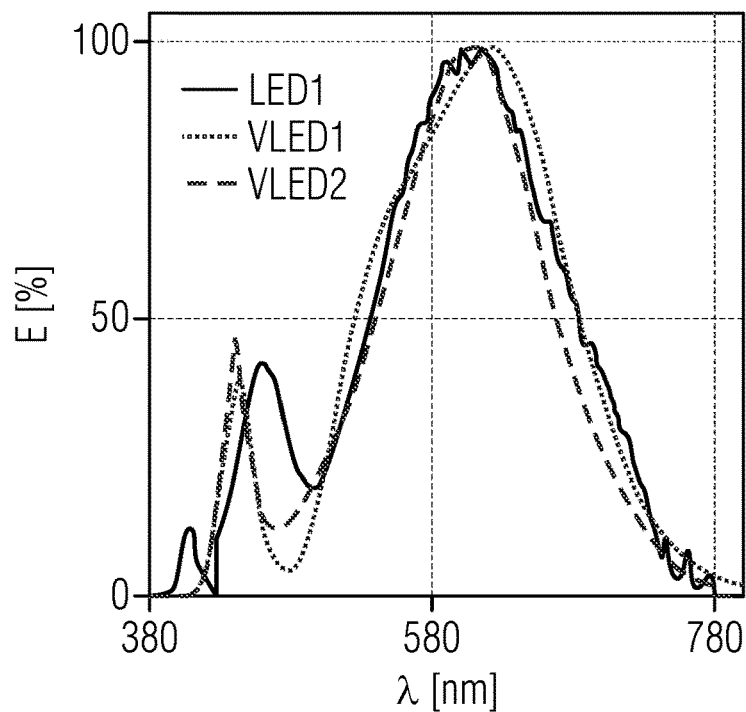
Figure 16:
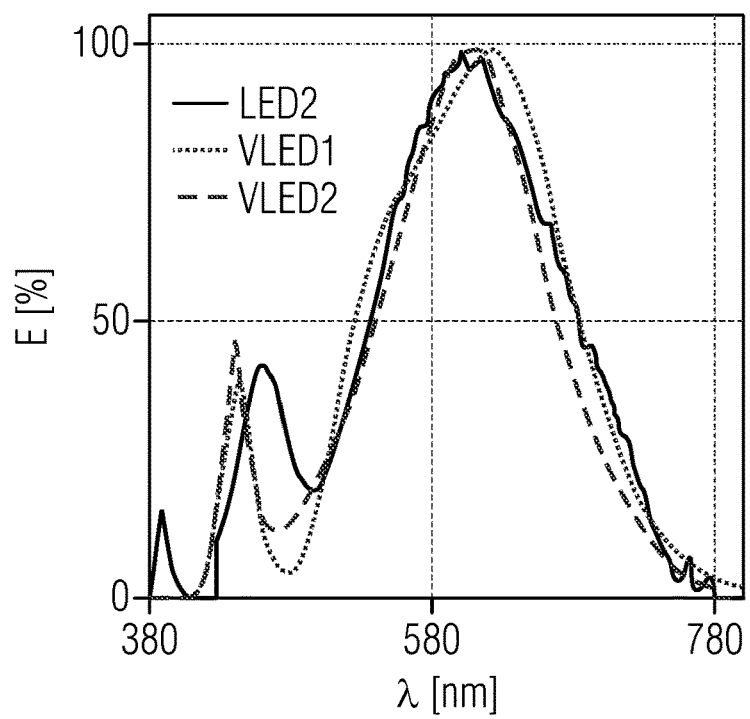

FIGS. 15 and 16 show simulated emission spectra of various conversion LEDs which emit white radiation. The primary radiation source used is an InGaN-based semiconductor layer sequence which emits a primary radiation having a peak wavelength of 410 nm (FIG. 15) or having a peak wavelength of 390 nm (FIG. 16). The construction of the conversion LEDs is shown in FIG. 17. As evident, the conversion LEDs according to the present disclosure (LED 1 and LED 2) using only one phosphor, the $KLi_3SiO_4$:$Eu^{2+}$ according to the present disclosure, exhibit similar emission spectra to the comparative examples VLED2 and VLED1 each comprising a green and a red phosphor. The phosphor according to the present disclosure thus advantageously makes it possible to provide a conversion LED which emits warm-white light having a color temperature of less than 3500 K, advantageously less than 3000 K, and for this purpose requires only one phosphor, unlike known white-emitting conversion LEDs that require at least one green and one red phosphor in combination with a blue primary radiation.

FIG. 17 compares various properties of conversion LEDs comprising the phosphor according to the present disclosure $KLi_3SiO_4$:$Eu^{2+}$ (LED1, LED2) and the comparative examples (VLED1 and VLED2). In this case, $\lambda_{prim}$ stands for the wavelength of the primary radiation. The first and second phosphors are indicated in the third and fourth columns. CIE-x and CIE-y indicate the color coordinates x and y of the radiation in the CIE standard chromaticity diagram from 1931. CCT/K indicates the correlated color temperature of the overall radiation in kelvins. R9 stands for a color rendering index known to the person skilled in the art (saturated red). LER stands for the luminous efficiency ("luminous efficacy") in lumens per watt. As evident, the conversion LEDs comprising the phosphor according to the present disclosure $KLi_3SiO_4:Eu^{2+}$ as sole phosphor have similar optical properties to conventional conversion LEDs based on two phosphors. In this case, however, the disadvantages arising from the use of two or more phosphors are eliminated. Firstly, the resulting spectrum is greatly dependent on the used ratio of the phosphors. As a result of batch fluctuations in phosphor production, frequent adaptations of the concentration of the phosphors are necessary as a result, which makes the production of the conversion LEDs very complicated. The phosphors additionally exhibit different emission properties depending on temperature, the radiance of the primary radiation and the excitation wavelength and additionally exhibit a different degradation behavior, that is to say a different stability with regard to temperature, radiation, moisture or gas influences. The production of phosphor mixtures may also be difficult if the phosphors differ greatly in their physical properties such as, for example, density, grain size and in the sedimentation behavior. With the use of two phosphors, all these effects lead to fluctuating color locus distributions and color shifts under changing operating conditions, for example current and/or temperature, in the products. In order conventionally to obtain a high color rendering index, advantageously with low color temperature, in particular less than 3500 K or less than 3000 K, red-emitting phosphors are required. However, all known red-emitting phosphors can only be synthesized by means of complex production methods and are therefore very much more expensive than known green and yellow phosphors. By contrast, the phosphor according to the present disclosure $KLi_3SiO_4:Eu^{2+}$ can be produced cost-effectively since the starting materials are commercially available, stable and moreover very inexpensive. Moreover, the synthesis does not require an inert gas atmosphere and therefore proves to be comparatively simple.

The use of the phosphor according to the present disclosure in a white-emitting conversion LED has numerous advantages. It is possible to use a primary radiation which is not perceived or is only scarcely perceived by the human eye (300 nm to 430 nm or 440 nm). Fluctuations of the primary radiations thus do not adversely affect the overall radiation properties. No color adaptation is required since the emission spectrum is constant. The conversion LEDs can be produced with a high throughput since color adaptation or complex chip binning is not required. No color shifts or other negative effects on the emission spectrum as a result of selective degradation of only one phosphor or changes in the primary radiation caused by temperature or forward current fluctuations occur. Furthermore, the conversion LED does not have an inherent color, but rather exhibits a white appearance in the switched-off state. Therefore, the phosphor is also suitable for "remote phosphor" arrangements in which a yellow or orange appearance in the switched-off state is not desired. A partial conversion of the primary radiation can also be carried out depending on the application. Since it is possible to excite the phosphor with a primary radiation in the range of 300 nm to 430 nm or 440 nm, a contribution of the primary radiation, advantageously in the short-wave blue range of the electromagnetic spectrum, to the overall radiation has the effect that objects illuminated thereby appear whiter, more radiant and therefore more attractive. By way of example, optical brightening agents in textiles can be excited thereby.

Figure 18:
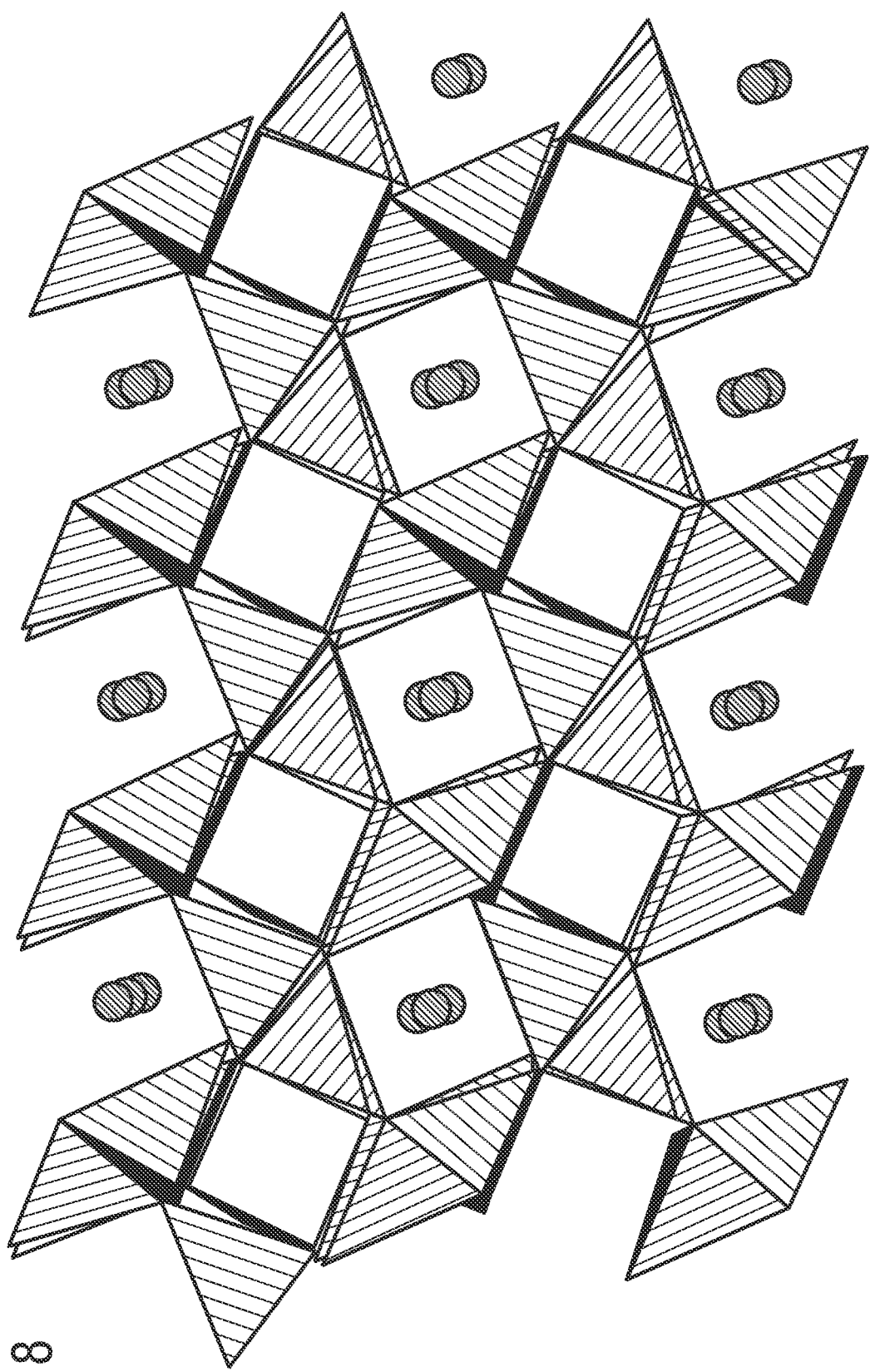

FIG. 18 shows a triclinic crystal structure of the phosphor $KLi_3SiO_4:Eu$ in a schematic illustration. The hatched circles represent the K atoms. The crystal structure corresponds to the crystal structure of $KLi_3SiO_4$, as described in K. Werthmann, R. Hoppe, Über Oxide des neuen Formeltyps $A[(T_4O_4)]$: Zur Kenntnis von $KLi_3GeO_4$, $KLi_3SiO_4$ und $KLi_3TiO_4$ [Regarding oxides of the new formula type $A[(T_4O_4)]$: Zur Kenntnis von $KLi_3GeO_4$, $KLi_3SiO_4$ and $KLi_3TiO_4$], Z. Anorg. Allg. Chem., 1984, 509, 7-22. The crystal structure is isotypic with respect to that of $SrLiAl_3N_4:Eu$, described in P. Pust, V. Weiler, C. Hecht, A. Tücks, A. S. Wochnik, A.-K. Henß, D. Wiechert, C. Scheu, P. J. Schmidt, W. Schnick, Narrow-Band Red-Emitting $Sr[LiAl_3N_4]:Eu^{2+}$ as a Next-Generation LED-Phosphor Material Nat. Mater. 2014 13, 891-896.

Figure 19:
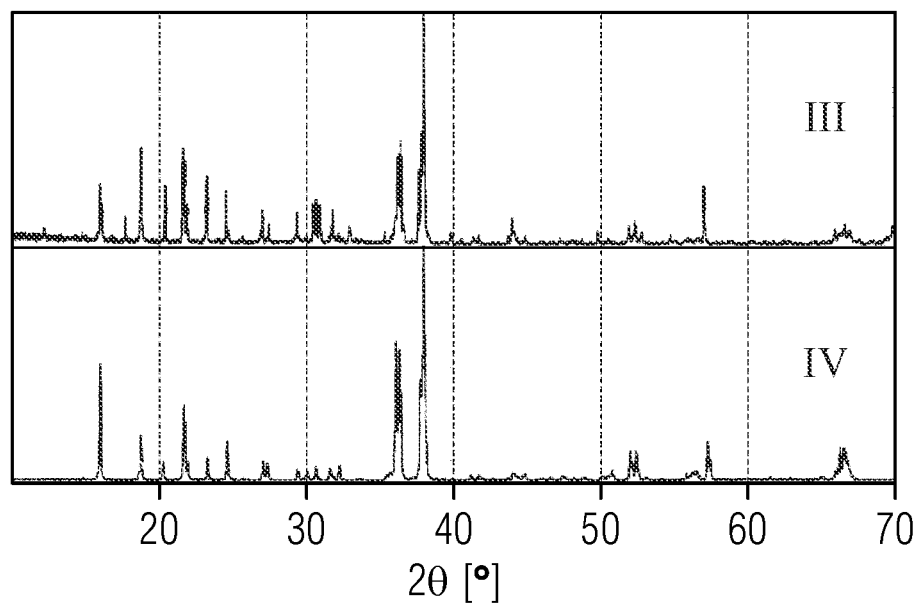

Two X-ray diffraction powder diffractograms using copper $K_{\alpha 1}$ radiation are indicated in FIG. 19. The diffraction angles in ° θ2 values are indicated on the x-axis and the intensity is indicated on the y-axis. The X-ray diffraction powder diffractogram provided with the reference sign III shows that of the second exemplary embodiment of the phosphor according to the present disclosure $KLi_3SiO_4:Eu$. The X-ray diffraction powder diffractogram provided with the reference sign IV shows the X-ray diffraction powder diffractogram for $KLi_3SiO_4$ simulated from the crystal structure of $KLi_3SiO_4$. From the correspondence of the reflections it is evident that the phosphor according to the present disclosure $KLi_3SiO_4:Eu$ crystallizes in the same crystal structure as $KLi_3SiO_4$.

Figure 20:
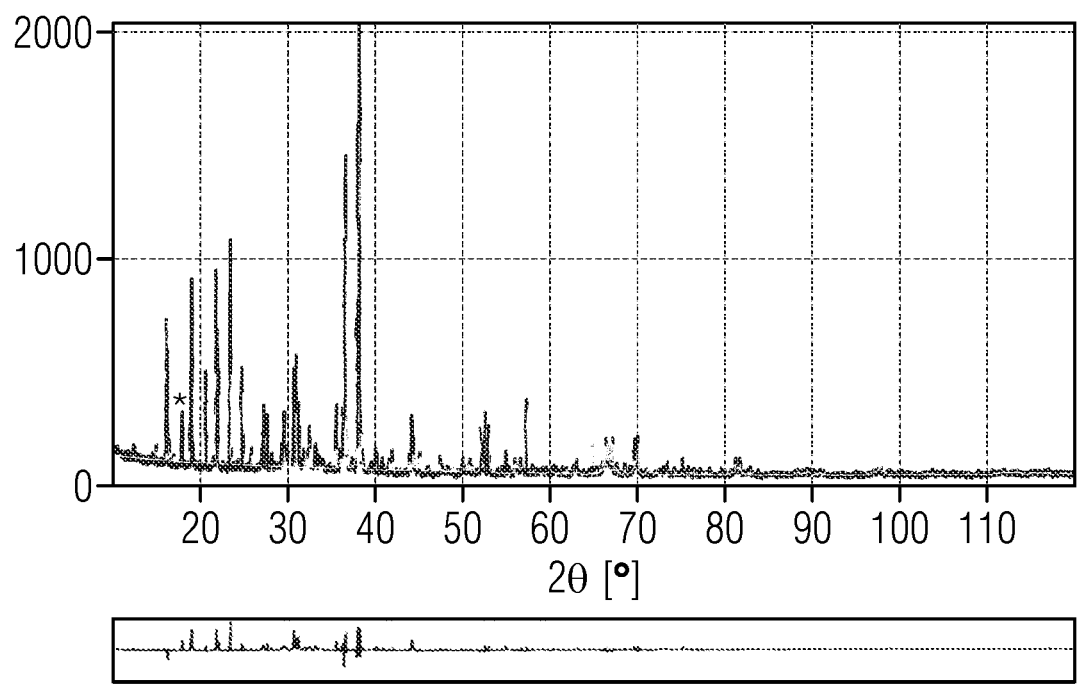

A crystallographic evaluation is found in FIG. 20. FIG. 20 shows a Rietveld refinement of the X-ray powder diffractogram of the second exemplary embodiment AB2, that is to say $KLi_3SiO_4:Eu$. For the Rietveld refinement, the atomic parameters for $KLi_3SiO_4$ (K. Werthmann, R. Hoppe, Über Oxide des neuen Formeltyps A[(T4O4)]: Zur Kenntnis von KLi3GeO4, KLi3SiO4 und KLi3TiO4, Z. Anorg. Allg. Chem., 1984, 509, 7-22) are used to show that the crystal structure of $KLi_3SiO_4:Eu$ corresponds to that of $KLi_3SiO_4$. In this case, the upper diagram illustrates the superimposition of the measured reflections with the calculated reflections for $KLi_3SiO_4$. The lower diagram illustrates the differences between the measured and calculated reflections. A peak of an unknown secondary phase has been marked with an asterisk.

FIG. 21 shows crystallographic data of $KLi_3SiO_4$.

FIG. 22 shows atomic positions in the structure of $KLi_3SiO_4$.

Figure 23:
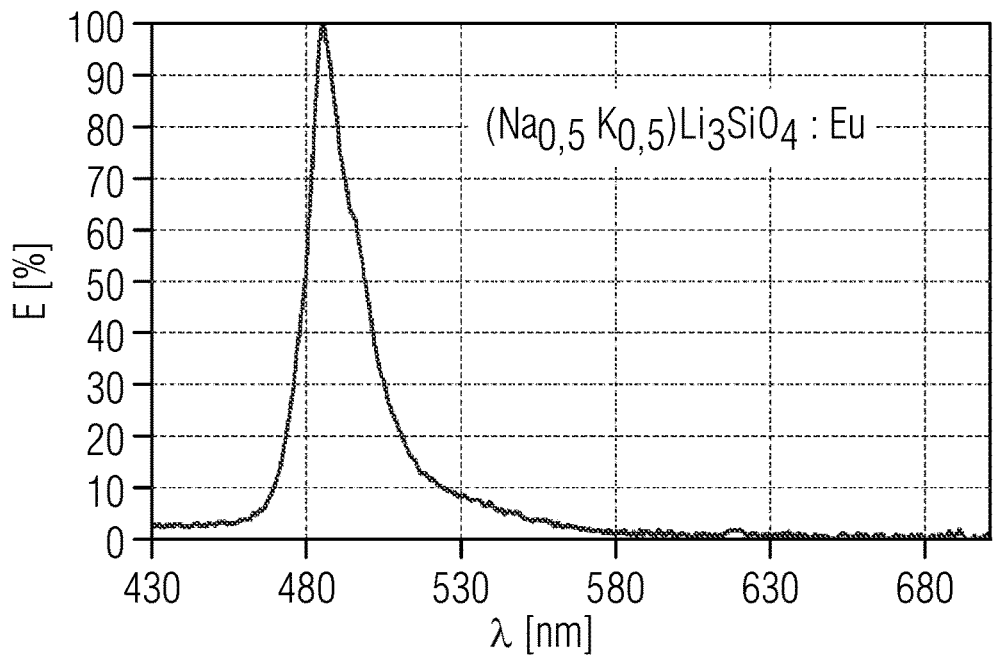

FIG. 23 illustrates the emission spectrum of the third exemplary embodiment AB3 of the phosphor according to the present disclosure having the molecular formula $(Na_{0.5}K_{0.5})Li_3SiO_4:Eu^{2+}$. The wavelength in nanometers is plotted on the x-axis and the emission intensity in percent is plotted on the y-axis. For measuring the emission spectrum, the phosphor according to the present disclosure was excited with primary radiation having a wavelength of 400 nm. The phosphor has a full width at half maximum of less than 20 nm and a peak wavelength of 486 nm. With this small full width at half maximum, this phosphor belongs to the most narrowband $Eu^{2+}$-doped phosphors known. The peak wavelength is in the blue-green spectral range of the electromagnetic spectrum, which spectral range can also be referred to as cyan-colored. Only a small number of phosphors having a peak wavelength in this range have been known hitherto and none of these phosphors has such a small full width at half maximum. With a peak wavelength of 486 nm and the small full width at half maximum, the phosphor has a good overlap with the eye sensitivity curve. The conversion of the UV or blue primary radiation into a secondary radiation having a somewhat longer wavelength in the blue range of the electromagnetic spectrum (peak wavelength of 486 nm), increases the efficiency of the conversion LED. The peak wavelength of the secondary radiation is closer to the eye sensitivity maximum at 555 nm in comparison with the primary radiation, whereby the emitted radiation has a higher overlap with the eye sensitivity curve and is thus perceived as brighter. Similar optical properties are also obtained with AB9, AB14, AB15 and AB16.

Figure 24:
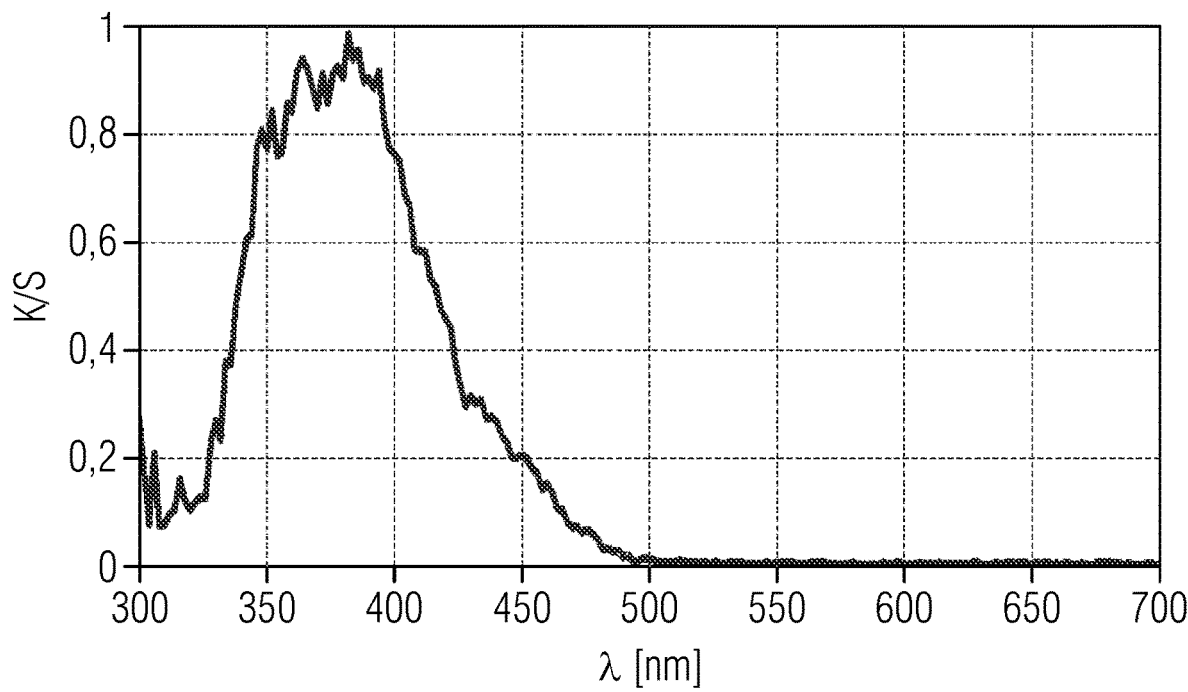

FIG. 24 shows a normalized Kubelka-Munk function (K/S), plotted against the wavelength λ in nm, for the third exemplary embodiment (AB3) of the phosphor according to the present disclosure.

It is evident from FIG. 24 that the maximum of K/S for the third exemplary embodiment (AB3) of the phosphor according to the present disclosure is between 350 nm and 420 nm. Up to 500 nm, K/S is significantly above the value zero. The phosphor $(Na_{0.5}K_{0.5})Li_3SiO_4:Eu^{2+}$ can be efficiently excited with a primary radiation starting from approximately 340 nm.

Figure 25:
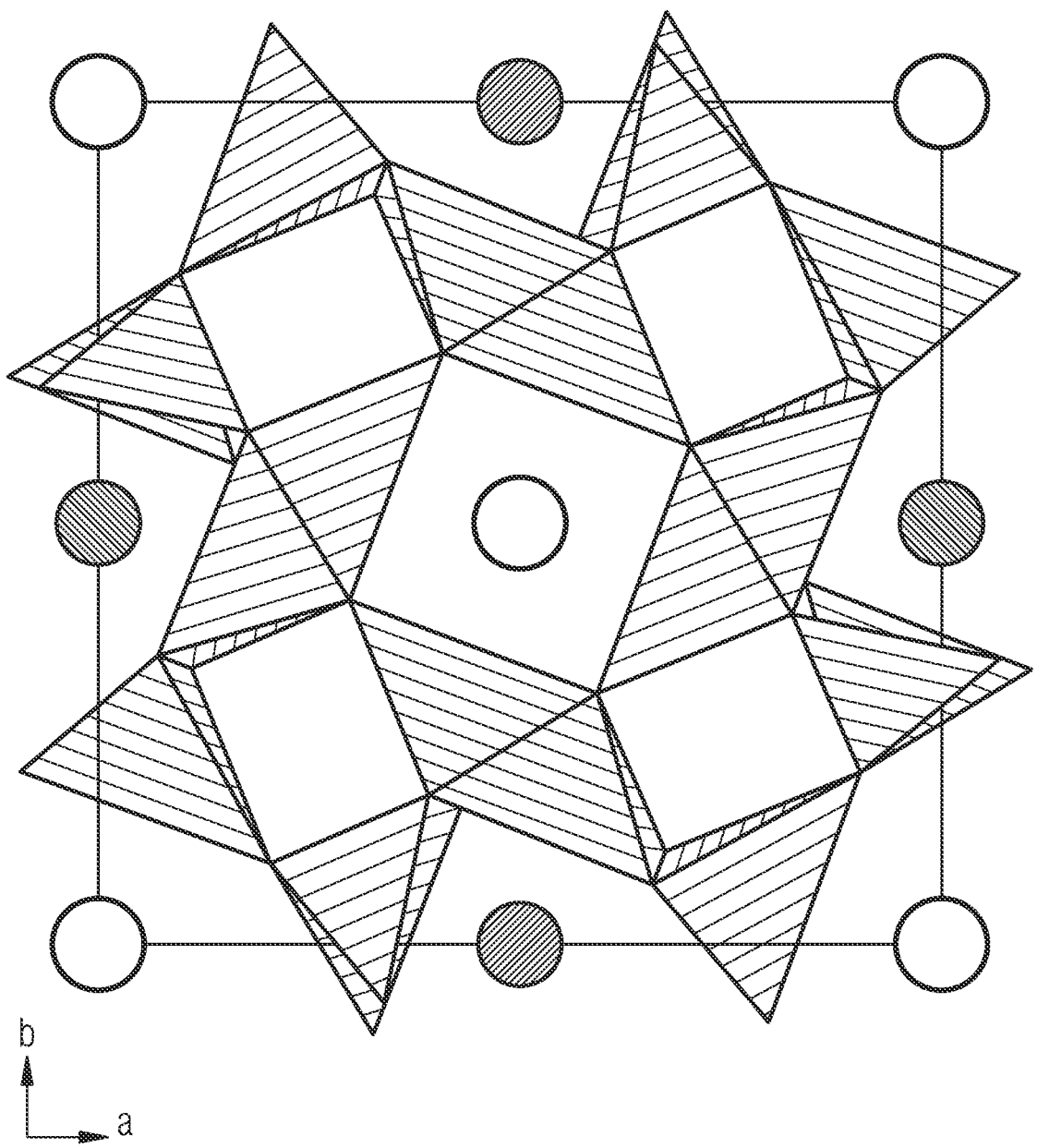

FIG. 25 shows the tetragonal crystal structure of the phosphor $(Na_{0.5}K_{0.5})Li_3SiO_4:Eu^{2+}$ in a schematic illustration. The hatched circles represent the Na atoms; the circles enclosing white areas represent the K atoms. The crystal structure was determined from X-ray powder diffractogram data. The crystal structure of $CsKNa_2Li_{12}Si_4O_{16}$ with Cs being substituted by K was used as the starting point.

Figure 26:
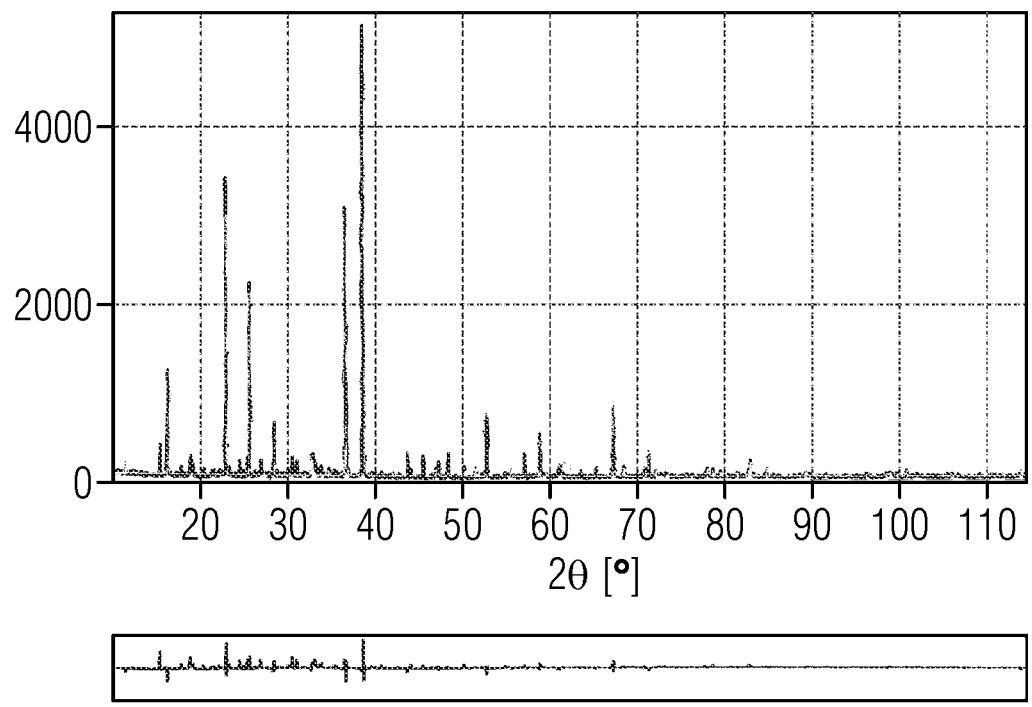

A crystallographic evaluation is found in FIG. 26. FIG. 26 shows a Rietveld refinement of the X-ray powder diffractogram of the third exemplary embodiment AB3, that is to say $(Na_{0.5}K_{0.5})Li_3SiO_4:Eu^{2+}$. The parameters and atomic coordinates of all non-Li atoms were freely refined. In this case, the upper diagram illustrates the superimposition of the measured reflections with the calculated reflections for $CsKNa_2Li_{12}Si_4O_{16}$. The lower diagram illustrates the differences between the measured and calculated reflections. The phosphor $(Na_{0.5}K_{0.5})Li_3SiO_4:Eu^{2+}$ is structurally isotypic with respect to the compounds $CsKNa_2Li_8\{Li[SiO_4]\}4$, $RbNa_3Li_8\{Li[SiO_4]\}_4$, $CsNa_3Li_8\{Li[GeO_4]\}_4$ and $RbNa_3Li_8\{Li[TiO_4]\}4$. The structure is also similar to that of the first exemplary embodiment $NaLi_3SiO_4$:Eu and the second exemplary embodiment $KLi_3SiO_4$:Eu of the phosphor according to the present disclosure, but has a complicated arrangement of the alkali metals.

FIG. 27 shows crystallographic data of $(Na_{0.5}K_{0.5})Li_3SiO_4$.

Figures 28, 29:
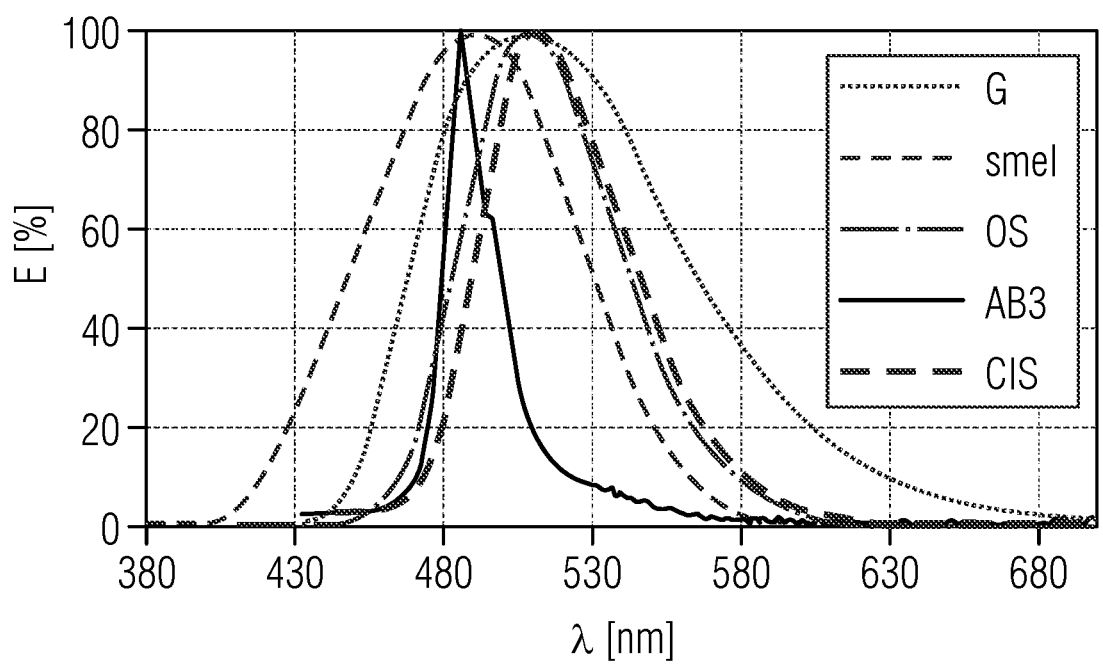

FIG. 28 shows atomic positions in the structure of $(Na_{0.5}K_{0.5})Li_3SiO_4$.

FIG. 29 shows the emission spectra of the third exemplary embodiment of the phosphor according to the present disclosure AB3 and three comparative examples ClS, OS and G, wherein ClS stands for $Ca_8Mg(SiO_4)_4Cl_2$:Eu, OS stands for $(Sr,Ba)_2SiO_4$:Eu and G stands for $Lu_3(Al,Ga)_5O_{12}$:Ce. All the phosphors emit in the blue to blue-green range of the electromagnetic spectrum. AB3, as evident, has the smallest full width at half maximum and the peak wavelength is shifted to shorter wavelengths in comparison with the comparative examples. Therefore, the phosphor according to the present disclosure is suitable for example for an application in signal lights such as blue lights of, for example, police vehicles, ambulances, emergency doctor vehicles or fire department vehicles, the dominant wavelength of which is advantageously in a range of between 465 nm and 480 nm.

The use of the comparative examples is less well suited thereto since the peak wavelengths thereof are above 510 nm, whereas the phosphor according to the present disclosure has a peak wavelength of 486 nm. On account of similar optical properties, AB9, AB14, AB15 and AB16 are also suitable for an application in signal lights.

The curve designated by smel shows the sensitivity curve for melatonin production, that is to say with what wavelengths melatonin production in the body can best be suppressed ("human response function for melanopic effects"; Lucas et al., Trends in Neurosciences January 2014 Vol. 37 No. 1). As evident, the emission spectrum of AB3 exhibits a high overlap with smel, and so this radiation can be effectively used for suppressing the formation of melatonin. Such irradiation can lead to an increased vigilance or ability to concentrate.

Figure 30:
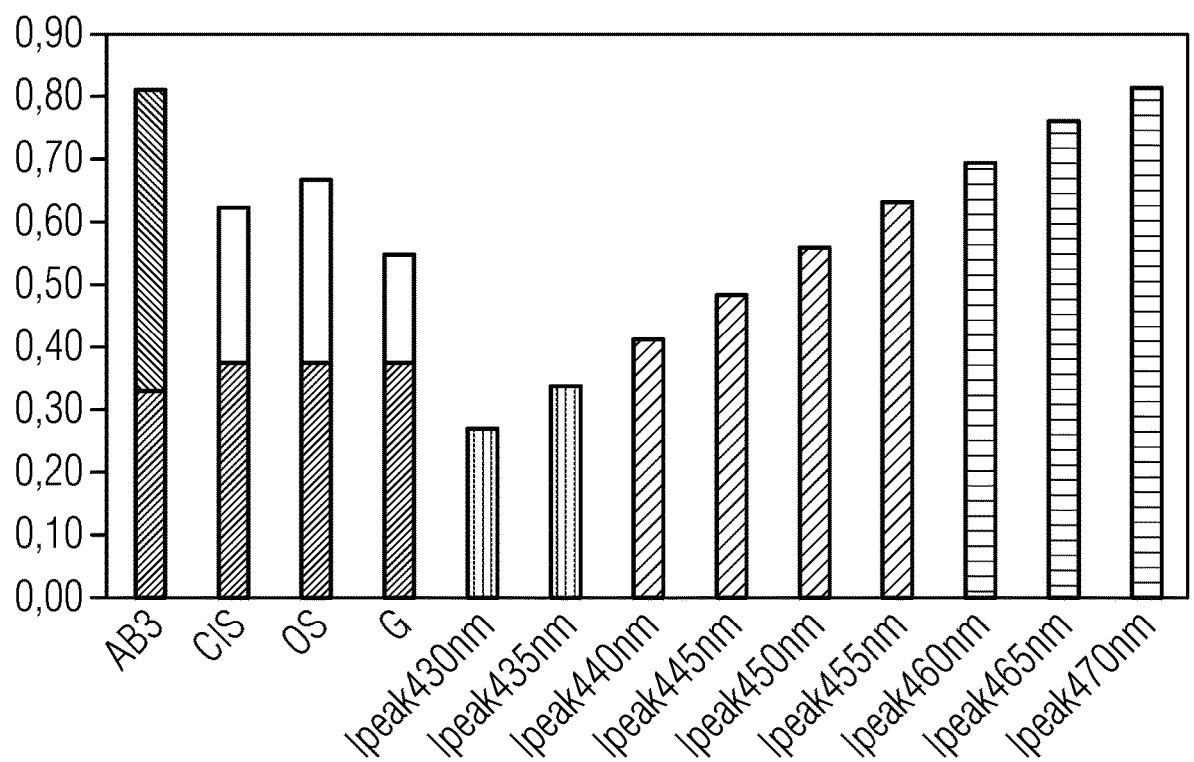
FIG. 30 shows the overlap of emission spectra of various phosphors and various blue-emitting LEDs with the sensitivity curve for melatonin production.

FIG. 30 shows the overlap of emission spectra of various phosphors (AB3, ClS, OS and G, as described under FIG. 29) and various blue-emitting LEDs (unconverted) with the sensitivity curve for melatonin production. The LEDs are light-emitting diodes having InGaN-based semiconductor chips. The LEDs Ipeak430 nm (peak wavelength of 430 nm) and Ipeak435 nm (peak wavelength of 435 nm) are not usually commercially available in large numbers, but are very efficient. The LEDs Ipeak440 nm (peak wavelength of 440 nm), Ipeak445 nm (peak wavelength of 445 nm), Ipeak450 nm (peak wavelength of 450 nm) and Ipeak455 nm (peak wavelength of 455 nm) are commercially available, inexpensive and efficient. The LEDs Ipeak460 nm (peak wavelength of 460 nm), Ipeak465 nm (peak wavelength of 465 nm) and Ipeak470 nm (peak wavelength of 470 nm) have only low efficiency and are not usually commercially available. InGaN-based semiconductor chips can in principle emit a radiation having a peak wavelength of up to 500 nm, although the efficiency decreases as the wavelength increases, for which reason they are produced in large numbers usually only up to a peak wavelength of up to approximately 460 nm. As a result, the areas of application for InGaN-based semiconductor chips in light-emitting diodes (without phosphor) are limited. As evident, the emission of the phosphor according to the present disclosure AB3 exhibits a greater overlap with the sensitivity curve for melatonin production than the phosphors ClS, OS and G and also than the InGaN-based LEDs. Melatonin production can thus be efficiently suppressed with the phosphor according to the present disclosure. On account of similar optical properties, AB9, AB14, AB15 and AB16 are also suitable for suppressing melatonin production.

Figure 31:
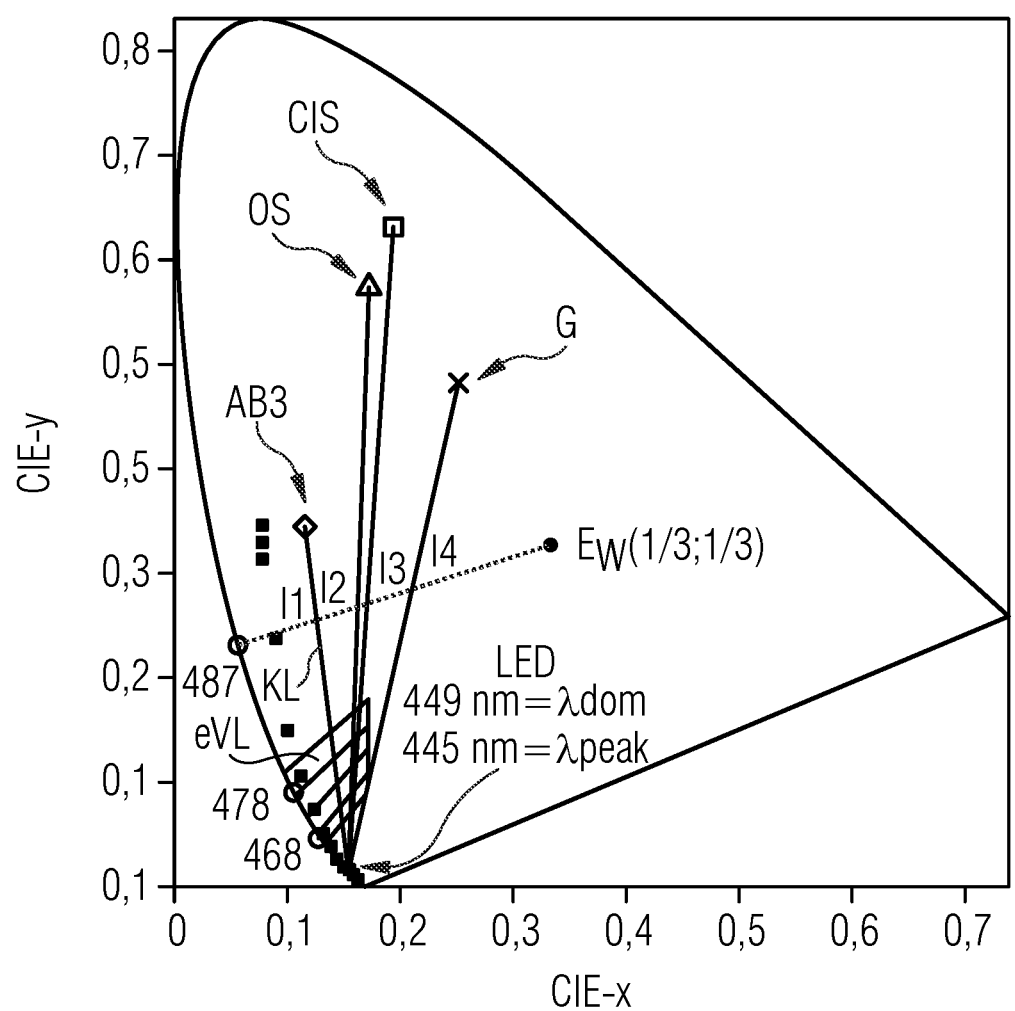

FIG. 31 shows the CIE standard diagram (1931), wherein the CIE-x portion of the primary color red is plotted on the x-axis and the CIE-y portion of the primary color green is plotted on the y-axis. The color loci of various phosphors (AB3, ClS, OS and G, as described under FIG. 29) are depicted in the CIE standard diagram. The black quadrilaterals represent color loci of various blue and blue-green InGaN semiconductor chips having peak wavelengths of between 430 nm and 492 nm and dominant wavelengths of between 436 nm and 493 nm. The black dot marks the white point Ew having the coordinates CIE-x=1/3 and CIE-y=1/3. The black lines linking the color loci of a blue indium gallium nitride semiconductor chip (λpeak=445 nm; λdom=449 nm) with the color loci of the phosphors represent the conversion lines of conversion LEDs that are constructed from the indium gallium nitride semiconductor chip and corresponding phosphors. The area identified by EVL shows the typical blue color space for products for application in the field of signal lights for police vehicles, for example. The open circles mark color loci having 100% color purity for selected dominant wavelengths at 468 nm, 476 nm and 487 nm. The dashed line represents color loci having dominant wavelengths at 487 nm with varying color purity. Color loci on this dashed line which lie nearer to the open circle 487 exhibit higher color purities than color loci that lie nearer to the white point E. The advantageous effects of the new phosphor AB3 become clear from this figure: the conversion line (KL) of a typical blue LED to the color locus of the phosphor according to the present disclosure AB3 intersects the EVL color space in the center, whereas the conversion lines of the same blue LED comprising the phosphors OS, ClS and G exhibit only a small overlap with the EVL color space. It is thus advantageously possible to obtain a plurality of color spaces within the EVL color space by using the phosphor AB3 by comparison with the conventional phosphors. Moreover, the conversion line K intersects the dashed line for the dominant wavelength 487 nm at the point I1, which has a higher color purity in comparison with the intersection points of the conversion lines of the known phosphors. The same improvement in the color purity using the phosphor according to the present disclosure AB3 is also manifested for other target dominant wavelengths, in particular within the EVL color space. The corresponding lines are not shown, for the sake of clarity. A high color purity results in a more saturated color impression. The phosphor according to the present disclosure thus makes it possible to obtain additional color loci which have not been able to be achieved hitherto. The phosphor according to the present disclosure $(Na_{0.5}K_{0.5})Li_3SiO_4:Eu^{2+}$ is therefore particularly suitable for conversion LEDs which emit a blue radiation with high color saturation. These conversion LEDs are suitable for use in blue lights or else for "color on demand" applications. On account of similar optical properties, AB9, AB14, AB15 and AB16 are also suitable for conversion LEDs which emit a blue radiation with high color saturation.

Figure 32:
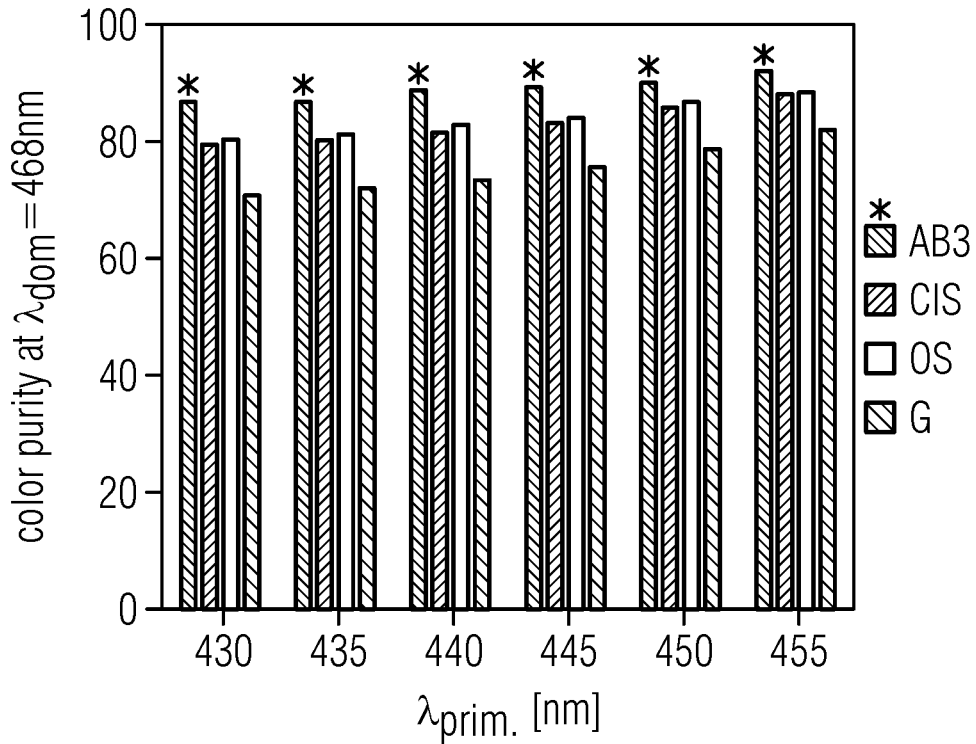
FIGS. 32, 33, 34 show comparisons of the color purity at different dominant wavelengths of the primary radiation of an exemplary embodiment with comparative examples.
Figure 33:
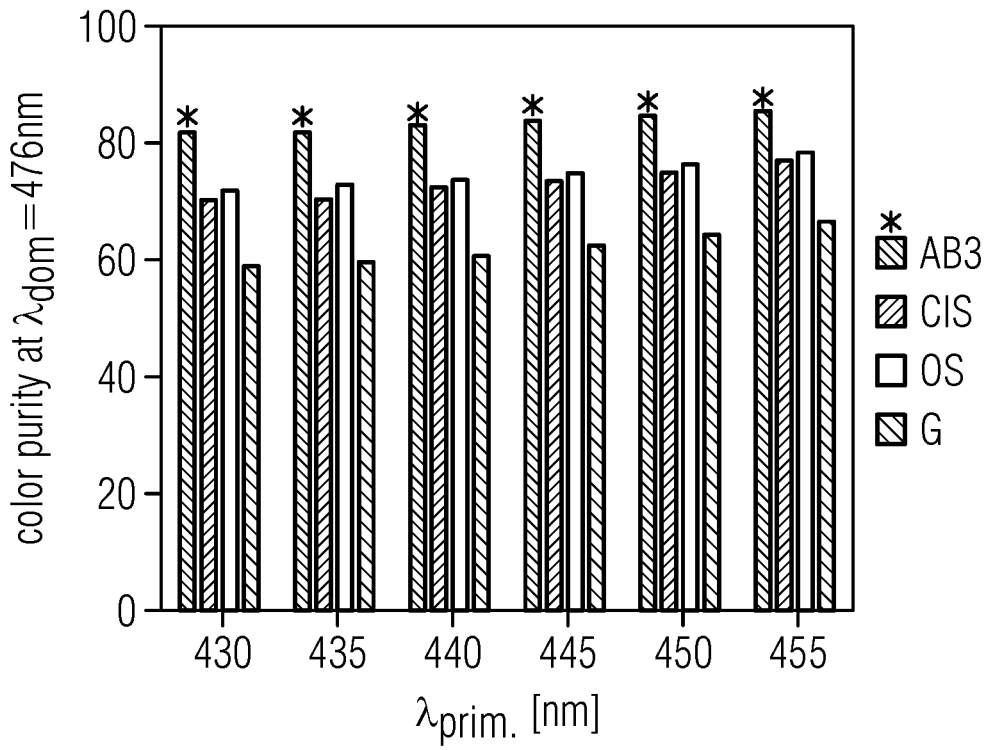
Figure 34:
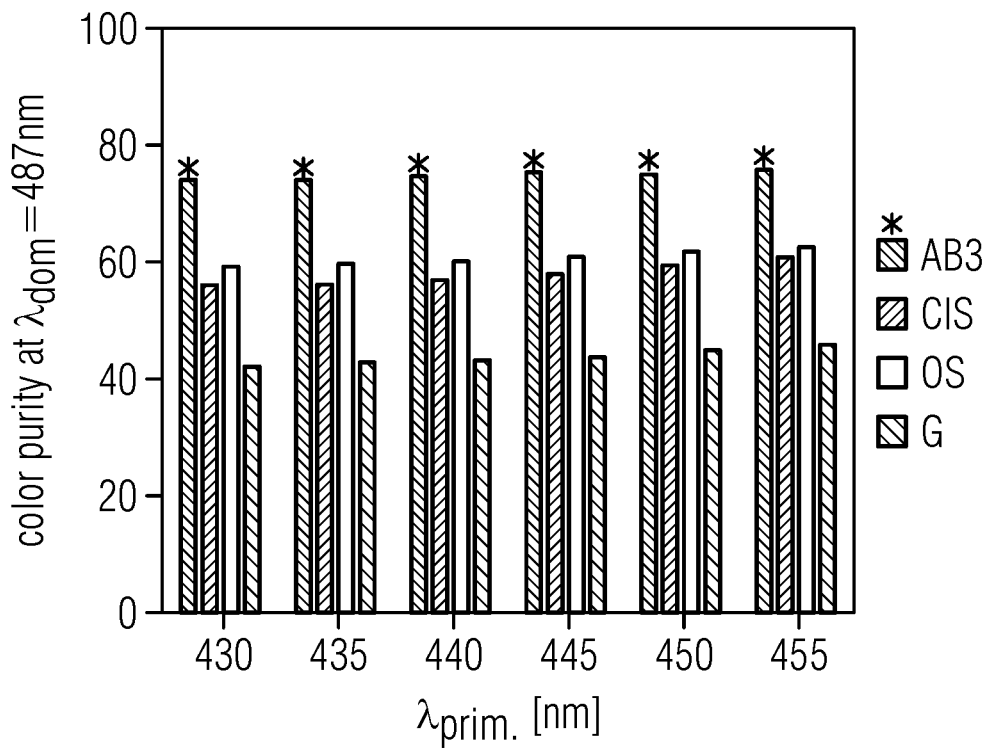

FIGS. 32, 33 and 34 show a comparison of the achievable color purities of different conversion LEDs at various target dominant wavelengths and wavelengths of the primary radiation. In order to carry out the simulation experiments, a blue semiconductor chip was combined with the different phosphors AB3, ClS, OS and G. Semiconductor chips based on InGaN and having a high efficiency were used in this case. The content of phosphor was varied for each experiment in order to attain the target dominant wavelength; the color purity was subsequently determined from the resulting spectra. The results show that for all chosen target dominant wavelengths and all chosen wavelengths of the primary radiation, the conversion LEDs comprising the phosphor AB3 and also comprising AB9, AB14, AB15 and AB16 (not shown) exhibit a significantly higher color purity than the comparative examples.

Figure 35:
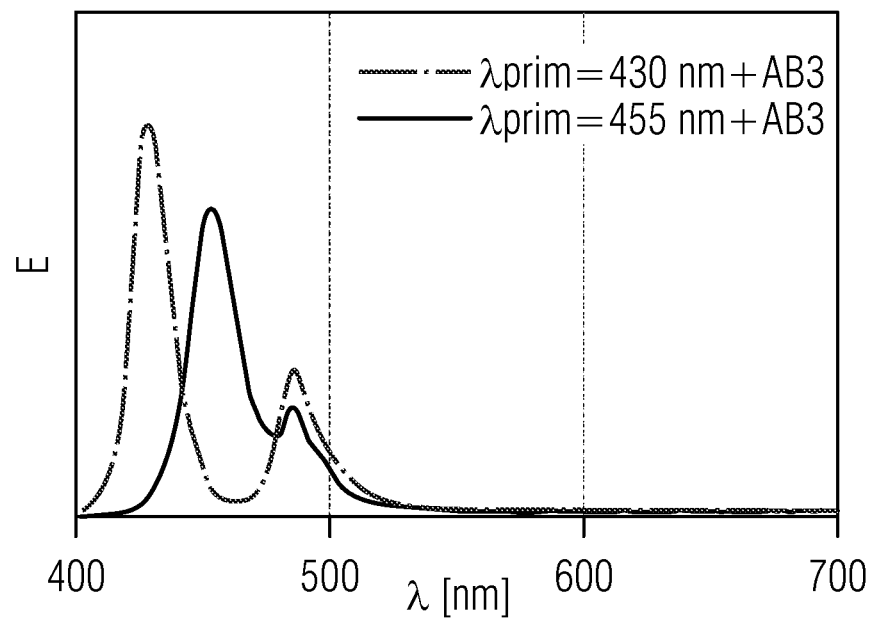
Figure 36:
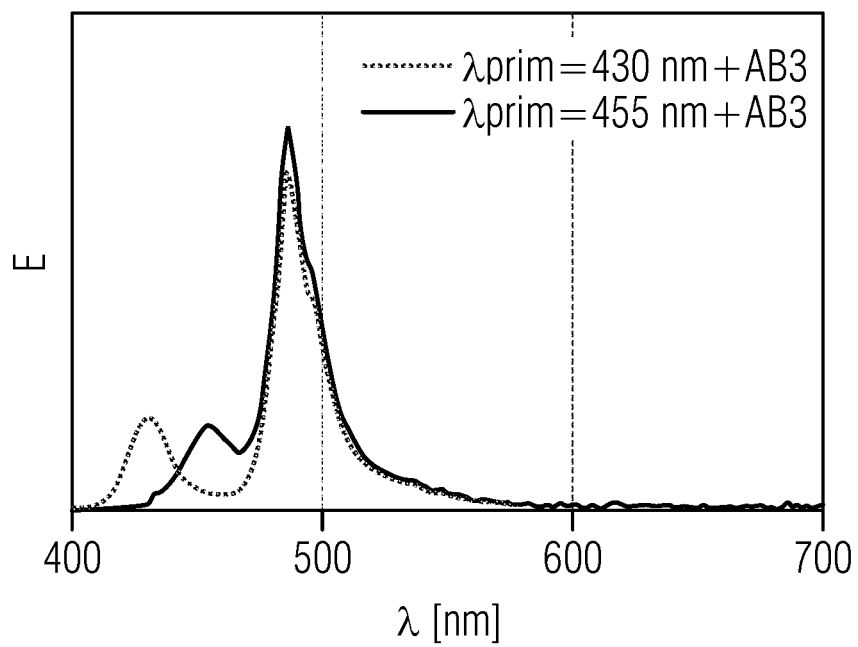
Figure 37:
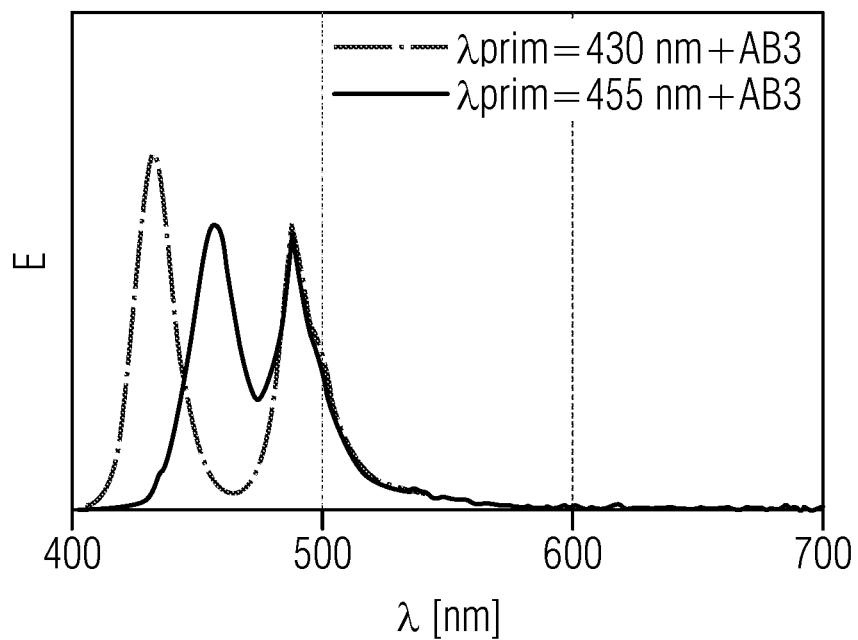

FIGS. 35, 36 and 37 shows the simulated emission spectra of the conversion LEDs corresponding to FIGS. 32, 33 and 34. In this case, FIG. 35 shows the emission spectra of a conversion LED having a primary radiation of 430 nm and of a conversion LED having a primary radiation of 455 nm in each case comprising the phosphor AB3 at a target dominant wavelength of 468 nm. FIG. 36 shows the emission spectra of a conversion LED having a primary radiation of 430 nm and of a conversion LED having a primary radiation of 455 nm in each case comprising the phosphor AB3 at a target dominant wavelength of 487 nm.

FIG. 37 shows the emission spectra of a conversion LED having a primary radiation of 430 nm and of a conversion LED having a primary radiation of 455 nm in each case comprising the phosphor AB3 at a target dominant wavelength of 476 nm.

Figure 38:
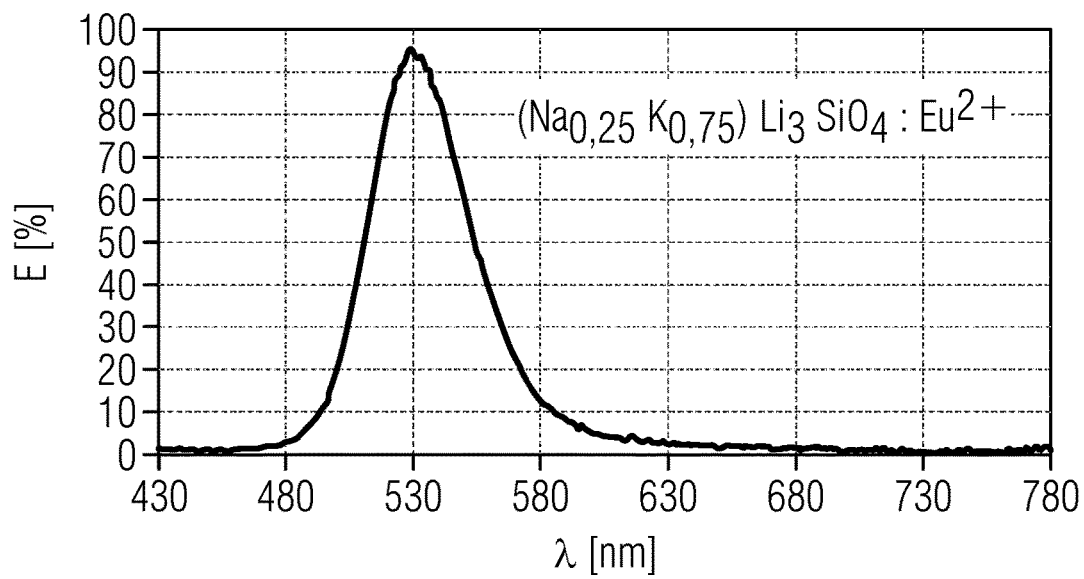

FIG. 38 illustrates the emission spectrum of the fourth exemplary embodiment AB4 of the phosphor according to the present disclosure having the molecular formula $(Na_{0.25}K_{0.75})Li_3SiO_4:Eu^{2+}$. The wavelength in nm is plotted on the x-axis and the emission intensity in % is plotted on the y-axis. For measuring the emission spectrum, the phosphor according to the present disclosure was excited with a primary radiation having a wavelength of 400 nm. The phosphor has a full width at half maximum of less than 50 nm, a peak wavelength of 529 nm, a dominant wavelength of 541 nm and a color locus in the CIE color space having the coordinates CIE-x: 0.255 and CIE-y: 0.680. The narrow full width at half maximum of the phosphor leads to a saturated green emission of the phosphor.

Figure 39:
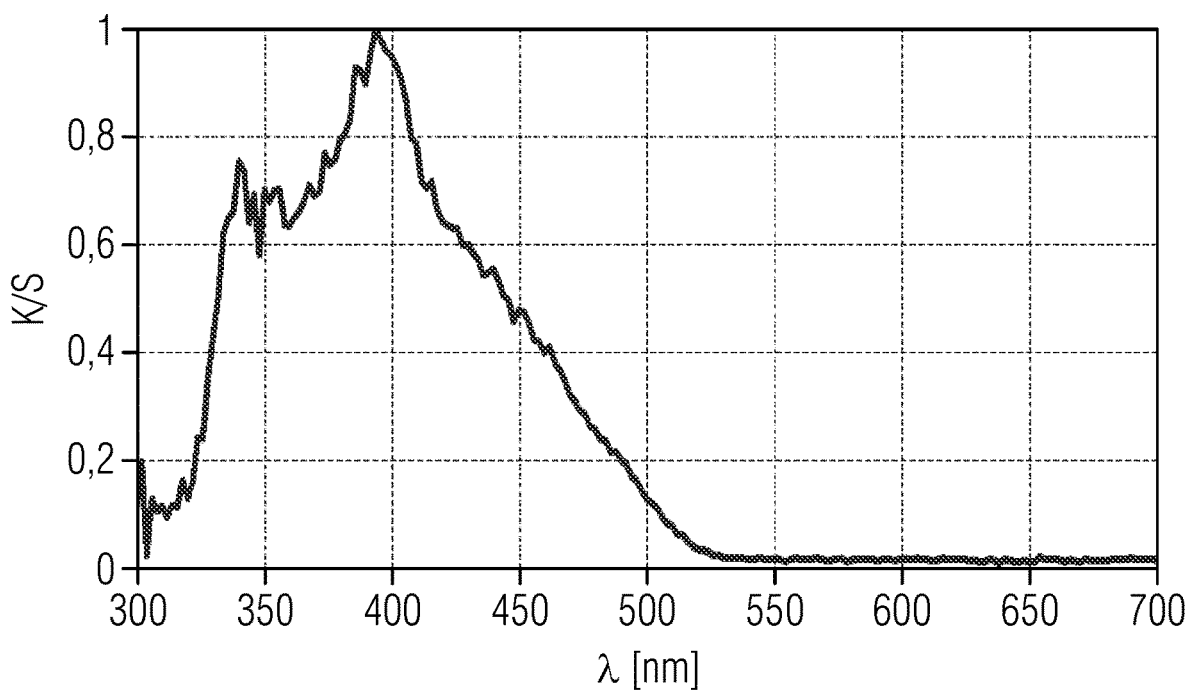

FIG. 39 shows a normalized Kubelka-Munk function (K/S), plotted against the wavelength $\lambda$ in nm, for the fourth exemplary embodiment (AB4) of the phosphor according to the present disclosure. The phosphor according to the present disclosure can be efficiently excited with a primary radiation in the range of between 330 nm and 500 nm, advantageously 340 nm to 460 nm, particularly advantageously 350 nm to 450 nm. As a result, the phosphor is suitable in particular for backlighting applications, using a semiconductor chip with a primary radiation in the near UV range or blue range of the electromagnetic spectrum.

Figure 40:
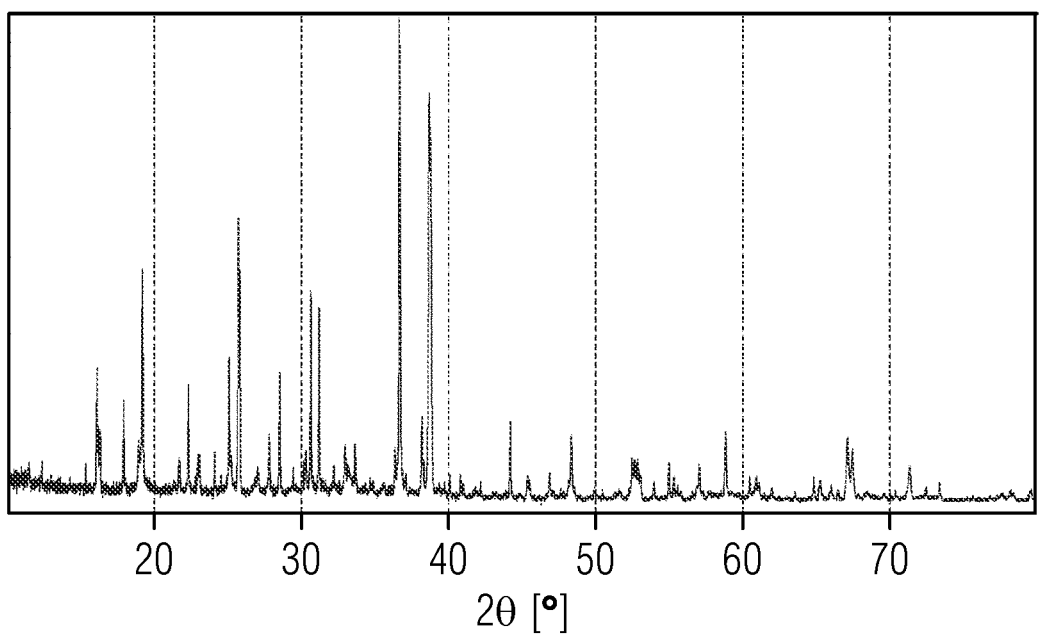

FIG. 40 shows the X-ray powder diffractogram of the fourth exemplary embodiment AB4. The intensity is indicated on the y-axis and the ° 2θ values are indicated on the x-axis. The reflection positions and the relative intensity in % of the reflection positions of the X-ray powder diffractogram are indicated in FIG. 41.

Figures 42, 43:
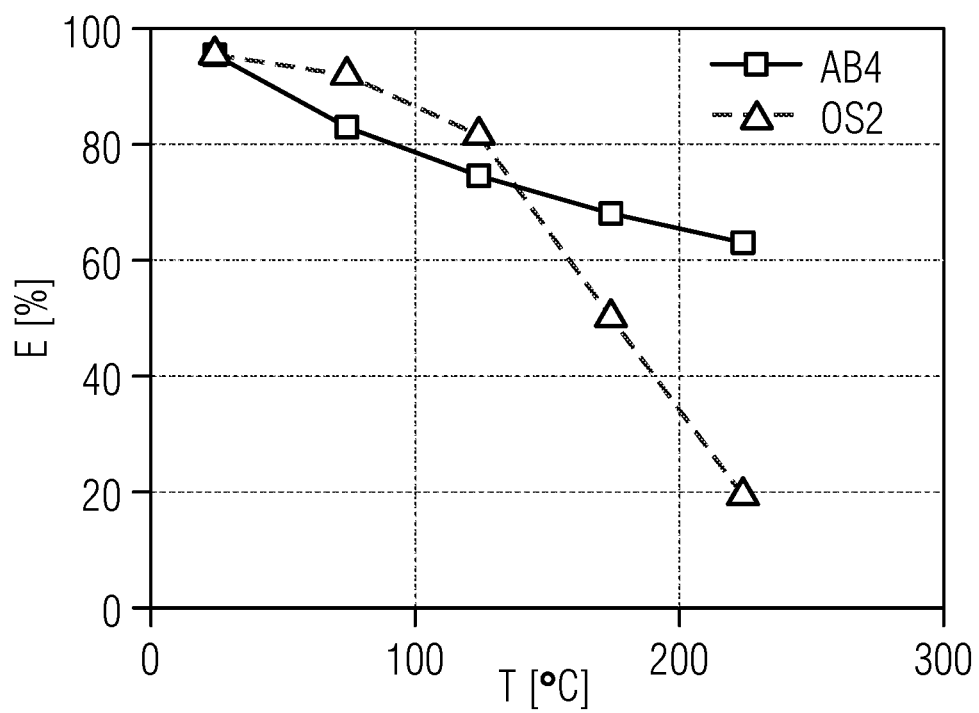

In FIG. 42, the emission intensity in % is plotted against the temperature in ° C. As evident, the exemplary embodiment AB4 of the phosphor according to the present disclosure exhibits a high thermal stability. FIG. 42 shows the thermal quenching behavior of the phosphor according to the present disclosure AB4 in comparison with a conventional phosphor OS2, a green orthosilicate of the formula $(Sr,Ba)_2SiO_4:Eu$. The phosphors were excited with a blue primary radiation having a wavelength of 460 nm at various temperatures from 25 to 225° C. and their emission intensity was recorded in the process. It is clearly evident that the phosphor AB4 according to the present disclosure has a significantly smaller loss of emission intensity at typical temperatures that prevail in a conversion LED, in particular temperatures above 140° C. The phosphor can thus advantageously be used even at higher operating temperatures in conversion LEDs.

FIG. 43 shows various optical properties of the fourth exemplary embodiment of the phosphor according to the present disclosure AB4 in comparison with conventional phosphors G2 and OS2. In this case, OS2 stands for a phosphor of the formula $(Sr,Ba)_2SiO_4:Eu$ and G2 stands for a phosphor of the formula $Lu_3(Al,Ga)_5O_{12}:Ce$. All three phosphors exhibit a similar dominant wavelength. In this case, however, the phosphor AB4 according to the present disclosure exhibits a significantly higher luminous efficiency (LER) and a significantly higher color purity. This leads to an improved color saturation, as a result of which it is possible to achieve a higher color space coverage, and to an improved overall efficiency. The reason for the improved properties is the small full width at half maximum of the fourth exemplary embodiment AB4 having the formula $(Na_{0.25}K_{0.75})Li_3SiO_4:Eu^{2+}$ of the phosphor according to the present disclosure in comparison with the conventional phosphors. On account of a similar position of the peak wavelengths and values of the full width at half maximum, the exemplary embodiments AB5, AB7, AB13 and AB8 likewise exhibit improved properties. The high luminous efficiency increases the efficiency of green conversion LEDs having partial or full conversion in comparison with green conversion LEDs comprising known green phosphors having a comparable dominant and/or peak wavelength.

Figure 44:
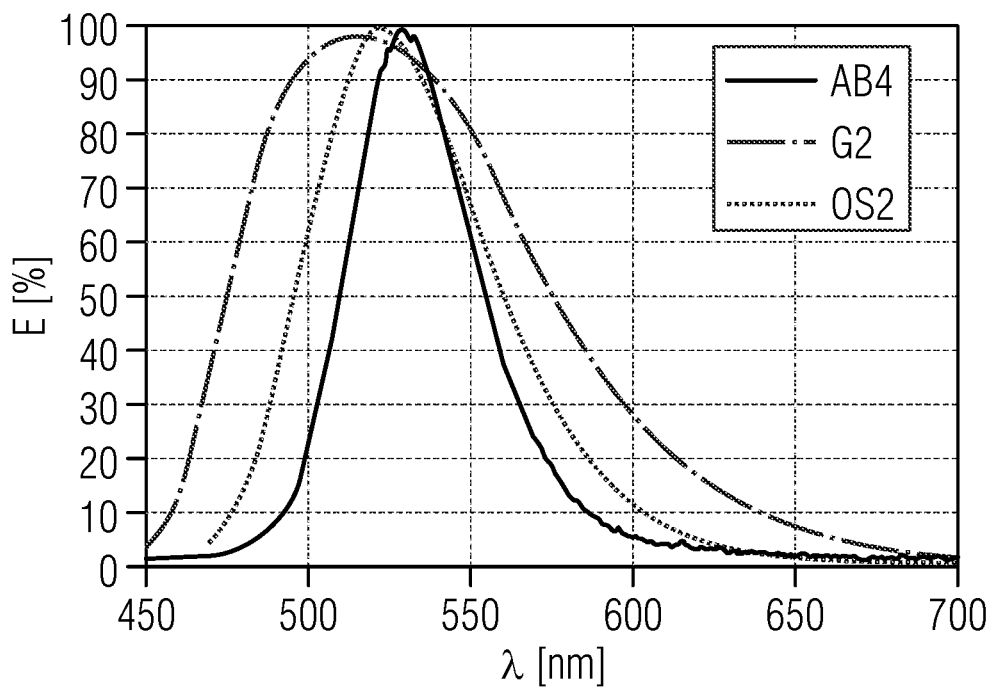
Figure 46:
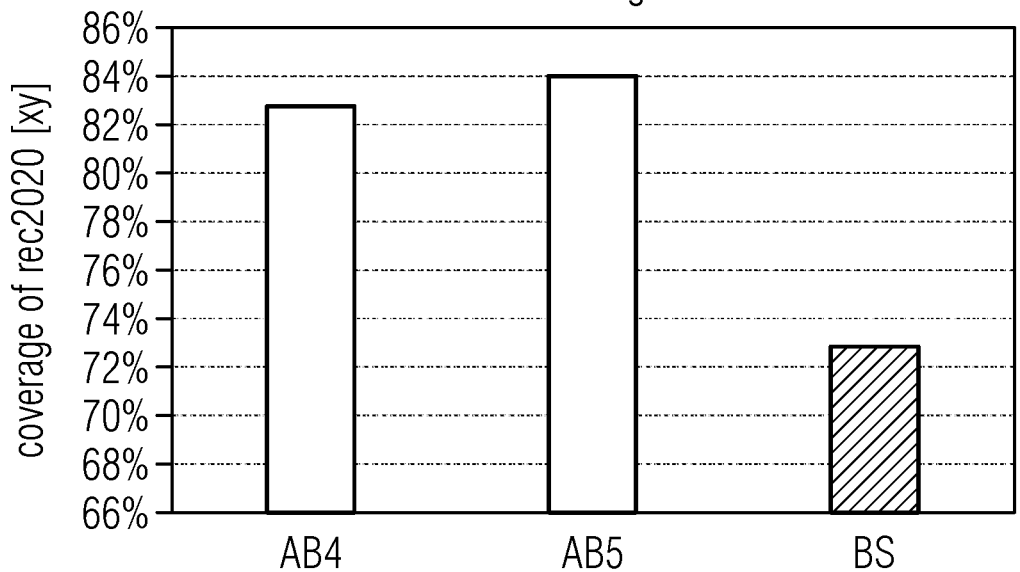
FIGS. 46 to 53 show graphical representations of the coverage of the color space rec2020 by different combinations of green and red phosphor.
Figure 47:
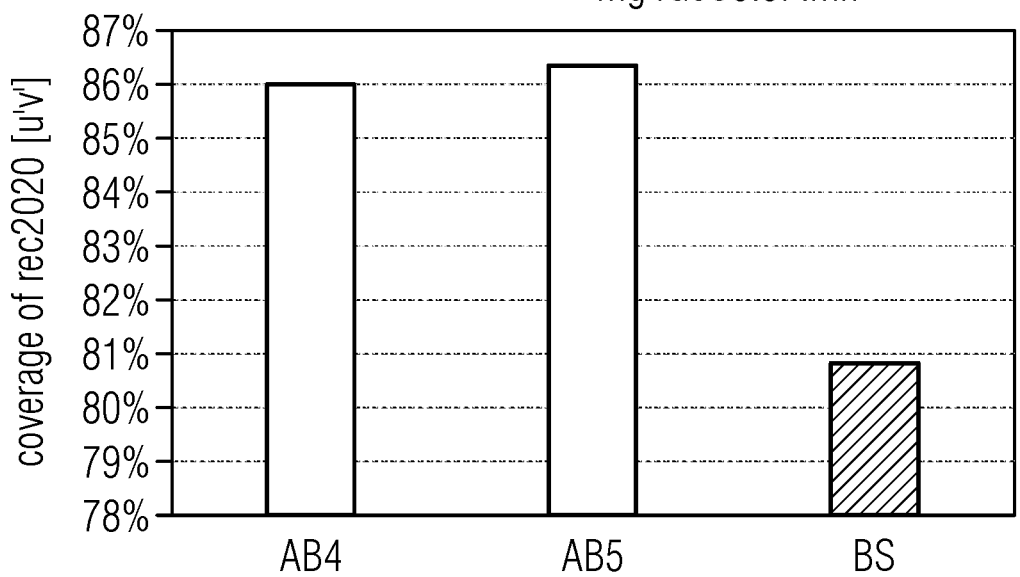
Figure 48:
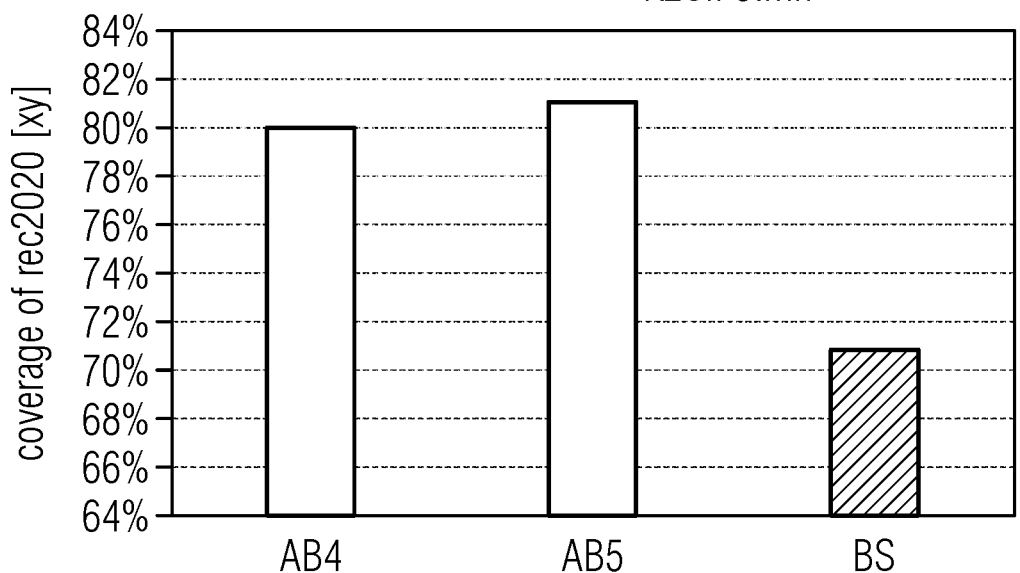
Figure 49:
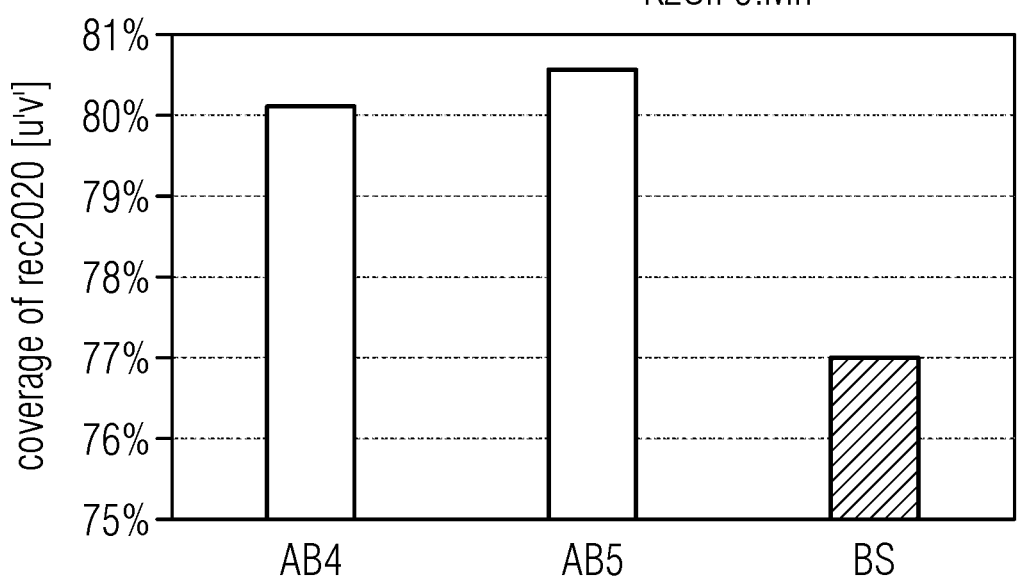
Figure 50:
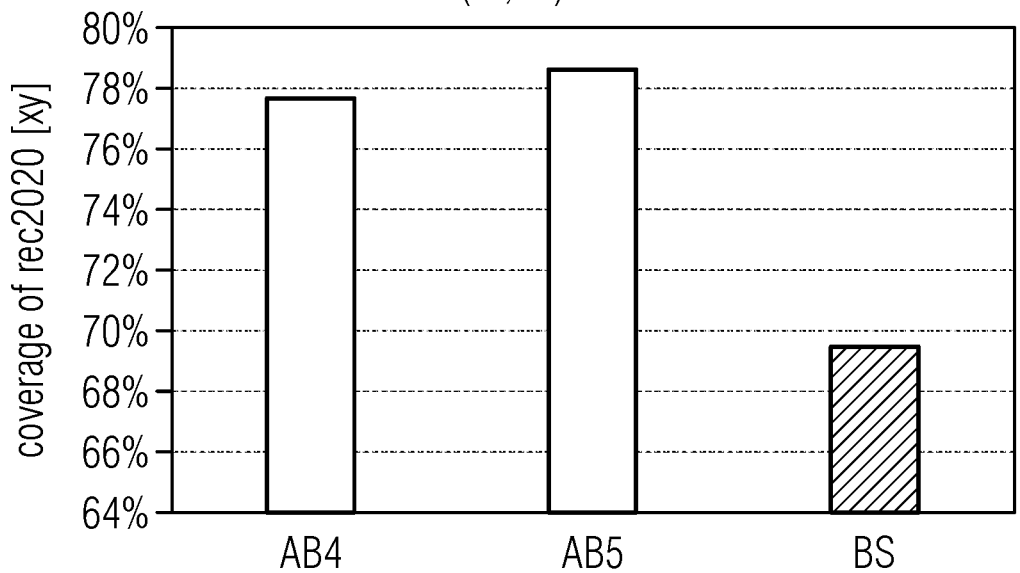
Figure 51:
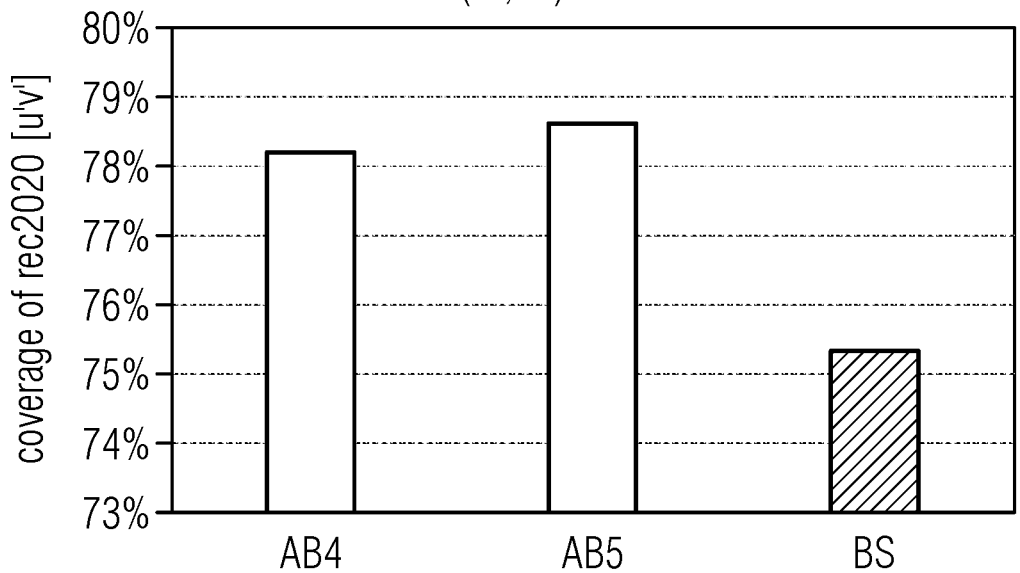
Figure 52:
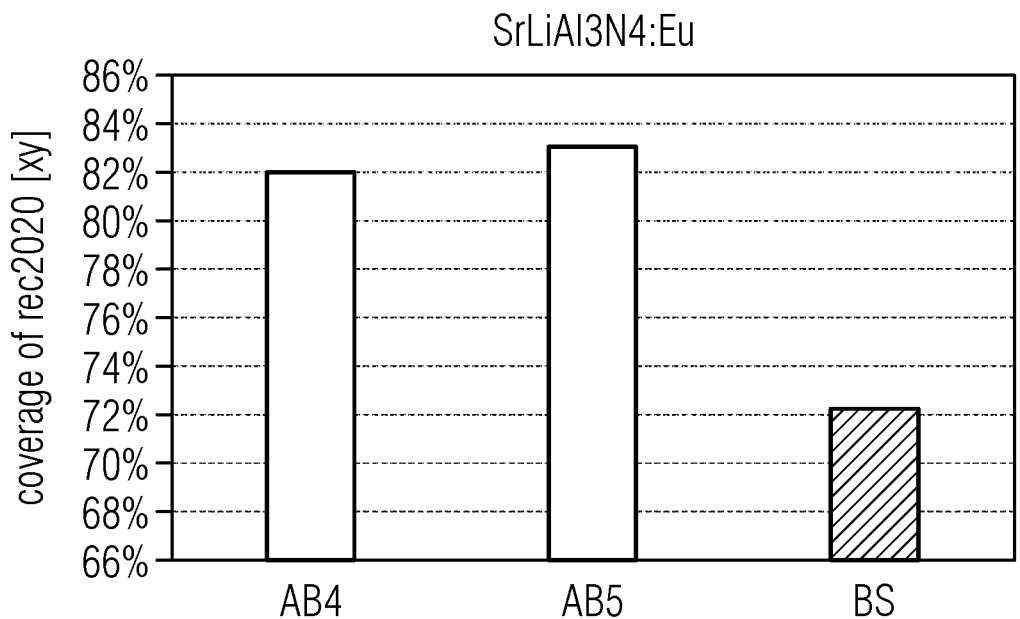
Figure 53:
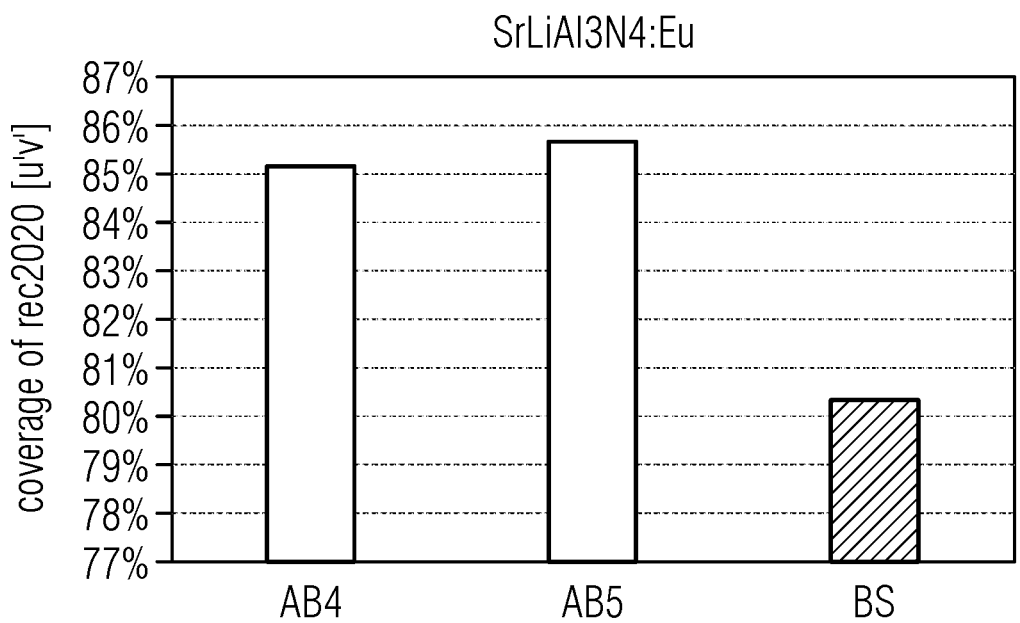

FIG. 44 shows a comparison of the emission spectra of the fourth exemplary embodiment AB4 of the phosphor according to the present disclosure in comparison with the conventional phosphors G2 and OS2 described under FIG. 43.

FIG. 45 shows the coverage of the color space rec2020 (xy) in the CIE color space system and rec2020 (u'v') in the CIE LUV color space system (1976) by different combinations of a green phosphor and a red phosphor in conjunction with a blue primary radiation of varying dominant wavelength. In this case AB4 stands for the fourth exemplary embodiment $(Na_{0.25}K_{0.75})Li_3SiO_4:Eu^{2+}$ of the phosphor according to the present disclosure and AB5 stands for the fifth exemplary embodiment $(Rb_{0.5}Li_{0.5})Li_3SiO_4$ of the phosphor according to the present disclosure, and BS stands for a conventional green-emitting beta-SiAlON:Eu phosphor. The proportions of blue, green and red radiation were adapted such that the white color locus for typical backlighting applications (CIE-x=0.278 and CIE-y=0.255) was obtained. Typical color filter curves were applied to the resulting spectrum and the resulting color loci for blue, green and red were calculated. The overlap of the resulting color space with the standard color spaces was then calculated and compared. In all cases it is evident that the spectra obtained with the exemplary embodiments AB4 and AB5 of the phosphor according to the present disclosure result in a greater coverage of the respective color space. Like AB4 and AB5, AB7, AB13 and AB8 also have a high coverage of the respective color space on account of the similar peak wavelength and full width at half maximum (FIGS. 76, 129, 86) in combination with the red phosphors indicated in FIG. 45. A greater bandwidth of colors can thus be rendered with the phosphors according to the present disclosure. Thus, by way of example, a display device, such as a display, having a conversion LED comprising the phosphor according to the present disclosure can render a significantly increased number of colors by comparison with what has been possible hitherto with conventional phosphors.

FIGS. 46 to 53 show a graphical representation of the results of the color space coverage as described in FIG. 45 for a dominant wavelength of the primary radiation at 448 nm. The second red phosphor used, together with its molecular formula, is indicated in each of the diagrams.

Figure 54A:
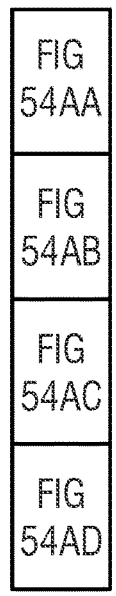
FIGS. 54A, 54AA, 54AB, 54AC, 54AD, 54B, 54BA, 54BB, 54BC, 54BD, 54C, 54CA, 54CB, 54CC, and 54CD show the coverage of various standard color spaces and color loci of filtered spectra of different combinations of green and red phosphor.
Figure 55:
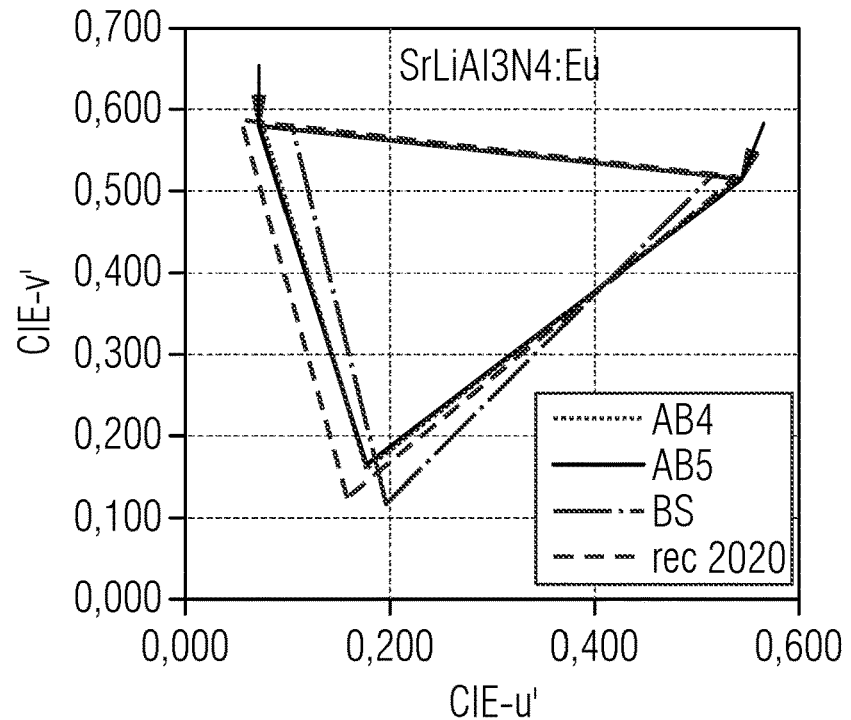
FIGS. 55 to 58 show the spanned color spaces of filtered spectra with different combinations of green and red phosphor upon excitation with a primary radiation λdom=448 nm.
Figure 56:
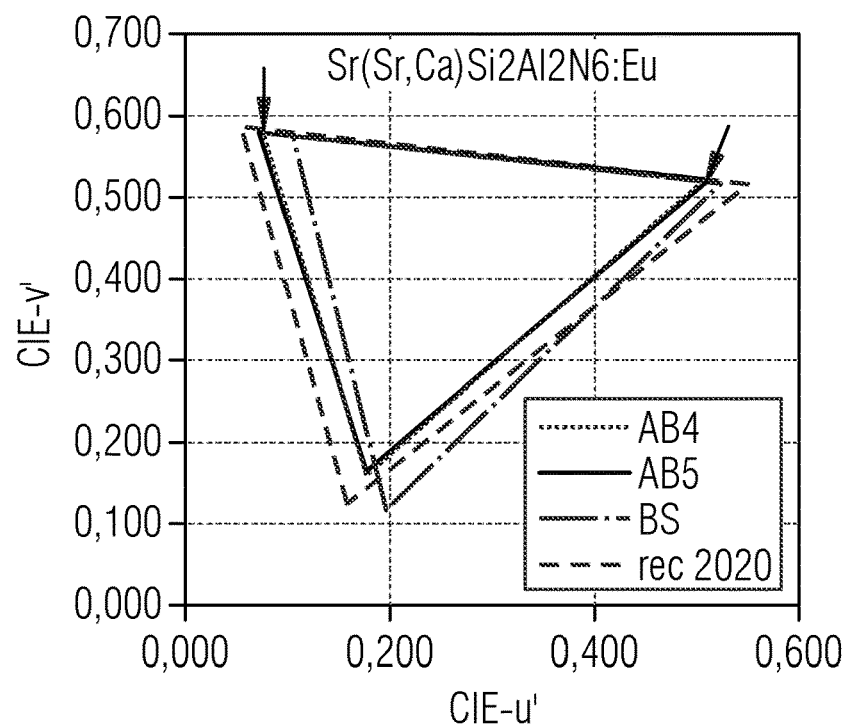
Figure 57:
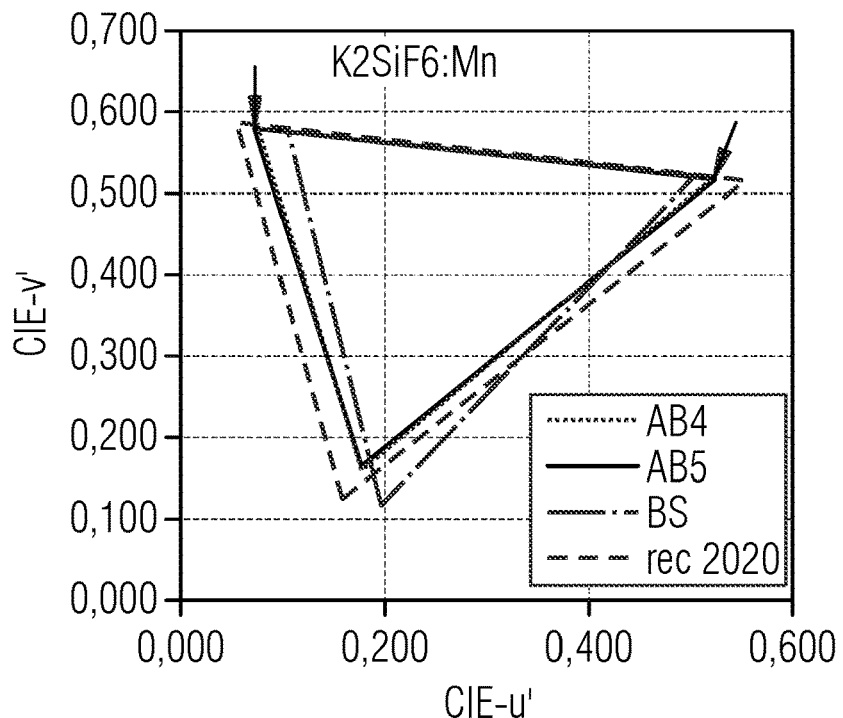
Figure 58:
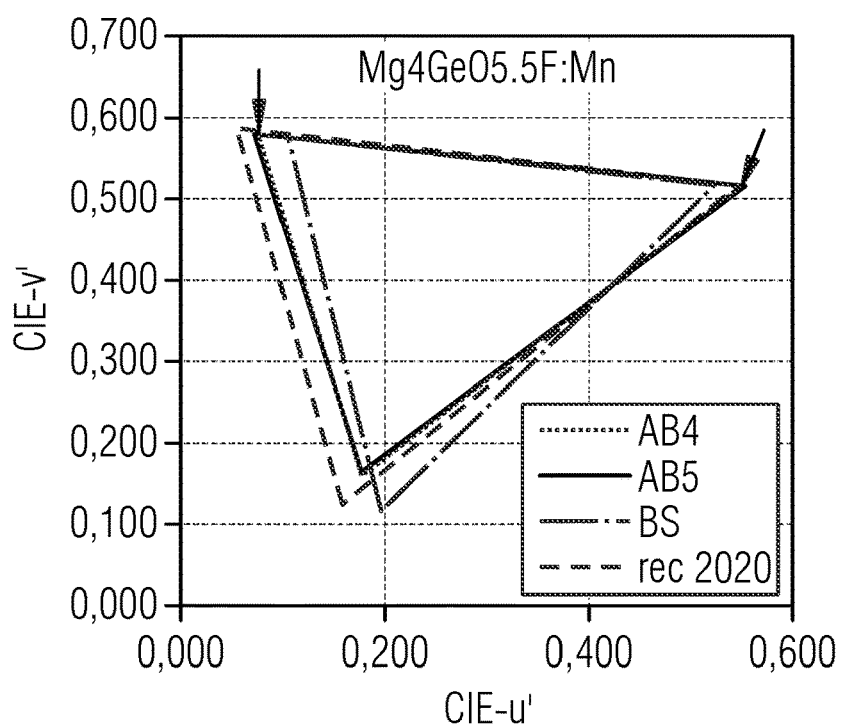
Figure 61:
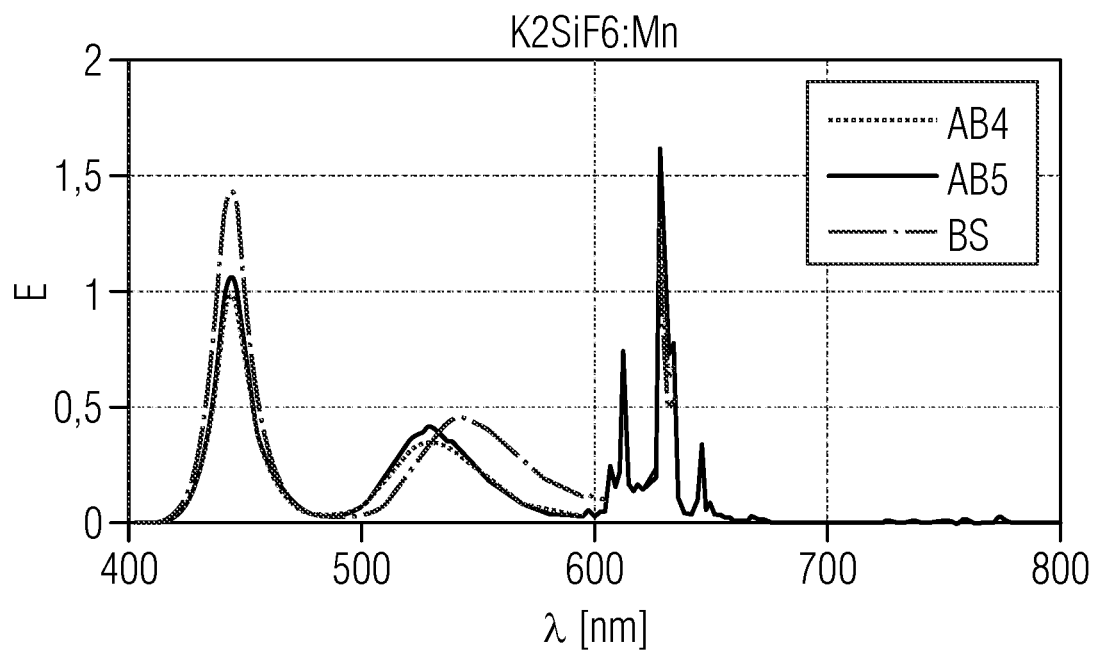
Figure 62:
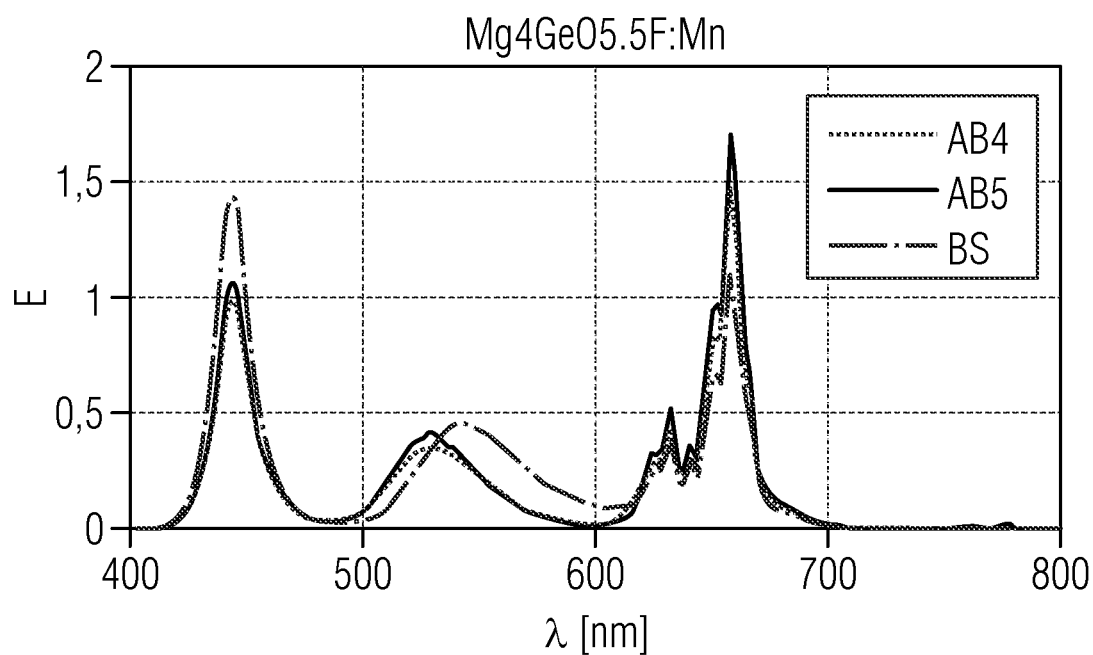

FIGS. 54A, 54B and 54C show a more comprehensive list of the data from FIG. 45, which additionally show the color loci of the filtered spectra and coverages with other standard color spaces.

FIGS. 55 to 58 show the spanned color spaces of various examples of the combinations illustrated in FIG. 45 with a wavelength of the primary radiation λdom=448 nm. Each FIG. shows a comparison of three different green phosphors (AB4, AB5 or BS) in each case combined with a red phosphor, which is indicated with its molecular formula in the figures. The color spaces spanned by the filtered spectra with the exemplary embodiments according to the present disclosure AB4 and AB5 are almost congruent. It is evident that a greater bandwidth of colors can be rendered with the exemplary embodiments AB4 and AB5 of the phosphor according to the present disclosure, primarily in the green and red corners of the spanned color triangle (marked by arrows). A similar behavior is also obtained with the exemplary embodiments AB7, AB13 and AB8 (not illustrated). This is assigned to the very narrowband emission of the phosphors according to the present disclosure AB4 and AB5, AB7, AB13 and AB8. The bandwidth of green colors is thus increased by the use of the phosphors according to the present disclosure AB4, AB5, AB7, AB13 and AB8 in comparison with conventional phosphors. The narrow full width at half maximum of the phosphors according to the present disclosure additionally reduces the radiation loss that arises as a result of the filtering. In comparison with the known phosphor β-SiAlON (BS), the phosphors according to the present disclosure can be produced on the basis of inexpensive starting materials and moreover the synthesis is carried out at moderate temperatures. This keeps the production costs low, which makes the phosphors also economically highly attractive for the production of mass-produced products such as LCD televisions, computer monitors or displays for smartphones or tablets.

FIGS. 59 to 62 show the corresponding conversion LED spectra of the examples of FIGS. 55 to 58. The red phosphor is indicated together with its molecular formula in the figures.

Figure 63:
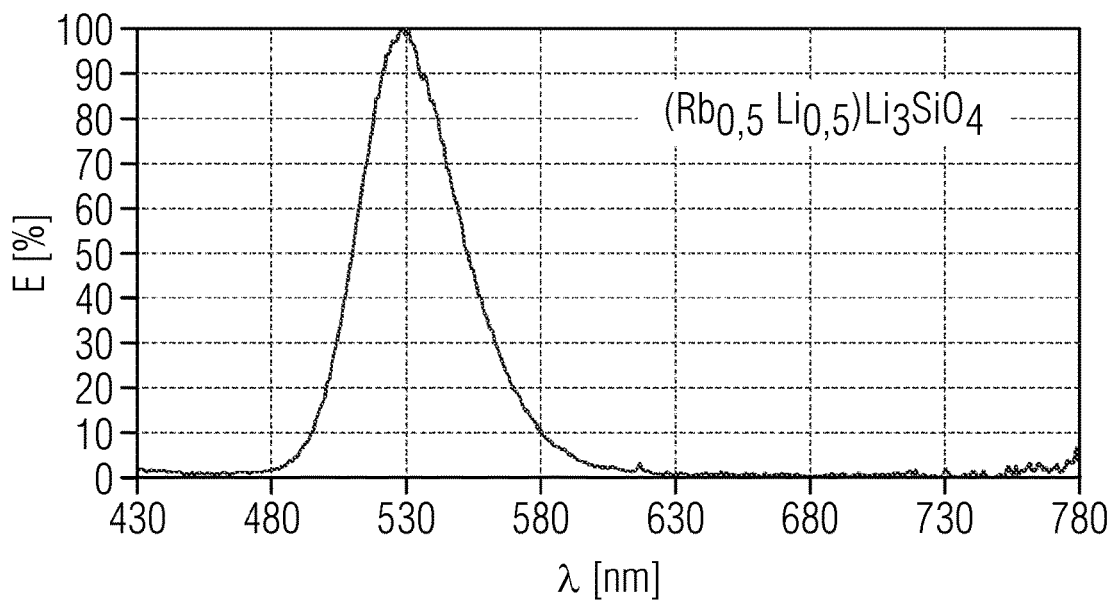

FIG. 63 illustrates the emission spectrum of the fifth exemplary embodiment AB5 of the phosphor according to the present disclosure having the molecular formula $(Rb_{0.5}Li_{0.5})Li_3SiO_4$. The wavelength in nm is plotted on the x-axis and the emission intensity in % is plotted on the y-axis. For measuring the emission spectrum, the phosphor according to the present disclosure was excited with light having a wavelength of 400 nm. The phosphor has a full width at half maximum of 43 nm and a peak wavelength of 528 mm and a dominant wavelength of 539 nm. The coordinates CIE-x and CIE-y are at 0.238 and 0.694. The phosphor thus proves to be very suitable for backlighting applications that have to have a saturated green hue.

Figure 64:
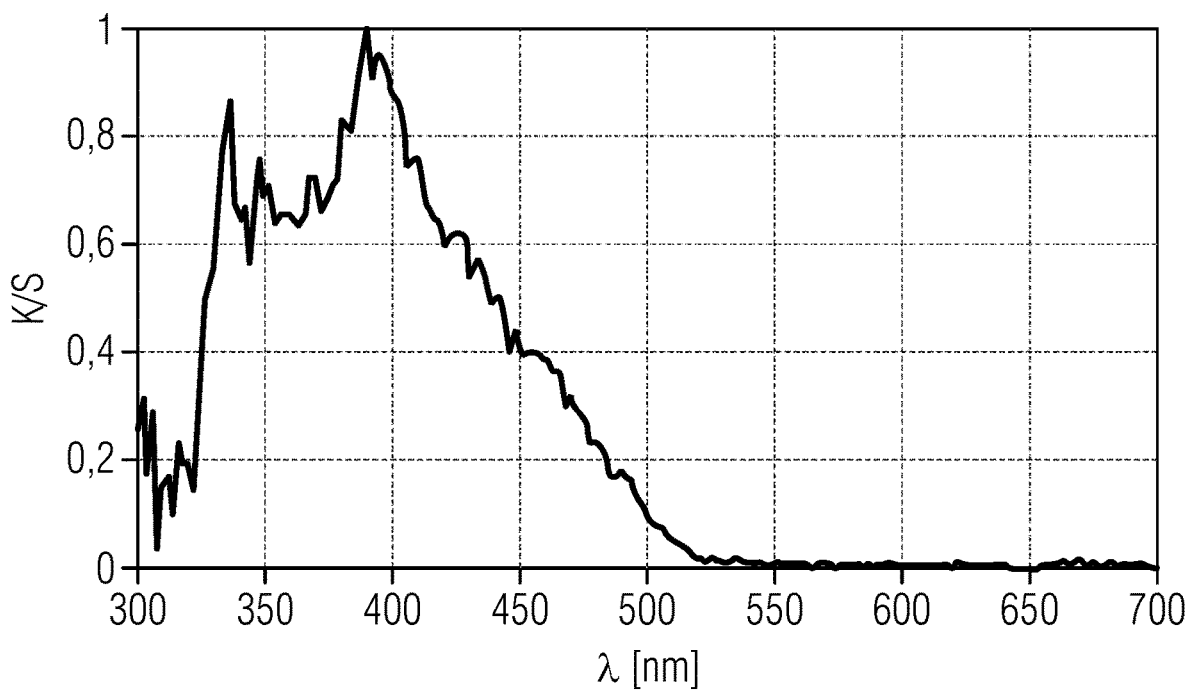

FIG. 64 shows a standardized Kubelka-Munk function (K/S), plotted against the wavelength λ in nm, for the fifth exemplary embodiment of the phosphor according to the present disclosure. The maximum of K/S for the fifth exemplary embodiment of the phosphor according to the present disclosure is approximately 400 nm, although the range of high absorption extends into the blue-green spectral range up to approximately 500 nm. Therefore, the phosphor can be efficiently excited with a primary radiation having a wavelength of between 330 and 500 nm, advantageously 340 and 460 nm, particularly advantageously 350 to 450 nm.

Figures 65, 66:
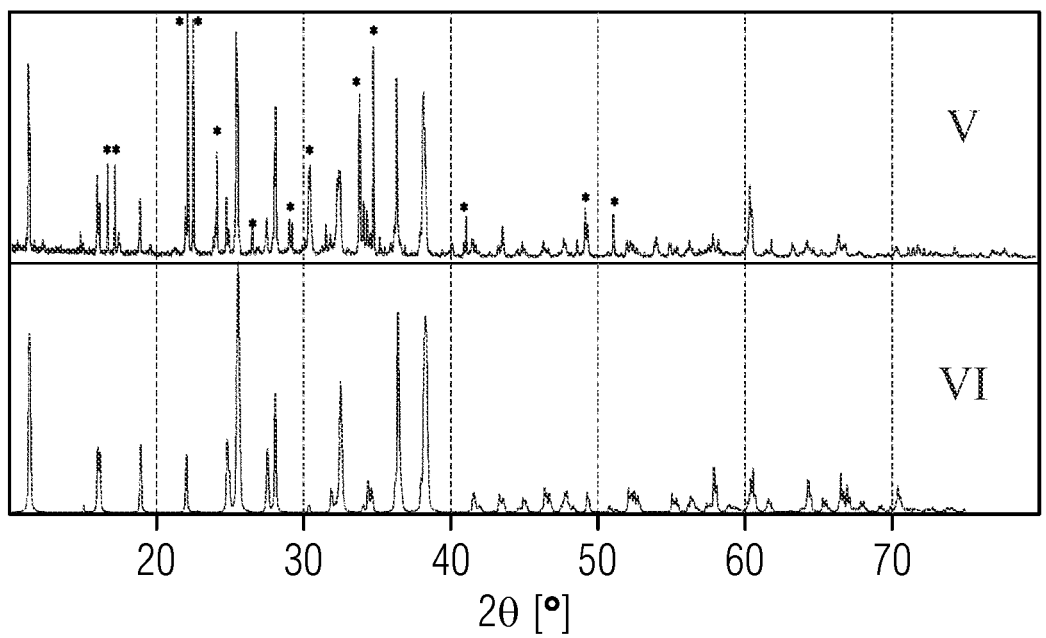

FIG. 65 shows the X-ray powder diffractogram of the fifth exemplary embodiment AB5 of the phosphor according to the present disclosure with the reference sign V. The X-ray powder diffractogram provided with the reference sign VI shows a simulated diffractogram of the compound RbLi $(Li_3SiO_4)_2$ (K. Bernet, R. Hoppe, Ein "Lithosilicat" mit Kolumnareinheiten: $RbLi_5\{Li[SiO_4]\}_2$ [A "lithosilicate" having columnar units: $RbLi_5\{Li[SiO_4]\}_2$], Z. Anorg. Allg. Chem., 1991, 592, 93-105). Peaks in the X-ray powder diffractogram V which can be assigned to the secondary phase $Li_4SiO_4$ are identified by asterisks.

FIG. 66 shows various optical properties of the fifth exemplary embodiment of the phosphor according to the present disclosure AB5 in comparison with conventional phosphors G1 and OS1. In this case, OS1 stands for a phosphor of the formula $(Sr,Ba)_2SiO_4:Eu$ and G1 stands for a phosphor of the formula $Lu_3(Al,Ga)_5O_{12}:Ce$. In comparison with the phosphors G2 and OS2, the phosphors G1 and OS1 have a different Eu and Ce content, respectively, in order in each case to obtain the same dominant wavelength as the exemplary embodiment AB5. All three phosphors exhibit a similar dominant wavelength. In this case, however, the phosphor according to the present disclosure AB5 exhibits a significantly higher luminous efficiency (LER) and a significantly higher color purity. This leads to an improved color saturation, whereby a higher color space coverage can be achieved, and to an improved overall efficiency. The reason for the improved properties is the full width at half maximum of the fourth exemplary embodiment AB5 having the formula $(Rb_{0.5}Li_{0.5})Li_3SiO_4$ of the phosphor according to the present disclosure in comparison with the conventional phosphors. The high luminous efficiency increases the efficiency of green conversion LEDs having partial or full conversion in comparison with green conversion LEDs comprising known green phosphors having a comparable peak wavelength.

Figure 67:
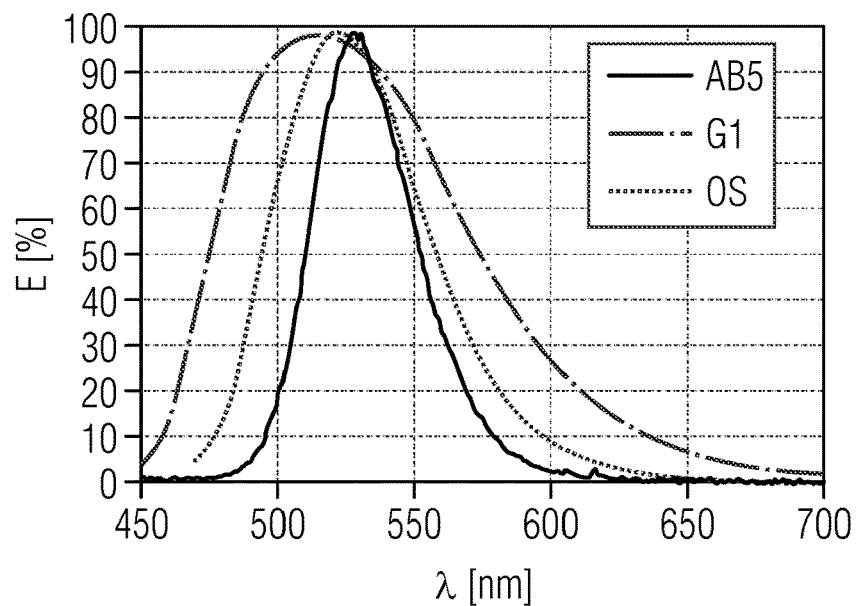

FIG. 67 shows a comparison of the emission spectra of the fifth exemplary embodiment AB5 of the phosphor according to the present disclosure in comparison with the conventional phosphors G1 and OS1 described under FIG. 66.

Figure 68:
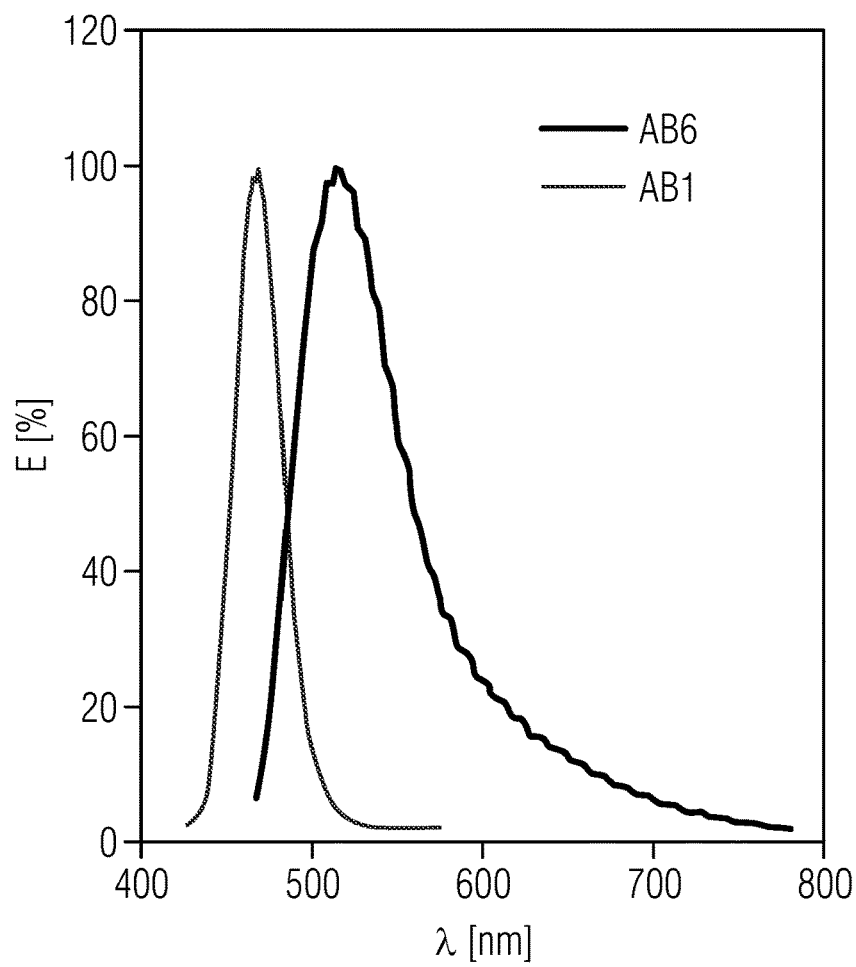

FIG. 68 illustrates the emission spectrum of the first exemplary embodiment AB1 having the molecular formula $NaLi_3SiO_4$:Eu and of the sixth exemplary embodiment AB6 having the molecular formula $Na_{0.97}Ca_{0.03}Li_{2.94}Al_{0.09}Si_{0.97}O_{3.88}N_{0.12}$:Eu. The wavelength in nanometers is plotted on the x-axis and the emission intensity in percent is plotted on the y-axis. For measuring the emission spectrum, the phosphors according to the present disclosure were excited with primary radiation having a wavelength of 400 nm (AB1) and 460 nm (AB6). The phosphor AB1 has a full width at half maximum of 32 nm or 1477 cm$^{-1}$ and a dominant wavelength of 473 nm; the peak wavelength is approximately 469 nm. The phosphor AB6 has a full width at half maximum of 72.8 nm, a dominant wavelength of 548 nm; the peak wavelength is approximately 516.9 nm. The color locus of AB6 is at the following coordinates CIE-x=0.301 and CIE-y=0.282 in the CIE standard chromaticity diagram from 1931. The luminous efficiency of AB6 is 432.8 lm/W. The different properties of AB1 and AB6, in particular the peak wavelength of $Na_{0.97}Ca_{0.03}Li_{2.94}Al_{0.09}Si_{0.97}O_{3.88}N_{0.12}$:Eu shifted into the longer-wavelength range in comparison with $NaLi_3SiO_4$:Eu, are due to a greater nephelauxetic effect of the nitrogen atoms surrounding the activator ions, here the Eu$^{2+}$ ions, in the mixed phase $Na_{0.97}Ca_{0.03}Li_{2.94}Al_{0.09}Si_{0.97}O_{3.88}N_{0.12}$:Eu. The higher the proportion of nitrogen in the vicinity of the activator ions, the longer the peak wavelength. As a result, with an increasing nitrogen content and thus with a rising value for y* in the phosphor $Na_{1-y*}Ca_{y*}Li_{3-2y*}Al_{3y*}Si_{1-y}O_{4-4y*}N_{4y*}$:Eu, the peak wavelength can be shifted within the visible range of the electromagnetic spectrum, in particular in a range of between 470 nm and 670 nm. The phosphor is thus suitable in particular for lighting devices or conversion LEDs in which phosphors having very specific properties are required (so-called "color on demand" applications).

Figures 69, 70:
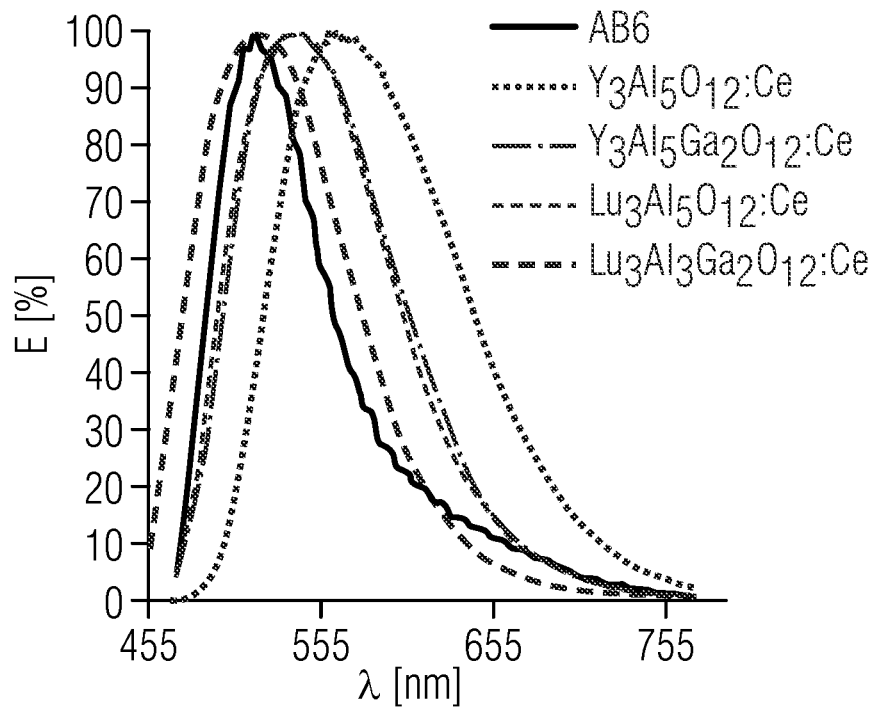

FIG. 69 shows the emission spectra of AB6 (excitation wavelength 460 nm) and four garnet phosphors as comparative examples (excitation wavelength in each case 460 nm; 440 nm in the case of $Y_3Al_3Ga_2O_{12}$:Ce). In comparison with the known garnet phosphors $Y_3Al_5O_{12}$:Ce, $Y_3Al_3Ga_2O_{12}$:Ce and $Lu_3Al_5O_{12}$:Ce, the exemplary embodiment according to the present disclosure AB6 has a peak wavelength shifted to shorter wavelengths and a smaller full width at half maximum. A similar peak wavelength to AB6 is exhibited by $Lu_3Al_3Ga_2O_{12}$:Ce. In comparison with the garnet phosphors $Y_3Al_5O_{12}$:Ce, $Y_3Al_3Ga_2O_{12}$:Ce and $Lu_3Al_5O_{12}$:Ce, the peak wavelength of AB6 and $Lu_3Al_3Ga_2O_{12}$:Ce lies nearer to the blue spectral range, in which in conventional conversion LEDs a spectral gap may disadvantageously be found, in which no or only very little light is emitted. Said spectral gap results in poor color rendering. Therefore, $Lu_3Al_3Ga_2O_{12}$:Ce is often used to reduce the spectral gap. In comparison with $Lu_3Al_3Ga_2O_{12}$:Ce, however, the sixth exemplary embodiment $Na_{0.97}Ca_{0.03}Li_{2.94}Al_{0.09}Si_{0.97}O_{3.88}N_{0.12}$:Eu has a significantly smaller full width at half maximum and, owing to the smaller full width at half maximum, a greater color purity. An additional factor is that the exemplary embodiment according to the present disclosure AB6 has a higher overlap with the eye sensitivity curve, thus resulting in a higher luminous efficiency. A comparison of the optical data is shown in FIG. 70. The percentages indicated between parentheses reflect the changes in the values in comparison with $Lu_3Al_3Ga_2O_{12}$:Ce. The conversion of the UV or blue primary radiation into a secondary radiation having a wavelength in the green range of the electromagnetic spectrum (peak wavelength of 516.9 nm) increases the efficiency of a conversion LED. In comparison with the primary radiation, the peak wavelength of the secondary radiation is nearer to the eye sensitivity maximum at 555 nm, as a result of which the emitted radiation has a higher overlap with the eye sensitivity curve and is thus perceived as brighter. Conversion LEDs comprising the phosphor in particular in combination with a green and red phosphor are suitable in particular for white conversion LEDs, for example for general lighting. In particular, a white overall radiation having a high color temperature can be generated.

Figure 71:
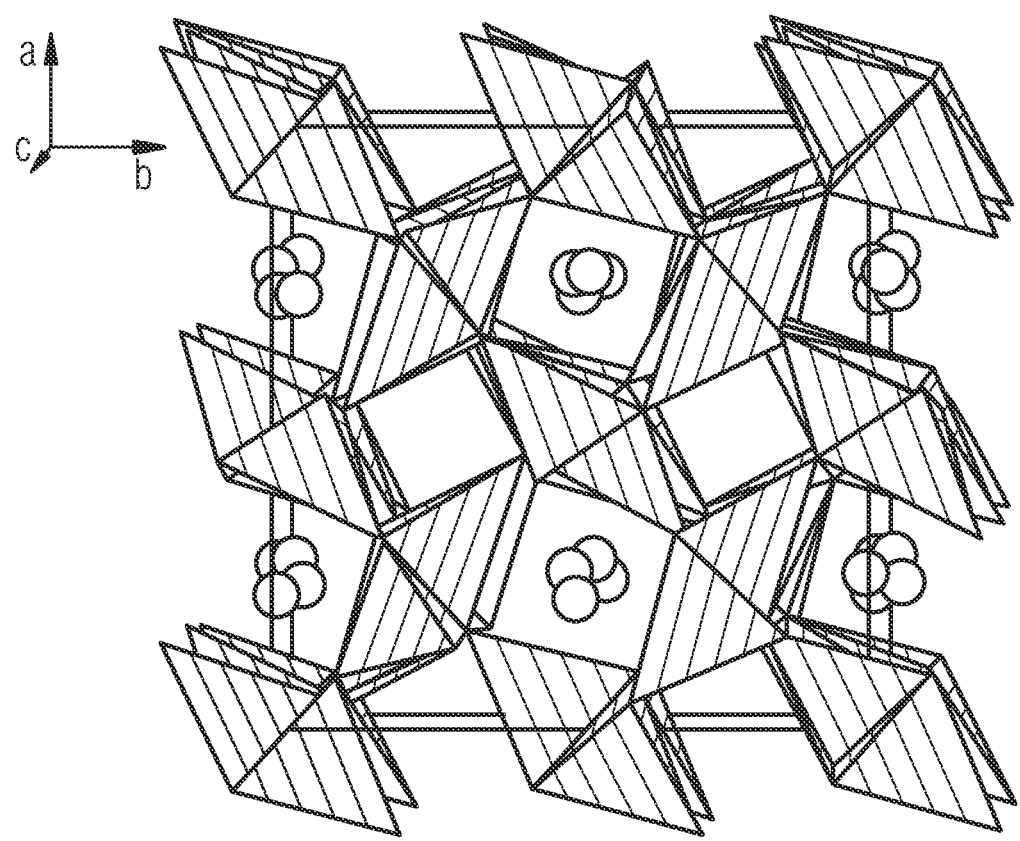

FIG. 71 shows the tetragonal crystal structure of the phosphor $Na_{0.97}Ca_{0.03}Li_{2.94}Al_{0.09}Si_{0.97}O_{3.88}N_{0.12}$:Eu in a schematic illustration along the crystallographic c-axis. The structure was determined by X-ray analysis of a single crystal of the phosphor. The hatched circles represent the mixed occupied positions for the Na and Ca atoms. The hatched regions represent the mixed occupied Li/Si/Al-O/N tetrahedra. The crystal structure corresponds to the crystal structure of $NaLi_3SiO_4$:Eu (see FIG. 8). The crystal structure is isotypic with respect to that of $CaLiAl_3N_4$:Eu, described in P. Pust, A. S. Wochnik, E. Baumann, P. J. Schmidt, D. Wiechert, C. Scheu, W. Schnick, Ca[LiAl$_3$N$_4$]:Eu$^{2+}$—A Narrow-Band Red-Emitting Nitridolithoaluminate, *Chemistry of Materials* 2014 26, 3544-3549.

FIG. 72 shows crystallographic data of $Na_{0.97}Ca_{0.03}Li_{2.94}Al_{0.09}Si_{0.97}O_{3.88}N_{0.12}$:Eu.

FIG. 73 shows atomic positions in the structure of $Na_{0.97}Ca_{0.03}Li_{2.94}Al_{0.09}Si_{0.97}O_{3.88}N_{0.12}$:Eu.

Figure 74:
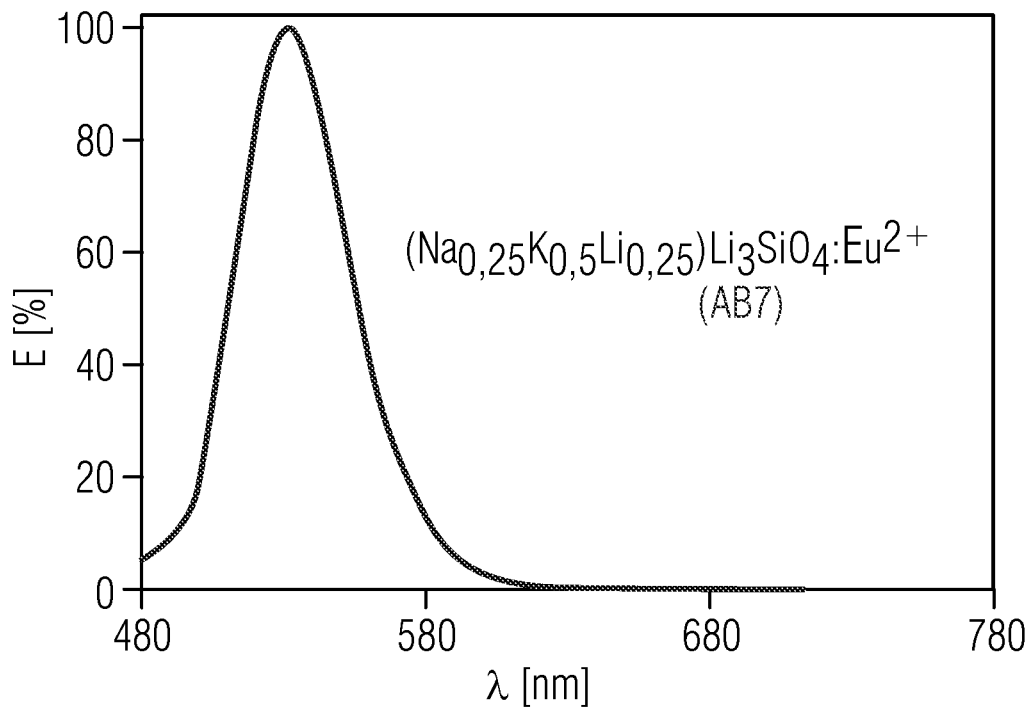

FIG. 74 illustrates the emission spectrum of the seventh exemplary embodiment AB7 of the phosphor according to the present disclosure having the molecular formula $(Na_{0.25}K_{0.5}Li_{0.25})Li_3SiO_4$:Eu$^{2+}$. For measuring the emission spectrum, a single crystal of the phosphor according to the present disclosure was excited with a primary radiation having a wavelength of 460 nm. The phosphor has a full width at half maximum of less than 50 nm, a peak wavelength of 532 nm, a dominant wavelength of 540.3 nm and a color locus in the CIE color space having the coordinates CIE-x: 0.235 and CIE-y: 0.640. The narrow full width at half maximum of the phosphor leads to a saturated green emission of the phosphor. The phosphor $(K_{1-r''-r'''}Na_{r''}Li_{r'''})_1(TA)_3(TD)_1(XB)_4$:E or $(K_{1-r''-r'''}Na_{r''}Li_{r'''})_1Li_3SiO_4$:E where $0<r''<0.5$ and $0<r'''<0.5$, in particular $(Na_{0.25}K_{0.5}Li_{0.25})Li_3SiO_4$:Eu$^{2+}$, is therefore particularly attractive for its use in a conversion LED in which a narrowband emission in the green spectral range is required, such as for the backlighting of LCD displays.

Figure 75:
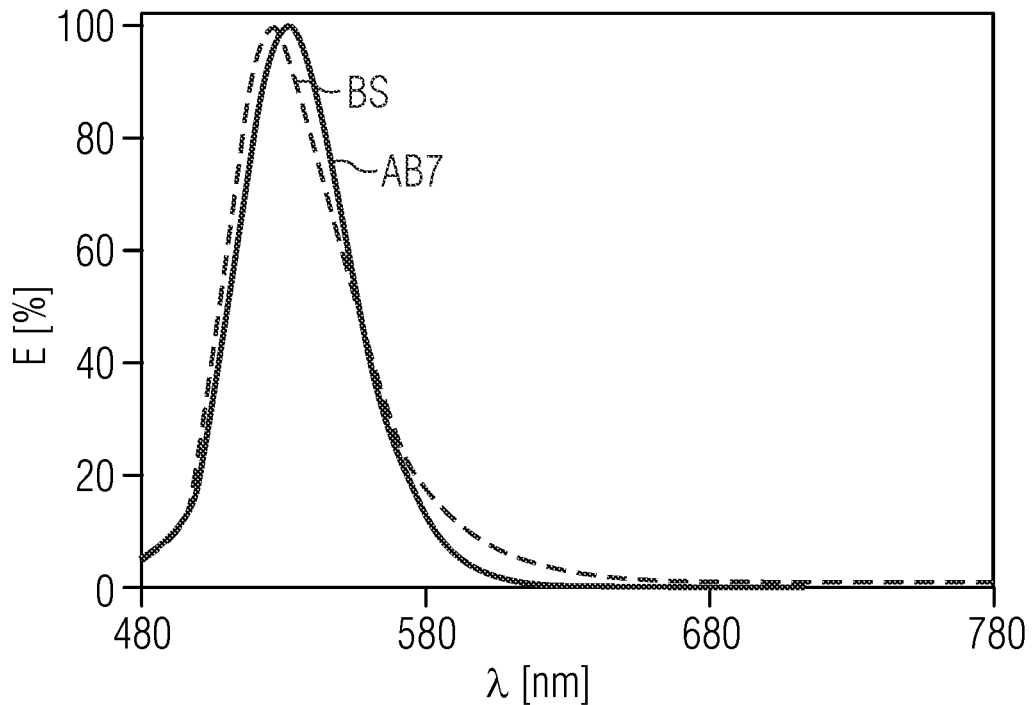

FIG. 75 shows the emission spectra of AB7 and a β-SiAlON:Eu (BS) as comparative example. The phosphors have comparable peak and dominant wavelengths and color purities, although AB7 exhibits a smaller full width at half maximum and, associated therewith, a greater luminous efficiency and higher color purity. This leads to an improved color saturation, as a result of which it is possible to achieve a higher color space coverage, and to an improved overall efficiency. The reason for the improved properties is the small full width at half maximum of the seventh exemplary embodiment AB7 having the formula $(Na_{0.25}K_{0.50}Li_{0.25})Li_3SiO_4:Eu^{2+}$ of the phosphor according to the present disclosure in comparison with the known phosphor BS. The high luminous efficiency increases the efficiency of green conversion LEDs having partial or full conversion in comparison with green conversion LEDs comprising known green phosphors having a comparable dominant and/or peak wavelength.

Figures 76, 77:
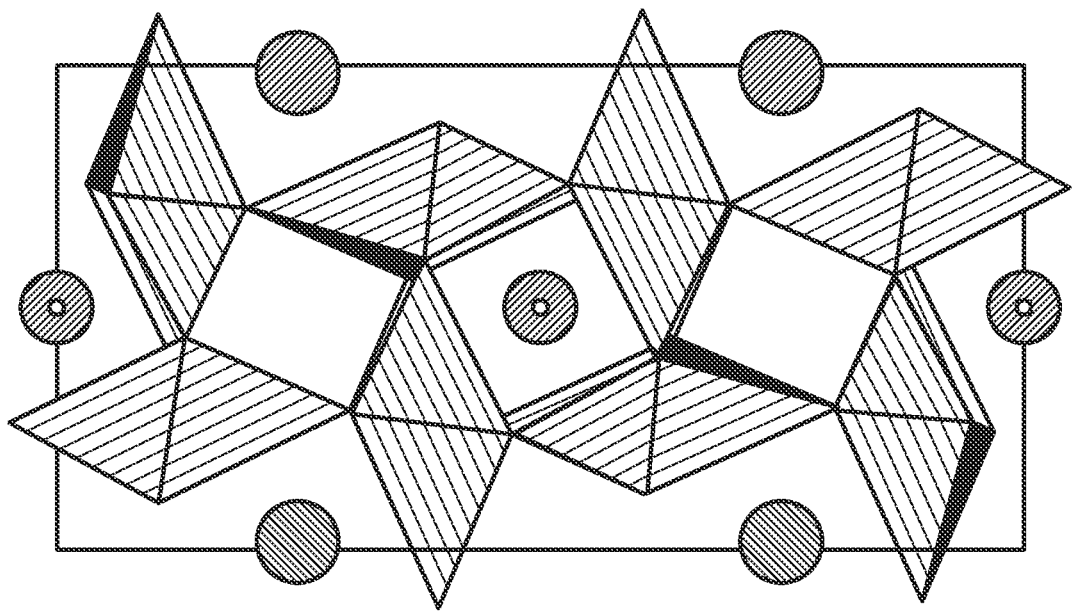

The optical data of the phosphors AB7 and BS are shown in FIG. 76. The phosphor $K_{1-r''-r'''}Na_{r''}Li_{r'''})_1(TA)_3(TD)_1(XB)_4:E$ or $(K_{1-r''-r'''}Na_{r''}Li_{r'''})_1Li_3SiO_4:E$ where $0 < r'' < 0.5$ and $0 < r''' < 0.5$, in particular $(Na_{0.25}K_{0.5}Li_{0.25})Li_3SiO_4:Eu^{2+}$, thus proves to be very suitable for applications in which a saturated green hue is desired, as in backlighting applications.

FIG. 77 shows the monoclinic crystal structure of the phosphor $(Na_{0.25}K_{0.50}Li_{0.25})Li_3SiO_4:Eu^{2+}$ in a schematic illustration along the crystallographic b-axis. The black circles represent Na atoms, the hatched circles represent K atoms and the circles enclosing white areas represent the Li atoms. The phosphor AB7 crystallizes in the same space group, C2/m, as the fifth exemplary embodiment $(Rb_{0.5}Li_{0.5})Li_3SiO_4:Eu^{2+}$ with comparable lattice parameters. The crystal structures of the phosphors $(Na_{0.25}K_{0.50}Li_{0.25})Li_3SiO_4:Eu$ and $(Rb_{0.5}Li_{0.5})Li_3SiO_4:Eu^{2+}$ have identical $(Li_3SiO_4)$ structural units. The occupation of the channels within these structural units is different in this case, however. $(Rb_{0.5}Li_{0.5})Li_3SiO_4:Eu^{2+}$ contains two types of channels, wherein one channel is occupied only by Rb and the other is occupied only by Li, while $(Na_{0.25}K_{0.50}Li_{0.25})Li_3SiO_4:Eu$ also contains two types of channels, wherein one channel is occupied only by K and the other channel is occupied only by Li and Na. The arrangement of Na and K in $(Na_{0.25}K_{0.50}Li_{0.25})Li_3SiO_4:Eu$ is similar to the arrangement in $CsKNaLi(Li_3SiO_4)_4$, as described in K. Bernet, R. Hoppe, Z. Anorg. Chem., 1991, 592, 93-105. The exact arrangement of Na and Li within a channel cannot be ascertained by means of X-ray diffraction. A statistical arrangement is taken as a basis in the present case. The crystal structure of AB7 is a crystal structure derived from the $UCr_4C_4$ structure type with a higher degree of ordering.

Figure 78:
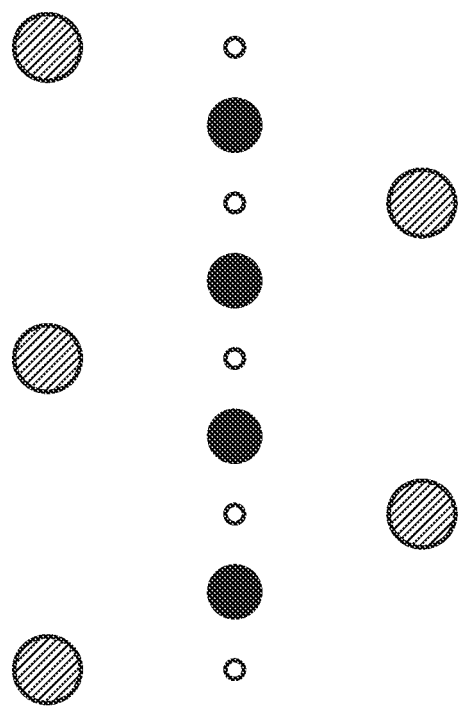

FIG. 78 shows the arrangement of Li, Na and K within the channels of the $(Li_3SiO_4)$ structural units for $(Na_{0.25}K_{0.50}Li_{0.25})Li_3SiO_4:Eu$. The black circles represent Na atoms, the hatched circles represent K atoms and the circles enclosing white areas represent the Li atoms. The arrangement is shown along the crystallographic c-axis.

FIG. 79 shows crystallographic data of $(Na_{0.25}K_{0.50}Li_{0.25})Li_3SiO_4:Eu$.

FIG. 80 shows atomic positions in the structure of $(Na_{0.25}K_{0.50}Li_{0.25})Li_3SiO_4:Eu$.

Figures 81, 82:
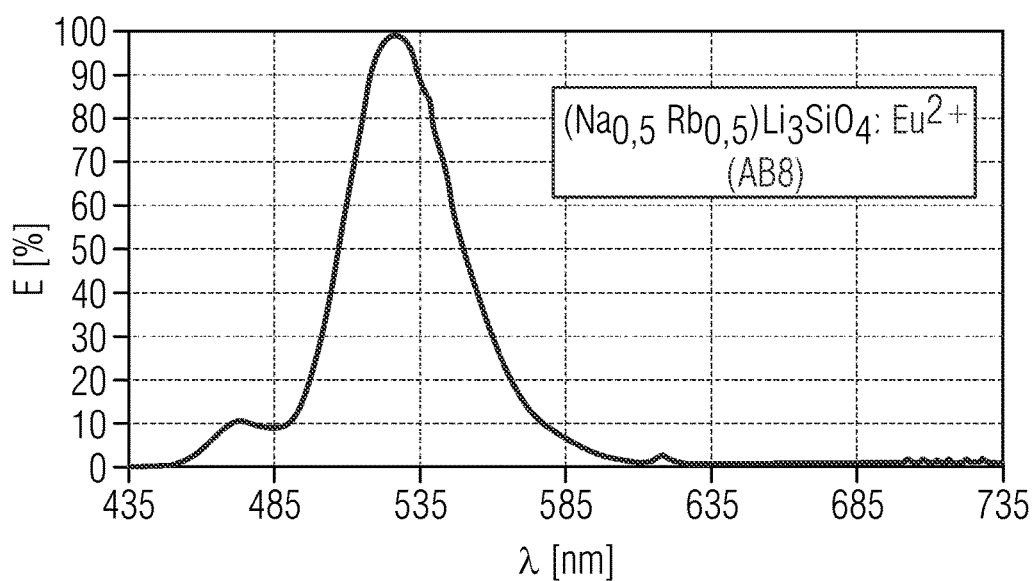

FIG. 81 shows anisotropic displacement parameters of $(Na_{0.25}K_{0.50}Li_{0.25})Li_3SiO_4:Eu$.

FIG. 82 illustrates the emission spectrum of the eighth exemplary embodiment AB8 of the phosphor according to the present disclosure having the molecular formula $(Na_{0.5}Rb_{0.5})Li_3SiO_4:Eu^{2+}$. The wavelength in nm is plotted on the x-axis and the emission intensity in percent is plotted on the y-axis. For measuring the emission spectrum, a powder of the phosphor according to the present disclosure was excited with a primary radiation having a wavelength of 400 nm. The phosphor has a peak wavelength of approximately 525 nm and a dominant wavelength of 531 nm. The full width at half maximum is less than 45 nm and the color locus in the CIE color space lies at the coordinates CIE-x: 0.211 and CIE-y: 0.671.

Figure 83:
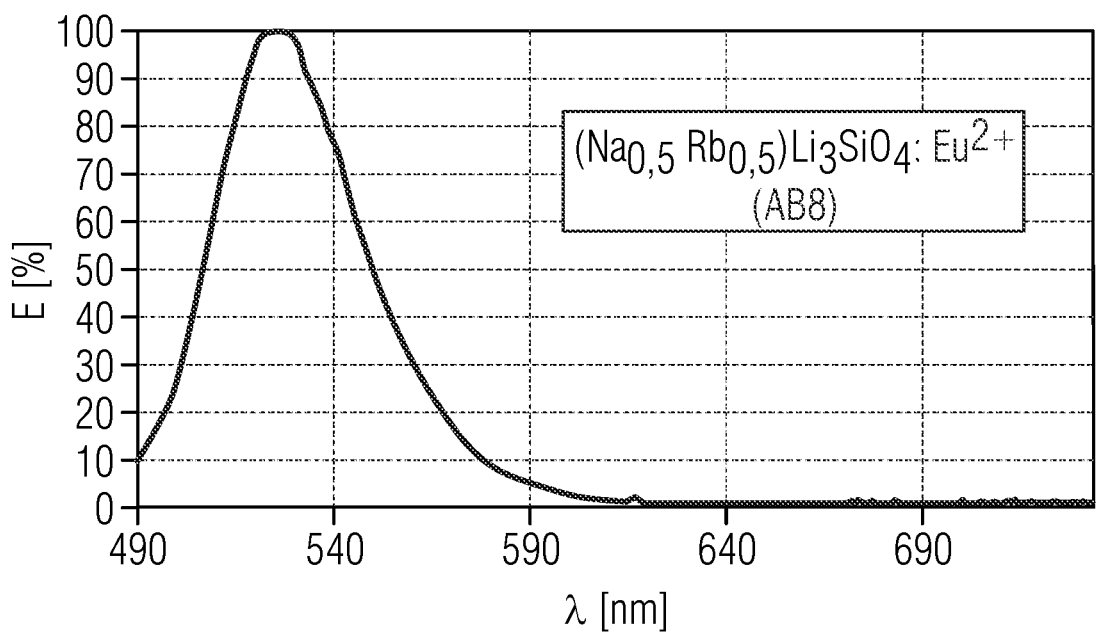

FIG. 83 illustrates the emission spectrum of the eighth exemplary embodiment AB8 of the phosphor according to the present disclosure having the molecular formula $(Na_{0.5}Rb_{0.5})Li_3SiO_4:Eu^{2+}$. For measuring the emission spectrum, a powder of the phosphor according to the present disclosure was excited with a primary radiation having a wavelength of 460 nm. The phosphor has a full width at half maximum of less than 45 nm, a peak wavelength of 528 nm, a dominant wavelength of 533 nm and a color locus in the CIE color space having the coordinates CIE-x: 0.212 and CIE-y: 0.686. The narrow full width at half maximum of the phosphor results in a saturated green emission of the phosphor. On account of the small full width at half maximum, the phosphor $(Rb_{r*}Na_{1-r*})_1(TA)_3(TD)_1(XB)_4:E$ or $Rb_{r*}Na_{1-r*})_1Li_3SiO_4:E$ where $0.4 \leq r^* < 1.0$, in particular $(Na_{0.5}Rb_{0.5})Li_3SiO_4:Eu^{2+}$, is particularly attractive for the use thereof in a conversion LED in which a narrowband emission in the green spectral range is required, as for the backlighting of LCD displays.

Figure 84:
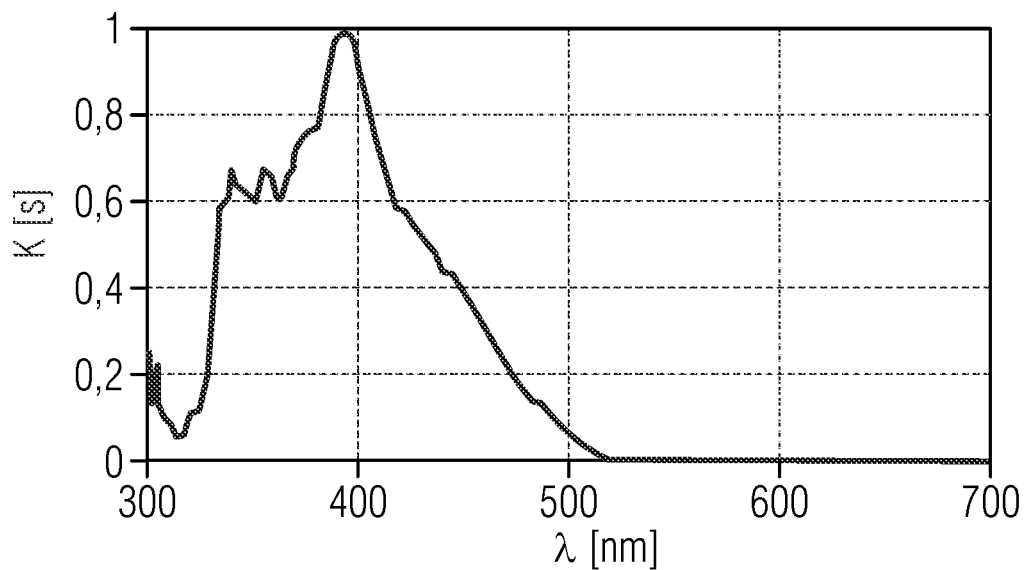

FIG. 84 shows a normalized Kubelka-Munk function (K/S), plotted against the wavelength λ in nm, for the eighth exemplary embodiment (AB8) of the phosphor according to the present disclosure. The phosphor according to the present disclosure can be efficiency excited with a primary radiation in the range of between 330 nm and 500 nm, advantageously 340 nm to 460 nm, particularly advantageously 350 nm to 450 nm. As a result, the phosphor is suitable in particular for backlighting applications, using a semiconductor chip with a primary radiation in the near UV range or blue range of the electromagnetic spectrum.

Figures 85, 86:
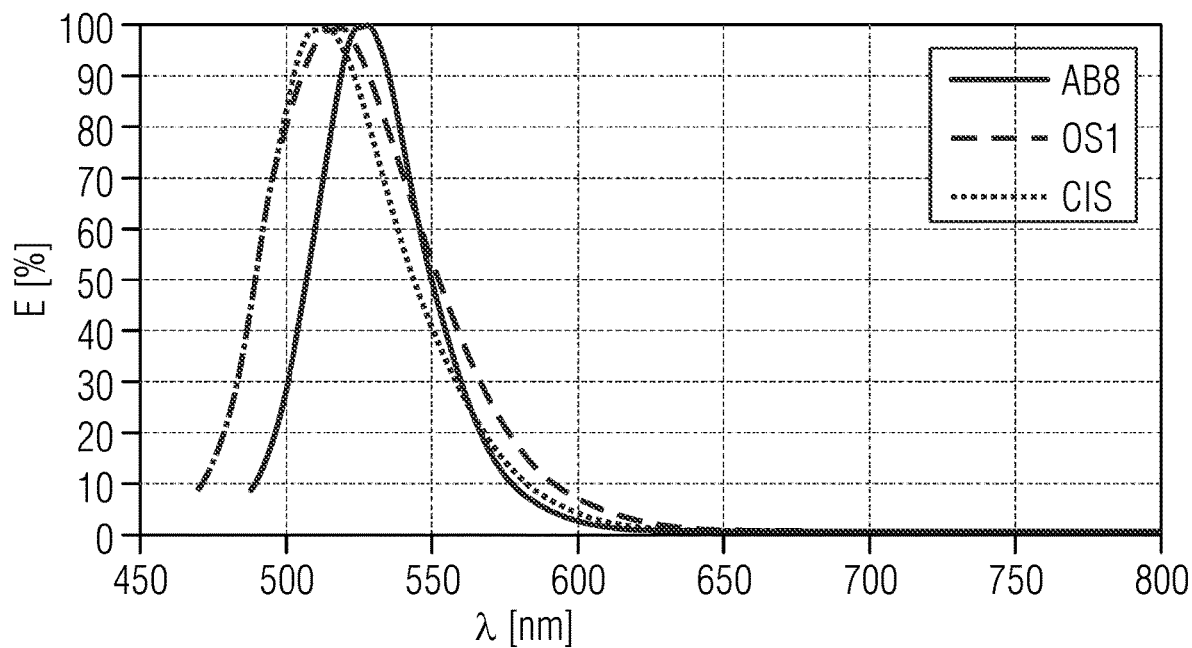

FIG. 85 shows a comparison of the emission spectra of the eighth exemplary embodiment AB8 of the phosphor according to the present disclosure in comparison with the conventional phosphors CIS and OS1 described under FIG. 86.

FIG. 86 shows various optical properties of the eighth exemplary embodiment of the phosphor according to the present disclosure AB8 in comparison with conventional phosphors ClS and OS1. In this case, OS1 stands for a phosphor of the formula $(Sr,Ba)_2SiO_4:Eu$, and ClS stands for $Ca_{7.8}Eu_{0.2}Mg(SiO_4)_4Cl_2$. All three phosphors exhibit a similar dominant wavelength. In this case, however, the phosphor AB8 according to the present disclosure exhibits a significantly higher luminous efficiency (LER). This leads to an improved color saturation, as a result of which it is possible to achieve a higher color space coverage, and to an improved overall efficiency. The reason for the improved properties is the small full width at half maximum of the eighth exemplary embodiment AB8 having the formula $(Na_{0.5}Rb_{0.5})Li_3SiO_4:Eu^{2+}$ of the phosphor according to the present disclosure in comparison with the conventional phosphors. The high luminous efficiency increases the efficiency of green conversion LEDs having partial or full conversion in comparison with green conversion LEDs comprising known green phosphors having a comparable dominant and/or peak wavelength.

Figure 87:
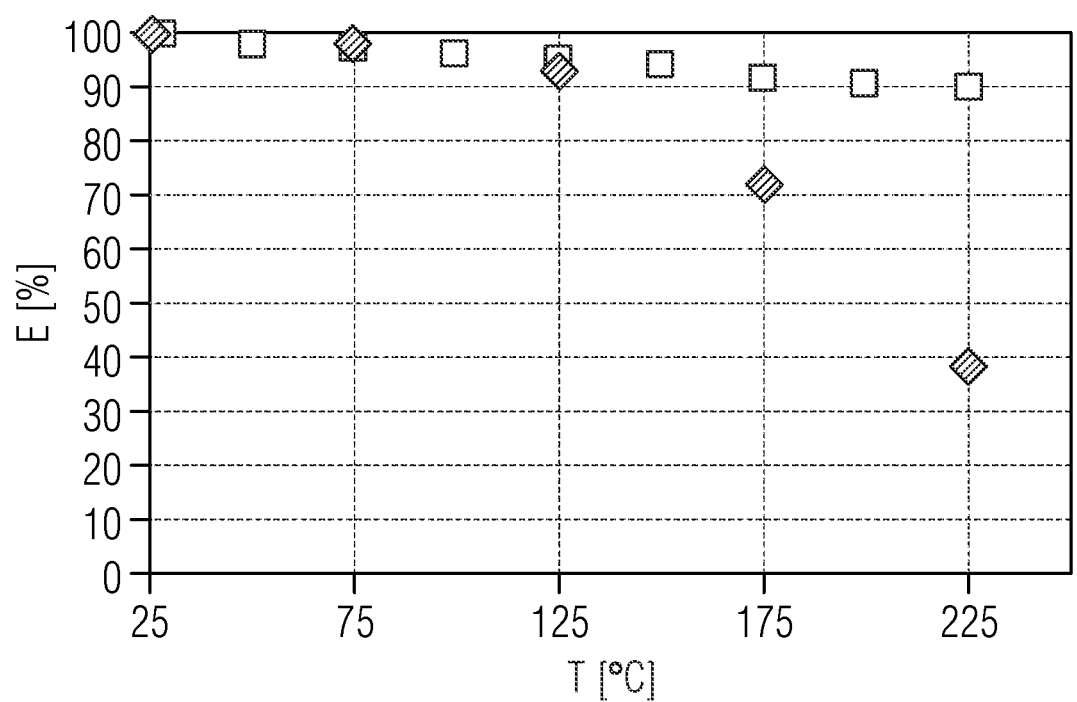

In FIG. 87, the relative brightness in % is plotted against the temperature in ° C. As is evident, the exemplary embodiment AB8 of the phosphor according to the present disclosure exhibits a high thermal stability. FIG. 87 shows the thermal quenching behavior of the phosphor according to the present disclosure AB8 (represented as open squares) in comparison with a conventional phosphor OS1 of the formula $(Sr,Ba)_2SiO_4:Eu$ (represented as filled rhombi). The phosphors were excited with a blue primary radiation having a wavelength of 400 nm for the phosphor according to the present disclosure AB8 and 460 nm for OS1 at various temperatures from 25 to 225° C. and their emission intensity was recorded in the process. It is clearly evident that the phosphor according to the present disclosure AB8 has a significantly smaller loss of emission intensity at typical temperatures that prevail in a conversion LED, in particular temperatures above 140° C. The phosphor can thus advantageously be used even at higher operating temperatures in conversion LEDs. Starting from 125° C., AB8 exhibits a significantly smaller loss of emission intensity in comparison with OS1. Moreover, AB8 at a temperature of 225° C. still exhibits an emission intensity of 90% in comparison with the emission intensity of 100% at 25° C. The emission intensity at 225° C. is more than twice as high as the emission intensity of OS1 at 225° C.

Figure 88:
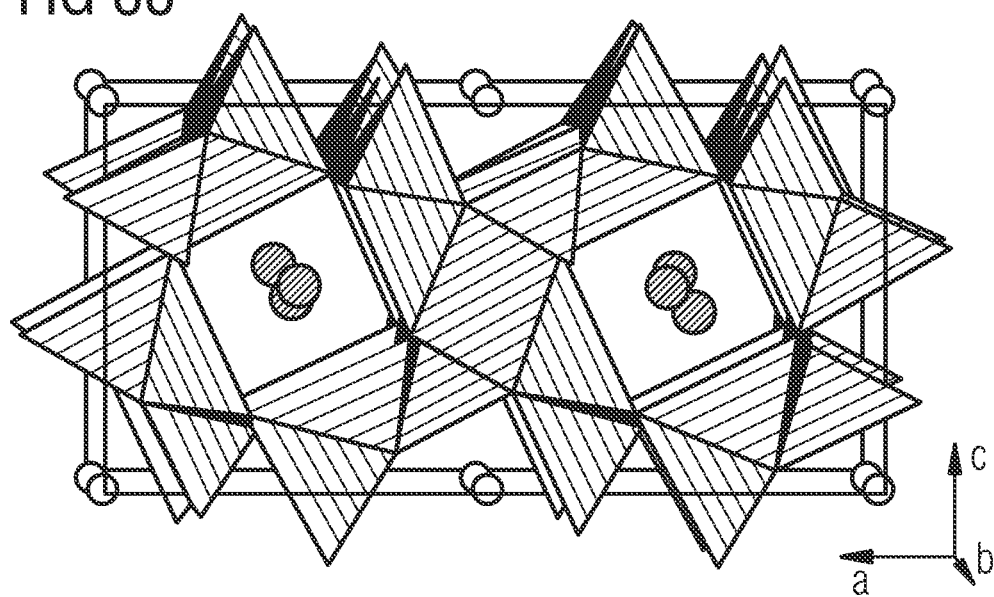

FIG. 88 shows the monoclinic crystal structure of the phosphor $(Na_{0.5}Rb_{0.5})$ $Li_3SiO_4:Eu^{2+}$ in a schematic illustration. The black circles represent Rb atoms and the circles enclosing white areas represent Na atoms. The phosphor AB8 crystallizes in the same space group, C2/m, as the fifth exemplary embodiment $(Rb_{0.5}Li_{0.5})$ $Li_3SiO_4:Eu^{2+}$ and the sixth exemplary embodiment $(Na_{0.25}K_{0.50}Li_{0.25})Li_3SiO_4:Eu$ with comparable lattice parameters. The crystal structures of the phosphors $(Na_{0.5}Rb_{0.5})Li_3SiO_4:Eu^{2+}$, $(Na_{0.25}K_{0.50}Li_{0.25})$ $Li_3SiO_4:Eu$ and $(Rb_{0.5}Li_{0.5})$ $Li_3SiO_4:Eu^{2+}$ have the same $(Li_3SiO_4)$ structural units. The $(Li_3SiO_4)$ structural units are $SiO_4$ and $LiO_4$ tetrahedra, wherein oxygen occupies the corners and Li and Si, respectively, occupy the center of the tetrahedron. The occupation of the channels within these structural units is different in this case, however. $(Rb_{0.5}Li_{0.5})$ $Li_3SiO_4:Eu^{2+}$ contains two types of channels, wherein one channel is occupied only by Rb and the other is occupied only by Li, $(Na_{0.25}K_{0.50}Li_{0.25})$ $Li_3SiO_4:Eu$ also contains two types of channels, wherein one channel is occupied only by K and the other channel is occupied only by Li and Na, and $(Rb_{0.5}Na_{0.s})$ $Li_3SiO_4:Eu^{2+}$ contains two types of channels, wherein one channel is occupied only by Rb and the other channel is occupied only by Na.

Figure 89:
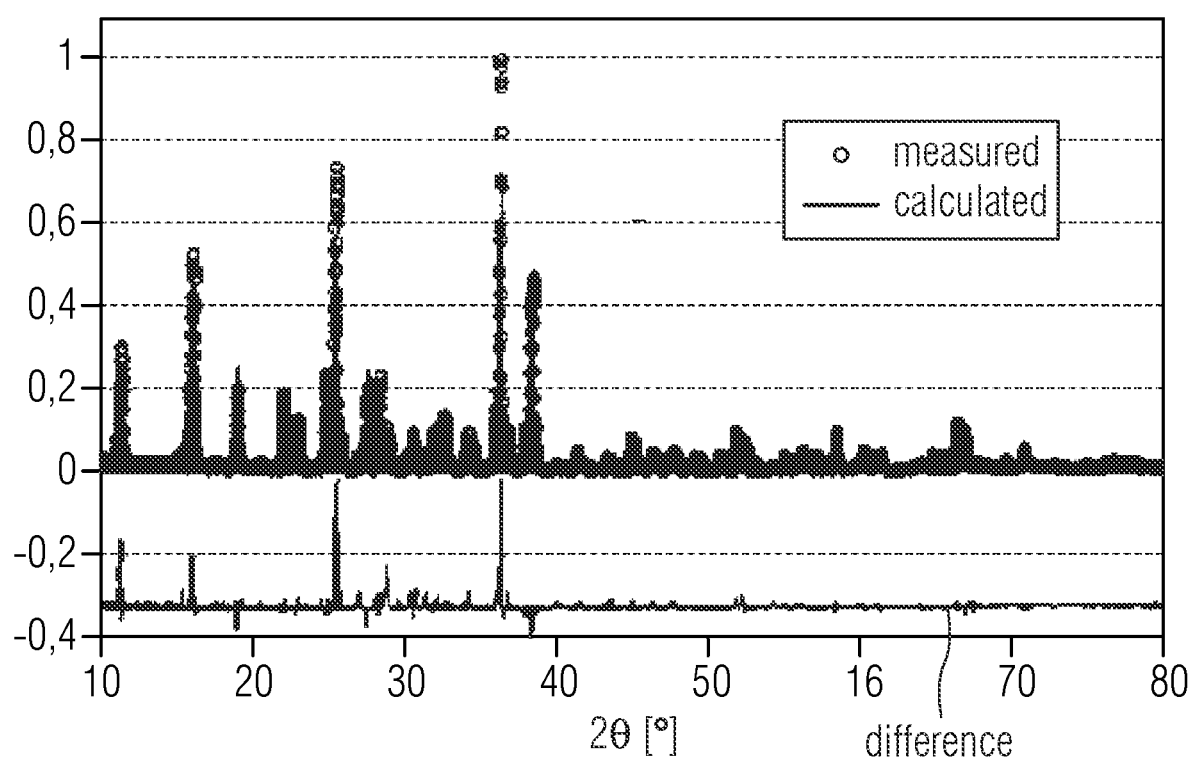

A crystallographic evaluation is found in FIG. 89. FIG. 89 shows a Rietveld refinement of the X-ray powder diffractogram of the eighth exemplary embodiment AB8. The diagram illustrates the superimposition of the measured reflections with the calculated reflections for $(Na_{0.5}Rb_{0.5})$ $Li_3SiO_4:Eu$, and also the differences between the measured and calculated reflections. The phosphor is contaminated with a small proportion of $Na_3RbLi_{12}Si_4O_{16}$.

FIG. 90 shows crystallographic data of $(Na_{0.5}Rb_{0.5})$ $Li_3SiO_4:Eu$.

FIG. 91 shows atomic positions in the structure of $(Na_{0.5}Rb_{0.5})$ $Li_3SiO_4:Eu$.

Figure 92:
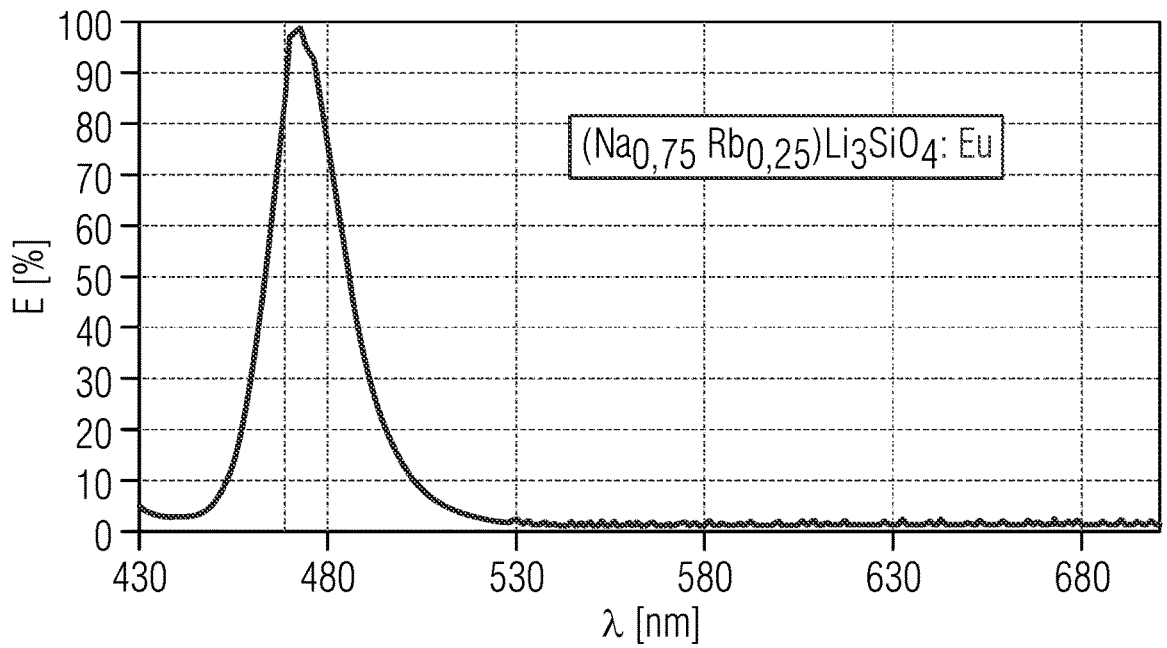

FIG. 92 illustrates the emission spectrum of the ninth exemplary embodiment AB9 of the phosphor according to the present disclosure having the molecular formula $(Rb_{0.25}Na_{0.75})$ $Li_3SiO_4:Eu$. The wavelength in nm is plotted on the x-axis and the emission intensity in % is plotted on the y-axis. For measuring the emission spectrum, a powder of the phosphor according to the present disclosure was excited with a primary radiation having a wavelength of 400 nm. The phosphor has a peak wavelength of approximately 473 nm and a dominant wavelength of 476 nm. The full width at half maximum is at 22 nm and the color locus in the CIE color space is at the coordinates CIE-x: 0.127 and CIE-y: 0.120.

Figure 93:
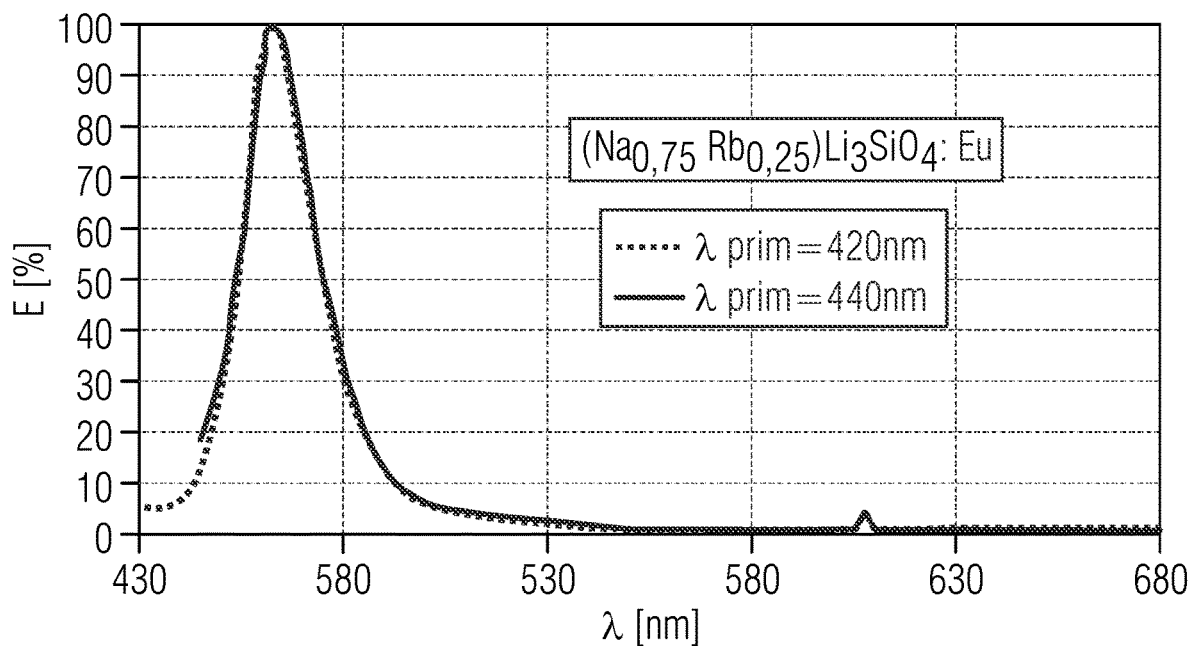

FIG. 93 illustrates the emission spectrum of the ninth exemplary embodiment AB9 of the phosphor according to the present disclosure having the molecular formula $(Na_{0.75}Rb_{0.25})Li_3SiO_4:Eu^{2+}$. For measuring the emission spectrum, a powder of the phosphor according to the present disclosure was excited with a primary radiation having a wavelength of 420 nm and 440 nm. In comparison with the excitation with a primary radiation of 400 nm as shown in FIG. 92, the phosphor has an even smaller full width at half maximum of between 19 nm and 21 nm. $(Na_{0.75}Rb_{0.25})$ $Li_3SiO_4:Eu^{2+}$ and $(Na_{0.5}K_{0.5})$ $Li_3SiO_4:Eu^{2+}$ belong to the most narrowband $Eu^{2+}$-doped phosphors known.

Figure 94:
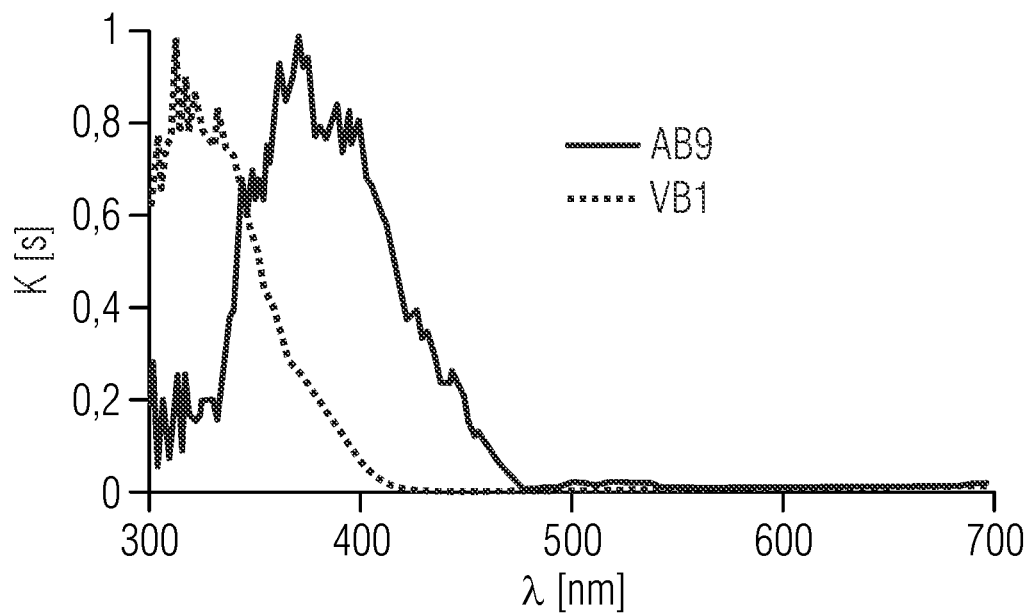

FIG. 94 shows a normalized Kubelka-Munk function (K/S), plotted against the wavelength $\lambda$ in nm, for the ninth exemplary embodiment (AB9) of the phosphor according to the present disclosure, and of $BaMgAl_{10}O_{17}:Eu$ (50 mol %) (VB1) as comparative example. The phosphor according to the present disclosure can be efficiently excited with a primary radiation in the range of between 340 nm and 470 nm, advantageously 340 nm to 450 nm, particularly advantageously 340 nm to 420 nm. As a result, the phosphor $(Rb_{r*}Na_{1-r*})_1(TA)_3(TD)_1(XB)_4:E$ or $Rb_{r*}Na_{1-r*})$ $Li_3SiO_4:E$ where $0<r*<0.4$, in particular $(Na_{0.75}Rb_{0.25})$ $Li_3SiO_4:Eu^{2+}$, is suitable in particular for backlighting applications, using a semiconductor chip with a primary radiation in the near UV range or blue range of the electromagnetic spectrum. As is evident, in comparison with VB1, AB9 is able to be efficiently excited even in the blue range of the electromagnetic spectrum.

Figure 95:
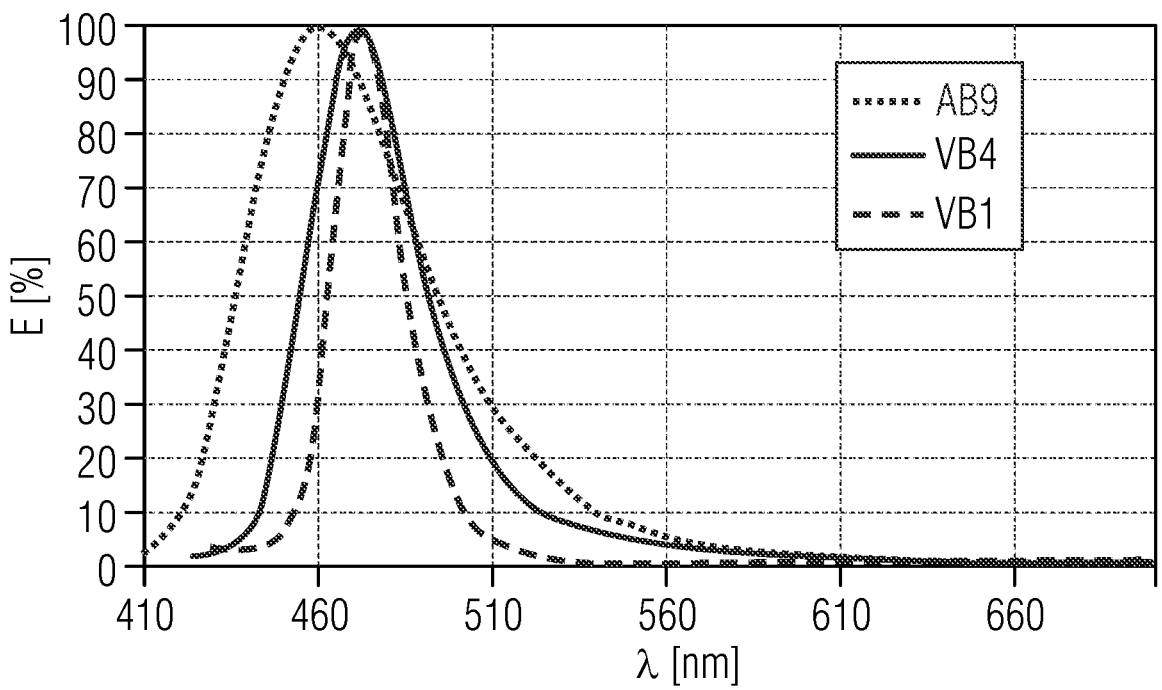
Figures 96, 97:
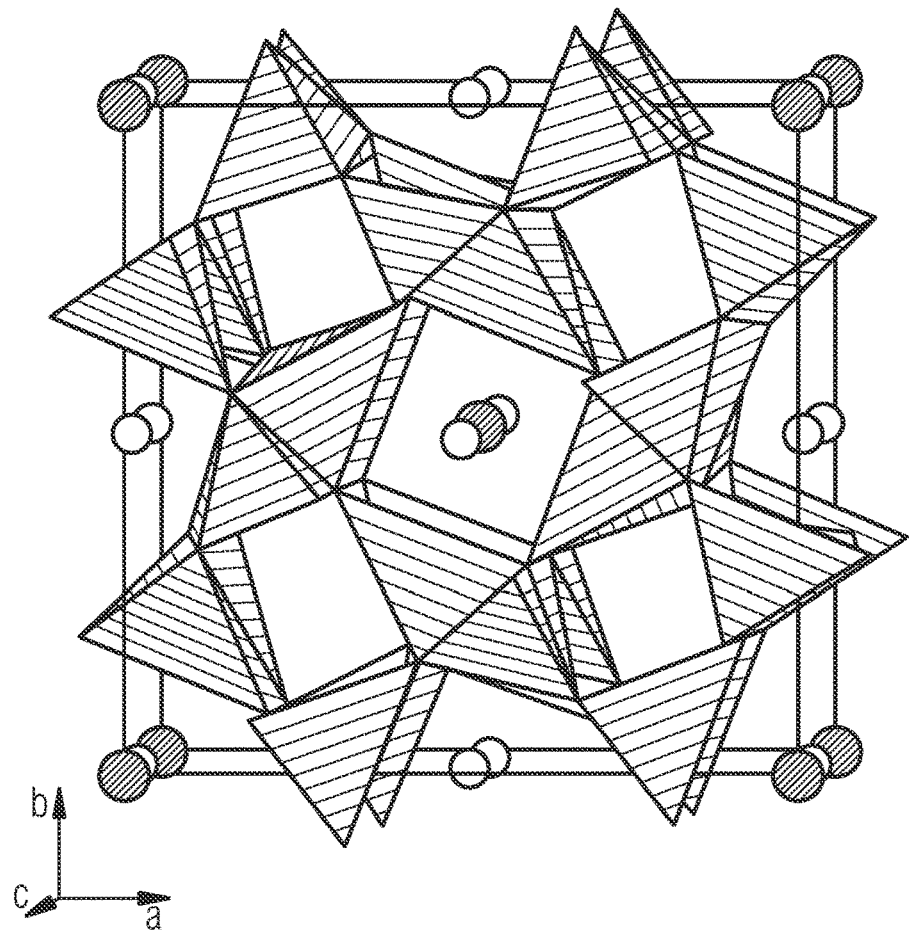

FIG. 95 shows a comparison of the emission spectra of the ninth exemplary embodiment AB9 of the phosphor according to the present disclosure in comparison with the conventional phosphors VB1 and VB4 described under FIG. 96, at an excitation wavelength of 400 nm.

FIG. 96 shows various optical properties of the ninth exemplary embodiment of the phosphor according to the present disclosure AB9 in comparison with conventional phosphors VB1 and VB4. In this case, VB1 stands for a phosphor of the formula $BaMgAl_{10}O_{17}:Eu$ and VB4 stands for $(Ba_{0.75}Sr_{0.25})Si_2O_2N_2:Eu$. All three phosphors exhibit a similar dominant wavelength and peak wavelength. In this case, however, the phosphor AB9 according to the present disclosure exhibits a significantly smaller full width at half maximum than the comparative examples.

FIG. 97 shows the tetragonal crystal structure of the phosphor $(Na_{0.75}Rb_{0.25})$ $Li_3SiO_4:Eu^{2+}$ in a schematic illustration. The black circles represent Rb atoms and the circles enclosing white areas represent Na atoms. The phosphor AB9 crystallizes in the same space group, I4/m, as the third exemplary embodiment $(Na_{0.5}K_{0.5})Li_3SiO_4:Eu^{2+}$. The crystal structures of the phosphors $(Na_{0.5}K_{0.5})$ $Li_3SiO_4:Eu^{2+}$ and $(Na_{0.75}Rb_{0.25})$ $Li_3SiO_4:Eu^{2+}$ have the same $(Li_3SiO_4)$ structural units. The $(Li_3SiO_4)$ structural units have $SiO_4$ and $LiO_4$ tetrahedra, wherein oxygen occupies the corners and Li and Si, respectively, occupy the center of the tetrahedron. The occupation of the channels within these structural units is different in the phosphors. $(K_{0.5}Na_{0.5}s)Li_3SiO_4:Eu^{2+}$ contains two types of channels, wherein one channel is occupied only by K and the other is occupied only by Na.

(Na$_{0.75}$Rb$_{0.25}$) Li$_3$SiO$_4$:Eu$^{2+}$ likewise contains two types of channels, wherein one channel is occupied only by Na and the other is occupied alternately by Na and Rb in mixed fashion.

Figure 98:
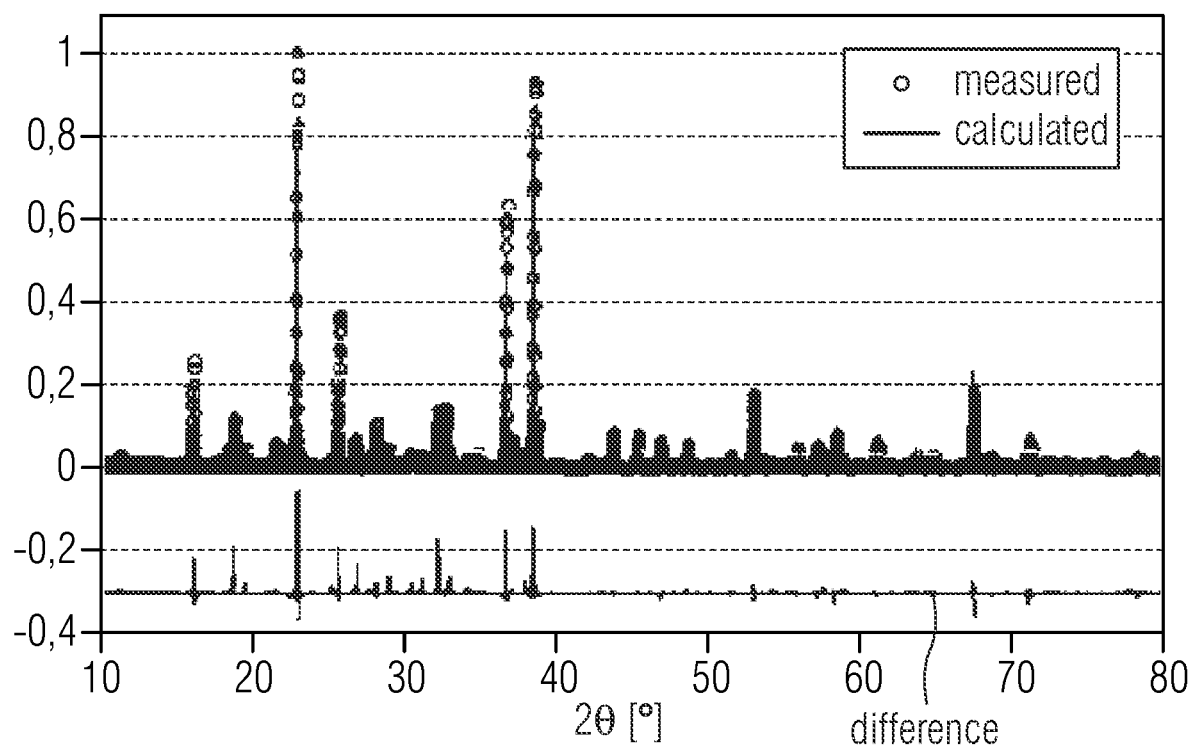

A crystallographic evaluation is found in FIG. 98. FIG. 98 shows a Rietveld refinement of the X-ray powder diffractogram of the ninth exemplary embodiment AB9. The diagram illustrates the superimposition of the measured reflections with the calculated reflections for (Na$_{0.75}$Rb$_{0.25}$) Li$_3$SiO$_4$:Eu, and also illustrates the differences between the measured and calculated reflections. The phosphor is contaminated with a small proportion of NaLi$_3$SiO$_4$.

FIG. 99 shows crystallographic data of (Na$_{0.75}$Rb$_{0.25}$) Li$_3$SiO$_4$:Eu.

Figures 100, 101:
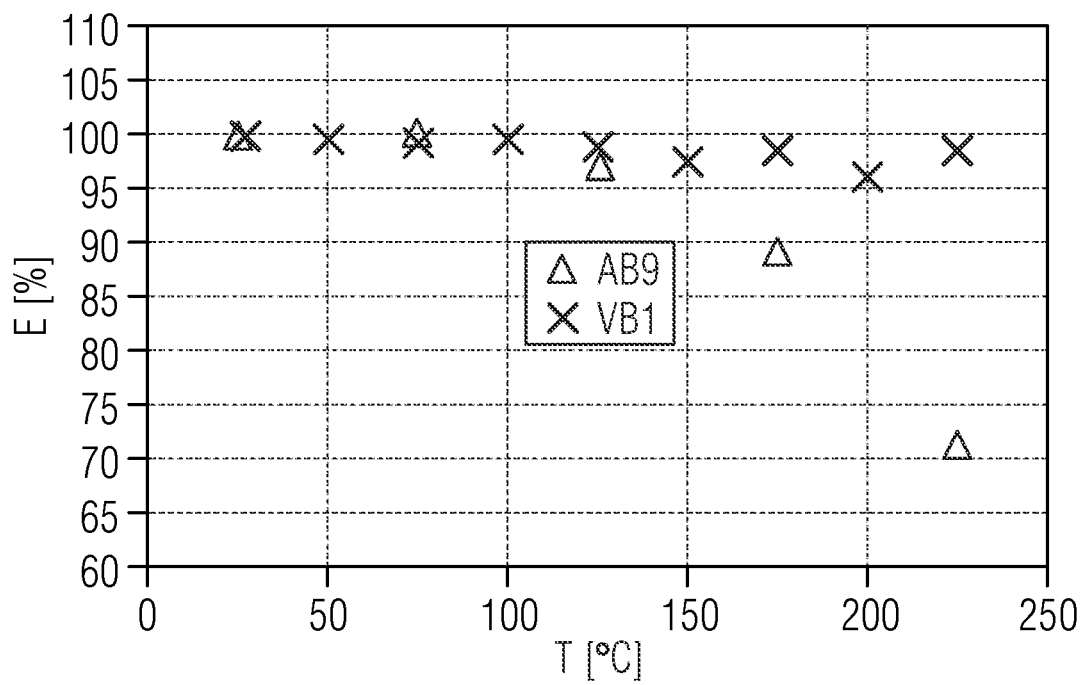

FIG. 100 shows atomic positions in the structure of (Na$_{0.75}$Rb$_{0.25}$) Li$_3$SiO$_4$:Eu.

In FIG. 101, the relative brightness in % is plotted against the temperature in ° C. As is evident, the exemplary embodiment AB9 of the phosphor according to the present disclosure exhibits a high thermal stability. FIG. 101 shows the thermal quenching behavior of the phosphor according to the present disclosure AB9 in comparison with a known phosphor BaMgAl$_{10}$O$_{17}$:Eu (VB1). The phosphors were excited with a blue primary radiation having a wavelength of 400 nm at various temperatures from 25 to 225° C. and their emission intensity between 410 nm and 780 nm was recorded in the process. It is clearly evident that the phosphor AB9 according to the present disclosure has a significantly smaller loss of emission intensity at temperatures above 100° C. At a temperature of 225° C., AB9 still exhibits an emission intensity of more than 95% in comparison with the emission intensity of 100% at 25° C.

Figure 102:
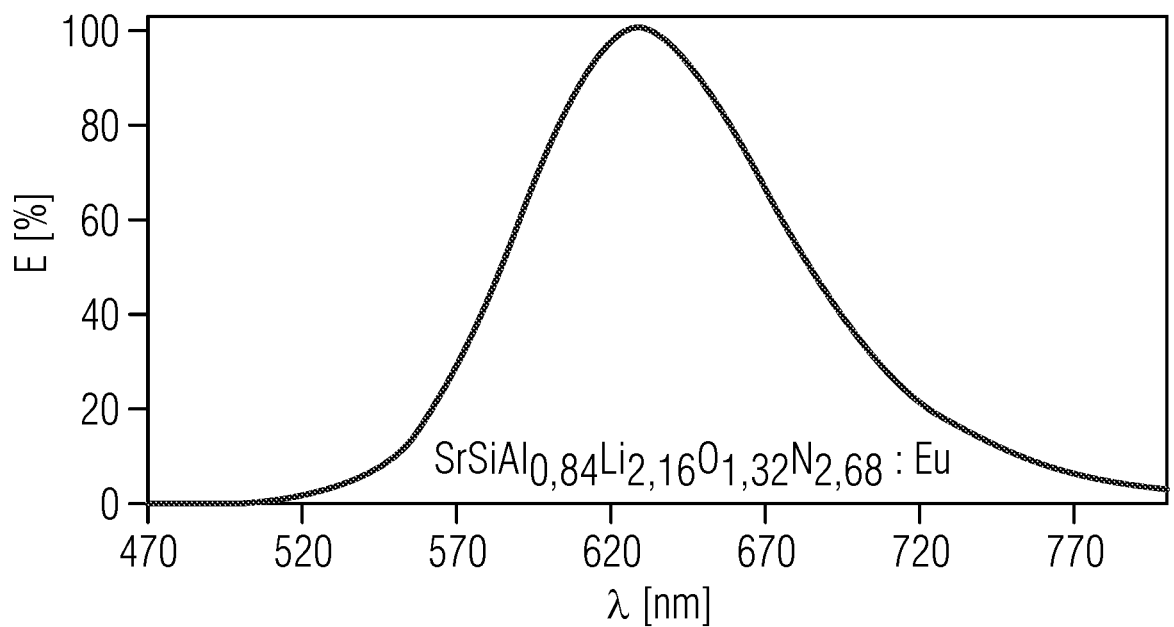

FIG. 102 illustrates the emission spectrum of the tenth exemplary embodiment AB10 of the phosphor according to the present disclosure having the molecular formula SrSiAl$_{0.84}$Li$_{2.16}$O$_{1.32}$N$_{2.68}$:Eu. For measuring the emission spectrum, a single crystal of the phosphor according to the present disclosure was excited with a primary radiation having a wavelength of 460 nm. The phosphor has a peak wavelength of approximately 628.7 nm and a dominant wavelength of 598 nm. The full width at half maximum is at 99 nm and the color locus in the CIE color space is at the coordinates CIE-x: 0.617 and CIE-y: 0.381.

Figure 103:
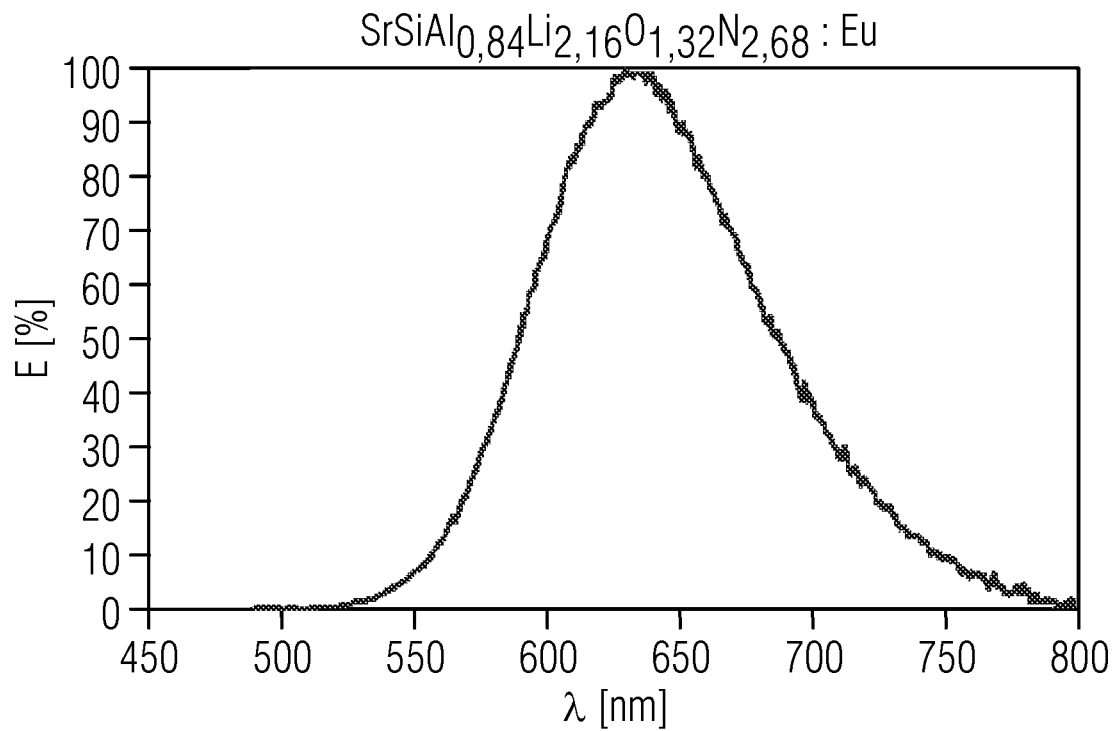

FIG. 103 illustrates the emission spectrum of the tenth exemplary embodiment AB10 of the phosphor according to the present disclosure having the molecular formula SrSiAl$_{0.84}$Li$_{2.16}$O$_{1.32}$N$_{2.68}$:Eu. For measuring the emission spectrum, a powder of the phosphor according to the present disclosure was excited with a primary radiation having a wavelength of 460 nm. The phosphor has a peak wavelength of approximately 632 nm and a dominant wavelength of 600 nm. The full width at half maximum is at 97.7 nm and the color locus in the CIE color space is at the coordinates CIE-x: 0.626 and CIE-y: 0.372. On account of self-absorption, the emission spectrum of the powder has a smaller full width at half maximum than the emission spectrum of the single crystal from FIG. 102.

Figure 104:
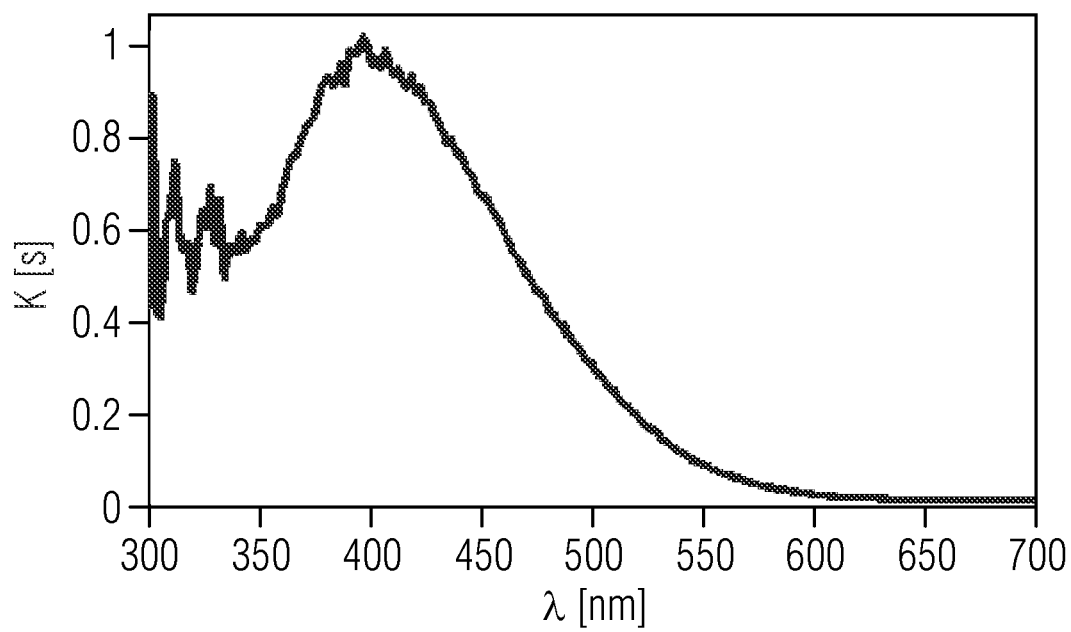

FIG. 104 shows a normalized Kubelka-Munk function (K/S), plotted against the wavelength λ in nm, for the tenth exemplary embodiment (AB10) of the phosphor according to the present disclosure. The phosphor according to the present disclosure can be efficiency excited with a primary radiation in the range of between 340 nm and 500 nm, advantageously 340 nm to 460 nm.

Figure 105:
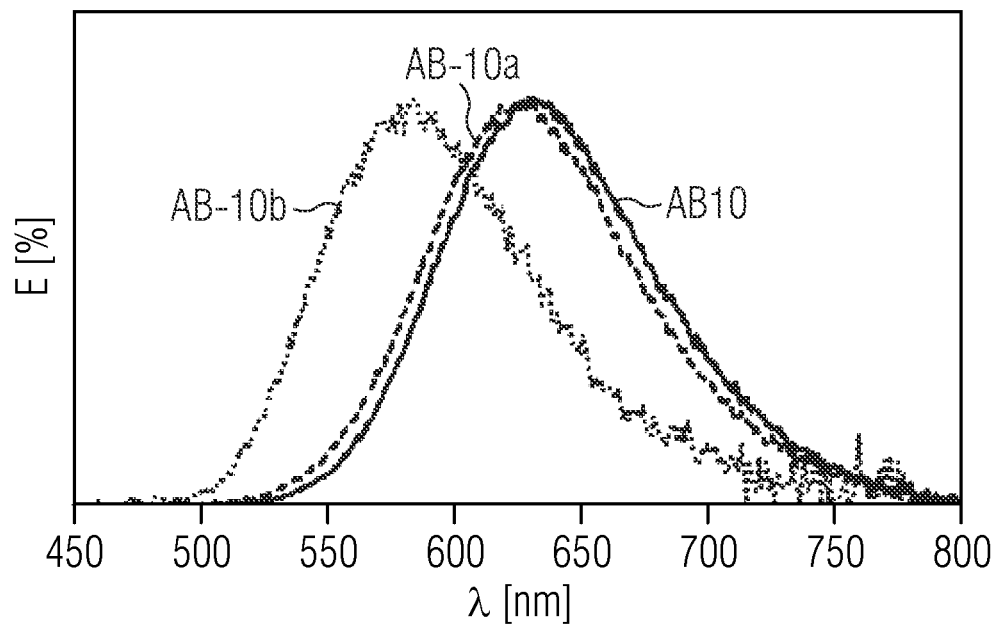

FIG. 105 illustrates the emission spectrum of the tenth exemplary embodiment AB10 of the phosphor according to the present disclosure having the molecular formula SrSiAl$_{0.84}$Li$_{2.16}$O$_{1.32}$N$_{2.68}$:Eu and of two further exemplary embodiments (AB-10a and AB-10b) of the phosphor having the general formula Sr(Si$_{0.25}$Al$_{-1/8+r/2}$Li$_{7/8-r/2}$)$_4$(O$_{1-r}$N$_{r}$)$_4$. The exemplary embodiments were produced like AB10; the weighed-in quantities are indicated in tables below.

Weighed-in quantities of the starting materials for AB-10a

| Starting material | Substance amount/ mmol | Mass/g |
|---|---|---|
| NaLi$_3$SiO$_4$ | 28.08 | 3.817 |
| SrO | 26.96 | 2.794 |
| LiAlH$_4$ | 84.25 | 3.192 |
| Eu$_2$O$_3$ | 0.56 | 0.198 |

Weighed-in quantities of the starting materials for AB-10b

| Starting material | Substance amount/ mmol | Mass/g |
|---|---|---|
| NaLi$_3$SiO$_4$ | 29.82 | 4.052 |
| SrO | 22.50 | 2.331 |
| Li$_3$N | 8.13 | 0.283 |
| AlN | 73.18 | 3.000 |
| Eu$_2$O$_3$ | 0.95 | 0.334 |

Figures 106, 107:
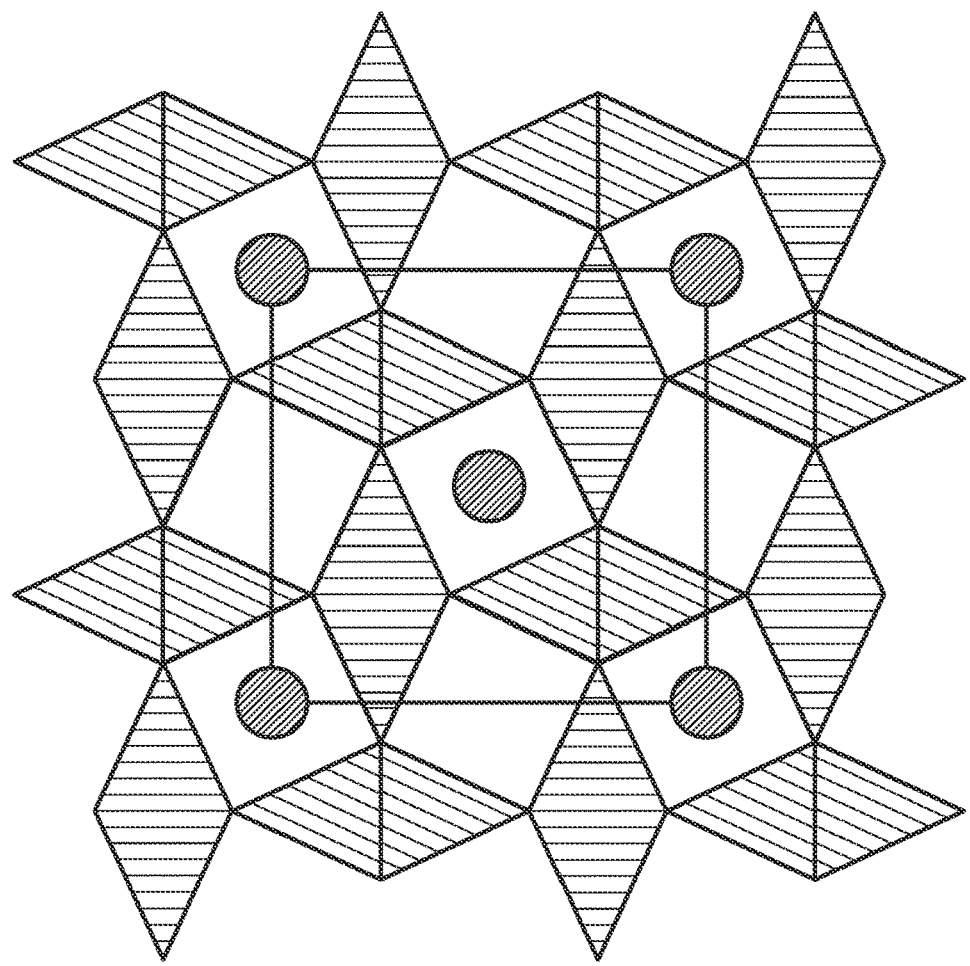

As is evident, by varying r in the formula Sr(Si$_{0.25}$Al$_{-1/8+r/2}$Li$_{7/8-r/2}$)$_4$(O$_{1-r}$N$_{r}$)$_4$, it is possible for the peak wavelength to be shifted from the yellow into the red spectral range. A comparison of optical properties of AB10, AB-10a and AB-10b is shown in FIG. 106. Known phosphors that exhibit emissions in this spectral range are α-SiAlON:Eu or (Ca,Sr,Ba)$_2$Si$_5$N$_8$:Eu. However, α-SiAlONs exhibit less adjustability of the peak wavelength than Sr(Si$_{0.25}$Al$_{-1/8+r/2}$Li$_{7/8-r/2}$)$_4$(O$_{1-r}$N$_{r}$)$_4$ and are thus limited in their application. Although a better adjustability of the peak wavelength is exhibited by (Ca,Sr,Ba)$_2$Si$_5$N$_8$:Eu, the use thereof is associated with high costs as a result of expensive starting materials, such as alkaline earth metal nitrides, and high synthesis temperatures over 1400° C. The phosphor (MB)(Si$_{0.25}$Al$_{-1/8+r/2}$Li$_{7/8-r/2}$)$_4$(O$_{1-r}$N$_{r}$)$_4$:E or Sr(Si$_{0.25}$Al$_{-1/8+r/2}$Li$_{7/8-r/2}$)$_4$(O$_{1-r}$N$_{r}$)$_4$:E where 0.25≤r≤1 can thus be adjusted in a targeted manner with regard to the desired color locus and/or color rendering index depending on requirements or application. Surprisingly many colors of the visible range, in particular from yellow to red, can thus be generated with just one phosphor. The phosphor is suitable in particular for conversion light-emitting diodes configured to emit a yellow to red radiation or a white radiation.

FIG. 107 shows the tetragonal crystal structure of the phosphor SrSiAl$_{0.84}$Li$_{2.16}$O$_{1.32}$N$_{2.68}$:Eu in a schematic illustration along the crystallographic c-axis. The hatched circles represent Sr atoms and hatched regions represent (Li,Si,Al)(O,N)$_4$ tetrahedra. The phosphor AB10 crystallizes in the UCr$_4$C$_4$ structure type. The Sr atoms are situated in tetragonal channels formed by the corner- and edge-linked (Li,Si,Al)(O,N)$_4$ tetrahedra. The phosphor crystallizes in the space group I4/m.

FIG. 108 shows crystallographic data of SrSiAl$_{0.84}$Li$_{2.16}$O$_{1.32}$N$_{2.68}$:Eu.

FIG. 109 shows atomic positions in the structure of SrSiAl$_{0.84}$Li$_{2.16}$O$_{1.32}$N$_{2.68}$:Eu.

FIG. 110 shows anisotropic displacement parameters of SrSiAl$_{0.84}$Li$_{2.16}$O$_{1.32}$N$_{2.68}$:Eu.

Figure 111:
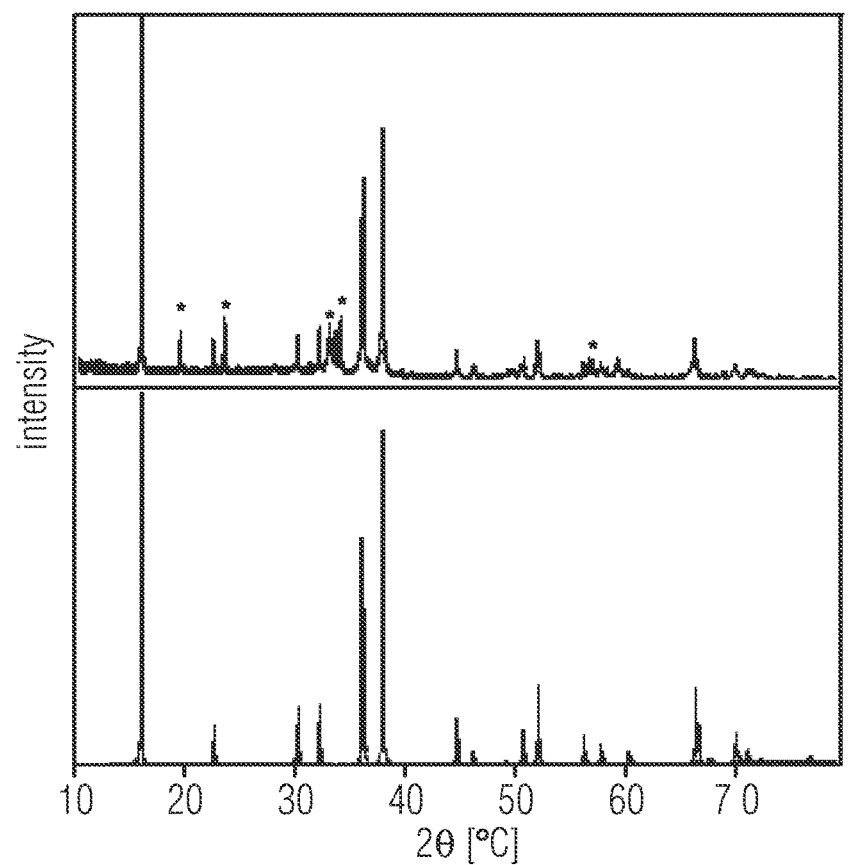

FIG. 111 shows a crystallographic evaluation of the X-ray powder diffractogram of the tenth exemplary embodiment AB10.

The diagram illustrates the superimposition of the measured reflections with the calculated reflections for $SrSiAl_{0.84}Li_{2.16}O_{1.32}N_{2.68}$:Eu. The upper part of the diagram shows the experimentally observed reflections (Cu Kαi radiation); the lower part of the diagram shows the calculated reflection positions. The calculation was made on the basis of the structure model for $SrSiAl_{0.84}Li_{2.16}O_{1.32}N_{2.68}$:Eu, as described in FIGS. 107-110. Reflections of secondary phases are identified by *. The secondary phases are present in a very small proportion.

Figure 112:
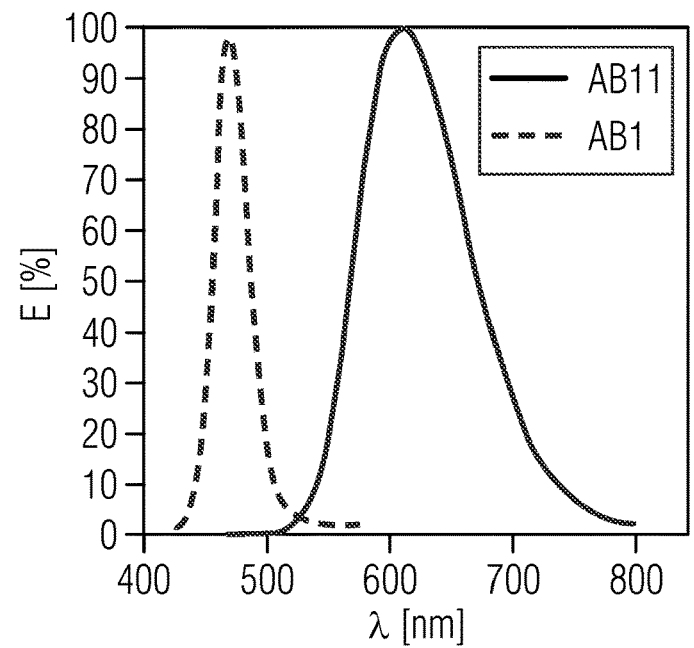

FIG. 112 illustrates the emission spectrum of the eleventh exemplary embodiment AB11 of the phosphor according to the present disclosure having the molecular formula $Na_{1-y^{}}Eu_{y^{}}Li_{3-2y^{}}Al_{3y^{}}*Si_{1-y^{}}O_{4-4y^{}}N_{4y^{}}$:Eu where $y^{}=0.2224$ in comparison with the first exemplary embodiment AB1 $NaLi_3SiO_4$. The phosphor AB11 has a peak wavelength of approximately 613.4 nm and a dominant wavelength of 593.6 nm. The full width at half maximum is at 105 nm and the color locus in the CIE color space is at the coordinates CIE-x: 0.595 and CIE-y: 0.404. The different properties of AB1 and AB11, in particular the peak wavelength shifted into the longer-wavelength range for $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$ in comparison with $NaLi_3SiO_4$:Eu is due to a stronger nephelauxetic effect of the nitrogen atoms surrounding the activator ions, here the $Eu^{2+}$ ions, in the mixed phase $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$. The higher the proportion of nitrogen in the vicinity of the activator ions, the longer the peak wavelength. As a result, with increasing nitrogen content and thus with a rising value for $y^{}$ in the phosphor $Na_{1-y^{}}Eu_{y^{}}Li_{3-2y^{}}Al_{3y^{}}Si_{1-y^{}}O_{4-4y^{}}N_{4y^{}}$:Eu, the peak wavelength can be shifted within the visible range of the electromagnetic spectrum, in particular in a range of between 470 nm and 670 nm. The phosphor $(MA)_{1-y^{*}}Sr_{y^{*}}Li_{3-2y^{*}}Al_{3y^{*}}Si_{1-y^{*}}O_{4-4y^{*}}N_{4y^{*}}$:E or $Na_{1-y^{}}Eu_{y^{}}Li_{3-2y^{}}Al_{3y^{}}Si_{1-y^{}}O_{4-4y^{}}N_{4y^{}}$:E where $0<y^{***}<0.875$ is thus suitable in particular for lighting devices or conversion LEDs in which phosphors having very specific properties are required (so-called "color on demand" applications), for example for flashing lights in a motor vehicle.

Figures 113, 114:
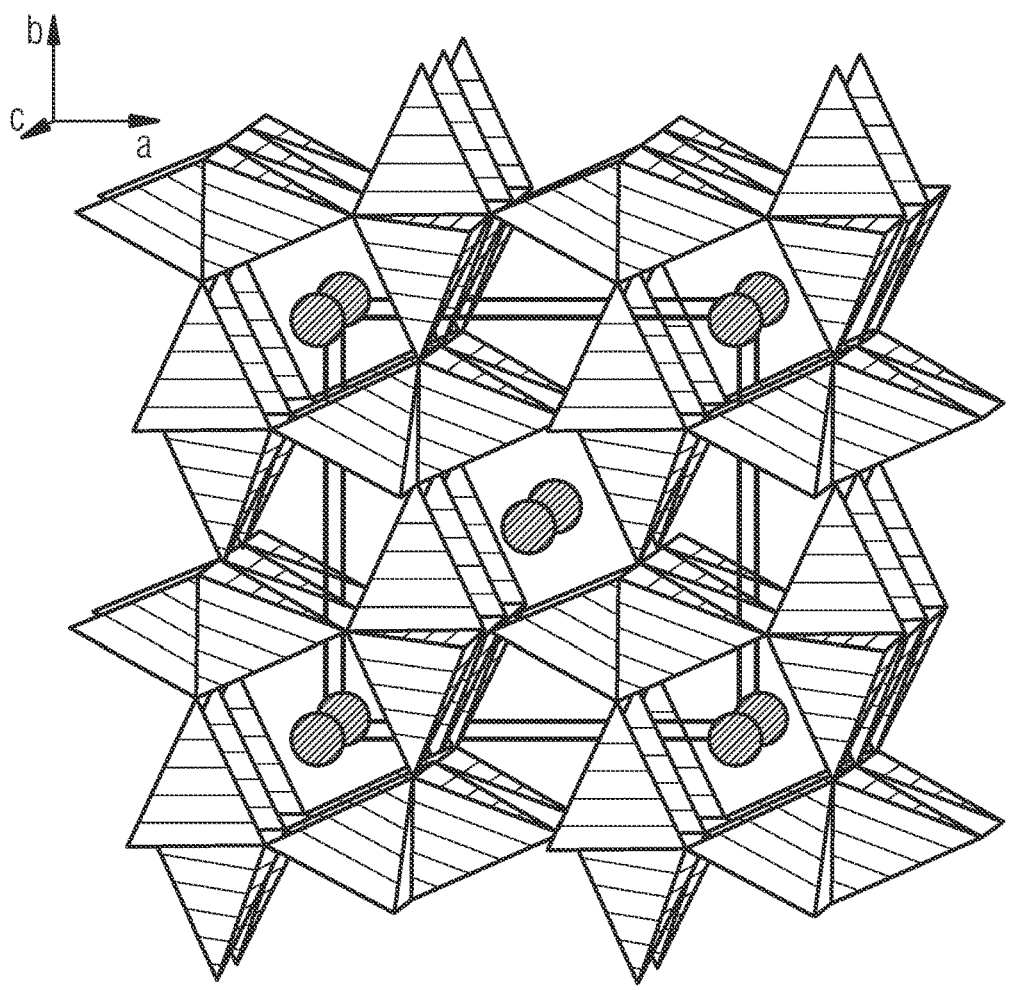

Optical data for AB11 are shown in FIG. 113.

FIG. 114 shows the tetragonal crystal structure of the phosphor $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$ (AB11) and in a schematic illustration along the crystallographic c-axis. The hatched circles represent Na/Eu atoms and the hatched regions represent $(Li,Si,Al)(O,N)_4$ tetrahedra. The phosphor AB11 crystallizes in the $UCr_4C_4$ structure type. The Na and Eu atoms are situated in tetragonal channels formed by the corner- and edge-linked $(Li,Si,Al)(O,N)_4$ tetrahedra. The phosphor crystallizes in the space group I4/m. The crystal structure is known e.g. for phosphors of the formula $Sr[Mg_2Al_2N_4]:Eu^{2+}$ (WO 2013/175336 A1 or P. Pust et al., Chem. Mater., 2014, 26, 6113). Surprisingly, in the present case it has been possible to show that even phosphors having a proportion of less than 87.5% nitrogen can be synthesized and are stable.

FIG. 115 shows crystallographic data of $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$.

FIG. 116 shows atomic positions in the structure of $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$.

FIG. 117 shows anisotropic displacement parameters of $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$.

Figure 118A:
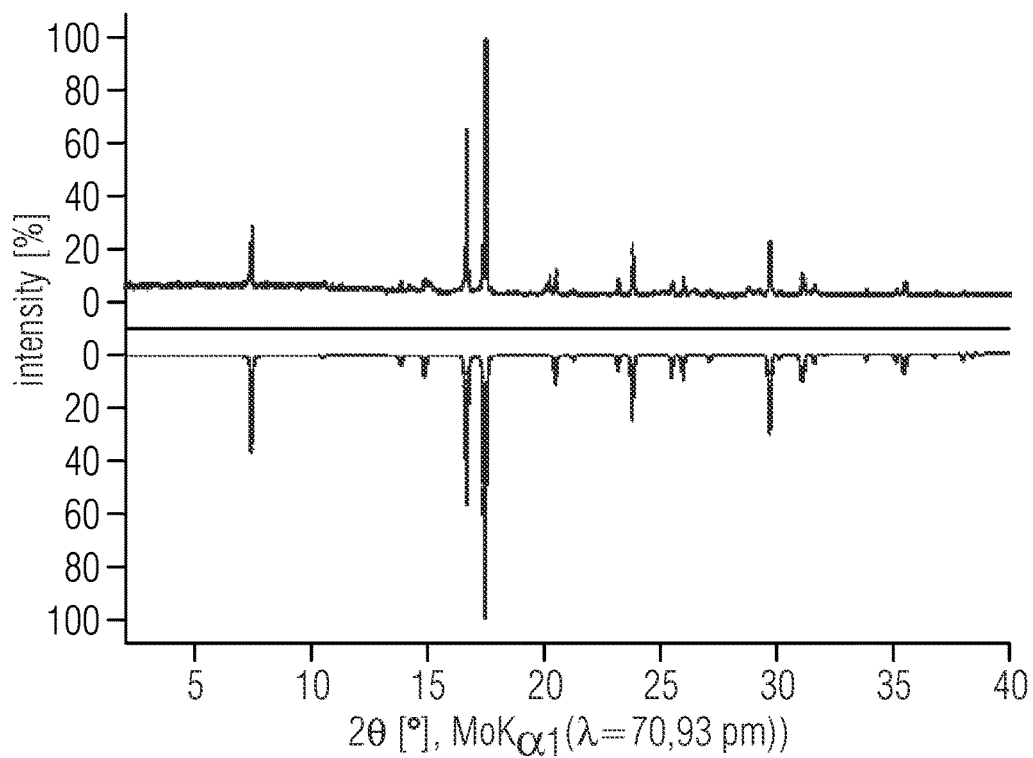

FIG. 118a shows a crystallographic evaluation of the X-ray powder diffractogram of the eleventh exemplary embodiment AB11. The diagram illustrates a comparison of the measured reflections with the calculated reflections for $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$. The upper part of the diagram shows the experimentally observed reflections (Mo $K_{α1}$ radiation); the lower part of the diagram shows the calculated reflection position. The calculation was made on the basis of the structure model for $Na_{1-y^{}}Eu_{y^{}}Li_{3-2y^{}}Al_{3y^{}}Si_{1-y^{}}O_{4-4y^{}}N_{4y^{}}$:Eu where $y^{}=0.2224$, as described in FIGS. 114-117. The correspondence of the reflections of the calculated powder diffractogram to the reflections of the measured powder diffractogram reveals a correspondence of the crystal structure of single crystals and powders of the phosphor.

Figure 118B:
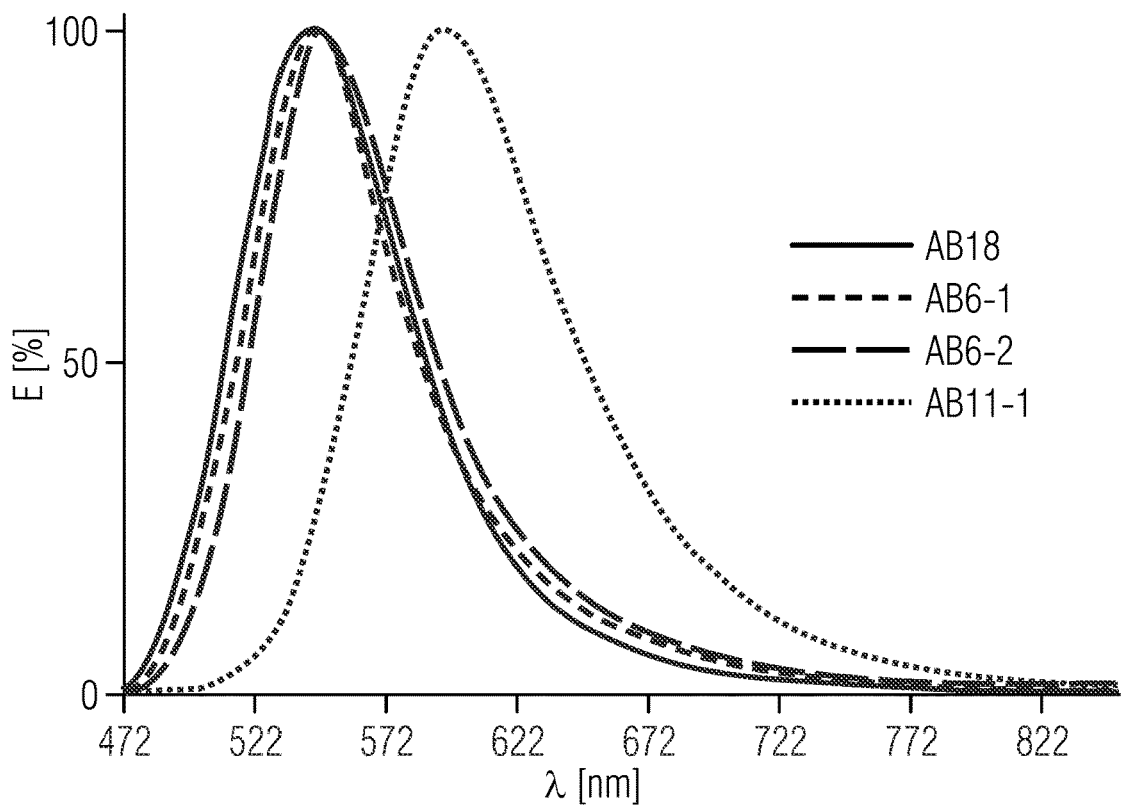

FIG. 118b shows the emission spectra of $Na_{1-y^{}}Eu_{y^{}}Li_{3-2y^{}}Al_{3y^{}}Si_{1-y^{}}O_{4-4y^{}}N_{4y^{}}$:Eu where $y^{}=0.1$ (AB11-1), $Na_{1-y^{*}}Ca_{y^{*}}Li_{3-2y^{*}}Al_{3y^{*}}Si_{1-y^{*}}O_{4-4y^{*}}N_{4y^{*}}$:Eu where $y^{*}=0.25$ (AB6-1; AB6-2) and $Na_{1-y^{*}}Sr_{y^{*}}Li_{3-2y^{*}}Al_{3y^{*}}Si_{1-y^{*}}O_{4-4y^{*}}N_{4y^{*}}$:Eu where $y^{*}=0.25$ (AB18). A comparison of the optical properties is shown in FIG. 119.

Figures 120, 121:
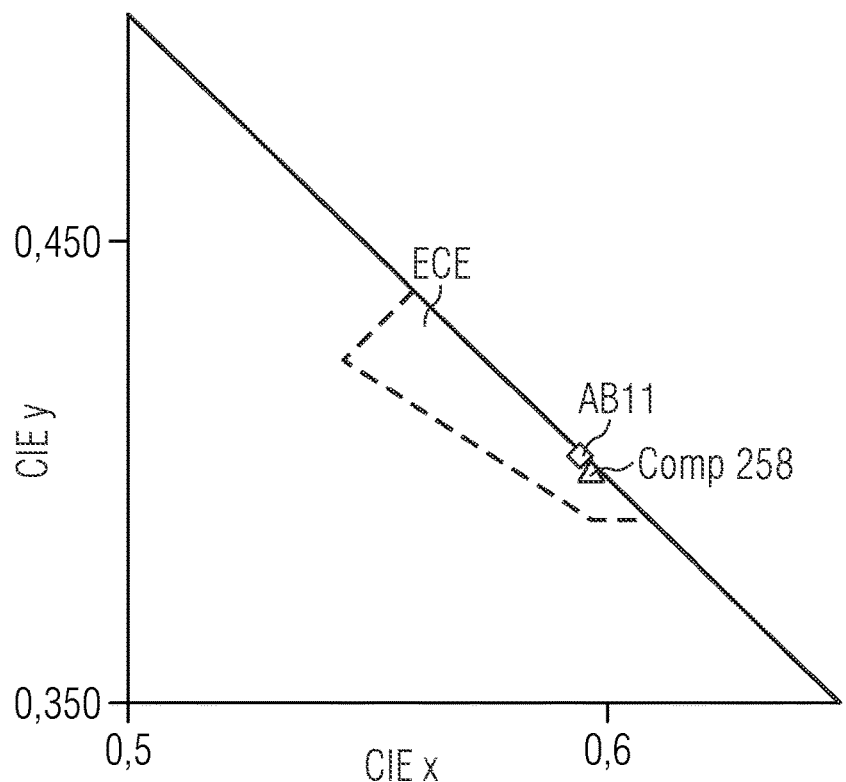

FIG. 120 shows an excerpt from the CIE color space. In this excerpt, the region designated by ECE corresponds to color loci for flashing lights in the exterior region of a motor vehicle in the yellow or yellow-orange color range which correspond to the ECE regulations (ECE: Economic Commission for Europe). The ECE regulations are a catalog of internationally agreed, standardized technical specifications for motor vehicles and for parts and items of equipment of motor vehicles. Furthermore, the color loci of the eleventh exemplary embodiment AB11 and of a comparative example $(Sr,Ca,Ba)_2Si_5N_8$:Eu (Comp 258) are shown. The color loci of both phosphors lie within the ECE region and are therefore suitable for the use of said phosphors in conversion LEDs for flashing lights in motor vehicles. In contrast to $(Sr,Ca,Ba)_2Si_5N_5$:Eu, the phosphor according to the present disclosure AB11 can be produced at lower temperatures. A yellow or yellow-orange conversion LED comprising AB11 (full conversion) is much more efficient and more temperature-stable in comparison with a yellow or yellow-orange LED, based on InGaAlP.

FIG. 121 shows the color loci of AB11 and Comp 258.

Figures 122, 123:
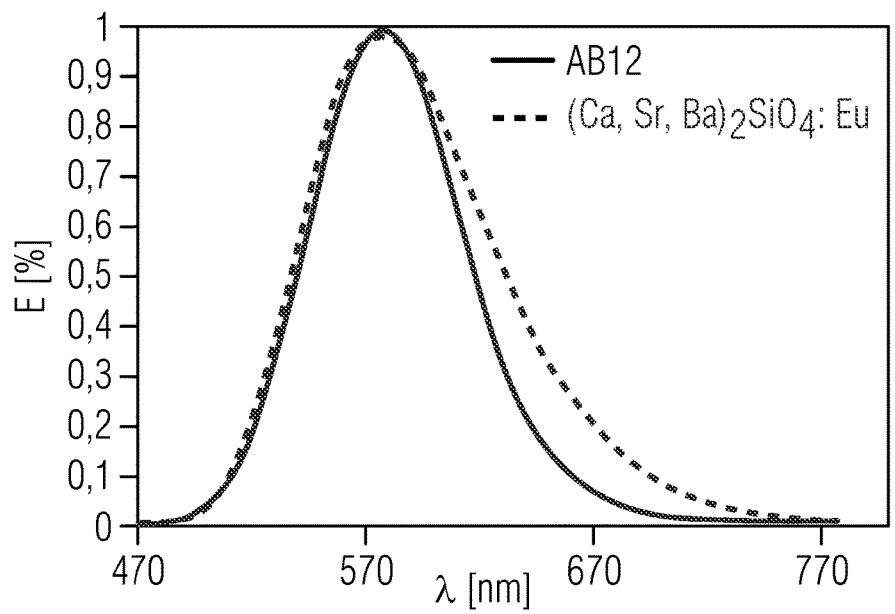

FIG. 122 illustrates the emission spectrum of a single crystal of the twelfth exemplary embodiment AB12 of the phosphor according to the present disclosure having the molecular formula $SrLi_{3-2x^{}}Al_{1+2x^{}}O_{4-4x^{}}N_{4x^{}}$:Eu where $x^{}=0.2014$ in comparison with a comparative example $(Ca,Sr,Ba)_2SiO_4$:Eu. The phosphor AB12 has a peak wavelength of approximately 580.3 nm and a dominant wavelength of 576.5 nm. The full width at half maximum is at 80 nm and the color locus in the CIE color space is at the coordinates CIE-x: 0.486 and CIE-y: 0.506. A comparison of the optical data of AB12 and $(Ca, Sr,Ba)_2SiO_4$:Eu is illustrated in FIG. 123. (MB) $Li_{3-2x^{}}Al_{1+2x^{}}O_{4-4x^{}}N_{4x^{}}$:Eu or $SrLi_{3-2x^{}}Al_{1+2x^{}}O_{4-4x^{}}N_{4x^{}}$:Eu where $0<x^{}<0.875$, in particular where $x^{}=0.2014$, is suitable for use in colored conversion LEDs in which the primary radiation is completely or almost completely converted into secondary radiation and is thus usable in particular for "color on demand" applications. As illustrated in FIG. 123**, a conversion LED comprising AB12 has a higher luminous efficiency than a conversion LED comprising $(Ca, Sr,Ba)_2SiO_4$:Eu.

Figures 124, 125:
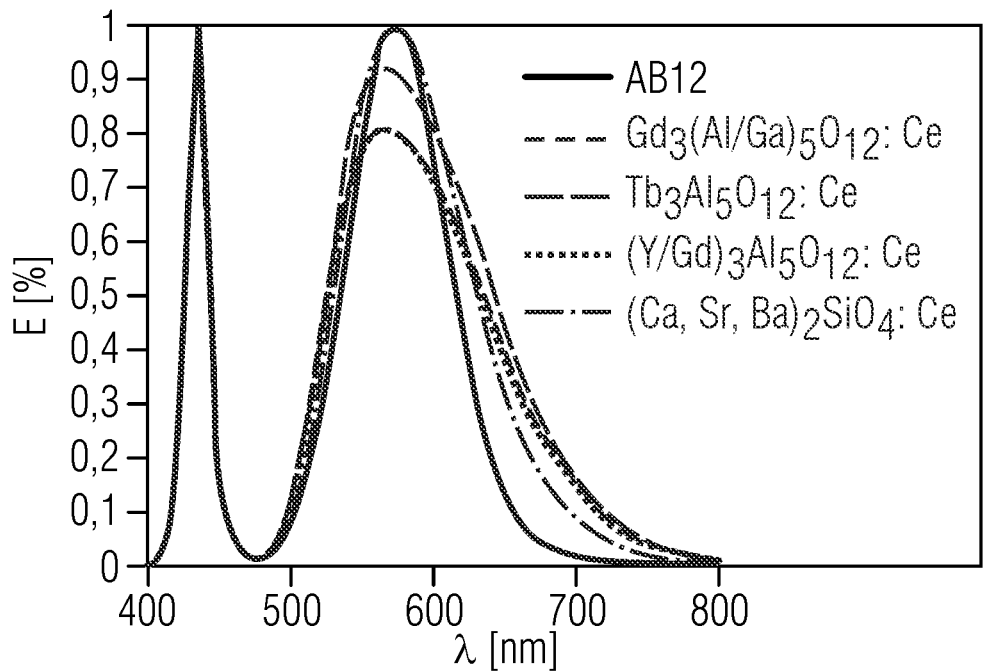

FIG. 124 shows simulated emission spectra of conversion LEDs. Emission spectra of conversion LEDs with a primary radiation of 442 nm with the twelfth exemplary embodiment AB12 and phosphors as comparative examples are shown. White emission spectra in which the overall radiation is composed of the primary radiation and the respective secondary radiation are shown. The optical data are illustrated in FIG. 125. On account of the small full width at half maximum of AB12 in comparison with the comparative examples, the conversion LED comprising the phosphor according to the present disclosure AB12 has a higher luminous efficiency (LER) since the overlap with the eye sensitivity curve is greater than in the comparative examples. (MB) $Li_{3-2x^{}}Al_{1+2x^{}}O_{4-4x^{}}N_{4x^{}}$:Eu or $SrLi_{3-2x^{}}Al_{1+2x^{}}O_{4-4x^{}}N_{4x^{}}$:N:Eu where $0<x^{**}<0.875$, in particular the twelfth exemplary embodiment, is thus suitable in particular for use as sole phosphor in a conversion LED for generating warm-white overall radiation, in particular having a color temperature of 3400 K±100 K in combination with a primary radiation in the UV to blue range, for example with a layer sequence based on InGaN. Color temperatures of 3400 K±100 K with color loci near the Planckian locus are not achieved with the use of $Y_3Al_5O_{12}$:Ce. Although the use of modifications of $Y_3Al_5O_{12}$:Ce, such as $(Y,Lu,Gd,Tb)_3(Al,Ga)_5O_{12}$:Ce (FIG. 125), leads to the desired color loci and color temperatures, the luminous efficiency is lower than with the use of $Y_3Al_5O_{12}$:Ce and the thermal quenching behavior is higher. Orthosilicates such as $(Ca,Sr,Ba)_2SiO_4$:Eu are thermally and chemically less stable in comparison with $Y_3Al_5O_{12}$:Ce and additionally have a poorer luminous efficiency in comparison with a conversion LED comprising AB12.

Figures 159, 160:
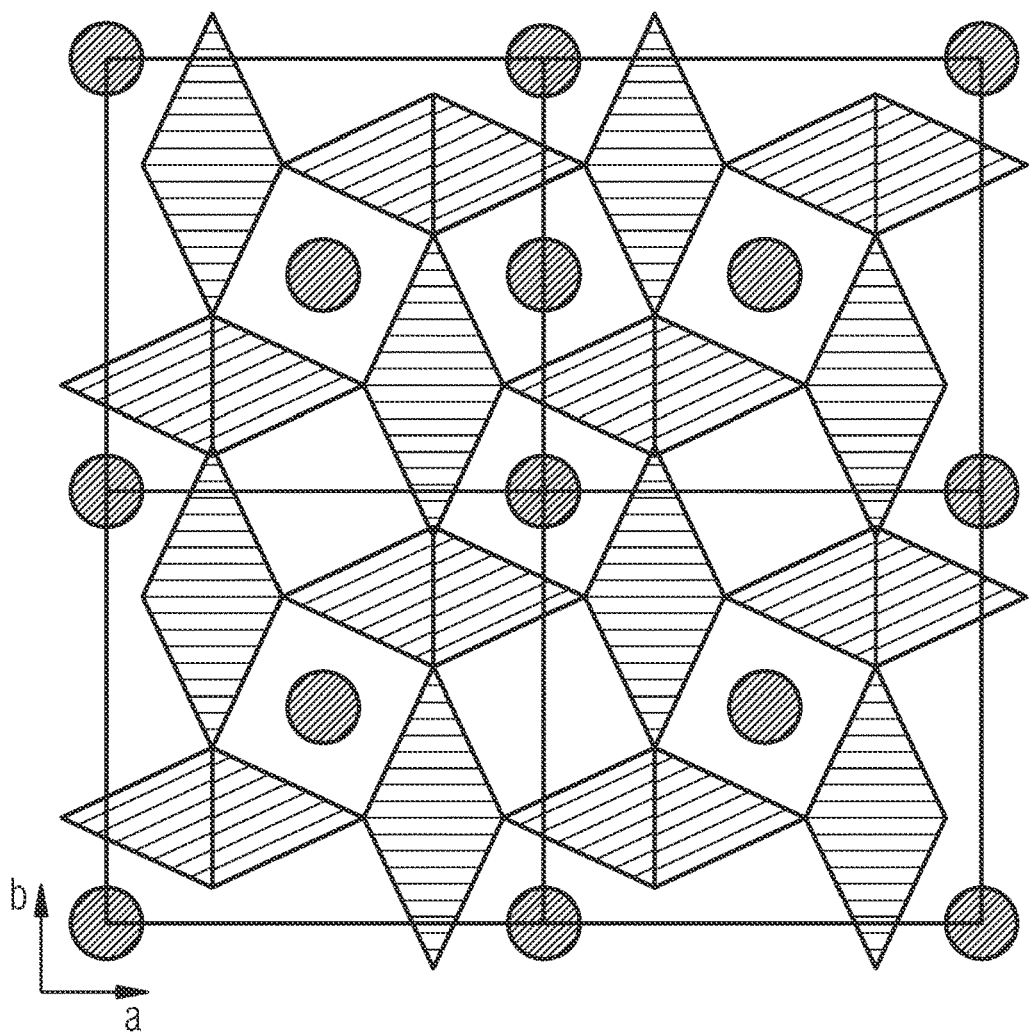

FIG. 114 and FIG. 160 show the tetragonal crystal structure of the phosphor $SrLi_{3-2x^{}}Al_{1+2x^{}}O_{4-4x^{}}N_{4x^{}}$:Eu where $x^{}=0.2014$ (AB12) in a schematic illustration along the crystallographic c-axis. The hatched circles represent Sr atoms and hatched regions represent $(Li,Al)(O,N)_4$ tetrahedra. The phosphor AB12 crystallizes in the $UCr_4C_4$ structure type. The phosphor crystallizes in the space group I4/m. The crystal structure is known e.g. for phosphors of the formula $Sr[Mg_2Al_2N_4]$:Eu$^{2+}$ (WO 2013/175336 A1 or P. Pust et al., Chem. Mater., 2014, 26, 6113). The $(Li,Al)(O,N)_4$ tetrahedra form tetragonal channels in which the Sr atoms are arranged. Surprisingly, in the present case it has been possible to show that even phosphors having a proportion of less than 87.5% nitrogen can be synthesized and are stable. The phosphors of the formula $SrLi_{3-2x^{}}Al_{1+2x^{}}O_{4-4x^{}}N_{4x^{}}$:Eu where $x^{} \geq 0.1250$ crystallize in this crystal type, which has been able to be shown on the basis of the exemplary embodiments AB12-1 to AB12-8. With increasing $x^{**}$, the volume of the unit cell increases and the peak wavelength is shifted to longer wavelengths.

FIG. 126 shows crystallographic data of $SrLi_{3-2x^{}}Al_{1+2x^{}}O_{4-4x^{}}N_{4x^{}}$:Eu where $x^{**}=0.2014$ (AB12).

FIG. 127 shows atomic positions in the structure of $SrLi_{3-2x^{}}Al_{1+2x^{}}O_{4-4x^{}}N_{4x^{}}$:Eu where $x^{**}=0.2014$ (AB12).

FIG. 128 shows anisotropic displacement parameters of $SrLi_{3-2x^{}}Al_{1+2x^{}}O_{4-4x^{}}N_{4x^{}}$:Eu where $x^{**}=0.2014$ (AB12).

Figure 129:
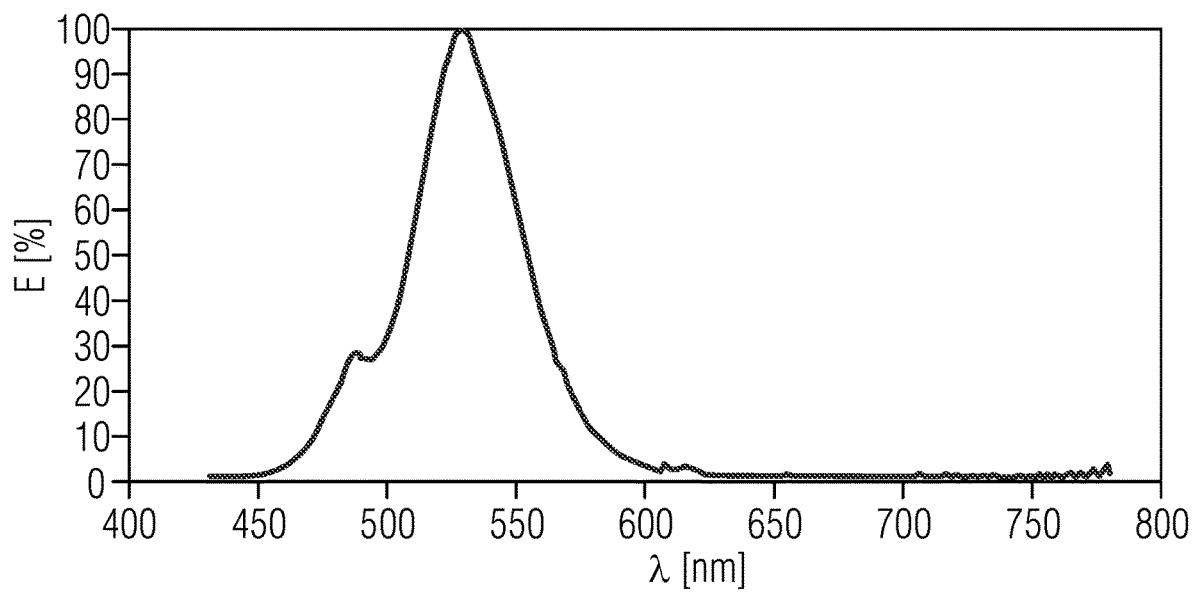
Figure 130:
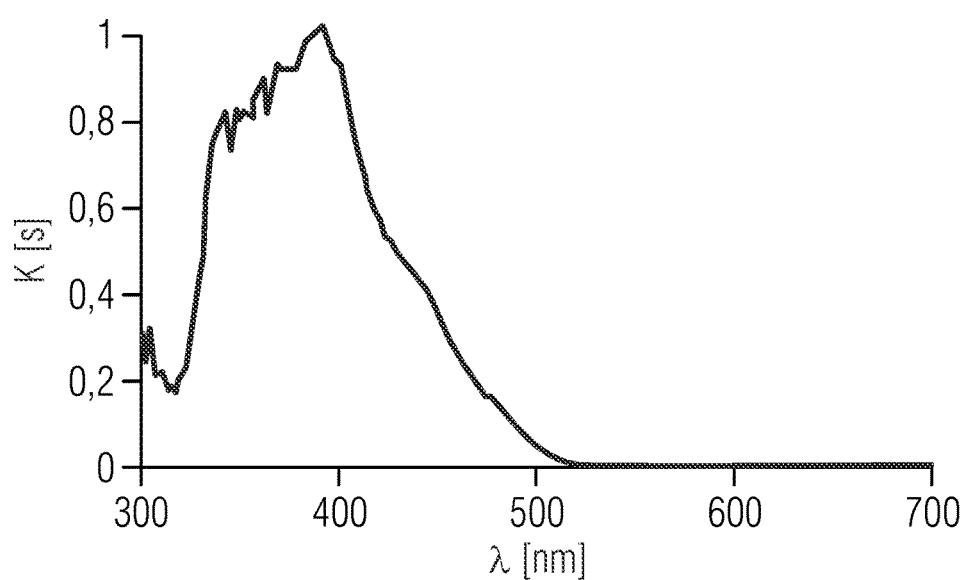

FIG. 129 illustrates the emission spectrum of AB13 of the phosphor according to the present disclosure having the molecular formula $(Cs_{0.25}Na_{0.25}K_{0.25}Li_{0.25}) Li_3SiO_4$:Eu$^{2+}$. For measuring the emission spectrum, a powder of the phosphor according to the present disclosure was excited with a primary radiation having a wavelength of 400 nm. The phosphor has a full width at half maximum of 46 nm, a peak wavelength of 530 nm and a dominant wavelength of 532 nm. The color locus is at CIE-x: 0.222 and CIE-y: 0.647. The optical properties are similar to those of the eighth exemplary embodiment. The peak at approximately 490 nm is probably attributable to a contamination by $CsNa_2K(Li_3SiO_4)_4$:Eu$^{2+}$. FIG. 130 shows a normalized Kubelka-Munk function (K/S), plotted against the wavelength λ in nm, for AB13. The phosphor can be efficiently excited with a primary radiation in the blue range.

Figure 131:
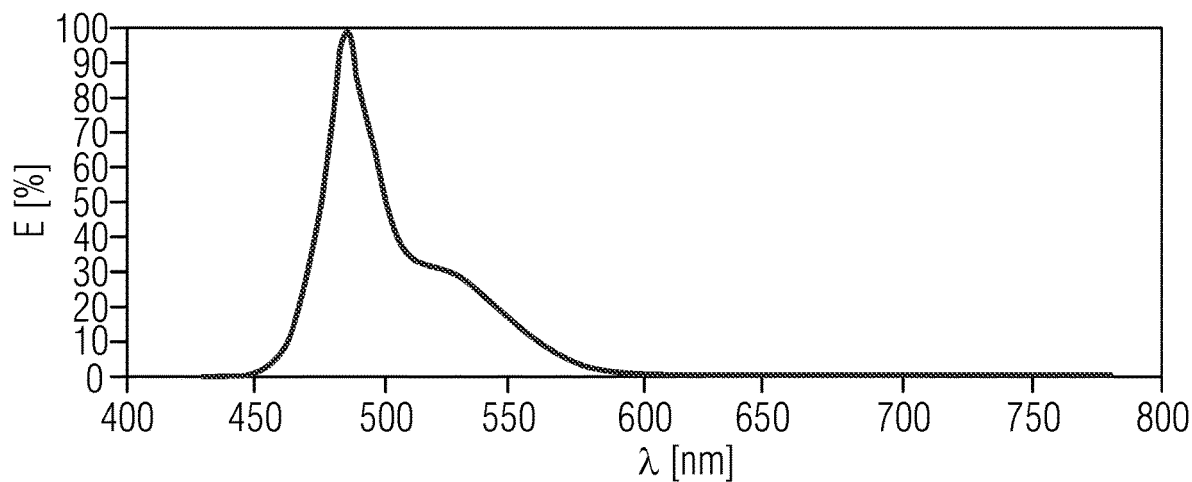

FIG. 131 illustrates the emission spectrum of AB14 of the phosphor according to the present disclosure having the molecular formula $(Cs_{0.25}Na_{0.5}K_{0.25})Li_3SiO_4$:Eu$^{2+}$. For measuring the emission spectrum, a powder of the phosphor according to the present disclosure was excited with a primary radiation having a wavelength of 400 nm. The phosphor has a full width at half maximum of 26 nm, a peak wavelength of 486 nm and a dominant wavelength of 497 nm. The color locus is at CIE-x: 0.138 and CIE-y: 0.419.

Figure 132:
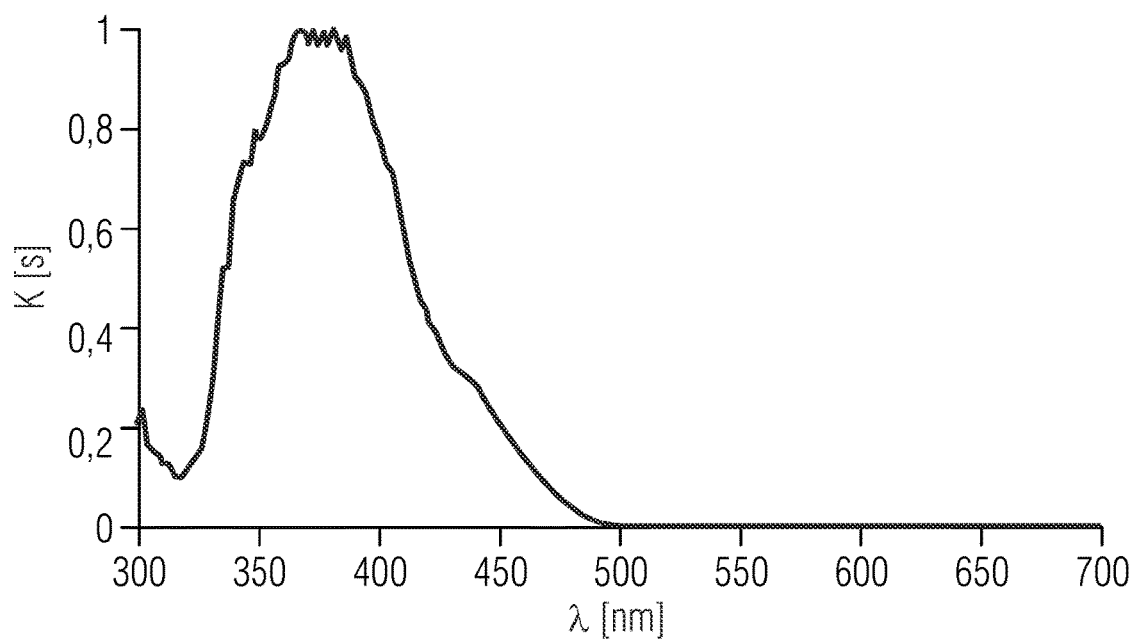

FIG. 132 shows a normalized Kubelka-Munk function (K/S), plotted against the wavelength λ in nm, for AB14. The phosphor can be efficiently excited with a primary radiation in the blue range.

Figure 133:
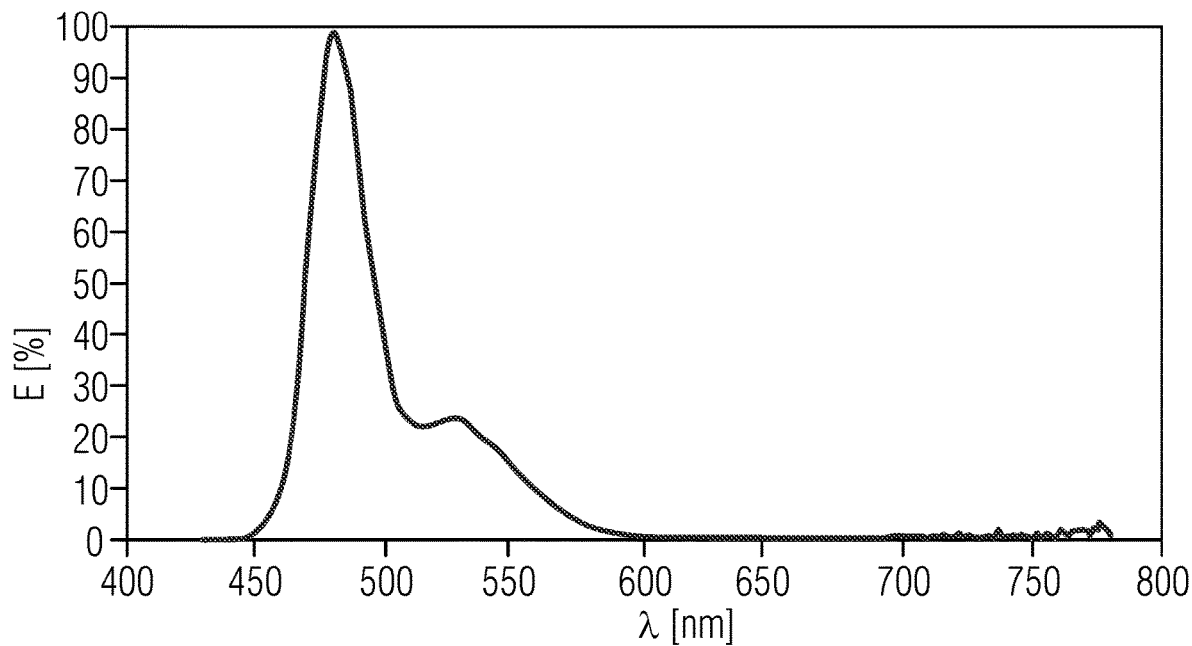

FIG. 133 illustrates the emission spectrum of AB15 of the phosphor according to the present disclosure having the molecular formula $(Rb_{0.25}Na_{0.5}K_{0.25}) Li_3SiO_4$:Eu$^{2+}$. For measuring the emission spectrum, a powder of the phosphor according to the present disclosure was excited with a primary radiation having a wavelength of 400 nm. The phosphor has a full width at half maximum of 27 nm, a peak wavelength of 480 nm and a dominant wavelength of 490 nm. The color locus is at CIE-x: 0.139 and CIE-y: 0.313. The peak at approximately 530 nm is probably attributable to a contamination by $RbNa(Li_3SiO_4)_2$ or $K_2NaLi(Li_3SiO_4)_4$.

Figure 134:
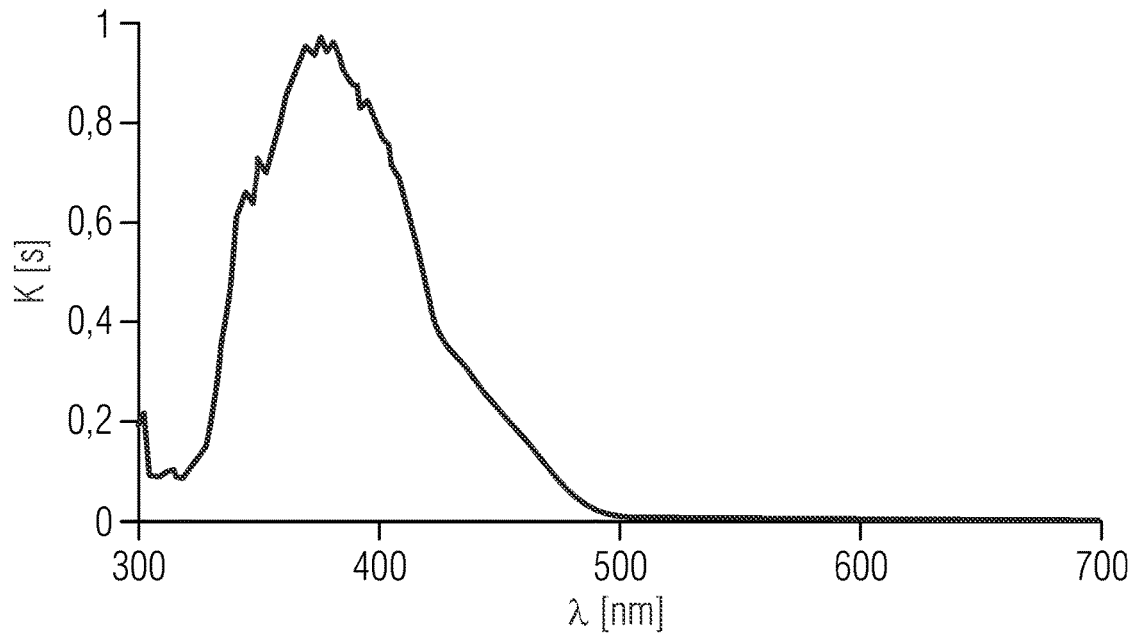

FIG. 134 shows a normalized Kubelka-Munk function (K/S), plotted against the wavelength λ in nm, for AB15. The phosphor can be efficiently excited with a primary radiation in the blue range.

Figure 135:
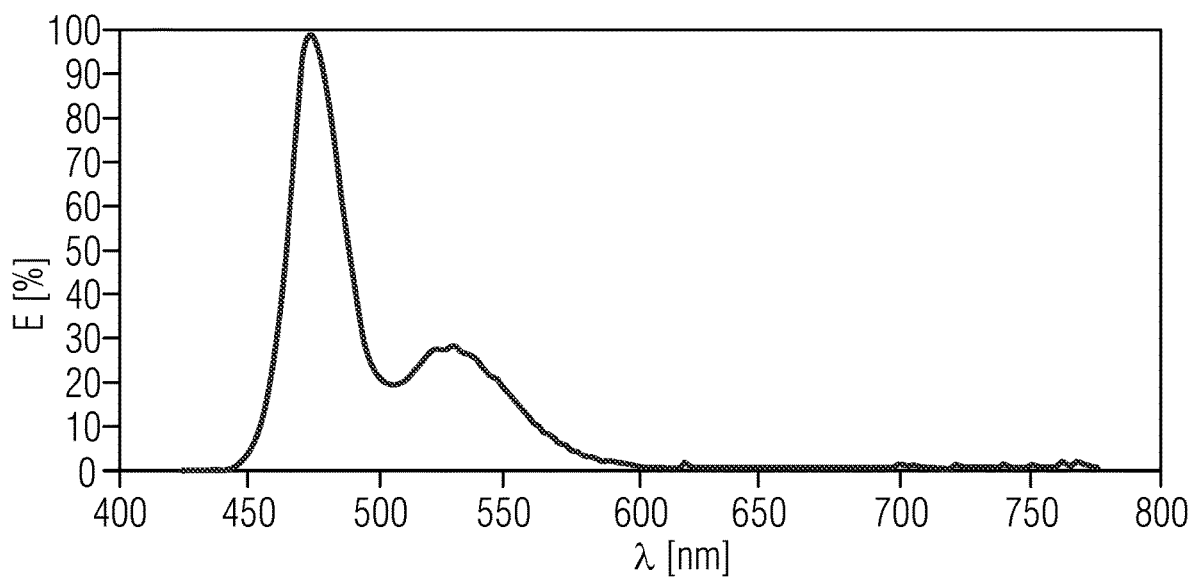

FIG. 135 illustrates the emission spectrum of AB16 of the phosphor according to the present disclosure having the molecular formula $(Cs_{0.25}Na_{0.25}Rb_{0.25}Li_{0.25}) Li_3SiO_4$:Eu$^{2+}$. For measuring the emission spectrum, a powder of the phosphor according to the present disclosure was excited with a primary radiation having a wavelength of 400 nm. The phosphor has a full width at half maximum of 24 nm, a peak wavelength of 473 nm, and a dominant wavelength of 489 nm. The peak at approximately 530 nm is probably attributable to a contamination by $RbNa(Li_3SiO_4)_2$.

The optical properties of AB14, AB15 and AB16 are similar to those of AB9 and AB3.

Figure 136:
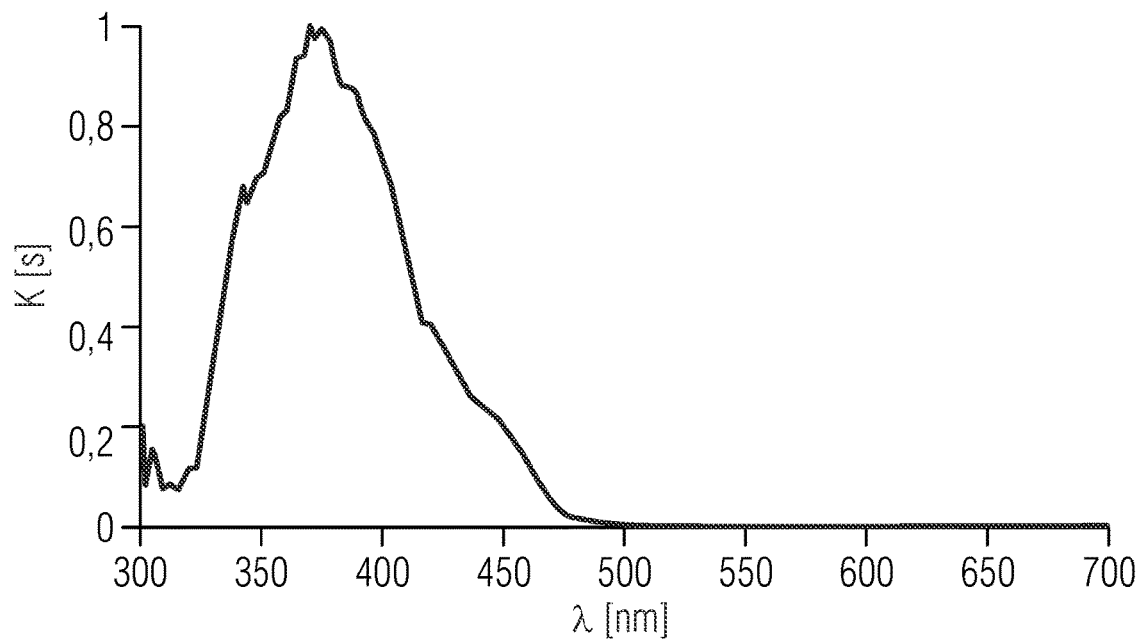

FIG. 136 shows a normalized Kubelka-Munk function (K/S), plotted against the wavelength λ in nm, for AB16. The phosphor can be efficiently excited with a primary radiation in the blue range.

Figure 137:
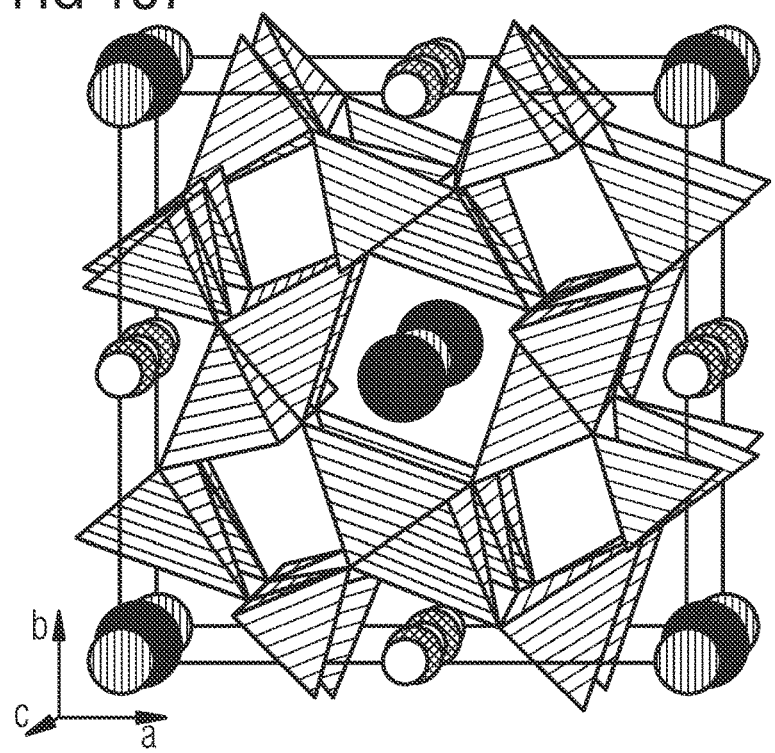

FIG. 137 shows the tetragonal crystal structure of AB13 of the phosphor according to the present disclosure having the molecular formula $(Cs_{0.25}Na_{0.25}K_{0.25}Li_{0.25}) Li_3SiO_4$:Eu$^{2+}$. The black circles represent Cs atoms, the circles enclosing white areas represent Li atoms, the circles with ruled lines represent K atoms and the checked circles represent Na atoms. The crystal structure is similar to the crystal structure of the ninth exemplary embodiment AB9; AB13 crystallizes in the same space group, I4/m. The $(Li_3SiO_4)$ structural units have $SiO_4$ and $LiO_4$ tetrahedra, wherein oxygen occupies the corners and Li and Si, respectively, occupy the center of the tetrahedron. $(Cs_{0.25}Na_{0.25}K_{0.25}Li_{0.25})Li_3SiO_4$:Eu$^{2+}$ contains two types of channels within the $(Li_3SiO_4)$ structural units, wherein one channel is occupied by Na and Li and the other is occupied alternately by Cs and K. The arrangement of Na and Li within one channel corresponds to that of AB7. The exact arrangement of Na and Li within one channel cannot be ascertained by means of X-ray diffraction.

Figure 138:
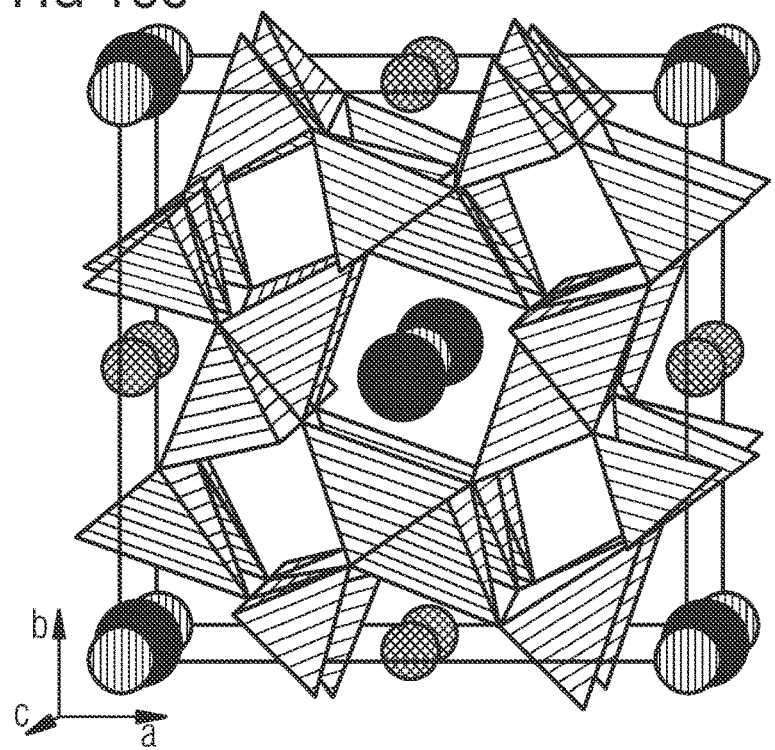

FIG. 138 shows the tetragonal crystal structure of AB14 of the phosphor according to the present disclosure having the molecular formula $(Cs_{0.25}Na_{0.5}K_{0.25})Li_3SiO_4$:$Eu^{2+}$. The black circles represent Cs atoms, the circles with ruled lines represent K atoms and the checked circles represent Na atoms. The crystal structure is similar to the crystal structure of the ninth exemplary embodiment AB9; AB13 crystallizes in the same space group I4/m. The ($Li_3SiO_4$) structural units have $SiO_4$ and $LiO_4$ tetrahedra, wherein oxygen occupies the corners and Li and Si, respectively, occupy the center of the tetrahedron. $(Cs_{0.25}Na_{0.5}K_{0.25})Li_3SiO_4$:$Eu^{2+}$ contains two types of channels within the ($Li_3SiO_4$) structural units, wherein one channel is occupied by Na and the other is occupied alternately by Cs and K.

Figure 139:
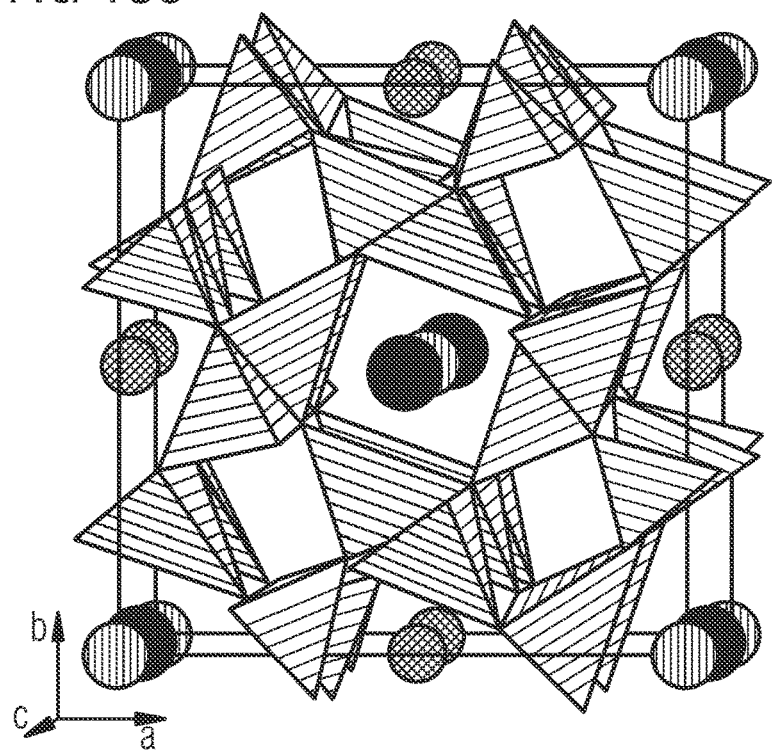

FIG. 139 shows the tetragonal crystal structure of AB15 of the phosphor according to the present disclosure having the molecular formula $(Rb_{0.25}Na_{0.5}K_{0.25})Li_3SiO_4$:$Eu^{2+}$. The black circles represent Rb atoms, the circles with ruled lines represent K atoms and checked circles represent Na atoms. The crystal structure is isostructural with respect to that of AB14, wherein the positions of the Cs atoms are occupied by Rb atoms.

Figure 140:
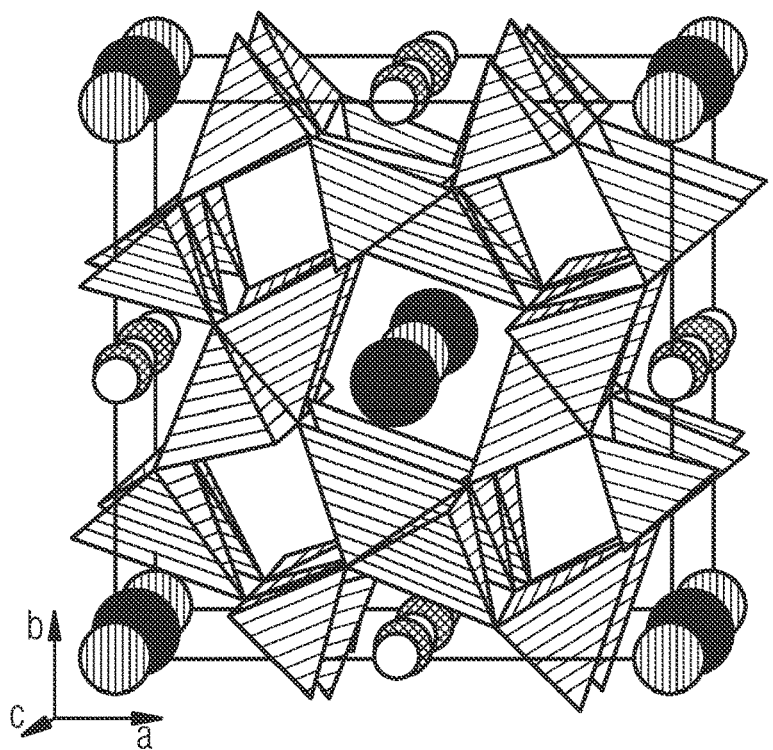
Figure 141:
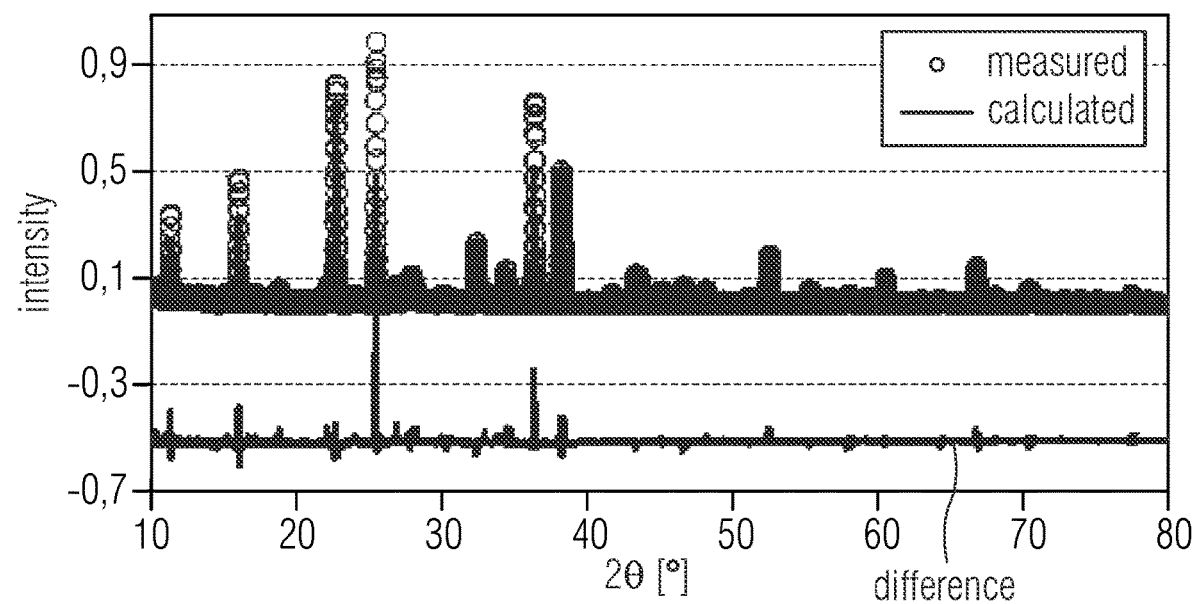
Figure 142:
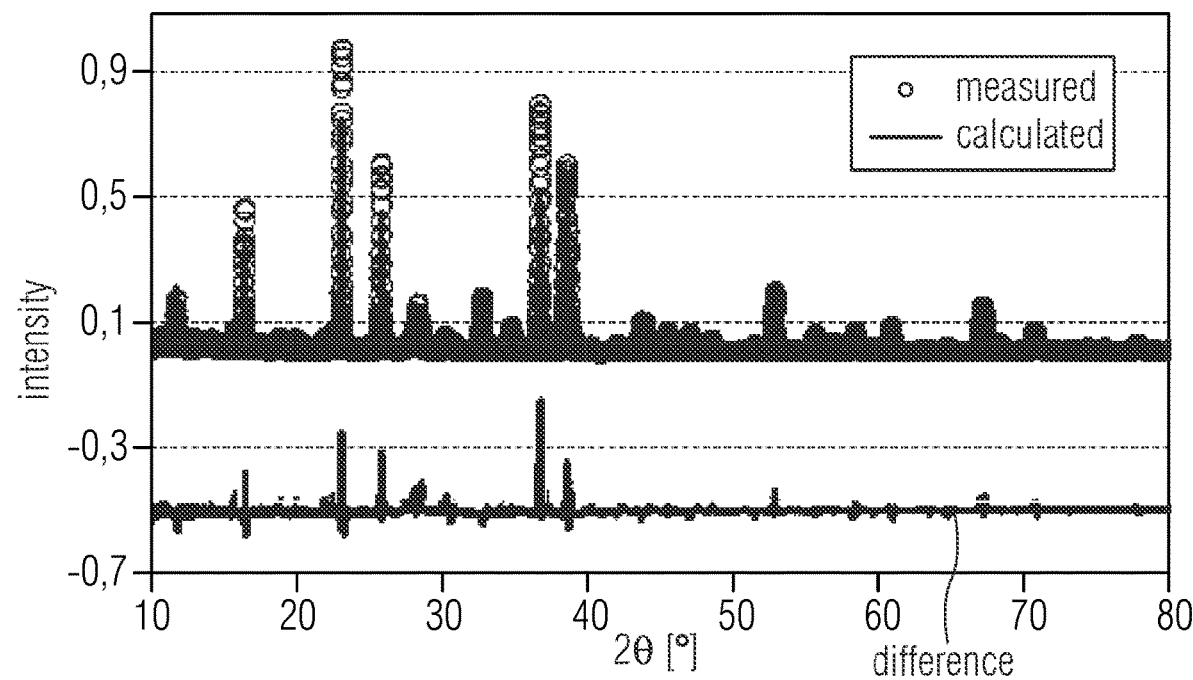
Figure 143:
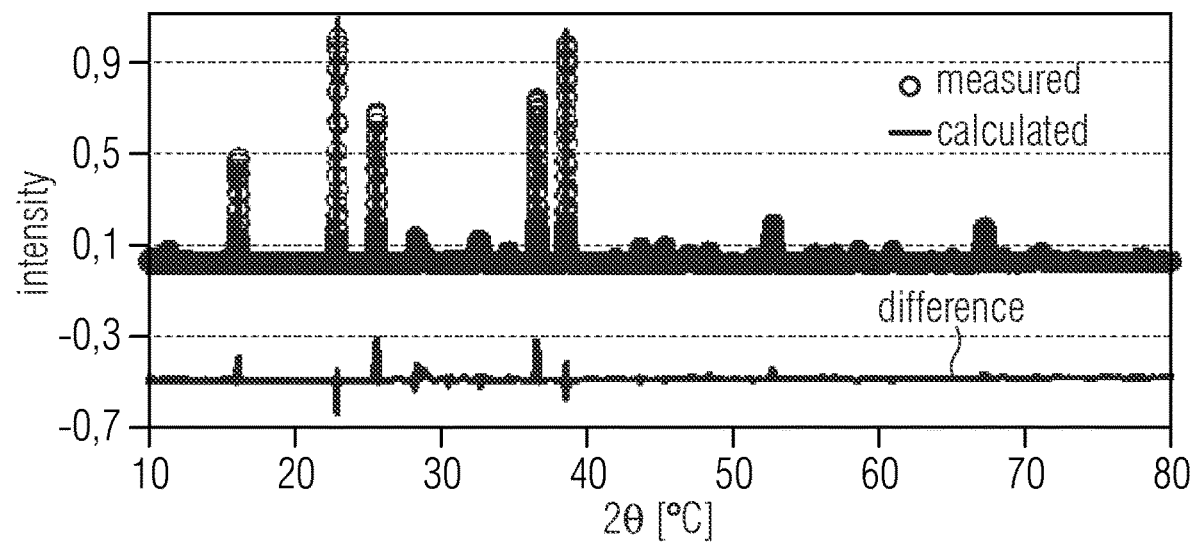

FIG. 140 shows the tetragonal crystal structure of AB16 of the phosphor according to the present disclosure having the molecular formula $(Cs_{0.25}Na_{0.25}Rb_{0.25}Li_{0.25})$ $Li_3SiO_4$:$Eu^{2+}$. The black circles represent Cs atoms, the circles with ruled lines represent Rb atoms, the checked circles represent Na atoms and the white circles represent Li atoms. The crystal structure is isostructural with respect to that of AB13, wherein the positions of the K atoms are occupied by Rb atoms.

Figure 144:
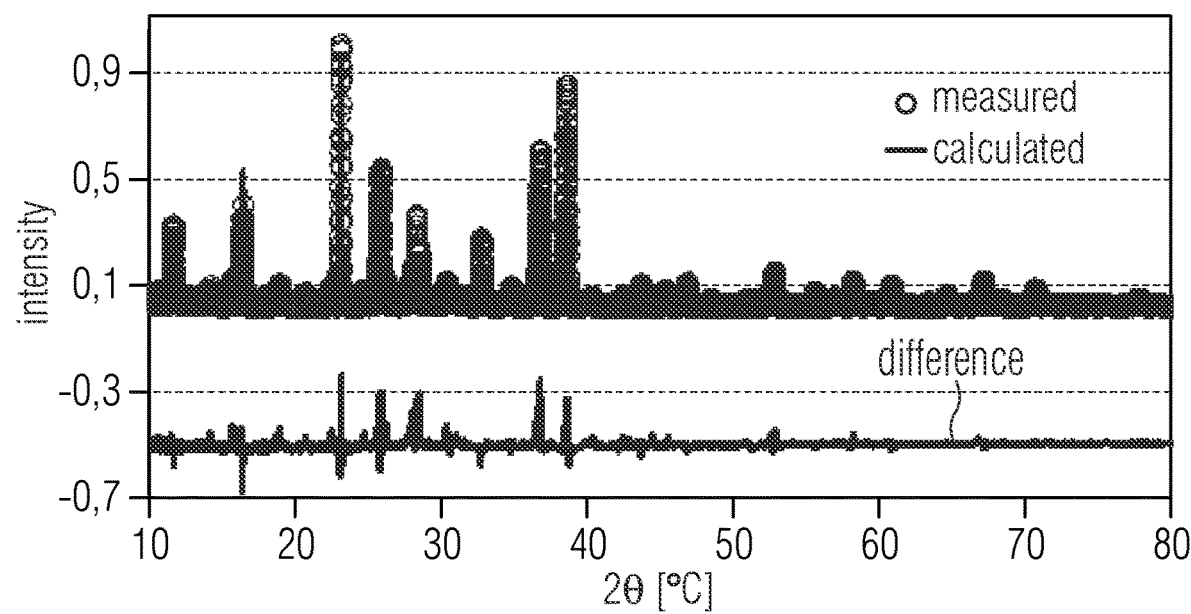

FIGS. 141-144 each show a Rietveld refinement of the X-ray powder diffractogram of AB13 (FIG. 141), of AB14 (FIG. 142), of AB15 (FIG. 143) and of AB16 (FIG. 144). The diagram illustrates the superimposition of the measured reflections with the calculated reflections, and also the differences between the measured and calculated reflections.

FIG. 145 shows crystallographic data and FIG. 146 shows atomic positions of AB13.

FIG. 147 shows crystallographic data and FIG. 148 shows atomic positions of AB14.

FIG. 149 shows crystallographic data and FIG. 150 shows atomic positions of AB15.

Figures 152A, 152B:
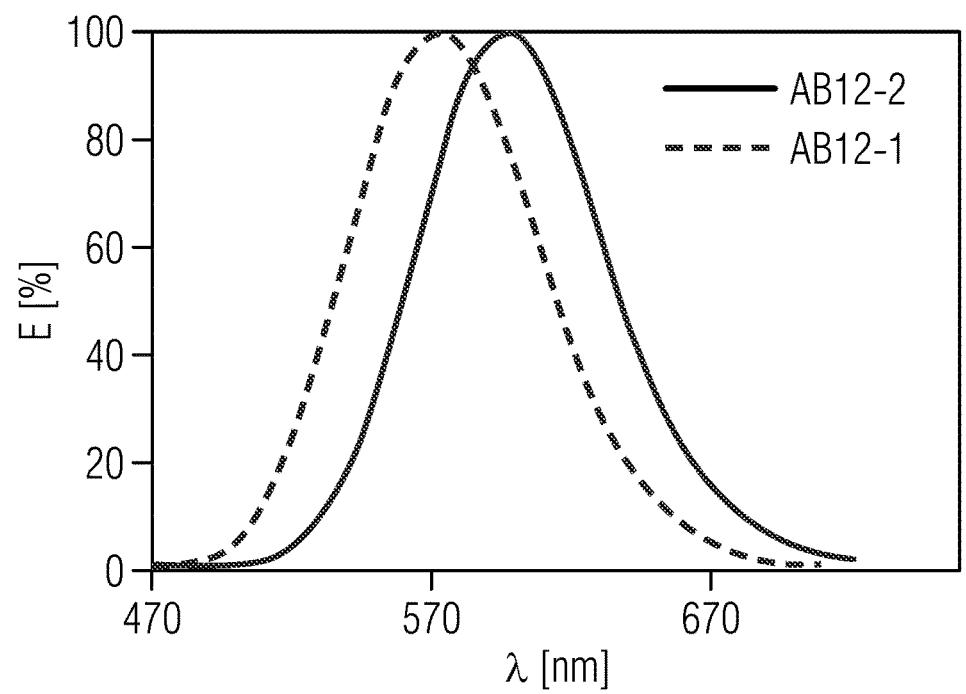

FIG. 151 shows crystallographic data and FIG. 152a shows atomic positions of AB16.

FIG. 152b shows the emission spectrum of single crystals of the phosphors AB12-1 and AB12-2 of the phosphor according to the present disclosure having the molecular formulae $SrLi_{3-2x^{}}Al_{1+2x^{}}O_{4-4x^{}}N_{4x^{}}$:$Eu^{2+}$ where $x^{}=0.125$ (AB12-1) and $x^{}=0.1375$ (AB12-2). The optical properties are shown in FIG. 153.

Figures 153, 154, 155:
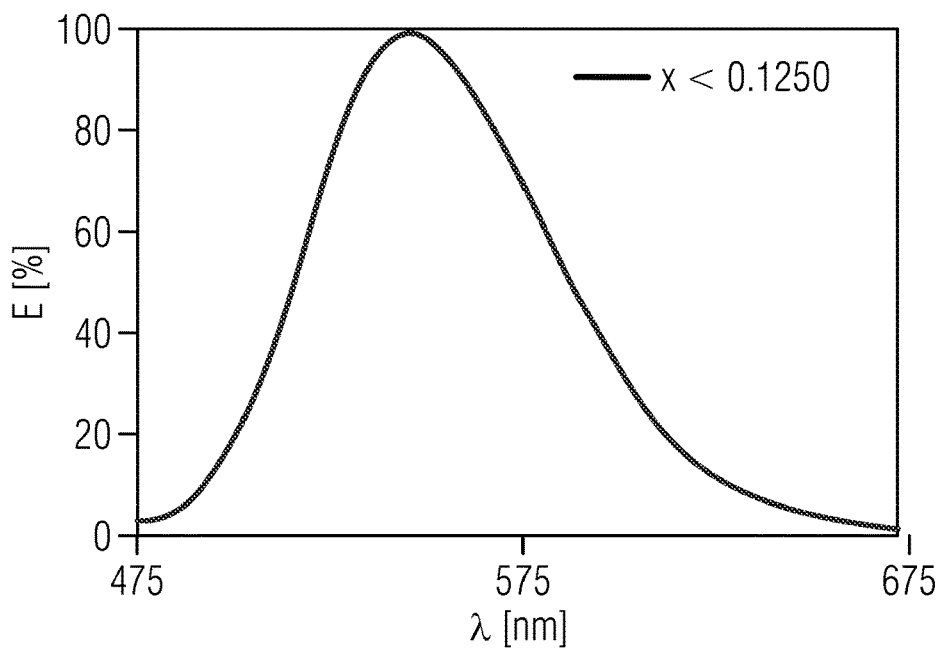

FIG. 154 shows the emission spectrum of a single crystal of the phosphor $SrLi_{3-2x^{}}Al_{1+2x^{}}O_{4-4x^{}}N_{4x^{}}$:$Eu^{2+}$ where $x^{}<0.125$. The phosphors $SrLi_{3-2x^{}}Al_{1+2x^{}}O_{4-4x^{}}N_{4x^{}}$:$Eu^{2+}$ where $x^{}<0.125$ have a smaller full width at half maximum than phosphors where $x^{}\geq 0.125$. The optical properties are shown in FIG. 155. The crystal structure of phosphors of the formula $SrLi_{3-2x^{}}Al_{1+2x^{}}O_{4-4x^{}}N_{4x^{}}$:$Eu^{2+}$ where $x^{}<0.125$ is related to the $UCr_4C_4$ structure type, although reflections in single crystal diffraction data indicate a higher degree of ordering. This results in a crystal structure having a higher degree of ordering that is derived from the $UCr_4C_4$ structure type. Surprisingly, phosphors having a higher oxygen content exhibit a higher degree of ordering within the crystal structure. The smaller full width at half maximum is attributable to the higher degree of ordering of the crystal structure.

Figures 156, 157:
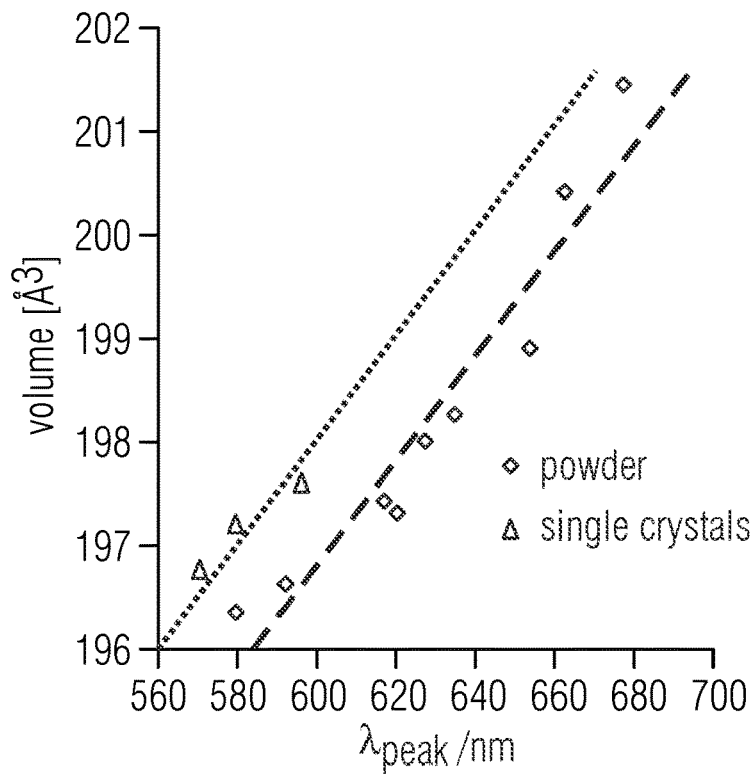
FIGS. 156 and 157 show the dependence of the peak wavelength on the cell volume of a unit cell.

FIG. 156 illustrates the peak wavelength λpeak in nm plotted against the cell volume of the unit cell of the crystal structure of phosphors of the formula $SrLi_{3-2x^{}}Al_{1+2x^{}}O_{4-4x^{}}N_{4x^{}}$:$Eu$ where $x^{}\geq 0.1250$ for powders and single crystals of $SrLi_{3-2x^{}}Al_{1+2x^{}}O_{4-4x^{}}N_{4x^{}}$:$Eu$ having different proportions of $x^{}$. The differences in the peak wavelengths in the measurement of powders and single crystals are caused by reabsorption effects in the powder measurement, which can lead to a long-wave shift in the observed peak wavelength. The peak wavelengths can be adjusted by adapting the cell volume of the unit cell. As $x^{}$ rises, the cell volume of the unit cell increases and at the same time the peak wavelength is shifted into the longer-wavelength range. Advantageously, by varying $x^{}\geq 0.125$, it is possible for the peak wavelength to be shifted from the green into the red spectral range. The peak wavelengths and cell volumes (V) for various proportions $x^{}$ are shown in FIG. 157. As a result, the phosphor of the general molecular formula $SrLi_{3-2x^{}}Al_{1+2x^{}}O_{4-4x^{}}N_{4x^{**}}$:$Eu$ is interesting for very many applications. In particular, it is possible to provide phosphors which have peak wavelengths between those of the yellow-emitting $Y_3Al_5O_{12}$:Ce, of the orange-red-emitting $(Ca, Sr,Ba)_2Si_5N_8$:Eu and of the red-emitting (Sr,Ca) $SiAlN_3$:Eu.

FIG. 158 shows crystallographic data of single crystals of the phosphors AB12-1 and AB12-2 of the phosphor according to the present disclosure having the molecular formulae $SrLi_{3-2x^{}}Al_{1+2x^{}}O_{4-4x^{}}N_{4x^{}}$:$Eu^{2+}$ where $x^{}=0.125$ (AB12-1) and $x^{}=0.1375$ (AB12-2).

FIG. 159 shows atomic positions in the structure of $SrLi_{3-2x^{}}Al_{1+2x^{}}O_{4-4x^{}}N_{4x^{}}$:$Eu^{2+}$ for AB12-2.

FIG. 161 illustrates the emission spectrum of AB17 of the phosphor according to the present disclosure having the molecular formula $Na_{0.125}K_{0.875}Li_3SiO_4$:Eu. For measuring the emission spectrum, a single crystal of the phosphor according to the present disclosure was excited with a primary radiation having a wavelength of 460 nm. The curves designated by Peak1 and Peak2 represent two Gaussian curves for describing the total emission with two emission peaks. The measured curve is congruent with the sum of the two Gaussian curves as calculated curve. The wavelength of the emission peak having the highest intensity is referred to as peak wavelength. The wavelength of the emission peak having lower intensity is referred to as relative emission maximum. The data resulting from the spectrum are summarized in FIG. 162.

FIG. 163 shows the emission spectrum of three embodiments of the phosphor according to the present disclosure $(Na_rK_{1-r})_1Li_3SiO_4$:Eu where $0.05<r<0.2$ with different proportions r. These also exhibit a wide emission.

FIG. 164 shows an overview of simulated optical data of conversion LEDs. A blue-emitting semiconductor chip based on InGaN is used as primary radiation source; the peak wavelength of the primary radiation is 438 nm or 443 nm. The phosphors used for converting the primary radiation are AB17 and $(Lu,Y)_3Al_5O_{12}$:Ce. The comparative examples are identified by Comp1, Comp2 and Comp3 and the embodiments according to the present disclosure by AB17-LED1 and AB17-LED2. For all the conversion LEDs, the overall radiation of the conversion LEDs results from a superimposition of the primary and secondary radiations. The color loci of the overall radiation all lie in the cold-white range with color temperatures of more than 8000 K close to the locus of the Planckian radiator. Surprisingly, the embodiments according to the present disclosure have a high color rendering index where CRI>80 and R9>50, while the comparative examples only have a CRI<70 and R9<0. This is attributable to the wide emission of the phosphor AB17 from the green to the red spectral range. The phosphor $(Na_rK_{1-r})_1(TA)_3(TD)_1(XB)_4$:Eu where 0.05<r<0.2, in particular $(Na_rK_{1-r})_1Li_3SiO_4$:Eu, is thus suitable in particular for conversion LEDs for general lighting. The phosphor can advantageously be used as sole phosphor in a conversion LED for general lighting.

Figure 165:
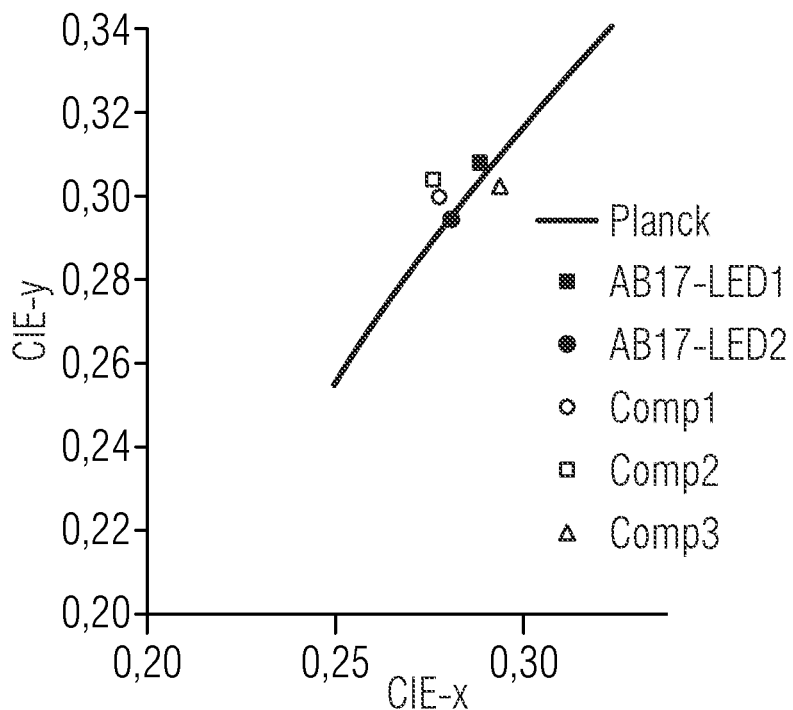

FIG. 165 illustrates the color loci of the overall radiation of the conversion LEDs from FIG. 164. As is evident, the color loci are all situated close to the color loci of the Planckian radiator.

Figure 166:
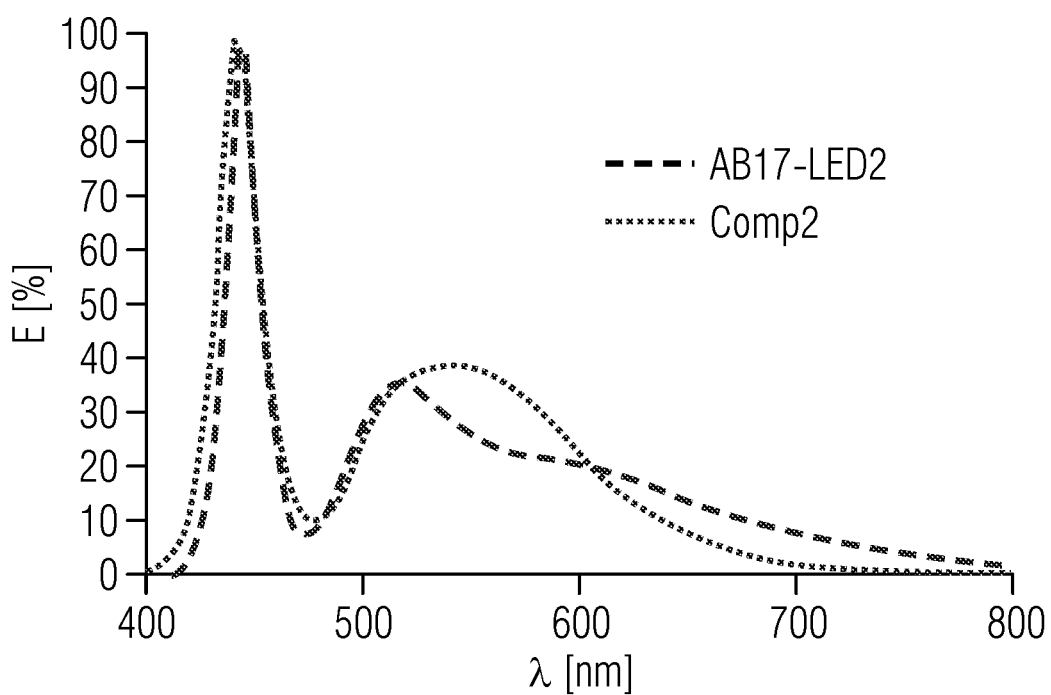

FIG. 166 illustrates emission spectra of the conversion LEDs AB17-LED2 and Comp2 from FIG. 164.

FIG. 167 shows an overview of simulated optical data of conversion LEDs. A blue-emitting semiconductor chip based on InGaN is used as primary radiation source; the peak wavelength is 443 nm, 446 nm or 433 nm. The phosphors used for converting the primary radiation are AB17 and $Lu_3Al_5O_{12}$:Ce. The comparative examples are identified by Comp4 and Comp5 and the embodiments according to the present disclosure are identified by AB17-LED3, AB17-LED4 and AB17-LED5. In the embodiments according to the present disclosure, only AB17 is used as phosphor, while in the comparative examples, a second, red-emitting phosphor $CaAlSiN_3$:Eu is used alongside $Lu_3Al_5O_{12}$:Ce. Surprisingly, the overall radiation of the embodiments according to the present disclosure has a very large overlap with the transmission range of standard filters and filters for larger color spaces (HCG, High Color Gamut), such that only little light is lost and the achievable color space is as large as possible. As is evident, with the embodiments according to the present disclosure having only one phosphor, it is possible to obtain a high, in some instances greater coverage of the colors of the sRBG color space than with the comparative examples in which two phosphors are used. The phosphor $(Na_rK_{1-r})_1(TA)_3(TD)_1(XB)_4$:Eu where 0.05<r≤0.2, in particular $(Na_rK_{1-r})_1Li_3SiO_4$:Eu, is thus suitable in particular for conversion LEDs for backlighting applications. The phosphor can advantageously be used as sole phosphor in a conversion LED for backlighting applications.

FIG. 168 illustrates emission spectra of the conversion LEDs AB17-LED5 and Comp5 from FIG. 167.

Figure 169:
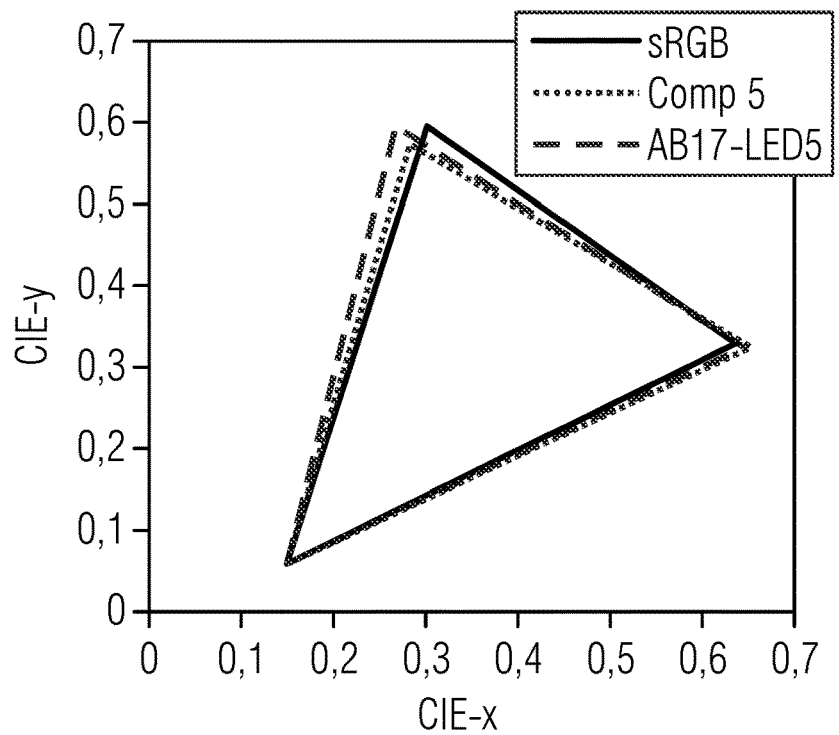
FIGS. 169 and 170 show spanned color spaces of the filtered overall radiation of various conversion LEDs.
Figure 170:
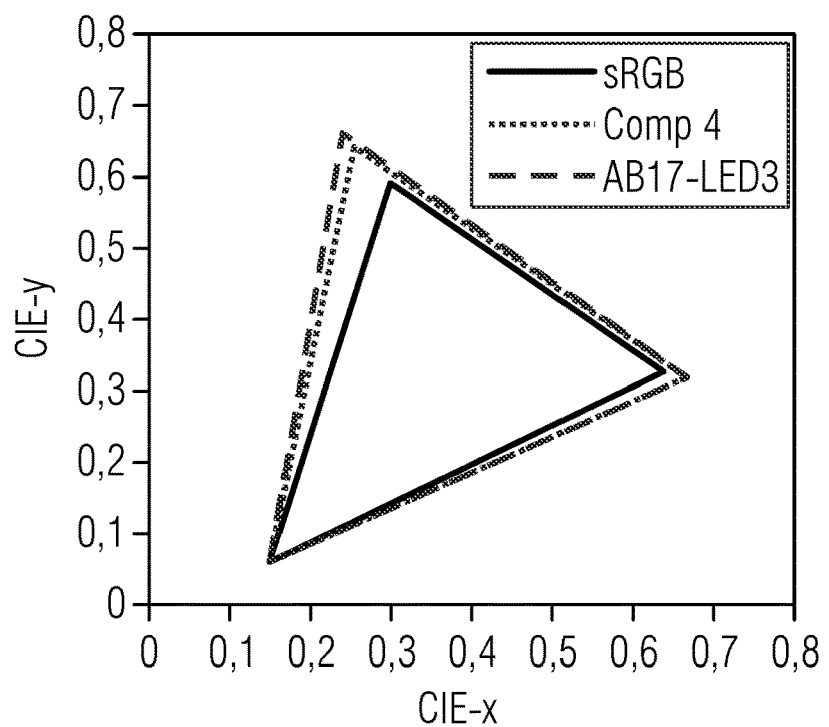

FIGS. 169 and 170 show the spanned color spaces of the filtered overall radiation of various conversion LEDs from FIG. 167 and the overlap thereof with the sRGB color space. It is evident that a large bandwidth of colors can be rendered with the exemplary embodiments AB17-LED3 and AB17-LED5; primarily in the green corner of the spanned color triangle it is possible to attain more colors than with the exemplary embodiments.

Figure 171:
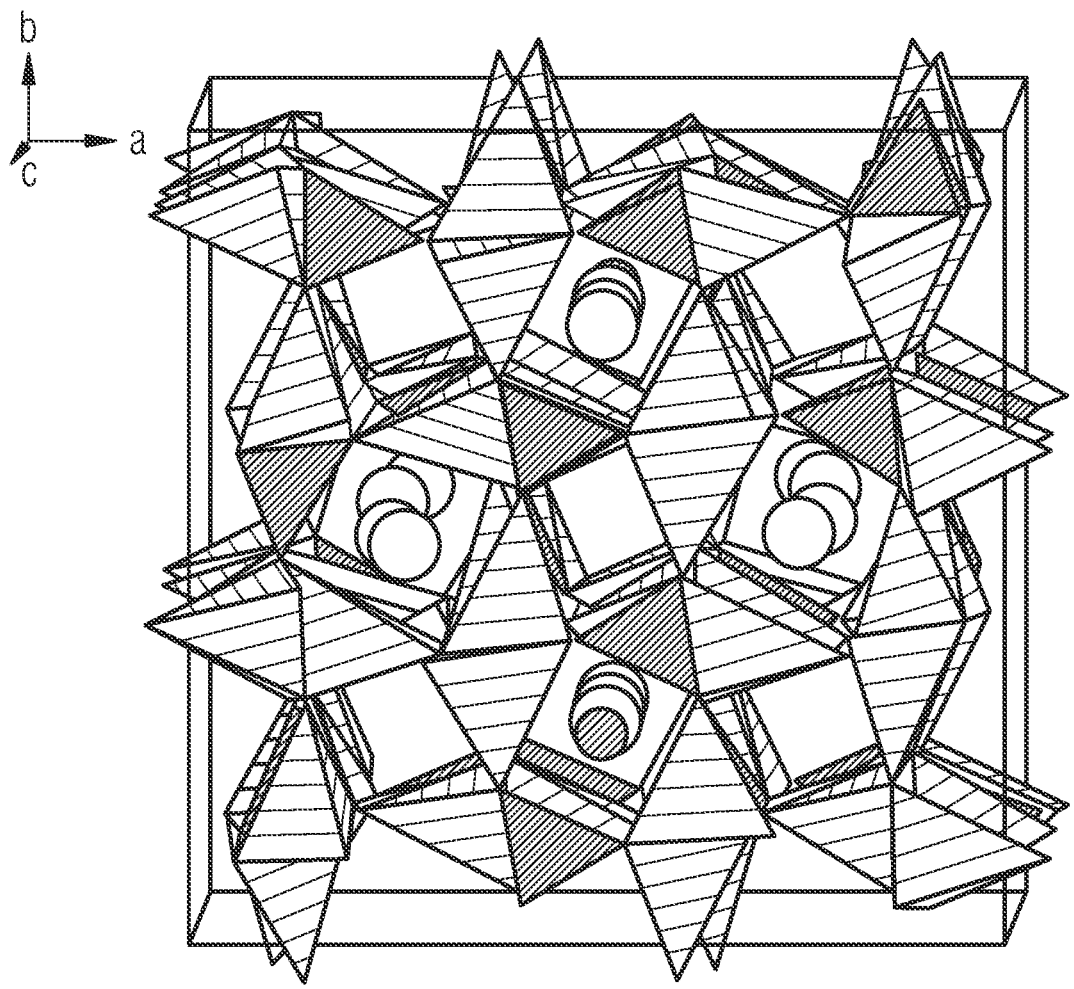

FIG. 171 shows a unit cell of the tetragonal crystal structure of the phosphor $Na_{0.125}K_{0.875}Li_3SiO_4$:Eu (AB17) in a schematic illustration along the crystallographic c-axis. The closely hatched circles represent Na atoms and the white circles represent K atoms. The hatched regions represent $LiO_4$ tetrahedra, and the closely hatched regions represent $SiO_4$ tetrahedra. The $LiO_4$ and $SiO_4$ tetrahedra are corner- and edge-linked and form channels in which the Na and K atoms are arranged. The crystal structure is related to the crystal structure of AB3, AB7, AB8, AB9, AB13, AB14, AB15 and AB16.

Figure 172:
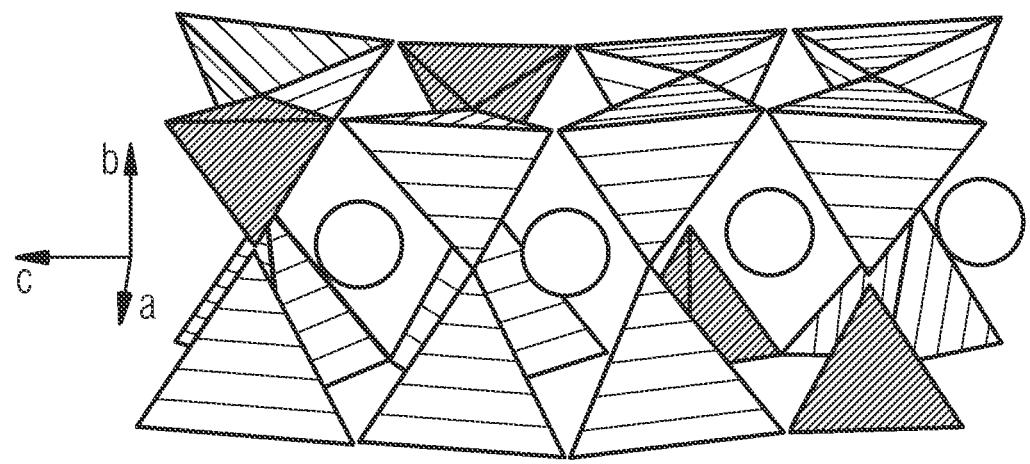
Figure 173:
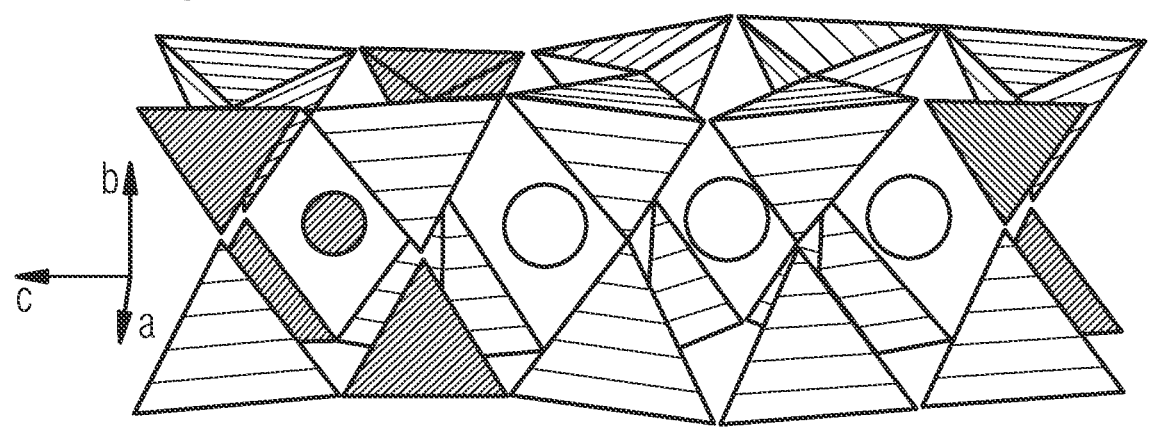

In particular, two types of channels are contained in the crystal structure. Exclusively K atoms are arranged in the first channels, while Na and K atoms are arranged in the other channels. $SiO_4$ tetrahedra (closely hatched) are arranged in the form of a helix (FIG. 172) around the channels in which exclusively K atoms are arranged. The Na atoms (closely hatched circles), within the channels in which Na and K atoms are arranged, are surrounded by $SiO_4$ tetrahedra in distorted tetrahedral fashion (black regions; FIG. 173). FIG. 172 shows the channel containing only K atoms. FIG. 173 shows the channel containing K atoms and Na atoms. The sequence of the arrangement of the K atoms and Na atoms within the channel is NaKKKNaKKK. The illustrations of the excerpts from the crystal structure in FIGS. 172 and 173 are perpendicular to the crystallographic c-axis.

FIG. 174 shows crystallographic data of $Na_{0.125}K_{0.875}Li_3SiO_4$:Eu (AB17).

FIG. 175 shows atomic positions in the structure of $Na_{0.125}K_{0.75}Li_3SiO_4$:Eu (AB17).

FIG. 176 shows anisotropic displacement parameters of $Na_{0.125}K_{0.875}Li_3SiO_4$:Eu (AB17).

Figure 177:
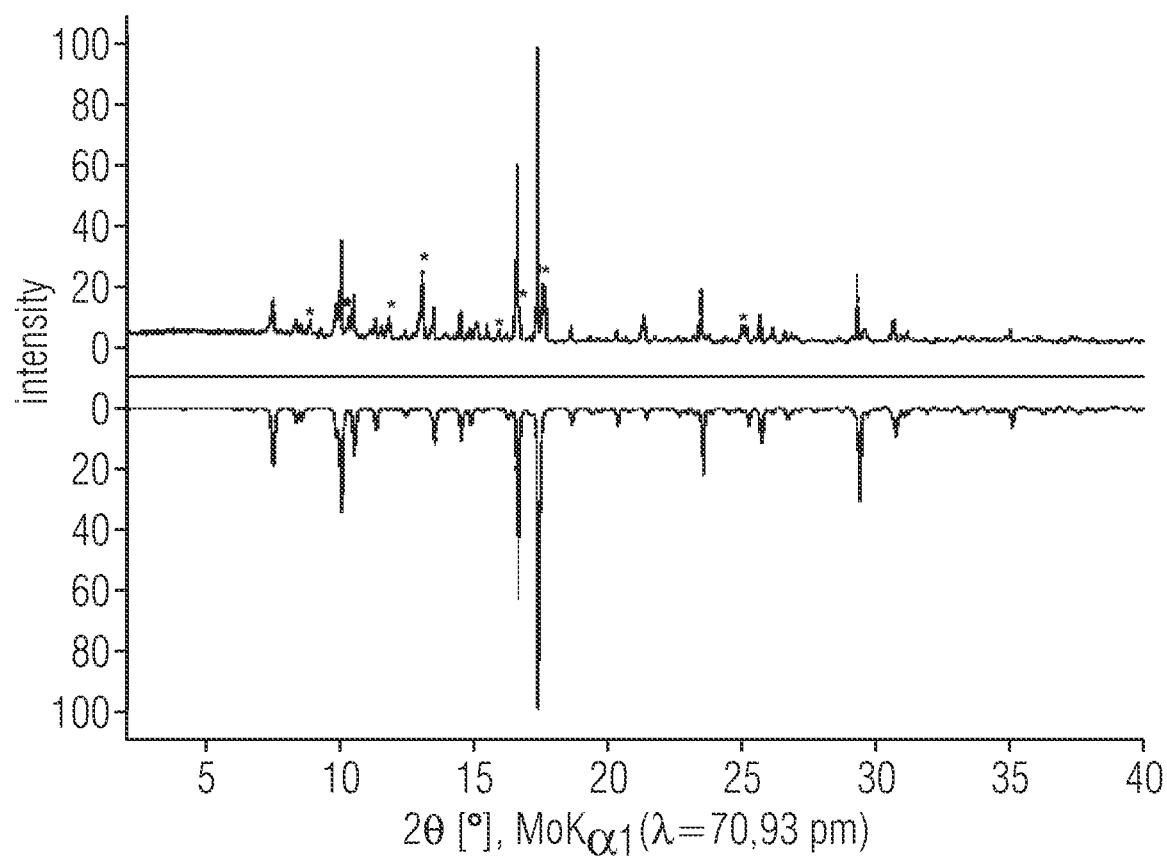

FIG. 177 shows a crystallographic evaluation of the X-ray powder diffractogram of the seventeenth exemplary embodiment AB17. The diagram illustrates a comparison of the measured reflections with the calculated reflections for $Na_{0.125}K_{0.875}Li_3SiO_4$:Eu. The upper part of the diagram shows the experimentally observed reflections (Mo $K_{\alpha 1}$ radiation); the lower part of the diagram shows the calculated reflection positions. The calculation was made on the basis of the structure model for $Na_{0.125}K_{0.875}Li_3SiO_4$:Eu, as described in FIGS. 171-176. Reflections of secondary phases are identified by *. The correspondence of the reflections of the calculated powder diffractogram to the reflections of the measured powder diffractogram reveals a correspondence of the crystal structure of single crystals and powders of the phosphor.

Figure 178:
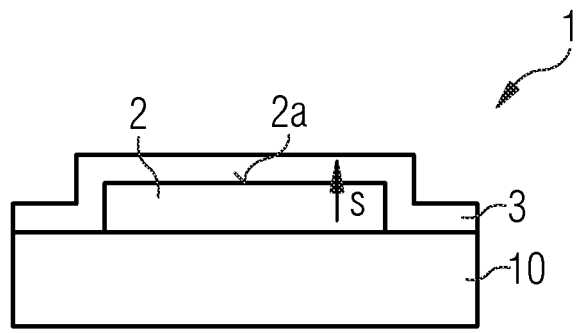
FIGS. 178 to 180 show schematic side views of various embodiments of conversion LEDs described here.

The conversion LED in accordance with FIG. 178 has a layer sequence 2 arranged on a substrate 10. The substrate 10 can be configured in reflective fashion, for example. A conversion element 3 in the form of a layer is arranged above the layer sequence 2. The layer sequence 2 has an active layer (not shown), which emits a primary radiation having a wavelength of 300 to 500 nm during operation of the conversion LED. The conversion element is arranged in the beam path of the primary radiation S. The conversion element 3 comprises a matrix material such as, for example, a silicone and particles of the phosphor $(Rb_{0.5}Li_{0.5})Li_3SiO_4$: Eu having an average grain size of 10 µm, which at least partly converts the primary radiation into a secondary radiation in the green range of the electromagnetic spectrum during operation of the conversion LED. The phosphor is distributed homogeneously in the matrix material in the conversion element 3 within the scope of production tolerance. The conversion element 3 is applied over the whole area above the radiation exit surface 2a of the layer sequence 2 and above the side surfaces of the layer sequence 2 and is in direct mechanical contact with the radiation exit surface 2a of the layer sequence 2 and the side surfaces of the layer sequence 2. The primary radiation can also emerge via the side surfaces of the layer sequence 2.

The conversion element 3 can be applied for example by injection molding, transfer molding or by spray coating methods. Moreover, the conversion LED has electrical contacts (not shown), the formation and arrangement of which are known to the person skilled in the art.

Figure 179:
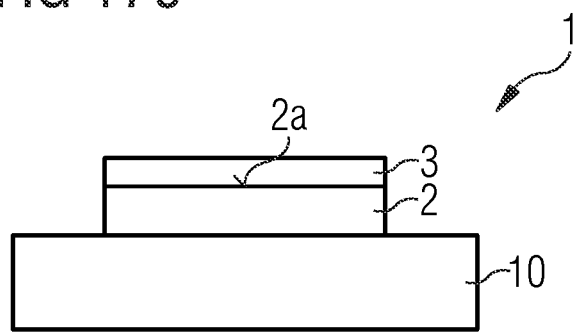

FIG. 179 shows a further exemplary embodiment of a conversion LED 1. In comparison with FIG. 68, the conversion element 3 is shaped as a lamina. The lamina can consist of sintered-together particles of the phosphor and can thus be a ceramic lamina, or the lamina comprises, for example, glass, silicone, an epoxy resin, a polysilazane, a polymethacrylate or a polycarbonate as matrix material with particles of the phosphor embedded therein. The conversion element 3 is applied over the whole area above the radiation exit surface 2a of the layer sequence 2. In particular, primary radiation does not emerge via the side surfaces of the layer sequence 2, but rather predominantly via the radiation exit surface 2a. The conversion element 3 can be applied on the layer sequence 2 by way of an adhesion layer (not shown), for example composed of silicone.

Figure 180:
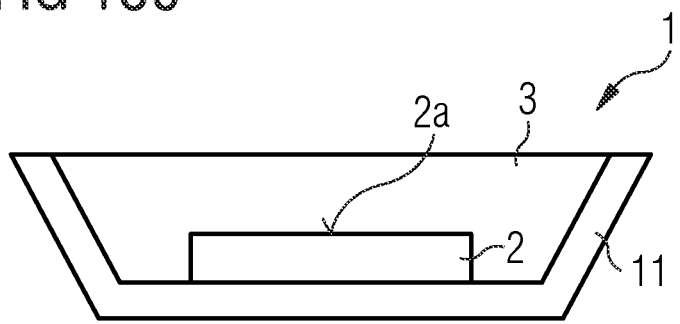

The conversion LED 1 in accordance with FIG. 180 comprises a housing 11 having a cutout. A layer sequence 2 is arranged in the cutout, said layer sequence having an active layer (not shown), which emits a primary radiation having a wavelength of 300 to 460 nm during operation of the conversion LED. The conversion element 3 is shaped as potting of the layer sequence 2 in the cutout and comprises a matrix material such as, for example, a silicone and a phosphor, for example $KLi_3SiO_4$:Eu, which at least partly converts the primary radiation into a secondary radiation that gives a white-colored luminous impression during operation of the conversion LED 1. It is also possible for the phosphor to be concentrated in the conversion element 3 spatially above the radiation exit surface 2a. This can be achieved by sedimentation, for example.

The present disclosure is not restricted to the exemplary embodiments by the description on the basis of said exemplary embodiments. Rather, the present disclosure encompasses any novel feature and also any combination of features, which in particular includes any combination of features in the patent claims, even if this feature or this combination itself is not explicitly specified in the patent claims or exemplary embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The following exemplary embodiments pertain to further aspects of this disclosure:

Embodiment 1 is a lighting device comprising a phosphor having the general molecular formula $(MA)_a(MB)_b(MC)_c(MD)_d(TA)_e(TB)_f(TC)_g(TD)_h(TE)_i(TF)_j(XA)_k(XB)_l(XC)_m(XD)_n$:E, wherein
  MA is selected from a group of monovalent metals which comprises Li, Na, K, Rb, Cs, Cu, Ag and combinations thereof,
  MB is selected from a group of divalent metals which comprises Mg, Ca, Sr, Ba, Zn, Mn, Eu, Yb, Ni, Fe, Co and combinations thereof,
  MC is selected from a group of trivalent metals which comprises Y, Fe, Cr, Sc, In, rare earth metals and combinations thereof,
  MD is selected from a group of tetravalent metals which comprises Zr, Hf, Mn, Ce and combinations thereof,
  TA is selected from the group of monovalent metals which comprises Li, Na, Cu, Ag and combinations thereof,
  TB is selected from a group of divalent metals which comprises Mg, Zn, Mn, Eu, Yb, Ni and combinations thereof,
  TC is selected from a group of trivalent metals which comprises B, Al, Ga, In, Y, Fe, Cr, Sc, rear earth metals and combinations thereof,
  TD is selected from a group of tetravalent metals which comprises Si, Ge, Sn, Mn, Ti, Zr, Hf, Ce and combinations thereof,
  TE is selected from a group of pentavalent elements which comprises P, Ta, Nb, V and combinations thereof,
  TF is selected from a group of hexavalent elements which comprises W, Mo and combinations thereof,
  XA is selected from a group of elements which comprises F, Cl, Br and combinations thereof,
  XB is selected from a group of elements which comprises O, S and combinations thereof,
  XC=N,
  XD=C,
  E=Eu, Ce, Yb and/or Mn,
  $a+b+c+d=t$
  $e+f+g+h+i+j=u$
  $k+l+m+n=v$
  $a+2b+3c+4d+e+2f+3g+4h+5i+6j-k-2l-3m-4n=w$
  $0.8 \leq t \leq 1$
  $3.5 \leq u \leq 4$
  $3.5 \leq v \leq 4$
  $(-0.2) \leq w \leq 0.2$ and
  $0 \leq m < 0.875$ v and/or $v \geq l > 0.125$ v.

Embodiment 2 is the lighting device according to embodiment 1, wherein the phosphor has a crystal structure in which TA, TB, TC, TD, TE and/or TF are surrounded by XA, XB, XC and/or XD, and the resultant structural units are linked via common corners and edges to form a three-dimensional spatial network having cavities or channels and MA, MB, MC and/or MD are/is arranged in the cavities or channels.

Embodiment 3 is the lighting device according to embodiment 1 or 2, wherein the phosphor has the following general molecular formula:

$(MA)_a(MB)_b(TA)_e(TB)_f(TC)_g(TD)_h(XB)_l(XC)_m$, wherein
  MA is selected from a group of monovalent metals which comprises Li, Na, K, Rb, Cs, Cu, Ag and combinations thereof,
  MB is selected from a group of divalent metals which comprises Mg, Ca, Sr, Ba, Zn, Mn, Eu, Yb, Ni, Fe, Co and combinations thereof,
  TA is selected from a group of monovalent metals which comprises Li, Na, Cu, Ag and combinations thereof,
  TB is selected from a group of divalent metals which comprises Mg, Zn, Mn, Eu, Yb, Ni and combinations thereof,
  TC is selected from a group of trivalent metals which comprises B, Al, Ga, In, Y, Fe, Cr, Sc, rare earths and combinations thereof,
  TD is selected from a group of tetravalent metals which comprises Si, Ge, Sn, Mn, Ti, Zr, Hf, Ce and combinations thereof,
  XB is selected from a group of elements which comprises O, S and combinations thereof,
  XC=N
  $a+b=t$ $e+f+g+h=u$ $l+m=v$ $a+2b+e+2f+3g+4h-2l-3m=w$ $0.8 \leq t \leq 1$ $3.5 \leq u \leq 4$ $3.5 \leq v \leq 4$ $(-0.2) \leq w \leq 0.2$ and $0 < m < 0.875$ v and/or $v \geq l > 0.125$ v.

Embodiment 4 is the lighting device according to embodiment 3, wherein

MA is selected from a group of monovalent metals which comprises Li, Na, K, Rb, Cs and combinations thereof, MB is selected from a group of divalent metals which comprises Mg, Ca, Sr, Ba, Eu and combinations thereof, TA is selected from a group of monovalent metals which comprises Li, Na, Cu, Ag and combinations thereof, TB is selected from a group of divalent metals which comprises Eu, TC is selected from a group of trivalent metals which comprises B, Al, Ga, In and combinations thereof, TD is selected from a group of tetravalent metals which comprises Si, Ge, Sn, Mn, Ti and combinations thereof,

XB=O.

Embodiment 5 is the lighting device according to any of embodiments 1 to 4, wherein the lighting device is a conversion light-emitting diode (1), comprising a primary radiation source (2) configured to emit an electromagnetic primary radiation during operation of the diode, a conversion element (3) comprising the phosphor, said conversion element being arranged in the beam path of the electromagnetic primary radiation, wherein the phosphor is configured at least partly to convert the electromagnetic primary radiation into an electromagnetic secondary radiation during operation of the lighting device.

Embodiment 6 is the lighting device according to any of embodiments 1 to 5, wherein the following hold true for the phosphor:

$a+b+c+d=1$ $e+f+g+h+i+j=4$ $k+l+m+n=4$ $a+2b+3c+4d+e+2f+3g+4h+5i+6j-k-2l-3m-4n=0$ and $m < 3.5$.

Embodiment 7 is the lighting device according to any of embodiments 1 to 6, wherein the phosphor has one of the following general molecular formulae:

$(MA)Li_{3-x}Si_{1-x}Zn_xAl_xO_4:E$ $(MA)Li_{3-x}Si_{1-x}Mg_xAl_xO_4:E$ $(MA)_{1-x}Ca_xLi_3Si_{1-x}Al_xO_4:E$ $(MA)_{1-x'}Ca_{x'}Li_{3-x''}Si_{1-x''}Mg_{2x''}O_4:E$ $(MA)Li_{3-2z}Mg_{3z}Si_{1-z}O_4:E$ or $(MA)Li_3Si_{1-2z'}Al_zP_zO_4:E$, wherein $0 \leq x \leq 1$, $0 \leq x' \leq 1$, $0 \leq x'' \leq 1$, $0 \leq z \leq 1$, $0 \leq z' \leq 0.5$ and E is selected from a group which comprises Eu, Ce, Yb, Mn and combinations thereof.

Embodiment 8 is the lighting device according to any of embodiments 1 to 6, wherein the phosphor has one of the following general molecular formulae:

$(MA)_{1-y}Zn_yLi_{3-2y}Al_{3y}Si_{1-y}O_{4-4y}N_{4y}:E$, $(MA)_{1-y^*}Ca_{y^*}Li_{3-2y^*}Al_{3y^*}Si_{1-y^*}O_{4-4y^*}N_{4y^*}:E$, $(MA)_{1-y^{}}Sr_{y^{}}Li_{3-2y^{}}Al_{3y^{}}Si_{1-y^{}}O_{4-4y^{}}N_{4y^{}}:E$ $(MA)_{1-y^{}}Eu_{y^{}}Li_{3-2y^{}}Al_{3y^{}}Si_{1-y^{}}O_{4-4y^{}}N_{4y^{}}:E$ $(MA)Li_{3-y'}Al_{y'}SiO_{4-2y'}N_{2y'}:E$, $(MA)Li_{3-y'}Mg_{y'}SiO_{4-y'}N_{y'}:E$, $(MA)_{1-w'''}Ca_{w'''}Li_3SiO_{4-w'''}N_{w'''}:E$, $(MA)Li_{3-w'}Al_{2w'}Si_{1-w'}O_{4-w'}N_{w'}:E$, $(MA)_{1-w''}Ca_{w''}Li_{3-w''}Si_{1-w''}Al_{2w''}O_{4-2w''}N_{2w''}:E$, wherein $0 < y^* < 0.875$, $0 < y^{} < 0.875$, $0 < y^{*} < 0.875$, $0 \leq y < 0.875$, $0 \leq y' \leq 1.75$, $0 \leq y' \leq 3$, $0 \leq w''' \leq 1$, $0 \leq w' \leq 1$, $0 \leq w'' \leq 1$ and E is selected from a group which comprises Eu, Ce, Yb, Mn and combinations thereof.

Embodiment 9 is the lighting device according to any of embodiments 1 to 6, wherein the phosphor has the following general molecular formula: $(MA)_1(TA)_3(TD)_1(XB)_4:E$, wherein MA is selected from a group of monovalent metals which comprises Li, Na, K, Rb, Cs and combinations thereof, TA=Li TD=Si and XB=O and E is selected from a group which comprises Eu, Ce, Yb, Mn and combinations thereof.

Embodiment 10 is the lighting device according to embodiment 9, wherein the phosphor has the general formula $(Na_rK_{1-r})_1(TA)_3(TD)_1(XB)_4:E, (Rb_{r'}Li_{1-r'})_1(TA)_3(TD)_1(XB)_4:E, (K_{1-r''-r'''}Na_{r''}Li_{r'''})_1(TA)_3(TD)_1(XB)_4:E$ or $(Rb_{r^*}Na_{1-r^*})_1(TA)_3(TD)_1(XB)_4:E$, wherein $0 \leq r \leq 1$, $0 \leq r' \leq 1$, $0 < r'' < 0.5$, $0 < r''' < 0.5$, $0 < r^* < 1$ and E is selected from a group which comprises Eu, Ce, Yb, Mn and combinations thereof.

Embodiment 11 is the lighting device according to embodiment 9, wherein the phosphor has the formula $(Cs,Na,K,Li)_1(TA)_3(TD)_1(XB)_4:E$.

Embodiment 12 is the lighting device according to embodiment 9, wherein the phosphor has the formula $(Na_rK_{1-r})_1(TA)_3(TD)_1(XB)_4:E$ or $(Na_rK_{1-r})Li_3SiO_4:E$, wherein $0.05 < r \leq 0.2$, preferably $0.1 < r \leq 0.2$ and E=Eu, Ce, Yb and/or Mn.

Embodiment 13 is the lighting device according to embodiment 8, wherein the phosphor has the formula $Na_{1-y^*}Ca_{y^*}Li_{3-2y^*}Al_{3y^*}Si_{1-y^*}O_{4-4y^*}N_{4y^*}:E$, wherein $0<y^*<0.875$, preferably $0<y^*\leq0.5$ and E is selected from a group which comprises Eu, Mn, Ce, Yb and combinations thereof.

Embodiment 14 is the lighting device according to embodiment 8, wherein the phosphor has the formula $Na_{1-y^{}}Eu_{y^{}}Li_{3-2y^{}}Al_{3y^{}}Si_{1-y^{}}O_{4-4y^{}}N_{4y^{}}$:E, wherein $0<y^{}<0.875$, preferably $0<y^{**}\leq0.5$ and E is selected from a group which comprises Eu, Mn, Ce, Yb and combinations thereof.

Embodiment 15 is the lighting device according to any of embodiments 1 to 6, wherein the phosphor has the formula $(MB)Li_{3-2x^{}}Al_{1+2x^{}}O_{4-4x^{}}N_{4x^{}}$:E, wherein $0<x^{**}<0.875$, MB is selected from a group of divalent metals which comprises Mg, Ca, Sr, Ba, Zn and combinations thereof, and E is selected from a group which comprises Eu, Mn, Ce, Yb and combinations thereof.

Embodiment 16 is the lighting device according to embodiment 15, wherein the phosphor has the formula $SrLi_{3-2x^{}}Al_{1+2x^{}}O_{4-4x^{}}N_{4x^{}}$:Eu, wherein $0<x^{}<0.875$, preferably $0.125\leq x^{}<0.875$ or $0.125\leq x^{}\leq 0.5$, very particularly preferably $0.125\leq x^{}\leq 0.45$.

Embodiment 17 is the lighting device according to any of embodiments 1 to 6, wherein the phosphor has the formula $(MB)(Si_{0.25}Al_{-1/8+r^{}/2}Li_{7/8-r^{}/2})_4$ $(O_{1-r^{}}N_{r^{}})_4$:E, wherein $0.25\leq r^{**}\leq 1$, MB is selected from a group of divalent metals which comprises Mg, Ca, Sr, Ba and combinations thereof, and E=Eu, Ce, Yb and/or Mn.

Embodiment 18 is the lighting device according to embodiment 7,
which is configured to emit a blue radiation, wherein the phosphor has the formula $(Na_rK_{1-r})_1(TA)_3(TD)_1(XB)_4$:E where $0.4<r\leq 1$ 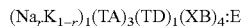:E where $0<r^*<0.4$ or $(Cs,Na,Rb,Li)_1(TA)_3(TD)_1(XB)_4$: E, $(Cs,Na,K)_1(TA)_3(TD)_1(XB)_4$:E and $(Rb,Na,K)_1(TA)_3(TD)_1(XB)_4$:E.

Embodiment 19 is the use of a lighting device according to any of embodiments 1 to 18 for the backlighting of display devices, in particular of displays.

Embodiment 20 is a display device comprising a lighting device according to any of embodiments 1 to 18.

LIST OF REFERENCE SIGNS ppm Parts per million
λpeak Peak wavelength
λdom Dominant wavelength
AB Exemplary embodiment
g Gram
E Emission
mmol Millimol
Mol % Mol percent
$R_{inf}$ Diffuse reflection
lm Lumen
W Watt
LER Luminous efficiency
LED Light-emitting diode
CRI Color rendering index
CCT Correlated color temperature
R9 Color rendering index
K/S Kubelka-Munk function
K Kelvin
cm Centimeter
nm Nanometer
° 2θ Degree 2 Theta
I, II, III, IV, V, VI X-ray powder diffractogram
Ew White point
KL Conversion line
T Temperature
° C. Degree Celsius
1 Conversion LED
2 Layer sequence/semiconductor chip
2a Radiation exit surface
3 Conversion element
10 Substrate
11 Housing
S Beam path of the primary radiation

What is claimed is:

1. A lighting device comprising a phosphor having the general molecular formula $(MB)Li_{3-2x^{}}Al_{1+2x^{}}O_{4-4x^{}}N_{4x^{}}$:E, wherein $0<x^{**}<0.875$, MB is selected from a group of divalent metals which comprises Mg, Ca, Sr, Ba, Zn and combinations thereof, and E is selected from a group which comprises Eu, Ce, Yb and combinations thereof.

2. The lighting device as claimed in claim 1, wherein $0.125\leq x^{**}<0.875$.

3. The lighting device as claimed in claim 1, wherein the phosphor has the formula $SrLi_{3-2x^{}}Al_{1+2x^{}}O_{4-4x^{}}N_{4x^{}}$:Eu, wherein $0<x^{**}<0.875$.

4. The lighting device as claimed in claim 3, wherein $0.125\leq x^{**}<0.875$.

5. The lighting device as claimed in claim 1, wherein the phosphor crystallizes in a tetragonal crystal system.

6. The lighting device as claimed in claim 5, wherein the phosphor crystallizes in the space group I4/m.

7. The lighting device as claimed in claim 1, wherein the lighting device is a conversion light-emitting diode comprising:
a primary radiation source configured to emit an electromagnetic primary radiation during operation of the diode,
a conversion element comprising the phosphor, said conversion element being arranged in the beam path of the electromagnetic primary radiation, wherein the phosphor is configured at least partly to convert the electromagnetic primary radiation into an electromagnetic secondary radiation during operation of the lighting device.

8. The lighting device as claimed in claim 1, wherein MB is selected from a group consisting of Ca, Sr, Ba, Zn, and combinations thereof.

9. The lighting device as claimed in claim 1, wherein E is Eu.

10. A lighting device comprising a phosphor having the general molecular formula $(MB)Li_{3-2x^{}}Al_{1+2x^{}}O_{4-4x^{}}N_{4x^{}}$:Eu, wherein $0<x^{**}<0.875$, MB is selected from a group of divalent metals which comprises Ca, Sr, Ba, Zn and combinations thereof.

11. The lighting device as claimed in claim 1, wherein the phosphor emits a secondary radiation in the blue to blue-green spectral range of the electromagnetic spectrum.

12. The lighting device as claimed in claim 1, wherein the phosphor emits a secondary radiation in the blue to green-yellow spectral range of the electromagnetic spectrum.

* * * * *